US012666747B2

(12) United States Patent
Shohji et al.

(10) Patent No.: US 12,666,747 B2
(45) Date of Patent: Jun. 23, 2026

(54) SOLID-STATE IMAGING DEVICE AND ELECTRONIC APPARATUS

(71) Applicant: SONY SEMICONDUCTOR SOLUTIONS CORPORATION, Kanagawa (JP)

(72) Inventors: Reijiroh Shohji, Nagasaki (JP); Masaki Haneda, Kanagawa (JP); Hiroshi Horikoshi, Kanagawa (JP); Minoru Ishida, Tokyo (JP); Takatoshi Kameshima, Kanagawa (JP); Ikue Mitsuhashi, Kanagawa (JP); Hideto Hashiguchi, Kanagawa (JP); Tadashi Iijima, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 180 days.

(21) Appl. No.: 18/594,924

(22) Filed: Mar. 4, 2024

(65) Prior Publication Data

US 2024/0274641 A1 Aug. 15, 2024

Related U.S. Application Data

(63) Continuation of application No. 17/592,025, filed on Feb. 3, 2022, now Pat. No. 11,955,500, which is a
(Continued)

(30) Foreign Application Priority Data

Apr. 4, 2017 (JP) .................................. 2017-074807
Jul. 3, 2017 (JP) .................................. 2017-130384

(51) Int. Cl.
H10F 39/00 (2025.01)
H10W 20/20 (2026.01)
H10W 90/00 (2026.01)

(52) U.S. Cl.
CPC ......... H10F 39/811 (2025.01); H10F 39/809 (2025.01); H10W 20/20 (2026.01); H10W 90/792 (2026.01)

(58) Field of Classification Search
CPC ...... H10F 39/811; H10F 39/809; H10F 39/18; H10F 39/803; H10F 39/8053;
(Continued)

(56) References Cited

U.S. PATENT DOCUMENTS 11,289,526 B2 3/2022 Shohji et al.
2014/0042298 A1 2/2014 Wan et al.
(Continued)

FOREIGN PATENT DOCUMENTS

CN 102544034 7/2012
CN 104718622 6/2015
(Continued)

OTHER PUBLICATIONS

International Search Report and Written Opinion for International (PCT) Patent Application No. PCT/JP2018/011565, dated Jun. 5, 2018, 7 pages.
(Continued)

*Primary Examiner* — Tucker J Wright
(74) *Attorney, Agent, or Firm* — SHERIDAN ROSS P.C.

(57) ABSTRACT

There is provided a solid-state imaging device including: a first substrate including a first semiconductor substrate and a first wiring layer, the first semiconductor substrate having a pixel unit with pixels; a second substrate including a second semiconductor substrate and a second wiring layer, the second semiconductor substrate having a circuit with a predetermined function; and a third substrate including a third semiconductor substrate and a third wiring layer, the third semiconductor substrate having a circuit with a predetermined function, the first, second, and third substrates
(Continued)

being stacked in this order, the first substrate and the second substrate being bonded together with the first wiring layer and the second wiring layer opposed to each other, a first coupling structure on bonding surfaces of the first substrate and the second substrate, and including an electrode junction structure with electrodes formed on the respective bonding surfaces in direct contact with each other.

13 Claims, 108 Drawing Sheets

Related U.S. Application Data continuation of application No. 16/497,084, filed as application No. PCT/JP2018/011565 on Mar. 23, 2018, now Pat. No. 11,289,526.

(58) Field of Classification Search
CPC .................. H01L 23/481; H01L 24/08; H01L 2224/08145; H01L 2224/08137; H01L 21/76898; H01L 25/16; H01L 25/167; H01L 25/18

See application file for complete search history.

(56) References Cited

U.S. PATENT DOCUMENTS

| | | |
|---|---|---|
| 2014/0042299 A1 | 2/2014 | Wan et al. |
| 2015/0091124 A1 | 4/2015 | Liu et al. |
| 2015/0270307 A1 | 9/2015 | Umebayashi et al. |
| 2016/0284753 A1 | 9/2016 | Komai et al. |
| 2017/0179181 A1 | 6/2017 | Kwon |
| 2022/0157877 A1 | 5/2022 | Shohji et al. |

FOREIGN PATENT DOCUMENTS

| | | |
|---|---|---|
| CN | 106165099 | 11/2016 |
| JP | 2014-099582 | 5/2014 |
| JP | 2015-135938 | 7/2015 |
| JP | 2016-171297 | 9/2016 |
| TW | 201523848 | 6/2015 |

OTHER PUBLICATIONS

Official Action for U.S. Appl. No. 16/497,084, dated Jul. 20, 2021, 10 pages.
Notice of Allowance for U.S. Appl. No. 16/497,084, dated Nov. 15, 2021, 8 pages.
Official Action for U.S. Appl. No. 17/592,025, dated May 16, 2023, 12 pages.
Official Action for U.S. Appl. No. 17/592,025, dated Sep. 21, 2023, 9 pages.
Notice of Allowance for U.S. Appl. No. 17/592,025, dated Dec. 6, 2023, 7 pages.

LOWER SURFACE OF
FIRST SUBSTRATE

203

UPPER SURFACE OF
SECOND SUBSTRATE

204

LOWER SURFACE OF
SECOND SUBSTRATE

205

UPPER SURFACE OF
THIRD SUBSTRATE

FIG. 2D 202
202

LOWER SURFACE OF
FIRST SUBSTRATE 203
203

UPPER SURFACE OF
SECOND SUBSTRATE

204

LOWER SURFACE OF
SECOND SUBSTRATE

205

UPPER SURFACE OF
THIRD SUBSTRATE 202
202
LOWER SURFACE OF
FIRST SUBSTRATE 203
203
UPPER SURFACE OF
SECOND SUBSTRATE 204
204
LOWER SURFACE OF
SECOND SUBSTRATE 205
205
UPPER SURFACE OF
THIRD SUBSTRATE

SOLID-STATE IMAGING DEVICE AND ELECTRONIC APPARATUS

CROSS REFERENCE TO RELATED APPLICATIONS

This application is a Continuation of U.S. patent application Ser. No. 17/592,025, filed Feb. 3, 2022, which is Continuation of U.S. patent application Ser. No. 16/497,084, filed Sep. 24, 2019, now U.S. Pat. No. 11,289,526, which is a national stage application under 35 U.S.C. 371 and claims the benefit of PCT Application No. PCT/JP2018/011565, having an international filing date of Mar. 23, 2018, which designated the United States, which PCT application claimed the benefit of Japanese Patent Application Nos. 2017-074807 filed Apr. 4, 2017 and 2017-130384 filed Jul. 3, 2017, the entire disclosures of each of which are incorporated herein by reference.

TECHNICAL FIELD

The present disclosure relates to a solid-state imaging device and an electronic apparatus.

BACKGROUND ART

Solid-state imaging devices have been developed that each of which has a structure in which a pixel chip provided with a pixel unit, a logic chip mounted with a logic circuit, and the like are stacked. The logic circuit executes various kinds of signal processing related to the operation of the solid-state imaging device. For example, PTL 1 discloses a three-layer stacked solid-state imaging device in which a pixel chip, a logic chip, and a memory chip mounted with a memory circuit are stacked. The memory circuit holds a pixel signal acquired by a pixel unit of the pixel chip.

Note that, when describing the structure of a solid-state imaging device, this specification also refers, as "substrates," to components each including, in combination, a semiconductor substrate having a pixel chip, a logic chip, or a memory chip formed thereon, and a multi-layered wiring layer formed on the semiconductor substrate. The "substrates" are then referred to as "first substrate," "second substrate," "third substrate," . . . in order from the upper side (side from which observation light comes) to the lower side of the stack structure to distinguish the substrates from each other. Note that the stacked solid-state imaging device is manufactured by stacking the respective substrates in the wafer state, and then dicing the stacked substrates into a plurality of stacked solid-state imaging devices (stacked solid-state imaging device chips). This specification assumes for the sake of convenience that the "substrates" may mean the wafer state before dicing, or the chip state after dicing.

CITATION LIST

Patent Literature

PTL 1: Japanese Unexamined Patent Application Publication No. 2014-99582

SUMMARY OF THE INVENTION

Problem to be Solved by the Invention

Several methods have been devised of electrically coupling the respective signal lines included in the upper and lower substrates to each other and electrically coupling the respective power supply lines included in the upper and lower substrates to each other in a stacked solid-state imaging device as described in PTL 1. Examples of the methods include a method of coupling signal lines to each other and coupling power supply lines to each other outside chips through a pad, a method of coupling signal lines to each other and coupling power supply lines to each other inside chips with a TSV (Through-Silicon Via), and the like. It is not necessarily the case that variations of the methods of electrically coupling the signal lines included in the substrates to each other and electrically coupling the power supply lines included in the substrates to each other have been examined in detail so far. Detailed examination of such variations may possibly provide an insight into the appropriate structures to obtain a solid-state imaging device that exhibits higher performance.

Accordingly, the present disclosure proposes a novel and improved solid-state imaging device and electronic apparatus that allow performance to be further improved.

Means for Solving the Problem

According to the present disclosure, there is provided a solid-state imaging device including: a first substrate including a first semiconductor substrate and a first multi-layered wiring layer stacked on the first semiconductor substrate, the first semiconductor substrate having a pixel unit formed thereon, the pixel unit having pixels arranged thereon; a second substrate including a second semiconductor substrate and a second multi-layered wiring layer stacked on the second semiconductor substrate, the second semiconductor substrate having a circuit formed thereon, the circuit having a predetermined function; and a third substrate including a third semiconductor substrate and a third multi-layered wiring layer stacked on the third semiconductor substrate, the third semiconductor substrate having a circuit formed thereon, the circuit having a predetermined function, the first substrate, the second substrate, and the third substrate being stacked in this order, the first substrate and the second substrate being bonded together in a manner that the first multi-layered wiring layer and the second multi-layered wiring layer are opposed to each other, a first coupling structure for electrically coupling the first substrate and the second substrate to each other existing on bonding surfaces of the first substrate and the second substrate, and including an electrode junction structure in which electrodes formed on the respective bonding surfaces are joined to each other in direct contact with each other.

Moreover, according to the present disclosure, there is provided an electronic apparatus including: a solid-state imaging device that electronically shoots an image of a target to be observed, the solid-state imaging device including a first substrate including a first semiconductor substrate and a first multi-layered wiring layer stacked on the first semiconductor substrate, the first semiconductor substrate having a pixel unit formed thereon, the pixel unit having pixels arranged thereon, a second substrate including a second semiconductor substrate and a second multi-layered wiring layer stacked on the second semiconductor substrate, the second semiconductor substrate having a circuit formed thereon, the circuit having a predetermined function, and a third substrate including a third semiconductor substrate and a third multi-layered wiring layer stacked on the third semiconductor substrate, the third semiconductor substrate having a circuit formed thereon, the circuit having a predetermined function, the first substrate, the second substrate, and the third substrate being stacked in this order, the first substrate and the second substrate being bonded together in a manner that the first multi-layered wiring layer and the second multi-layered wiring layer are opposed to each other, a first coupling structure for electrically coupling the first substrate and the second substrate to each other existing on bonding surfaces of the first substrate and the second substrate, and including an electrode junction structure in which electrodes formed on the respective bonding surfaces are joined to each other in direct contact with each other.

According to the present disclosure, in the solid-state imaging device including three substrates that are stacked, the first substrate that is a pixel substrate and the second substrate are bonded together face-to-face (to be described in detail later), and on the bonding surfaces of the first substrate and the second substrate, the electrode junction structure in which electrodes formed on the respective bonding surfaces are joined to each other in direct contact with each other is provided as the first coupling structure for electrically coupling respective signal lines included in the first substrate and the second substrate to each other and electrically coupling respective power supply lines included in the first substrate and the second substrate. According to the configuration, various coupling structures are provided as a second coupling structure for electrically coupling respective signal lines included in the second substrate and the third substrate to each other and electrically coupling respective power supply lines included in the second substrate and the third substrate to each other, and/or as a third coupling structure for electrically coupling respective signal lines included in the first substrate and the third substrate to each other and electrically coupling respective power supply lines included in the first substrate and the third substrate to each other, which makes it possible to achieve many variations of the coupling structure. This makes it possible to achieve a superior solid-state imaging device that allow performance to be further improved.

Effects of the Invention

As described above, according to the present disclosure, it is possible to further improve the performance of the solid-state imaging device. It is noted that the effects described above are not necessarily limitative, and with or in the place of the above effects, there may be achieved any one of the effects described in this specification or other effects that may be grasped from this specification.

BRIEF DESCRIPTION OF THE DRAWINGS

FIG. 2B is a diagram for describing an example of disposition of the coupling structures of the solid-state imaging device in the horizontal plane.

FIG. 2D is a diagram for describing another example of disposition of the coupling structures of the solid-state imaging device in the horizontal plane.

FIG. 5A is a diagram schematically illustrating disposition of power supply wiring lines and GND wiring lines in the solid-state imaging device illustrated in FIG. 3A.

FIG. 5B is a diagram schematically illustrating disposition of power supply wiring lines and GND wiring lines in the solid-state imaging device illustrated in FIG. 3B.

FIG. 5C is a diagram illustrating a configuration example of the solid-state imaging device illustrated in FIG. 5A for decreasing impedance.

MODES FOR CARRYING OUT THE INVENTION

Figure 1:
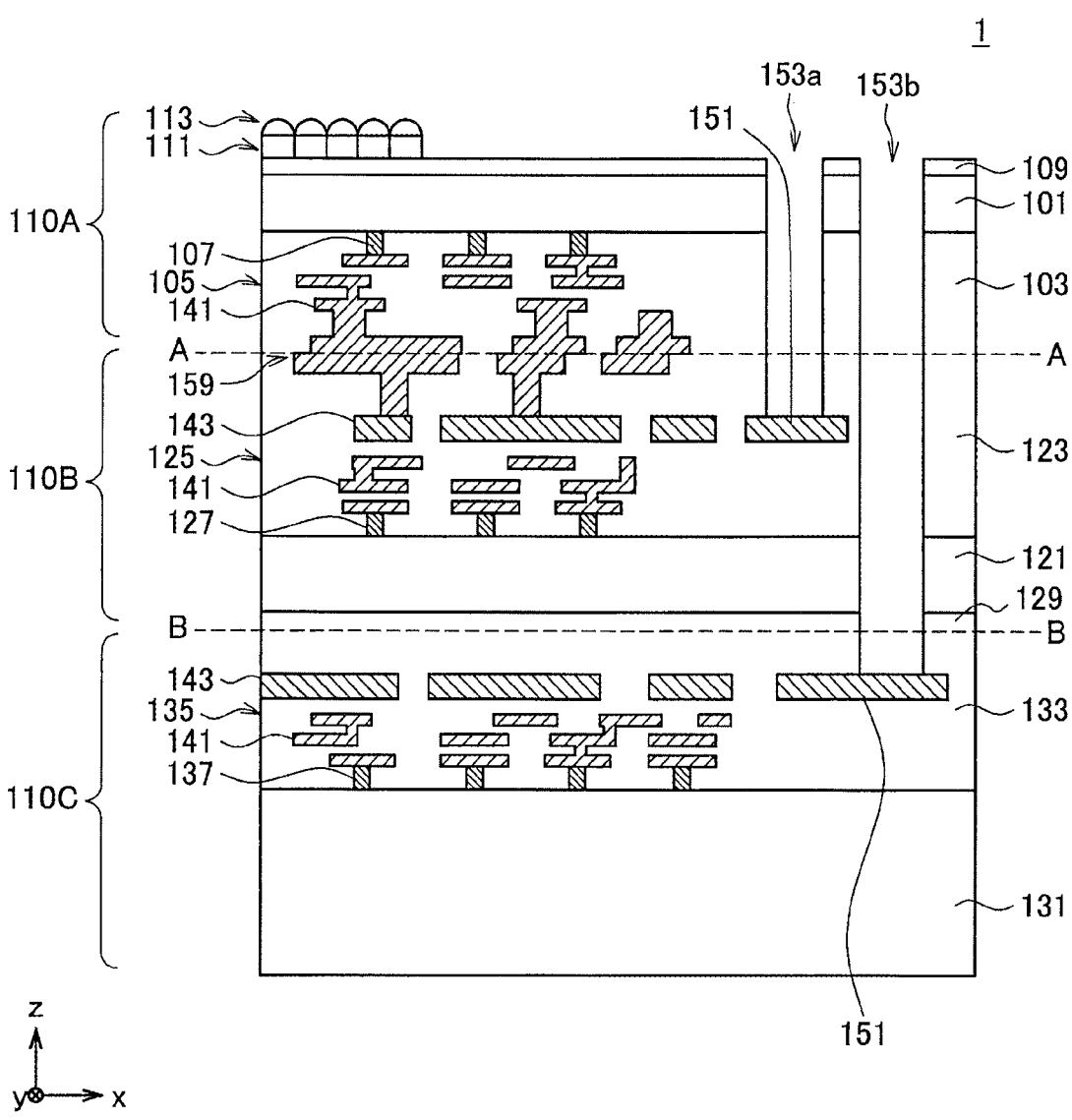
FIG. 1 is a vertical cross-sectional view of a schematic configuration of a solid-state imaging device according to an embodiment of the present disclosure.

Hereinafter, (a) preferred embodiment(s) of the present disclosure will be described in detail with reference to the appended drawings. Note that, in this specification and the appended drawings, components that have substantially the same function and configuration are denoted with the same reference numerals, thereby refraining from repeatedly describing these components.

In addition, in each of the drawings described below, sizes of some constituent members may be expressed exaggeratedly in some cases for description. Relative sizes of constituent members illustrated in the drawings do not necessarily accurately express size relations between actual constituent members.

Note that description is given in the following order.
1. Overall Configuration of Solid-state Imaging Device
2. Disposition of Coupling Structures
3. Direction of Second Substrate
3-1. Consideration Based on PWELL Area
3-2. Consideration Based on Power Consumption and Disposition of GND Wiring Lines
4. Manufacturing Method
4-1. First Manufacturing Method
4-2. Second Manufacturing Method
4-3. Third Manufacturing Method
4-4. Fourth Manufacturing Method
4-5. Summary
5. Variations of Configuration of Solid-state Imaging Device
5-1. First Configuration Example
5-2. Second Configuration Example
5-3. Third Configuration Example
5-4. Fourth Configuration Example
5-5. Fifth Configuration Example
5-6. Sixth Configuration Example
5-7. Seventh Configuration Example
5-8. Eighth Configuration Example
5-9. Ninth Configuration Example
5-10. Tenth Configuration Example
5-11. Summary
6. Application examples
7. Supplement

1. Overall Configuration of Solid-State Imaging Device

FIG. 1 is a vertical cross-sectional view of a schematic configuration of a solid-state imaging device according to an embodiment of the present disclosure. As illustrated in FIG. 1, a solid-state imaging device 1 according to the present embodiment is a three-layer stacked solid-state imaging device including a first substrate 110A, a second substrate 110B, and a third substrate 110C that are stacked. In the diagram, a broken line A-A indicates bonding surfaces of the first substrate 110A and the second substrate 110B, and a broken line B-B indicates bonding surfaces of the second substrate 110B and the third substrate 110C. The first substrate 110A is a pixel substrate provided with a pixel unit. The second substrate 110B and the third substrate 110C are provided with circuits for performing various kinds of signal processing related to an operation of the solid-state imaging device 1. The second substrate 110B and the third substrate 110C are, for example, a logic substrate provided with a logic circuit or a memory substrate provided with a memory circuit. The solid-state imaging device 1 is a back-illuminated CMOS (Complementary Metal-Oxide-Semiconductor) image sensor that photoelectrically converts, in the pixel unit, light coming from a back surface side of the first substrate 110A, which is described below. Note that the following describes, for the explanation of FIG. 1, a case where the second substrate 110B is a logic substrate, and the third substrate 110C is a memory substrate.

It is possible in the stacked solid-state imaging device 1, to more appropriately configure circuits to adapt to functions of the respective substrates. It is thus easier to allow the solid-state imaging device 1 to exhibit higher performance. It is possible in the illustrated configuration example to appropriately configure the pixel unit in the first substrate 110A, and the logic circuit or the memory circuit in the second substrate 110B and the third substrate 110C to adapt to the functions of the respective substrates. This makes it possible to achieve the solid-state imaging device 1 that exhibits high performance.

Note that the following also refers to a stacking direction of the first substrate 110A, second substrate 110B, and third substrate 110C as z-axis direction. In addition, a direction in which the first substrate 110A is positioned in the z-axis direction is defined as a positive direction of an z axis. Further, two directions orthogonal to each other on a plane (a horizontal plane) perpendicular to the z-axis direction are also referred to as x-axis direction and y-axis direction. In addition, one of opposed two surfaces of semiconductor substrates 101, 121, and 131 on the respective substrates in the directions of the substrate principal surfaces is provided with functional components such as transistors or is provided with multi-layered wiring layers 105, 125, and 135, and the following also refers to these surfaces as front surfaces (also referred to as front side surfaces). The multi-layered wiring layers 105, 125, and 135 bring the functional components into operation, and are described below. The semiconductor substrates 101, 121, and 131 are described below. The other surfaces opposed to the front surfaces are also referred to as back surfaces (back side surfaces). Further, in each of the substrates, a side on which the front surface is provided is also referred to as a front surface side (a front side), and a side on which the back surface is provided is also referred to as a back surface side (a back side).

The first substrate 110A mainly includes the semiconductor substrate 101 including, for example, silicon (Si), and the multi-layered wiring layer 105 formed on the semiconductor substrate 101. A pixel unit having pixels two-dimensionally arranged and a pixel signal-processing circuit that processes a pixel signal are mainly formed on the semiconductor substrate 101. Each pixel mainly includes a photodiode (PD)

and a drive circuit. The PD receives light (observation light) from an observation target and performs photoelectric conversion, and the drive circuit includes a transistor or the like for reading out an electric signal (a pixel signal) corresponding to the observation light acquired by the PD. In the pixel signal processing circuit, for example, various kinds of signal processing such as analog-to-digital conversion (AD conversion) are executed on the pixel signal. Note that in the present embodiment, the pixel unit is not limited to a pixel unit having the pixels two-dimensionally arranged, and may be a pixel unit having the pixels three-dimensionally arranged. Further, in the present embodiment, a substrate formed using a material other than a semiconductor may be used instead of the semiconductor substrate 101. For example, a sapphire substrate may be used instead of the semiconductor substrate 101. In this case, a mode in which a pixel is formed by depositing a film (e.g., an organic photoelectric conversion film) that performs photoelectric conversion on the sapphire substrate may be applied.

An insulating film 103 is stacked on the front surface of the semiconductor substrate 101 on which the pixel unit and the pixel signal processing circuit are formed. The multi-layered wiring layer 105 is formed inside the insulating film 103. The multi-layered wiring layer 105 includes a signal line wiring line for transmitting various signals such as a pixel signal and a drive signal for driving a transistor of a drive circuit. The multi-layered wiring layer 105 further includes a power supply wiring line, a ground wiring line (a GND wiring line), and the like. Note that in the following, for the sake of simplicity, the signal line wiring line is sometimes simply referred to as signal line. In addition, the power supply wiring line and the GND wiring line are sometimes collectively referred to as power supply line. A lowermost wiring line of the multi-layered wiring layer 105 may be electrically coupled to the pixel unit or the pixel signal processing circuit by a contact 107 in which, for example, an electrically-conductive material such as tungsten (W) is embedded. Note that a plurality of wiring layers may be actually formed by repeating formation of an interlayer insulating film having a predetermined thickness and formation of a wiring layer, but FIG. 1 collectively refers to a plurality of the interlayer insulating films as insulating film 103, and collectively refers to a plurality of the wiring layers as multi-layered wiring layer 105 for the sake of simplicity.

Note that in an uppermost layer of the multi-layered wiring layer 105, an electrode is formed in a manner that a metallic surface of the electrode is exposed from the insulating film 103. In a case where the first substrate 110A and the second substrate 110B are bonded together, the electrode is included in an electrode junction structure 159 for electrically coupling wiring lines in these substrates to each other, as described later. Note that, in this specification, for the sake of simplicity, electrically coupling a wiring line in one substrate and a wiring line in another substrate to each other is sometimes simply abbreviated to electrically coupling one substrate and another substrate to each other. At this time, wiring lines electrically coupled to each other upon electrically coupling the substrates to each other may be signal lines or power supply lines.

The second substrate 110B is, for example, a logic substrate. The second substrate 110B mainly includes the semiconductor substrate 121 including, for example, Si and the multi-layered wiring layer 125 formed on the semiconductor substrate 121. A logic circuit is formed on the semiconductor substrate 121. In the logic circuit, various kinds of signal processing related to the operation of the solid-state imaging device 1 are executed. For example, the logic circuit may control a drive signal for driving the pixel unit of the first substrate 110A (i.e., drive control of the pixel unit) and exchange of a signal with the outside. Note that, in the present embodiment, a substrate formed using a material other than a semiconductor may be used instead of the semiconductor substrate 121. For example, a sapphire substrate may be used instead of the semiconductor substrate 121. In this case, a mode in which a semiconductor film (e.g., an Si film) is deposited on the sapphire substrate to form a logic circuit in the semiconductor film may be applied.

A insulating film 123 is stacked on the front surface of the semiconductor substrate 121 on which the logic circuit is formed. The multi-layered wiring layer 125 for transmitting various signals related to an operation of the logic circuit is formed inside the insulating film 123. The multi-layered wiring layer 125 further includes a power supply wiring line, a GND wiring line, and the like. A lowermost wiring line of the multi-layered wiring layer 125 may be electrically coupled to the logic circuit by a contact 127 in which, for example, an electrically-conductive material such as W is embedded. Note that, similarly to the insulating film 103 and the multi-layered wiring layer 105 of the first substrate 110A, the insulating film 123 of the second substrate 110B may also be a collective term of a plurality of interlayer insulating films, and the multi-layered wiring layer 125 may also be a collective term of a plurality of wiring layers.

Note that in an uppermost layer of the multi-layered wiring layer 125, an electrode is formed in a manner that a metallic surface of the electrode is exposed from the insulating film 123. In a case where the first substrate 110A and the second substrate 110B are bonded together, the electrode is included in the electrode junction structure 159 for electrically coupling the signal lines included in these substrates to each other and electrically coupling the power supply lines included in these substrates to each other, as described later. In addition, a pad 151 may be formed in the multi-layered wiring layer 125. The pad 151 functions as an external input/output unit (I/O unit) for exchanging various signals with the outside. The pad 151 may be provided along an outer periphery of a chip.

The third substrate 110C is, for example, a memory substrate. The third substrate 110C mainly includes the semiconductor substrate 131 including, for example, Si, and the multi-layered wiring layer 135 formed on the semiconductor substrate 131. A memory circuit is formed on the semiconductor substrate 131. The memory circuit temporarily holds a pixel signal acquired by the pixel unit of the first substrate 110A and is subjected to AD conversion by the pixel signal processing circuit. Temporarily holding a pixel signal in the memory circuit enables a global shutter system and allows the pixel signal to be read out from the solid-state imaging device 1 to the outside at higher speed. This makes it possible to shoot an image of higher quality in which distortion is suppressed even at the time of high-speed shooting. Note that in the present embodiment, a substrate formed using a material other than a semiconductor may be used instead of the semiconductor substrate 131. For example, a sapphire substrate may be used instead of the semiconductor substrate 131. In this case, a mode in which a film (e.g., a phase-change material film) for forming a memory element is deposited on the sapphire substrate and a memory circuit is formed using the film may be applied.

An insulating film 133 is stacked on the front surface of the semiconductor substrate 131 on which the memory circuit is formed. The multi-layered wiring layer 135 for transmitting various signals related to an operation of the memory circuit is formed inside the insulating film 133. The multi-layered wiring layer 135 further includes a power supply wiring line, a GND wiring line, and the like. A lowermost wiring line of the multi-layered wiring layer 135 may be electrically coupled to the memory circuit by a contact 137 in which, for example, an electrically-conductive material such as W is embedded. Note that, similarly to the insulating film 103 and the multi-layered wiring layer 105 of the first substrate 110A, the insulating film 133 of the third substrate 110C may also be a collective term of a plurality of interlayer insulating films, and the multi-layered wiring layer 135 may also be a collective term of a plurality of wiring layers.

Note that the pad 151 may be formed in the multi-layered wiring layer 135. The pad 151 functions as an I/O unit for exchanging various signals with the outside. The pad 151 may be provided along the outer periphery of the chip.

Each of the first substrate 110A, the second substrate 110B, and the third substrate 110C is fabricated in a wafer state. Thereafter, these substrates are bonded together, and respective processes are performed for electrically coupling the respective signal lines included in the substrates to each other and electrically coupling the respective power supply lines included in the substrates to each other.

Specifically, the first substrate 110A in the wafer state and the second substrate 110B in the wafer state are first bonded together in a manner that the front surface (the surface provided with the multi-layered wiring layer 105) of the semiconductor substrate 101 of the first substrate 110A and the front surface (the surface provided with the multi-layered wiring layer 125) of the semiconductor substrate 121 of the second substrate 110B are opposed to each other. The following also refers to such a state in which two substrates are bonded together with the front surfaces of semiconductor substrates of the substrates to be opposed to each other as Face to Face (F-to-F).

At this time, the first substrate 110A and the second substrate 110B are bonded together in a manner that the metallic surface of the electrode in the uppermost layer of the multi-layered wiring layer 105 of the first substrate 110A and the metallic surface of the electrode in the uppermost layer of the multi-layered wiring layer 125 of the second substrate 110B are in contact with each other. Heat treatment is then performed, thereby joining the electrodes to each other, and electrically coupling the respective signal lines included in the first substrate 110A and the second substrate 110 to each other and electrically coupling the respective power supply lines included in the first substrate 110A and the second substrate 110B to each other. This specification also refers to such a structure, in which electrodes are directly joined to each other, for electrically coupling respective signal lines included in the substrates to each other and electrically coupling respective power supply lines included in the substrates to each other as electrode junction structure 159. That is, the electrode junction structure 159 includes an electrode formed on the bonding surface in the first substrate 110A, a via for electrically coupling the electrode to a predetermined wiring line in the multi-layered wiring layer 105, an electrode formed on the bonding surface in the second substrate 110B, and a via for electrically coupling the electrode to a predetermined wiring line in the multi-layered wiring layer 125. In an illustrated example, the first substrate 110A and the second substrate 110B are bonded together F-to-F; therefore, each of these vias is provided in a corresponding insulating film (in the insulating films 103 and 123), but depending on a direction in which the substrates are bonded together, one of the vias may be a via penetrating the semiconductor substrate (a so-called TSV (a via provided by penetrating at least one semiconductor substrate of the semiconductor substrate 101, 121, or 131 from one surface of any of first substrate 110A, second substrate 110B, and third substrate 110C)) (for example, in an electrode junction structure 159b illustrated in FIG. 15A to be described later, the via of the second substrate 110B is provided by penetrating the semiconductor substrate 121). Note that in the present embodiment, as described above, a substrate including a material other than a semiconductor may also be used instead of the semiconductor substrates 101, 121, and 131, but this specification also refers to a via provided by penetrating such a substrate including a material other than a semiconductor as TSV for the sake of convenience.

Next, the third substrate 110C in the wafer state is further bonded to the stack of the first substrate 110A and the second substrate 110B in a manner that the back surface (the surface opposite to the side on which the multi-layered wiring layer 125 is provided) of the semiconductor substrate 121 of the second substrate 110B in the wafer state and the front surface (the surface on which the multi-layered wiring layer 135 is provided) of the semiconductor substrate 131 of the third substrate 110C are opposed to each other. Note that at this time, in the second substrate 110B, the semiconductor substrate 121 is thinned before a bonding process, and an insulating film 129 having a predetermined thickness is formed on the back surface of the semiconductor substrate 121. The following also refers to such a state in which two substrates are bonded together in a manner that the front surface of a semiconductor substrate of one of the substrates and the back surface of a semiconductor substrate of another substrate are opposed to each other as Face to Back (F-to-B).

Next, the semiconductor substrate 101 of the first substrate 110A is thinned, and an insulating film 109 is formed on the back surface side of the semiconductor substrate 101. Thereafter, a color filter layer 111 (CF layer 111) and a microlens array 113 (ML array 113) are formed on the back surface of the semiconductor substrate 101 of the first substrate 110A with the insulating film 109 interposed therebetween.

The CF layer 111 includes a plurality of CFs arranged two-dimensionally. The ML array 113 includes a plurality of MLs arranged two-dimensionally. The CF layer 111 and the ML array 113 are formed directly above the pixel unit, and one CF and one ML are provided for the PD of a corresponding one of the pixels.

Each of the CFs of the CF layer 111 has, for example, any of red, green, and blue colors. The observation light that has passed through the CF enters the PD of the pixel, and a pixel signal is acquired. This allows a pixel signal of a color component of the color filter to be acquired for an observation target (i.e., this allows for color imaging). Actually, one pixel corresponding to one CF may function as a sub-pixel, and one pixel may include a plurality of sub-pixels. For example, in the solid-state imaging device 1, one pixel may include sub-pixels of four colors including a pixel provided with a red CF (i.e., a red pixel), a pixel provided with a green CF (i.e., a green pixel), a pixel provided with a blue CF (i.e., a blue pixel), and a pixel provided with no CF (i.e., a white pixel). This specification, however, also refers to a component corresponding to one sub-pixel simply as pixel without distinguishing a sub-pixel from a pixel for the convenience of explanation. Note that a method of arranging CFs is not particularly limited, but any type of arrangement may be adopted such as delta arrangement, stripe arrangement, diagonal arrangement, or rectangle arrangement.

The ML array 113 is formed to position each of the MLs directly above a corresponding one of the CFs. Providing the ML array 113 allows the observation light collected by the MLs to enter the PDs of the pixels through the CFs, which makes it possible to achieve effects of improving efficiency of collecting the observation light and improving sensitivity of the solid-state imaging device 1.

After the CF layer 111 and the ML array 113 are formed, pad openings 153a and 153b are formed to expose the pads 151 provided in the multi-layered wiring layer 125 of the second substrate 110B and the multi-layered wiring layer 135 of the third substrate 110C. The pad opening 153a is formed to penetrate the first substrate 110A from the back surface side of the first substrate 110A and reach a metallic surface of the pad 151 provided in the multi-layered wiring layer 125 of the second substrate 110B. The pad opening 153b is formed to penetrate the first substrate 110A and the second substrate 110B from the back surface side of the first substrate 110A and reach the metallic surface of the pad 151 provided in the multi-layered wiring layer 135 of the third substrate 110C. The pads 151 and other external circuits are electrically coupled to each other through the pad openings 153a and 153b by, for example, wire bonding. That is, the respective signal lines included in the second substrate 110B and the third substrate 110C may be electrically coupled to each other through the other external circuits and the respective power supply lines included in the second substrate 110B and the third substrate 110C may be electrically coupled to each other through the other external circuits.

Note that in this specification, in a case where a plurality of pad openings 153 exists in the diagram as illustrated in FIG. 1, the plurality of pad openings 153 is distinguished by attaching different alphabets to ends of reference numerals such as the pad opening 153a and the pad opening 153b, for the sake of convenience.

Thereafter, a processed stack wafer structure including the substrates that are stacked in the wafer state is diced for each solid-state imaging device 1, thereby completing the solid-state imaging device 1.

The schematic configuration of the solid-state imaging device 1 has been described above. As described above, in the solid-state imaging device 1, the electrode junction structure 159 electrically couples the respective signal lines included in the first substrate 110A and the second substrate 110B to each other and electrically couples the respective power supply lines included in the first substrate 110A and the second substrate 110B to each other, and the pads 151 exposed by the pad openings 153a and 153b are coupled to each other through an electrical coupling means such as a wiring line or a substrate provided outside the solid-state imaging device 1, which allows the respective signal lines included in the second substrate 110B and the third substrate 110C to be electrically coupled to each other, and allows the respective power supply lines included in the second substrate 110B and the third substrate 110C to be electrically coupled to each other. That is, the respective signal lines included in the first substrate 110A, the second substrate 110B, and the third substrate 110C may be electrically coupled to each other through the electrode junction structure 159, the pads 151, and the pad openings 153a and 153b, and the respective power supply lines included in the first substrate 110A, the second substrate 110B, and the third substrate 110C may be electrically coupled to each other through the electrode junction structure 159, the pads 151, and the pad openings 153*a* and 153*b*. Note that this specification also collectively refers, as coupling structures, to structures such as the electrode junction structure 159, the pads 151, and the pad openings 153*a* and 153*b* illustrated in FIG. 1, that allow respective signal lines included in the substrates to be electrically coupled to each other, and allow respective power supply lines included in the substrates to be electrically coupled to each other. Although not used in the configuration illustrated in FIG. 1, the coupling structures also encompass a TSV 157 to be described later (a twin contact type or shared contact type TSV to be described later).

Note that the multi-layered wiring layer 105 of the first substrate 110A, the multi-layered wiring layer 125 of the second substrate 110B, and the multi-layered wiring layer 135 of the third substrate 110C may include a plurality of stacked first metal wiring layers 141 each including a first metal having relatively low resistance. The first metal is, for example, copper (Cu). Using a Cu wiring line makes it possible to exchange signals at higher speed. However, the pads 151 may each include a second metal that is different from the first metal in view of the adhesiveness and the like to wires for wire bonding. Accordingly, in an illustrated configuration example, the multi-layered wiring layer 125 of the second substrate 110B provided with the pad 151, and the multi-layered wiring layer 135 of the third substrate 110C provided with the pad 151 include a second metal wiring layer 143 including the second metal in the same layer as the pad 151. The second metal is, for example, aluminum (Al). In addition to the pads 151, an Al wiring line may be used, for example, as a power supply wiring line or a GND wiring line that is generally formed as a wide wiring line.

In addition, the first metal and the second metal are not limited to Cu and Al exemplified above. As the first metal and the second metal, various metals may be used. Alternatively, respective wiring layers of the multi-layered wiring layers 105, 125, and 135 may each include an electrically-conductive material other than metals. It is sufficient if these wiring layers each include an electrically-conductive material. The material is not limited. Alternatively, instead of using two types of electrically-conductive materials, all the multi-layered wiring layers 105, 125, and 135 including the pads 151 may include the same electrically-conductive material.

Further, in the present embodiment, the TSV 157 to be described later, and the electrodes and vias included in the electrode junction structure 159 each also include the first metal (e.g., Cu). For example, in a case where the first metal is Cu, these structures may be formed by a damascene method or a dual damascene method. The present embodiment is not, however, limited to such an example, and a portion or all of these structures may include the second metal, another metal different from both the first metal and the second metal, or another non-metallic electrically-conductive material. For example, the TSV 157 and vias included in the electrode junction structure 159 may be formed by embedding, in an opening, a metal material having favorable embeddability such as W. In a case where a via diameter is relatively small, such a structure using W may be suitably applied in consideration of the embeddability. In addition, the TSV 157 may not necessarily be formed by embedding an electrically-conductive material in a through hole (an opening penetrating at least one semiconductor substrate), and may be formed by forming a film including an electrically-conductive material on an inner wall (a sidewall and a bottom) of the through hole.

Moreover, although not illustrated in FIG. 1 and some of respective subsequent diagrams, the solid-state imaging device 1 includes insulating materials for electrically insulating the electrically-conductive materials such as the first metal and the second metal from the semiconductor substrates 101, 121, and 131 in portions illustrated as if the electrically-conductive materials such as the first metal and the second metal are in contact with the semiconductor substrates 101, 121, and 131. The insulating materials may include, for example, various known materials such as silicon oxide (SiO$_2$) or silicon nitride (SiN). The insulating materials may be interposed between the electrically-conductive material and the semiconductor substrates 101, 121, and 131, or may exist inside the semiconductor substrates 101, 121, and 131 away from portions where the electrically-conductive materials are in contact with the semiconductor substrate 101, 121, and 131. For example, with respect to the TSV 157 to be described later and a TSV included in the electrode junction structure 159, insulating materials may exist between inner walls of through holes provided in the semiconductor substrates 101, 121, and 131 and electrically-conductive materials embedded in the through holes (i.e., films including insulating materials may be formed on the inner walls of the through holes). Alternatively, with respect to the TSV 157 and the TSV included in the electrode junction structure 159, insulating materials may exist in portions inside the semiconductor substrate 101, 121, and 131 and away from the through holes provided in the semiconductor substrates 101, 121, and 131 by predetermined distances in the direction of the horizontal plane. In addition, although not illustrated in FIG. 1 and some of respective subsequent diagrams, in a case where the first metal is Cu, a barrier metal for preventing diffusion of Cu exists in portions where Cu is in contact with the semiconductor substrates 101, 121, and 131 or the insulating films 103, 109, 123, 129, and 133. As the barrier metal, various known materials such as titanium nitride (TiN) or tantalum nitride (TaN) may be used.

In addition, specific configurations of respective components (the pixel unit and the pixel signal processing circuit provided to the first substrate 110A, the logic circuit provided to the second substrate 110B, and the memory circuit provided to the third substrate 110C), the multi-layered wiring layers 105, 125, and 135, and the insulating films 103, 109, 123, 129, and 133 that are formed in the semiconductor substrates 101, 121, and 131 of the respective substrates, and formation methods thereof may be similar to various known configurations and methods. The specific configurations and formation methods are not thus described here in detail.

For example, it is sufficient if the insulating films 103, 109, 123, 129, and 133 include materials having insulating properties, and the materials are not limited. The insulating film 103, 109, 123, 129, and 133 may include, for example, SiO$_2$, SiN, or the like. In addition, each of the insulating films 103, 109, 123, 129, and 133 does not have to include one type of insulating material, but may include a plurality of types of stacked insulating materials. Moreover, for example, in the insulating films 103, 123, and 133, a Low-k material having insulating properties may be used in a region where a wiring line demanding signal transmission at higher speed is formed. Using the Low-k materials allows parasitic capacitance between wiring lines to be decreased, which makes it possible to further contribute to high-speed signal transmission.

As the other specific configurations of the respective components formed on the semiconductor substrates 101, 121, and 131 of the respective substrates, the multi-layered wiring layers 105, 125, and 135, and the insulating films 103, 109, 123, 129, and 133, and the other formation methods thereof, it is possible to apply, as appropriate, what is described, for example, in PTL 1. PTL 1 is a prior application filed by the applicant of the present application.

In addition, in the configuration example described above, a pixel signal processing circuit that performs signal processing such as AD conversion on a pixel signal is mounted on the first substrate 110A, but the present embodiment is not limited to the example. A portion or all of the functions of the pixel signal processing circuit may be provided to the second substrate 110B. This case may achieve the solid-state imaging device 1 that performs so-called pixel-by-pixel analog-to-digital conversion (pixel ADC). In the pixel ADC, a pixel signal acquired by a PD provided to each pixel is transmitted to the pixel signal processing circuit of the second substrate 110B for each pixel, and AD conversion is performed for each pixel, for example, in a pixel array in which a plurality of pixels is arrayed in both a column direction and a row direction. This allows pixel signals to be subjected to AD conversion and read out at higher speed as compared with a solid-state imaging device that includes one AD conversion circuit for each column of the pixel array, and performs general column-by-column analog/digital conversion (column ADC). In the column ADC, a plurality of pixels included in a column is sequentially subjected to AD conversion. Note that, in a case where the solid-state imaging device 1 is configured be able to execute the pixel ADC, each pixel is provided with an electrode junction structure that electrically couples the respective signal lines included in the first substrate 110A and the second substrate 110B to each other.

In addition, in the configuration example described above, a case where the second substrate 110B is a logic substrate, and the third substrate 110C is a memory substrate has been described. The present embodiment is not, however, limited to such an example. It is sufficient if the second substrate 110B and the third substrate 110C are substrates having functions other than that of the pixel substrate, and the functions may be optionally determined. For example, the solid-state imaging device 1 does not have to include any memory circuit. In this case, for example, both the second substrate 110B and the third substrate 110C may function as logic substrates. Alternatively, a logic circuit and a memory circuit may be distributed in the second substrate 110B and the third substrate 110C, and these substrates may cooperate to achieve the functions of a logic substrate and a memory substrate. Alternatively, the second substrate 110B may be a memory substrate, and the third substrate 110C may be a logic substrate.

In addition, in the configuration example described above, Si substrates are used as the semiconductor substrates 101, 121, and 131 in the respective substrates, but the present embodiment is not limited to such an example. As the semiconductor substrates 101, 121, and 131, other types of semiconductor substrates may be used such as gallium arsenide (GaAs) substrates or silicon carbide (SiC) substrates, for example. Alternatively, instead of the semiconductor substrates 101, 121, and 131, substrates each including a material other than a semiconductor may be used such as sapphire substrates, as described above.

2. Disposition of Coupling Structures

As described above with reference to FIG. 1, in the solid-state imaging device 1, respective signal lines and/or respective power supply lines included in respective substrates may be electrically coupled to each other over a plurality of substrates through coupling structures. The disposition of these coupling structures in the horizontal plane may be determined as appropriate to improve the performance of the entire solid-state imaging device 1 by considering the configuration, performance, and the like of each of the substrates (chips). Several variations of the disposition of the coupling structures of the solid-state imaging device 1 in the horizontal plane are now described.

Figure 2A:
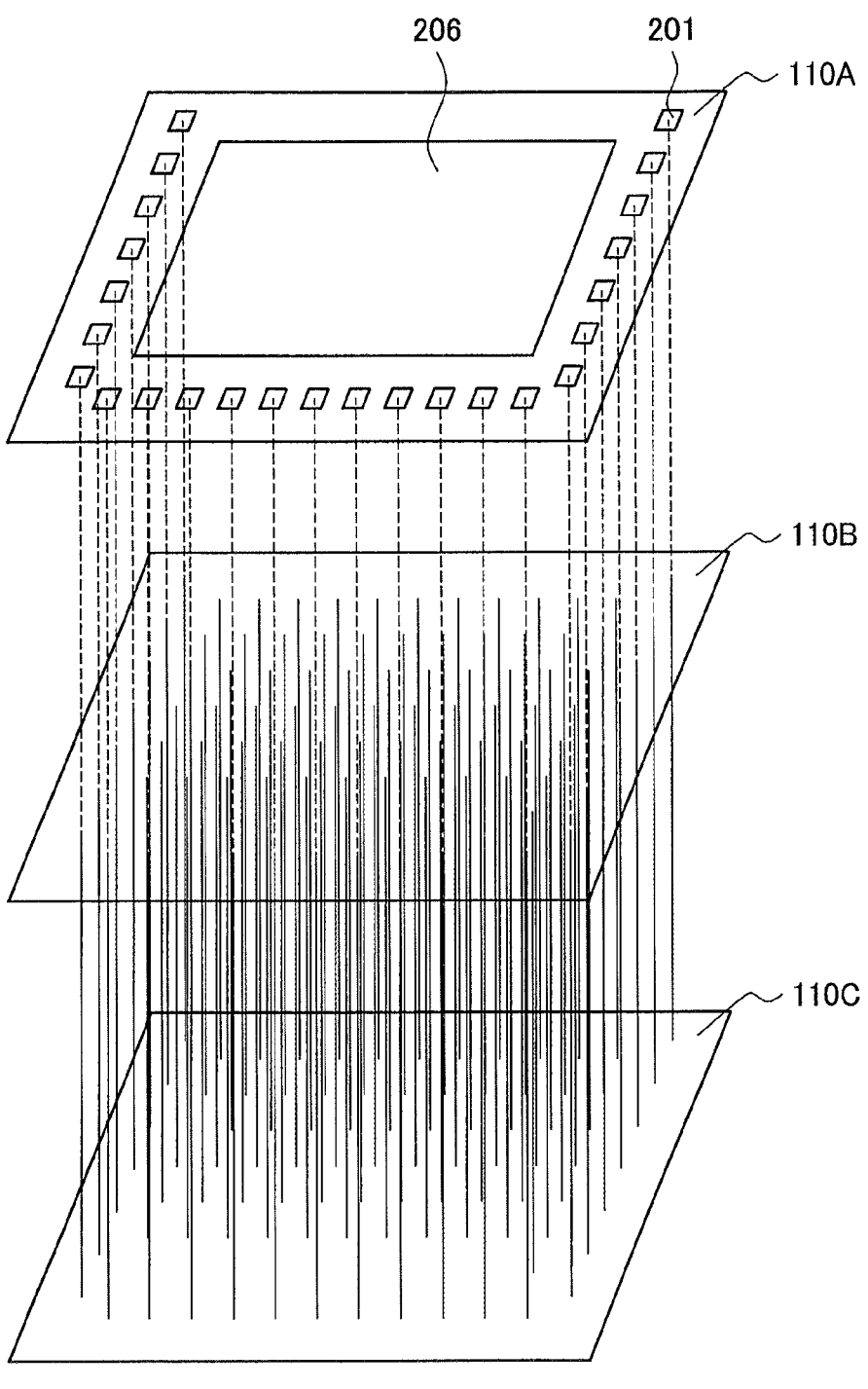
FIG. 2A is a diagram for describing an example of disposition of coupling structures of the solid-state imaging device in a horizontal plane.
Figure 2B:
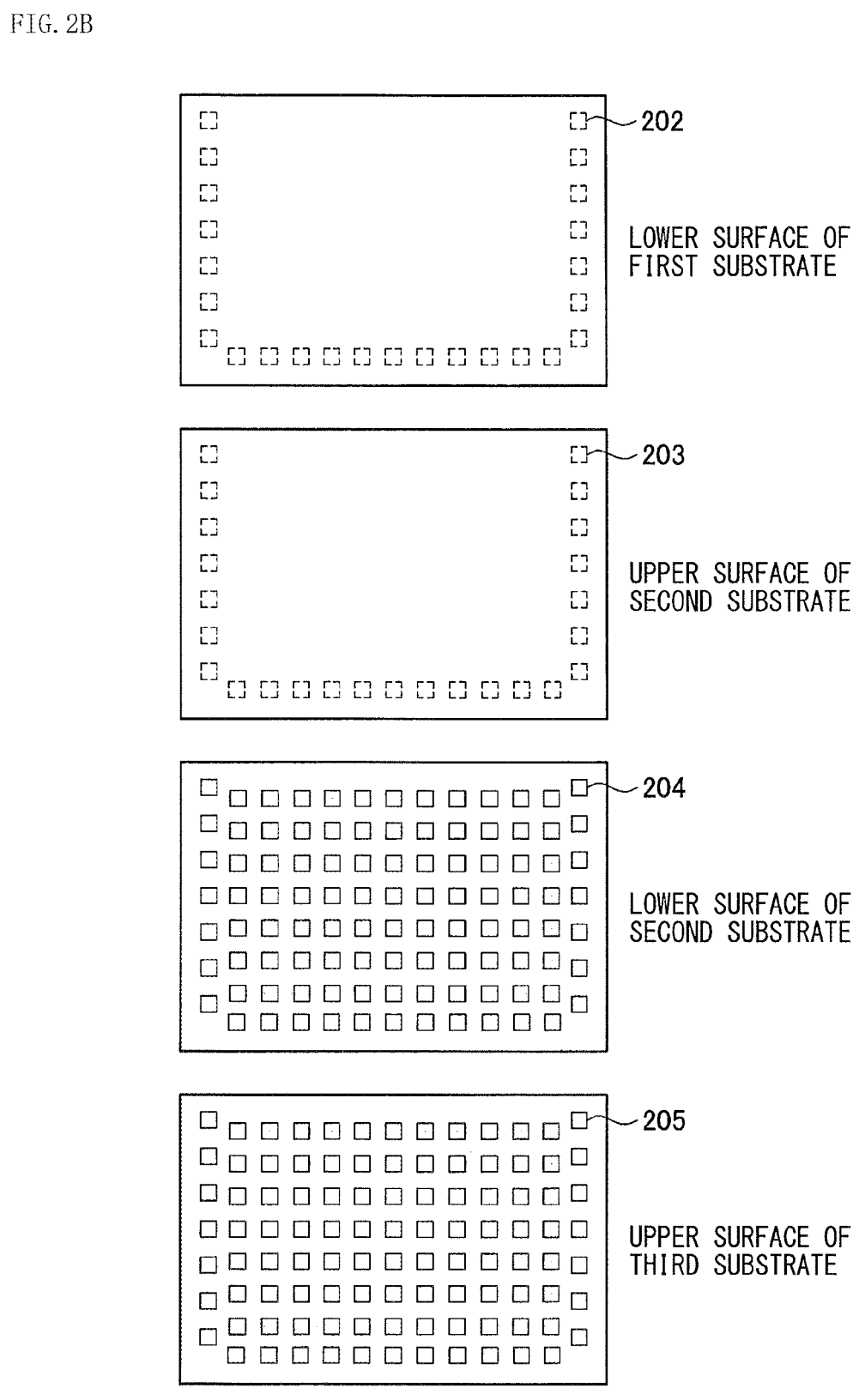

Each of FIGS. 2A and 2B is a diagram for describing an example of the disposition of the coupling structures of the solid-state imaging device 1 in the horizontal plane. FIGS. 2A and 2B each illustrate the disposition of the coupling structures in the solid-state imaging device 1 in a case where a pixel signal processing circuit that performs processing such as AD conversion on a pixel signal is mounted on the first substrate 110A, for example.

FIG. 2A schematically illustrates the first substrate 110A, the second substrate 110B, and the third substrate 110C included in the solid-state imaging device 1. Electrical coupling between the lower surface (surface opposed to the second substrate 110B) of the first substrate 110A and the upper surface (surface opposed to the first substrate 110A) of the second substrate 110B through coupling structures is indicated by a broken line in a simulated manner, and electrical coupling between the lower surface (surface opposed to the third substrate 110C) of the second substrate 110B and the upper surface (surface opposed to the second substrate 110B) of the third substrate 110C through coupling structures is indicated by a solid line in a simulated manner.

On the upper surface of the first substrate 110A, positions of a pixel unit 206 and coupling structures 201 are illustrated. Each of the coupling structure 201 functions as an I/O unit for exchanging various signals such as a power supply signal and a GND signal with the outside. Specifically, each of the coupling structures 201 may be the pad 151 provided on the upper surface of the first substrate 110A. Alternatively, as illustrated in FIG. 1, in a case where the pad 151 is embedded in the multi-layered wiring layer 105 of the first substrate 110A, the multi-layered wiring layer 125 of the second substrate 110B, or the multi-layered wiring layer 135 of the third substrate 110C, the coupling structure 201 may be the pad opening 153 provided to expose the pad 151. Alternatively, the coupling structure 201 may be a lead line opening 155 to be described later. As illustrated in FIG. 2A, the first substrate 110A is provided with the pixel unit 206 in the middle of the chip, and the coupling structures 201 included in the I/O unit are disposed around the pixel unit 206 (i.e., along the outer periphery of the chip). In addition, although not illustrated, pixel signal processing circuits may also be disposed around the pixel unit 206.

FIG. 2B schematically illustrates positions of coupling structures 202 on the lower surface of the first substrate 110A, positions of coupling structures 203 on the upper surface of the second substrate 110B, positions of coupling structures 204 on the lower surface of the second substrate 110B, and positions of coupling structures 205 on the upper surface of the third substrate 110C. Each of the coupling structures 202 to 205 may be the TSV 157 to be described later or the electrode junction structure 159 described above provided between the substrates. Alternatively, as illustrated in FIG. 1, in a case where the pad 151 is embedded in the multi-layered wiring layer 125 of the second substrate 110B or the multi-layered wiring layer 135 of the third substrate 110C, it may be the pad opening 153, out of the coupling structures 202 to 205, that is positioned directly below the coupling structure 201. The pad opening 153 is provided to expose the pad 151. Alternatively, the coupling structures 202 to 205 may be the lead line openings 155 to be described later. Note that FIG. 2B illustrates the coupling structures 202 to 205 in accordance with the form of straight lines indicating electric coupling illustrated in FIG. 2A. That is, the coupling structure 202 on the lower surface of the first substrate 110A and the coupling structure 203 on the upper surface of the second substrate 110B are indicated by broken lines, and the coupling structure 204 on the lower surface of the second substrate 110B and the coupling structure 205 on the upper surface of the third substrate 110C are indicated by solid lines.

As described above, in the illustrated configuration example, pixel signal processing circuits are mounted around the pixel unit 206 of the first substrate 110A. Therefore, pixel signals acquired by the pixel unit 206 are subjected to processing such as AD conversion by the pixel signal processing circuits on the first substrate 110A, and then transmitted to a circuit included in the second substrate 110B. In addition, as described above, the coupling structures 201 included in the I/O unit are also disposed around the pixel unit 206 of the first substrate 110A of the first substrate 110A. Therefore, as illustrated in FIG. 2B, the coupling structures 202 on the lower surface of the first substrate 110A are disposed along the outer periphery of the chip in association with the regions where the pixel signal processing circuits and the I/O units exist in order to electrically couple the pixel signal processing circuits and the I/O units to a circuit included in the second substrate 110B. In addition, the coupling structures 203 on the upper surface of the second substrate 110B are also disposed accordingly along the outer periphery of the chip.

Meanwhile, a logic circuit or a memory circuit mounted on the second substrate 110B and the third substrate 110C may be formed on the entire surface of the chip. The coupling structures 204 on the lower surface of the second substrate 110B and the coupling structures 205 on the upper surface of the third substrate 110C are thus disposed over the entire surface of the chips in association with the position at which the logic circuit or the memory circuit is mounted, as illustrated in FIG. 2B.

Figure 2C:
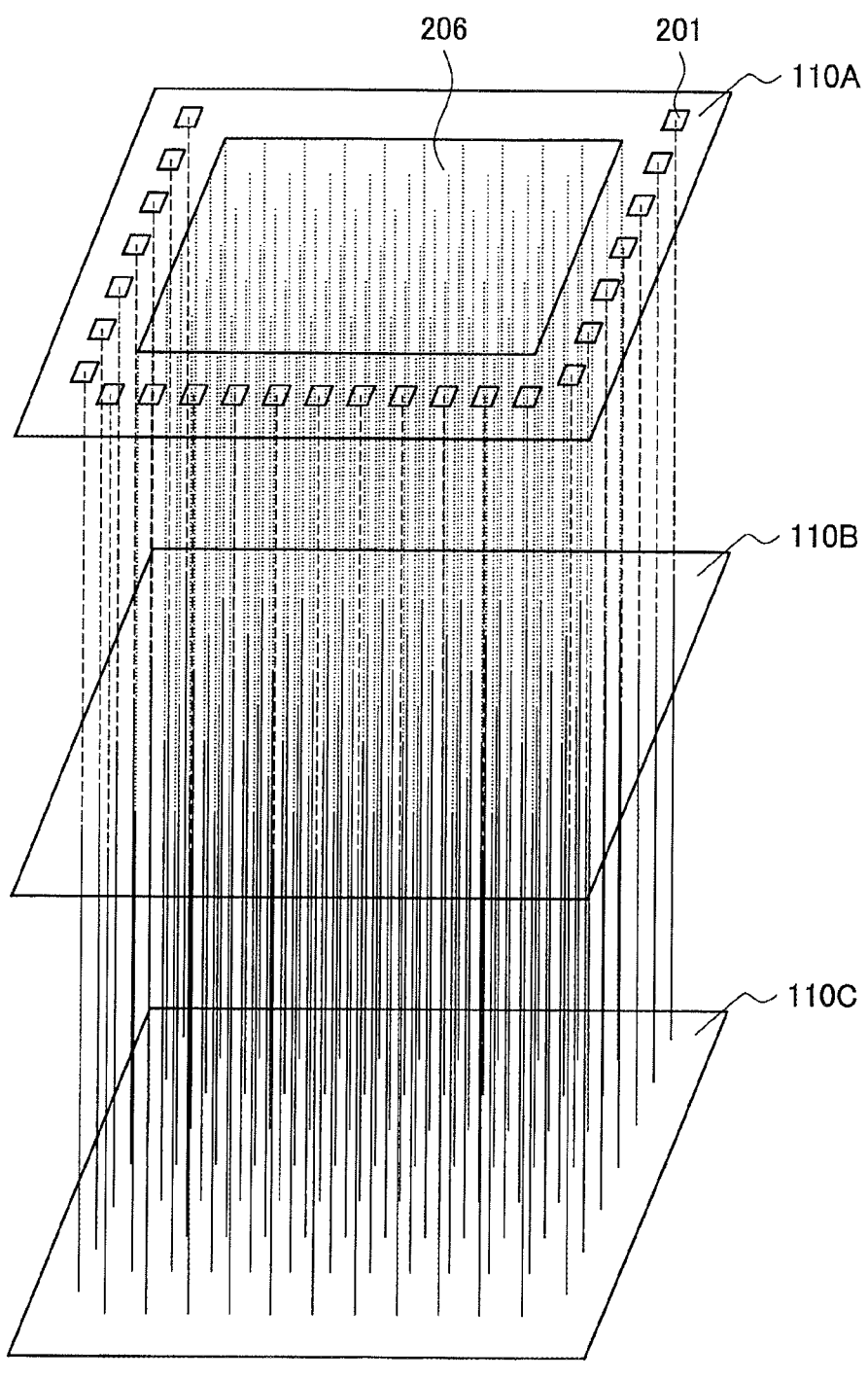
FIG. 2C is a diagram for describing another example of disposition of the coupling structures of the solid-state imaging device in the horizontal plane.
Figure 2D:
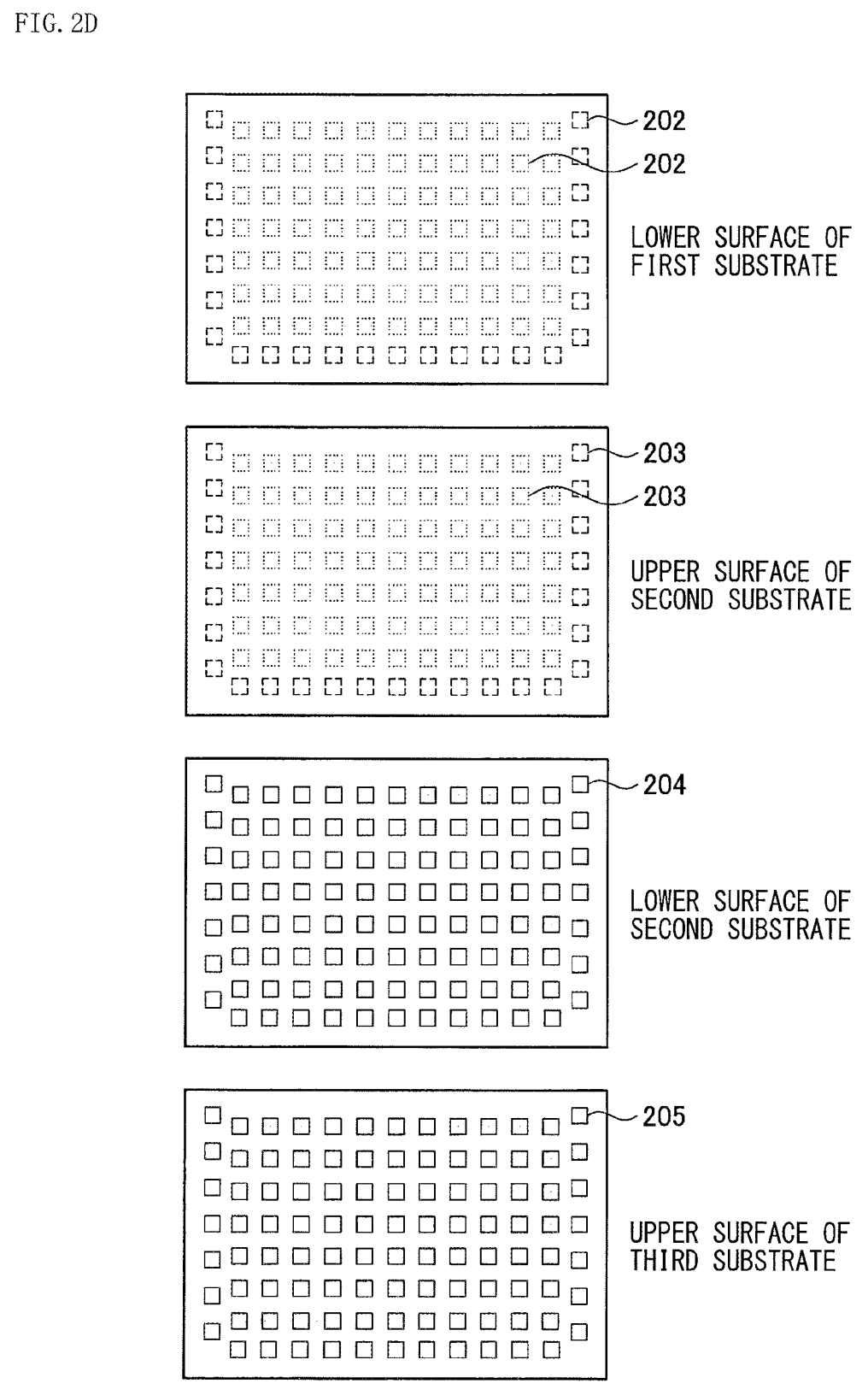

Each of FIGS. 2C and 2D is a diagram for describing another example of the disposition of the coupling structures of the solid-state imaging device 1 in the horizontal plane. FIGS. 2C and 2D each illustrate the disposition of coupling structures in a case where, for example, the solid-state imaging device 1 is configured to be able to execute pixel ADC. In this case, a pixel signal processing circuit is mounted on not the first substrate 110A, but the second substrate 110B.

Similarly to FIG. 2A, FIG. 2C schematically illustrates the first substrate 110A, the second substrate 110B, and the third substrate 110C included in the solid-state imaging device 1. Electrical coupling between the lower surface (surface opposed to the second substrate 110B) of the first substrate 110A and the upper surface (surface opposed to the first substrate 110A) of the second substrate 110B through coupling structures is indicated by a broken line or a dotted line in a simulated manner, and electrical coupling between the lower surface (surface opposed to the third substrate 110C) of the second substrate 110B and the upper surface (surface opposed to the second substrate 110B) of the third substrate 110C through coupling structures is indicated by a solid line in a simulated manner. Among the lines indicating electrical coupling between the lower surface of the first substrate 110A and the upper surface of the second substrate 110B, a broken line indicates electrical coupling related to an I/O unit, for example, which also exists in FIG. 2A, and a dotted line indicates electrical coupling related to pixel ADC, which does not exist in FIG. 2A.

Similarly to FIG. 2B, FIG. 2D schematically illustrates the positions of coupling structures 202 on the lower surface of the first substrate 110A, the positions of coupling structures 203 on the upper surface of the second substrate 110B, the positions of coupling structures 204 on the lower surface of the second substrate 110B, and the positions of coupling structures 205 on the upper surface of the third substrate 110C. Note that FIG. 2D illustrates the coupling structures 202 to 205 in accordance with the forms of straight lines indicating electrical coupling illustrated in FIG. 2C. That is, among the coupling structures 202 on the lower surface of the first substrate 110A and the coupling structures 203 on the upper surface of the second substrate 110B, those that correspond to, for example, electrical coupling related to I/O units, which also exists in FIG. 2A, are indicated by broken lines, and those that may correspond to electrical coupling related to pixel ADC are indicated by dotted lines. In contrast, the coupling structures 204 on the lower surface of the second substrate 110B and the coupling structures 205 on the upper surface of the third substrate 110C are indicated by solid lines.

As described above, in the illustrated configuration example, a pixel signal processing circuit is mounted on the second substrate 110B, and the pixel signal processing circuit is configured to be able to perform pixel ADC. That is, a pixel signal acquired by each pixel of the pixel unit 206 is transmitted to the pixel signal processing circuit mounted on the second substrate 110B directly below for each pixel, and the pixel signal processing circuit performs processing such as AD conversion. As illustrated in FIGS. 2C and 2D, in the configuration example, the coupling structures 202 on the lower surface of the first substrate 110A are thus disposed along the outer periphery of the chip (coupling structures 202 indicated by the broken lines in the diagram) in association with the regions where the I/O units exist in order to transmit signals from the I/O units to a circuit included in the second substrate 110B, and are disposed over the entire region where the pixel unit 206 exists (coupling structures 202 indicated by the dotted lines in the diagram) in order to transmit a pixel signal from each pixel of the pixel unit 206 to the circuit included in the second substrate 110B.

The respective signal lines included in the second substrate 110B and the third substrate 110C are electrically coupled to each other, and the respective power supply lines included in the second substrate 110B and the third substrate 110C are electrically coupled to each other similarly to the configuration example illustrated in FIGS. 2A and 2B. As illustrated in FIGS. 2C and 2D, the coupling structures 204 on the lower surface of the second substrate 110B and the coupling structures 205 on the upper surface of the third substrate 110C are thus disposed over the entire surfaces of the chips.

Figure 2E:
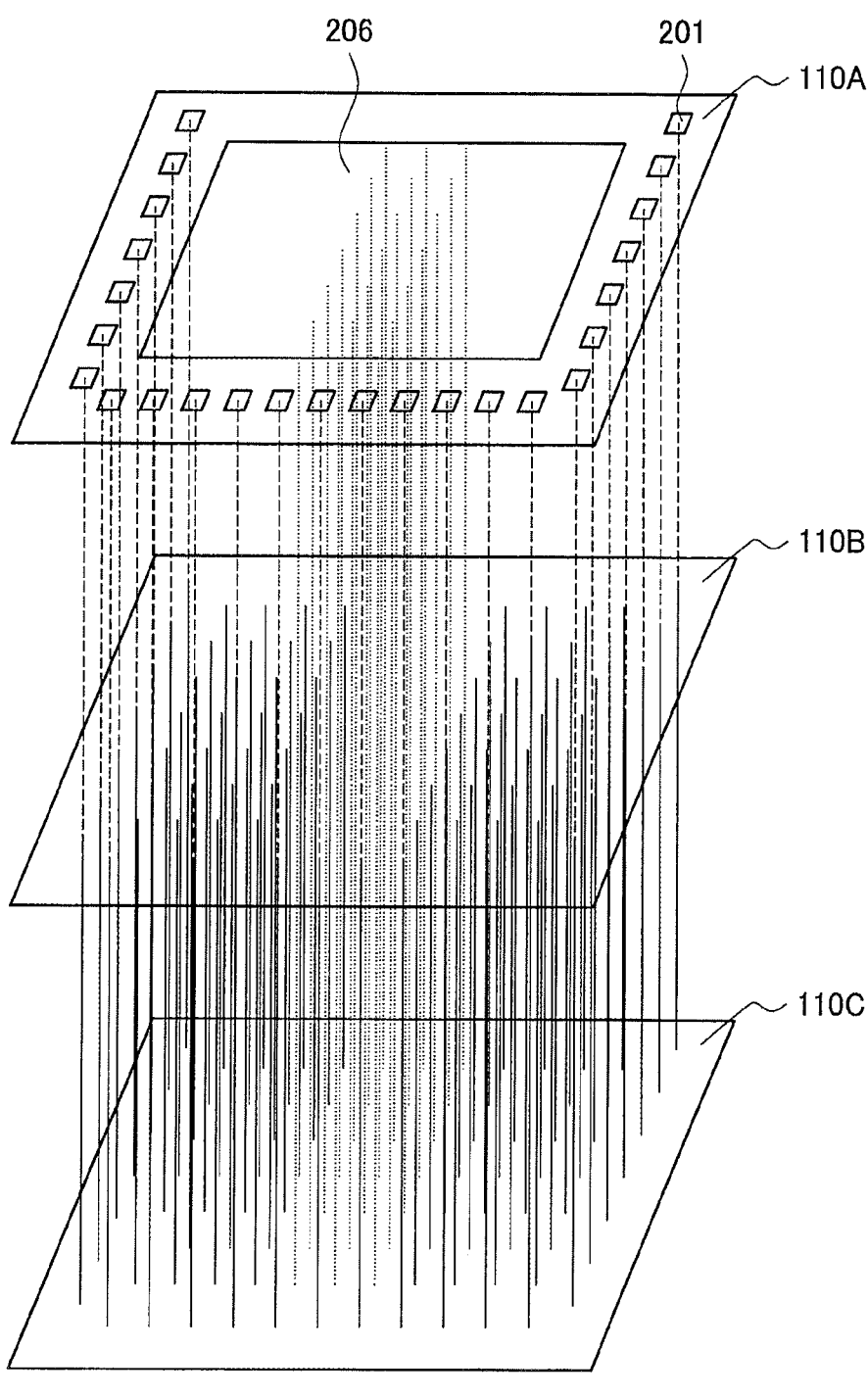
FIG. 2E is a diagram for describing still another example of disposition of the coupling structures of the solid-state imaging device in the horizontal plane.
Figure 2F:
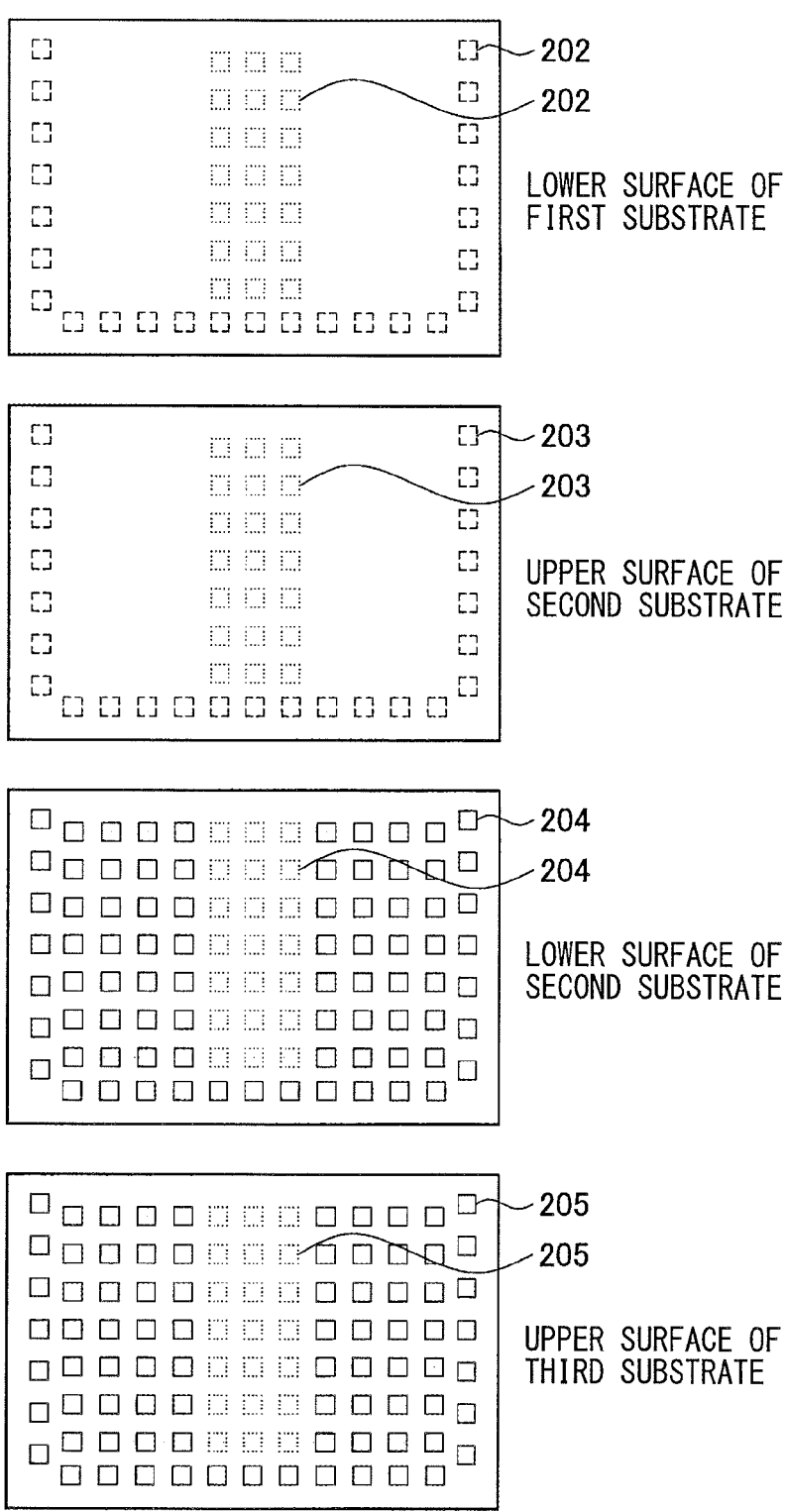
FIG. 2F is a diagram for describing still another example of disposition of the coupling structures of the solid-state imaging device in the horizontal plane.

Each of FIGS. 2E and 2F is a diagram for describing still another example of the disposition of the coupling structures of the solid-state imaging device 1 in the horizontal plane. FIGS. 2E and 2F each illustrate the disposition of coupling structures in a case where, for example, a memory circuit is mounted on the second substrate 110B.

Similarly to FIG. 2A, FIG. 2E schematically illustrates the first substrate 110A, the second substrate 110B, and the third substrate 110C included in the solid-state imaging device 1. Electrical coupling between the lower surface (surface opposed to the second substrate 110B) of the first substrate 110A and the upper surface (surface opposed to the first substrate 110A) of the second substrate 110B through coupling structures is indicated by a broken line or a dotted line in a simulated manner, and electrical coupling between the lower surface (surface opposed to the third substrate 110C) of the second substrate 110B and the upper surface (surface opposed to the second substrate 110B) of the third substrate 110C through coupling structures is indicated by a solid line or a dotted line in a simulated manner. Among the lines indicating electrical coupling between the lower surface of the first substrate 110A and the upper surface of the second substrate 110B, a broken line indicates electrical coupling related to an I/O unit, for example, which also exists in FIG. 2A, and a dotted line indicates electrical coupling related to a memory circuit, which does not exist in FIG. 2A. In addition, among the lines indicating electrical coupling between the lower surface of the second substrate 110B and the upper surface of the third substrate 110C, the solid lines indicate electrical coupling, which also exists in FIG. 2A, related to signals that are not directly related to an operation of a memory circuit, for example, and the dotted lines indicate electrical coupling, which does not exist in FIG. 2A, related to a memory circuit.

Similarly to FIG. 2B, FIG. 2F schematically illustrates the positions of coupling structures 202 on the lower surface of the first substrate 110A, the positions of coupling structures 203 on the upper surface of the second substrate 110B, the positions of coupling structures 204 on the lower surface of the second substrate 110B, and the positions of coupling structures 205 on the upper surface of the third substrate 110C. Note that FIG. 2F illustrates the coupling structures 202 to 205 in accordance with the forms of straight lines indicating electrical coupling illustrated in FIG. 2E. That is, among the coupling structures 202 on the lower surface of the first substrate 110A and the coupling structures 203 on the upper surface of the second substrate 110B, those that correspond to, for example, electrical coupling related to I/O units, which also exists in FIG. 2A, are indicated by broken lines, and those that may correspond to electrical coupling related to a memory circuit are indicated by dotted lines. In addition, among the coupling structures 204 on the lower surface of the second substrate 110B and the coupling structures 205 on the upper surface of the third substrate 110C, those that correspond to electrical coupling, which also exists in FIG. 2A, related to signals that are not directly related to an operation of a memory circuit, for example, are indicated by solid lines, and those that may correspond to electrical coupling related to a memory circuit are indicated by dotted lines.

As described above, in the illustrated configuration example, a memory circuit is mounted on the second substrate 110B. In this case, a pixel signal processing circuit is mounted on the first substrate 110A, and a pixel signal acquired by the pixel unit 206 and subjected to AD conversion by the pixel signal processing circuit of the first substrate 110A may be transmitted to the memory circuit of the second substrate 110B and held in the memory circuit. To read out the pixel signal held in the memory circuit of the second substrate 110B, for example, to the outside, signals are then transmitted between the memory circuit of the second substrate 110B and a logic circuit of the third substrate 110C.

Therefore, in the configuration example, as the coupling structures 202 on the lower surface of the first substrate 110A, the coupling structures 202 are disposed along the outer periphery of the chip (coupling structures 202 indicated by the broken lines in the diagram) in association with the regions where I/O units and pixel signal processing circuits are mounted in order to transmit signals from the I/O units and the pixel signal processing circuits to the second substrate 110B, and the coupling structures 202 are disposed (coupling structures 202 indicated by the dotted lines in the diagram) for transmitting the pixel signals subjected to AD conversion to a memory circuit of the second substrate 110B. At this time, in order to equalize the delay times, it is desirable that wiring lengths of transmission paths of the pixel signals from a circuit of the first substrate 110A to the memory circuit of the second substrate 110B and wiring lengths of transmission paths of the signals between the memory circuit of the second substrate 110B and a logic circuit of the third substrate 110C be each equal as much as possible. Thus, for example, as illustrated in FIG. 2F, the coupling structures 202 to 205 for exchanging signals between the circuit of the first substrate 110A and the memory circuit of the second substrate 110B and between the memory circuit of the second substrate 110B and a circuit of the third substrate 110C may be provided to concentrate in the vicinity of the middle of the horizontal plane. However, as long as it is possible to make the wiring lengths substantially uniform, the coupling structures 202 to 205 do not necessarily have to be provided in the vicinity of the middle of the horizontal plane as in the illustrated example.

Several examples of the disposition of coupling structures of the solid-state imaging device 1 in the horizontal plane have been described above. Note that the present embodiment is not limited to the examples described above. Components mounted on the respective substrates of the solid-state imaging device 1 may be determined as appropriate, and the disposition of coupling structures of the solid-state imaging device 1 in the horizontal plane may also be determined as appropriate in accordance with the components. As components mounted on each substrate and the corresponding disposition of coupling structures in the horizontal plane, various known components and disposition may be applied. In addition, in the examples illustrated in FIGS. 2A to 2F, the coupling structures 201 included in I/O units are disposed along three sides of the outer periphery of the chip, but the present embodiment is not limited to the examples. Various known disposition may also be applied as the disposition of I/O units. For example, the coupling structures 201 included in I/O units may be disposed along one side, two sides, or four sides of the outer periphery of the chip.

3. Direction of Second Substrate

In the configuration example illustrated in FIG. 1, in the solid-state imaging device 1, the first substrate 110A and the second substrate 110B are bonded together F-to-F (that is, the front surface side of the second substrate 110B is directed toward the first substrate 110A). Meanwhile, the solid-state imaging device 1 may include the first substrate 110A and the second substrate 110B that are bonded together F-to-B (that is, the front surface side of the second substrate 110B may be directed toward the third substrate 110C).

The direction of the second substrate 110B may be determined as appropriate to improve the performance of the entire solid-state imaging device 1 by considering, for example, the configuration, performance, and the like of each of the substrates (each of the chips). Here, two concepts for determining the direction of the second substrate 110B are described as an example.

3-1. Consideration Based on PWELL Area

Figure 3A:
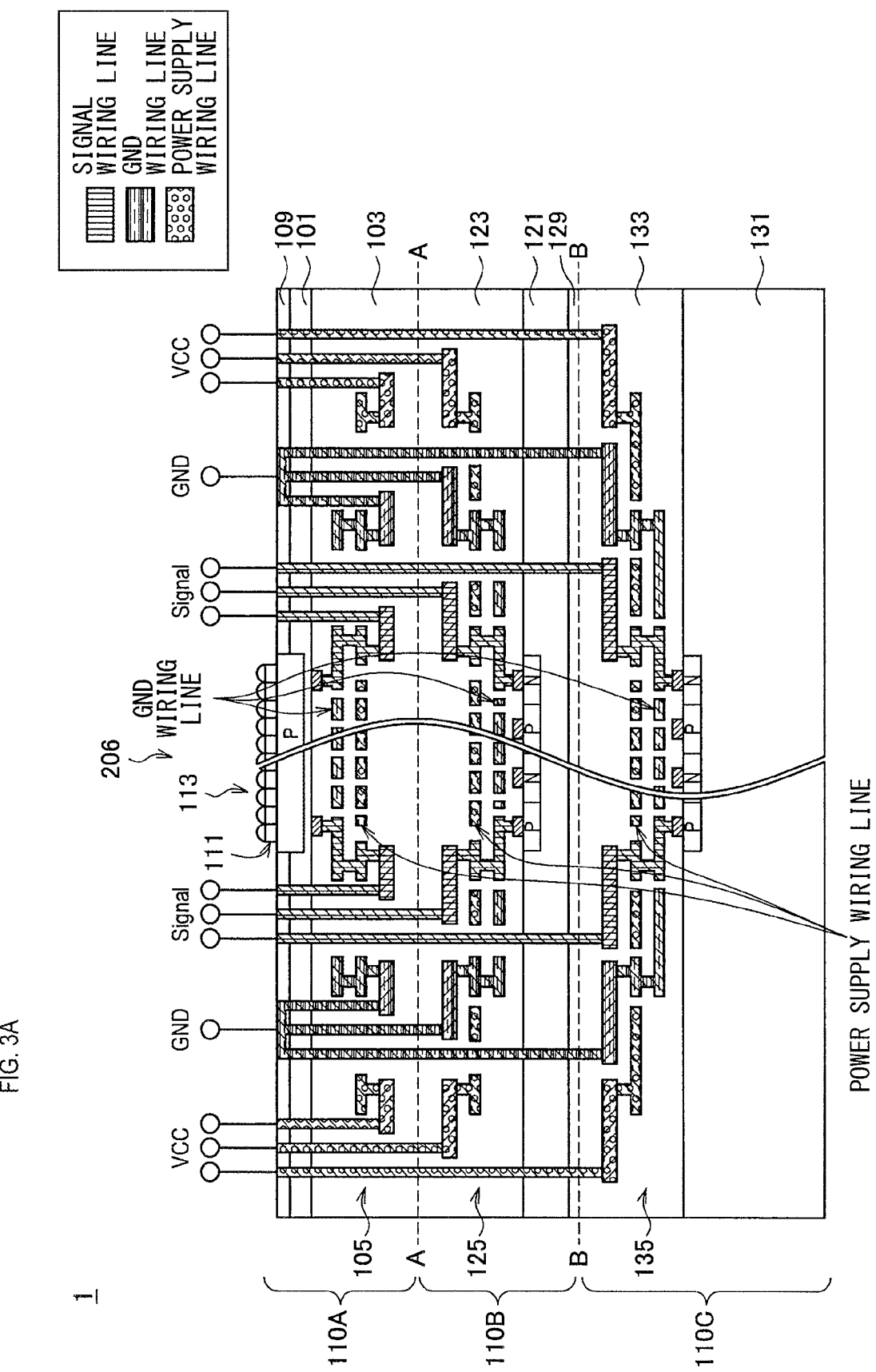
FIG. 3A is a vertical cross-sectional view of a schematic configuration of the solid-state imaging device in which a first substrate and a second substrate are bonded together F-to-F.
Figure 3B:
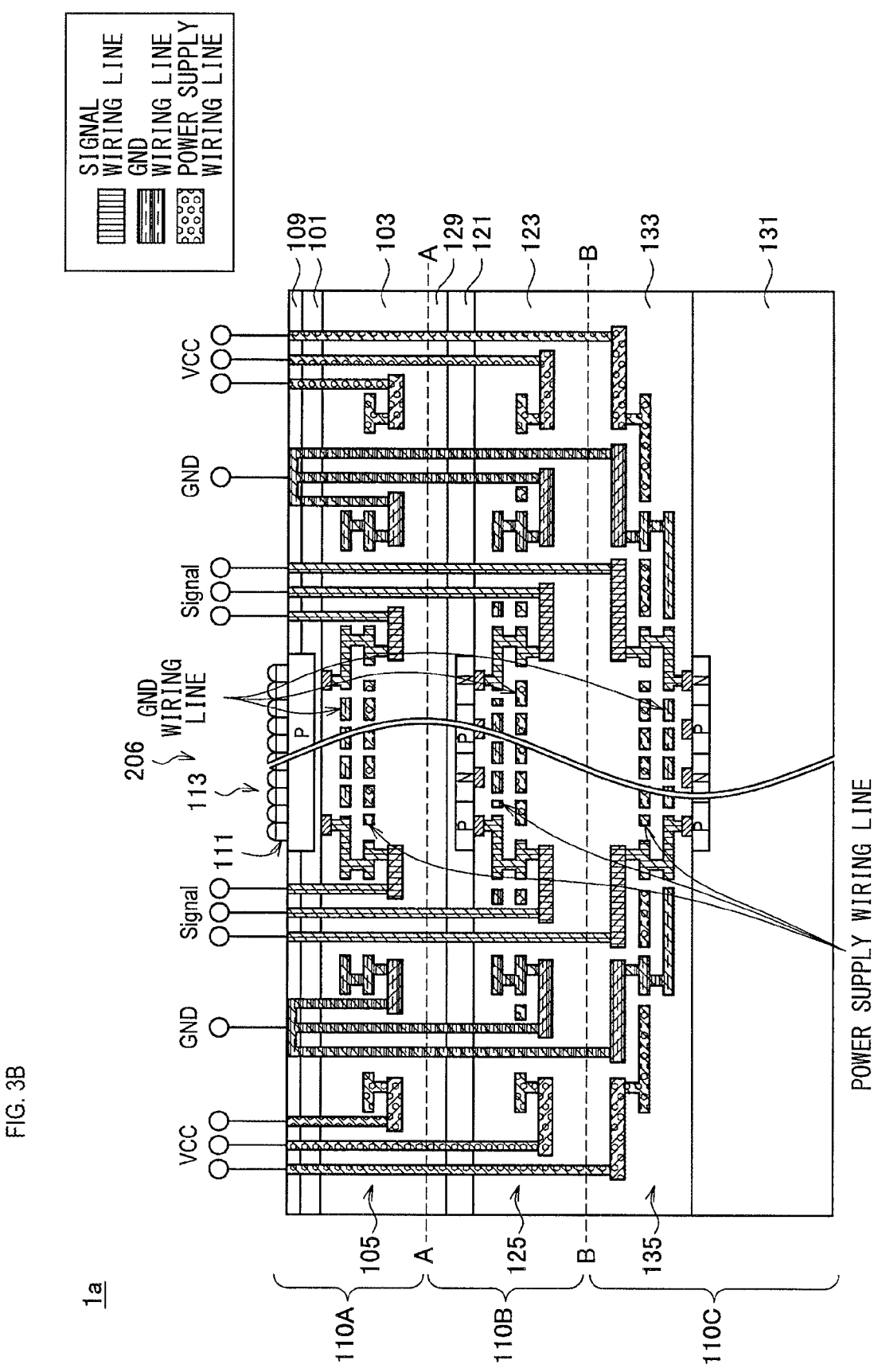
FIG. 3B is a vertical cross-sectional view of a schematic configuration of the solid-state imaging device in which the first substrate and the second substrate are bonded together F-to-B.

FIG. 3A is a vertical cross-sectional view of a schematic configuration of the solid-state imaging device 1 in which the first substrate 110A and the second substrate 110B are bonded together F-to-F, similarly to the configuration example illustrated in FIG. 1. FIG. 3B is a vertical cross-sectional view of a schematic configuration of a solid-state imaging device 1a in which the first substrate 110A and the second substrate 110B are bonded together F-to-B, unlike the configuration example illustrated in FIG. 1. The configuration of the solid-state imaging device 1a is similar to that of the solid-state imaging device 1 illustrated in FIG. 1 except that the direction of the second substrate 110B is reversed.

In FIG. 3A and FIG. 3B, functions of the wiring lines (the signal line, the GND wiring lines, or the power supply wiring lines) included in the multi-layered wiring layers 105, 125, and 135 are represented by superimposing different kinds of hatching on these wiring lines (that is, hatching of the wiring lines illustrated in FIGS. 3A and 3B is expressed by superimposing hatching representing the functions of the wiring lines illustrated in legends in FIGS. 3A and 3B on hatching of the respective wiring lines illustrated in FIG. 1 (the same applies to FIG. 4A and FIG. 4B to be described later)). As illustrated, in the solid-state imaging devices 1 and 1a, terminals (corresponding to the pads 151 described above) for drawing out signal lines, the GND wiring lines, and the power supply wiring lines to the outside are provided along the outer periphery of the chip. These respective terminals are provided in pairs at positions sandwiching the pixel unit 206 in the horizontal plane. Therefore, inside the solid-state imaging devices 1 and 1a, the signal lines, the GND wiring lines, and the power supply wiring lines extend to couple these terminals to each other, and spread in the horizontal plane.

In FIGS. 3A and 3B, "P" is attached to PWELLs, and "N" is attached to NWELLs provided to the first substrate 110A, the second substrate 110B, and the third substrate 110C. For example, in the illustrated configuration, the PDs included in the respective pixels of the pixel unit are PDs in which N-type diffused regions are formed in the PWELLs in order to read out an electron generated resulting from photoelectric conversion, and a transistor of a drive circuit included in each pixel in order to read out an electron generated in the PD is an N-type MOS transistor. Therefore, WELLs of the pixel unit are PWELLs. In contrast, a logic circuit and a memory circuit provided to the second substrate 110B and the third substrate 110C include CMOS circuits, and PMOSs and NMOSs are thus mixed. Accordingly, PWELLs and NWELLs exist that are substantially the same in area, for example. Therefore, in the illustrated configuration example, the first substrate 110A has a larger PWELL area than the second substrate 110B and the third substrate 110C.

Here, in the solid-state imaging devices 1 and 1a, a GND potential may be imparted to a PWELL. Thus, any configuration in which a PWELL and a power supply wiring line are opposed to each other with an insulator interposed therebetween causes parasitic capacitance to be formed therebetween.

Figure 4A:
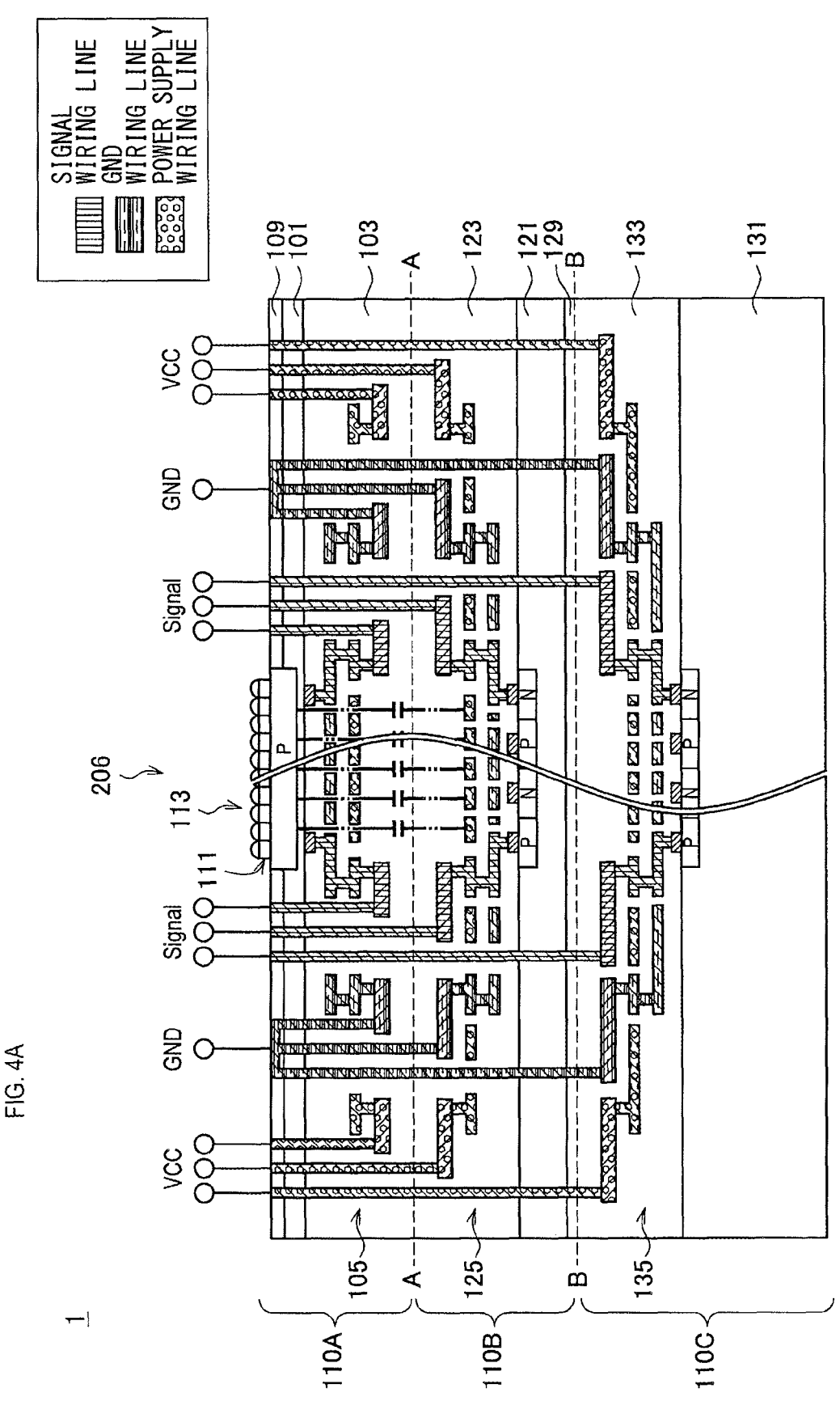
FIG. 4A is a diagram for describing parasitic capacitance between a PWELL and a power supply wiring line in the solid-state imaging device illustrated in FIG. 3A.

The parasitic capacitance formed between a PWELL and a power supply wiring line is described with reference to FIGS. 4A and 4B. FIG. 4A is a diagram for describing the parasitic capacitance between the PWELL and the power supply wiring line in the solid-state imaging device 1 illustrated in FIG. 3A. In FIG. 4A, the parasitic capacitance between the PWELL and the power supply wiring line is represented by a two-dot chain line in a simulated manner with respect to the solid-state imaging device 1 illustrated in FIG. 3A. As illustrated in FIG. 4A, in the solid-state imaging device 1, the first substrate 110A and the second substrate 110B are bonded together F-to-F. The PWELLs of the pixel unit of the first substrate 110A and the power supply wiring lines in the multi-layered wiring layer 125 of the second substrate 110B are therefore opposed to each other with insulators interposed therebetween, as illustrated in the diagram. The insulators are included in the insulating films 103 and 123. This may cause parasitic capacitance to be formed therebetween in a corresponding region.

Figure 4B:
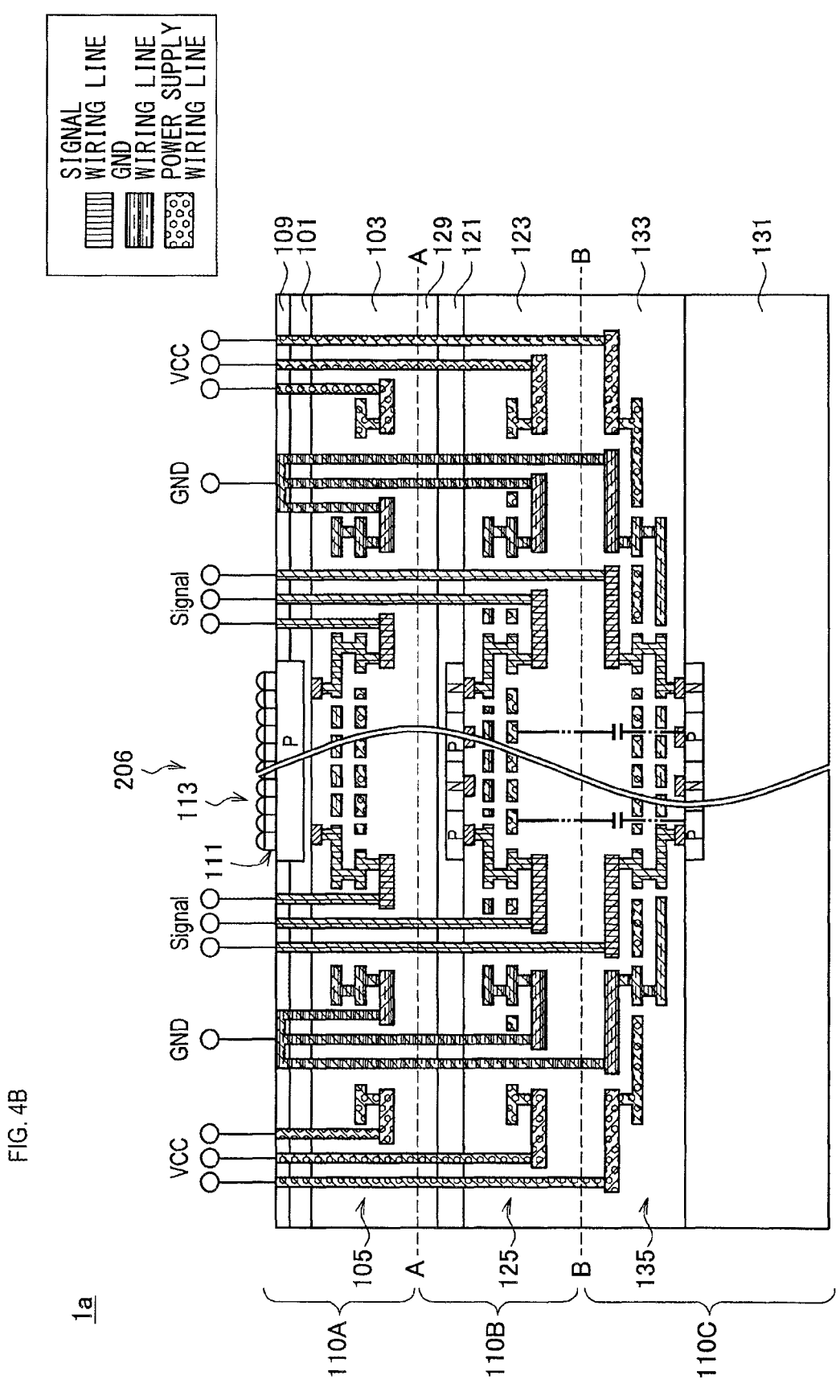
FIG. 4B is a diagram for describing parasitic capacitance between a PWELL and a power supply wiring line in the solid-state imaging device illustrated in FIG. 3B.

Meanwhile, FIG. 4B is a diagram for describing the parasitic capacitance between a PWELL and a power supply wiring line in the solid-state imaging device 1a illustrated in FIG. 3B. In FIG. 4B, the parasitic capacitance between the PWELL and the power supply wiring line is represented by a two-dot chain line in a simulated manner with respect to the solid-state imaging device 1a illustrated in FIG. 3B. As illustrated in FIG. 4B, in the solid-state imaging device 1a, the second substrate 110B and the third substrate 110C are bonded together F-to-F. The PWELLs of the logic circuit or memory circuit of the third substrate 110C and the power supply wiring lines in the multi-layered wiring layer 125 of the second substrate 110B are therefore opposed to each other with insulators interposed therebetween. The insulators are included in the insulating films 123 and 133. This may cause parasitic capacitance to be formed therebetween in a corresponding region.

The parasitic capacitance described above is considered to increase as the PWELL area increases. This causes larger parasitic capacitance in the configuration illustrated in FIG. 4A in which the first substrate 110A and the second substrate 110B are bonded together F-to-F than in the configuration illustrated in FIG. 4B in which the first substrate 110A and the second substrate 110B are bonded together F-to-B among the configuration examples illustrated in FIGS. 4A and 4B.

If the parasitic capacitance related to the power supply wiring lines in the second substrate 110B is large, the impedance of the current paths between the power supply and the GND in the second substrate 110B is decreased. It is thus possible to further stabilize the power supply system in the second substrate 110B. Specifically, for example, even in a case where the power consumption fluctuates in accordance with fluctuations in the operation of the circuits on the second substrate 110B, fluctuations in the power supply levels caused by the fluctuations in the power consumption may be suppressed. Even in a case where the circuits related to the second substrate 110B are operated at high speed, it is thus possible to further stabilize the operation, and improve the performance of the entire solid-state imaging device 1.

In this way, when PWELL area is brought into focus, in the configuration examples illustrated in FIGS. 3A to 4B, the solid-state imaging device 1 in which the first substrate 110A and the second substrate 110B are bonded together F-to-F forms larger parasitic capacitance with respect to the power supply wiring lines of the second substrate 110B than the solid-state imaging device 1a in which the first substrate 110A and the second substrate 110B are bonded together F-to-B does, making it possible to achieve higher stability at the time of high-speed operation. That is, it is possible to say that the solid-state imaging device 1 has a more preferable configuration.

Some designs of the respective substrates may, however, cause the third substrate 110C to have a larger PWELL area than that of the first substrate 110A. In this case, the configuration of the solid-state imaging device 1*a* in which larger parasitic capacitance is formed between the power supply wiring lines of the second substrate 110B and the PWELLs of the third substrate 110C is considered to make it possible to obtain higher stability at the time of high-speed operation than the solid-state imaging device 1 does.

In summary, when considering the direction of the second substrate 110B on the basis of the PWELL area, it is preferable that the solid-state imaging device 1 be configured in a manner that the front surface side of the second substrate 110B is directed toward the first substrate 110A in a case where the PWELL area of the first substrate 110A is larger than the PWELL area of the third substrate 110C. That is, it is preferable that the solid-state imaging device 1 be configured in a manner that the first substrate 110A and the second substrate 110B are bonded together F-to-F. Conversely, it is preferable that the solid-state imaging device 1*a* be configured in a manner that the front surface side of the second substrate 110B is directed toward the third substrate 110C in a case where the PWELL area of the third substrate 110C is larger than the PWELL area of the first substrate 110A. That is, it is preferable that the solid-state imaging device 1*a* be configured in a manner that the first substrate 110A and the second substrate 110B are bonded together F-to-B.

In the present embodiment, the direction of the second substrate 110B may be determined from such a viewpoint based on PWELL area. The solid-state imaging devices 1 to 11*f* according to the present embodiment illustrated in FIG. 1 and FIGS. 10A to 19F described below are each configured, for example, to have the PWELL area of the first substrate 110A larger than the PWELL area of the third substrate 110C, and have the first substrate 110A and the second substrate 110B accordingly bonded together F-to-F. The solid-state imaging devices 1 to 11*f* thus make it possible to obtain high operation stability even at the time of high-speed operation.

Note that examples of a case where the PWELL area of the first substrate 110A is larger than the PWELL area of the third substrate 110C include a case where only a pixel unit including, in a PWELL, a PD for reading out an electron generated resulting from photoelectric conversion and an NMOS transistor for reading out an electron from the PD is mounted on the first substrate 110A, and various circuits (such as a pixel signal processing circuit, a logic circuit, and a memory circuit) are mounted on the second substrate 110B and the third substrate 110C. Meanwhile, examples of a case in which the PWELL area of the third substrate 110C is larger than the PWELL area of the first substrate 110A include a case in which a pixel unit and various circuits are mounted together on the first substrate 110A and the area of the first substrate 110A occupied by the various circuits is relatively large.

3-2. Consideration Based on Power Consumption and Disposition of GND Wiring Lines The above focuses on PWELL area for the solid-state imaging device 1 illustrated in FIG. 3A and the solid-state imaging device 1*a* illustrated in FIG. 3B, but power consumption and the disposition of GND wiring lines in each substrate are now brought into focus.

Figure 5A:
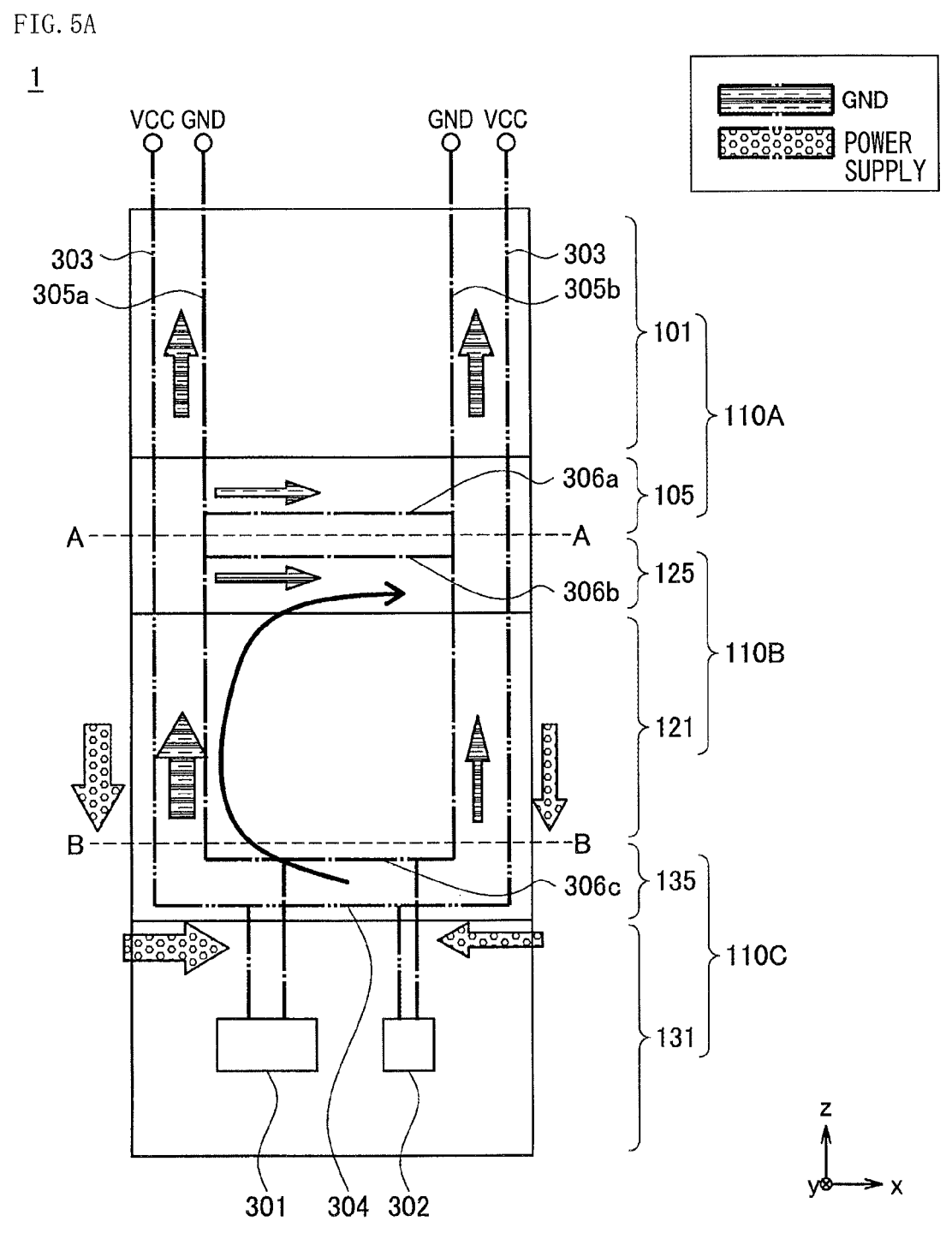
Figure 5B:
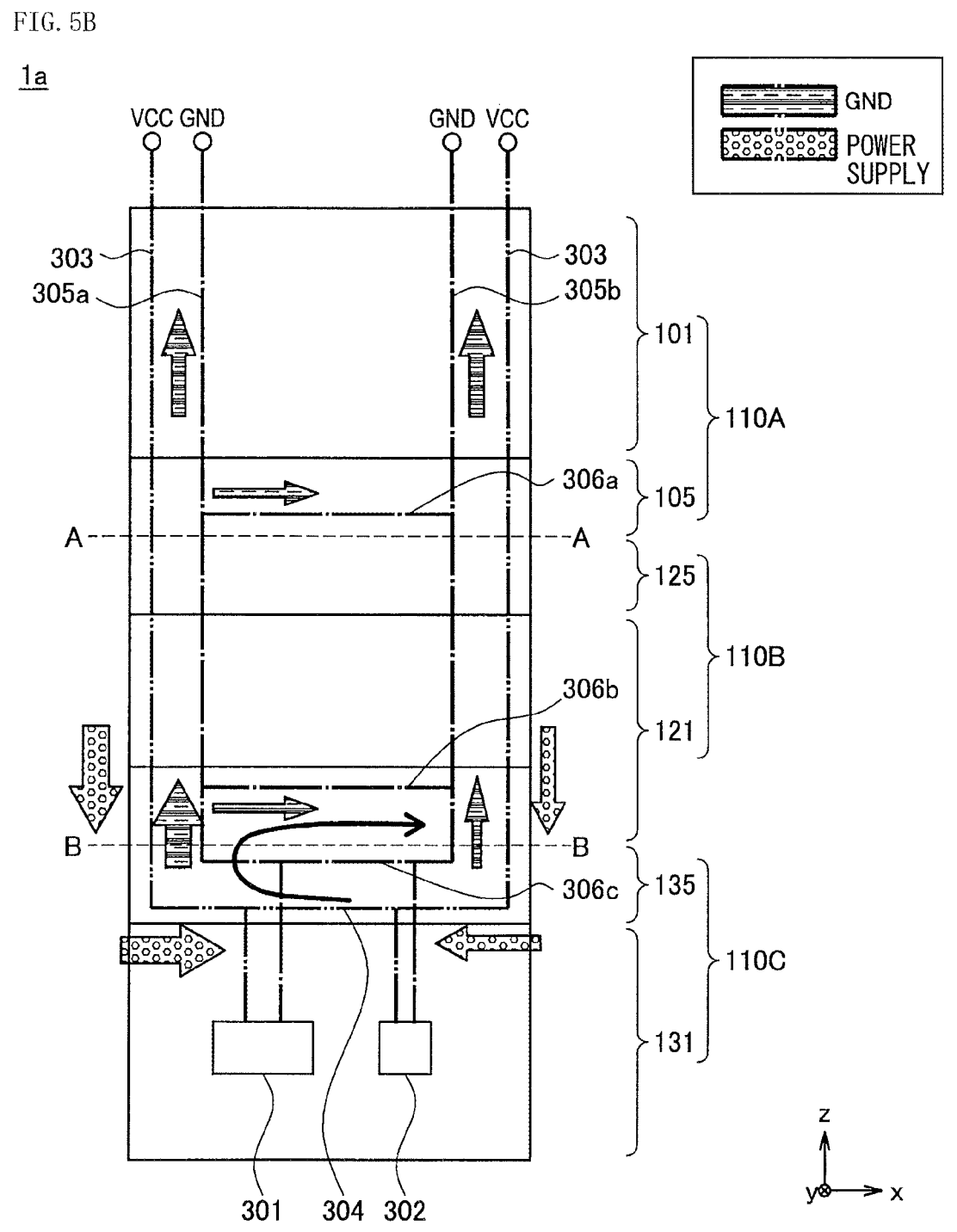

FIG. 5A is a diagram schematically illustrating the disposition of power supply wiring lines and GND wiring lines in the solid-state imaging device 1 illustrated in FIG. 3A. FIG. 5B is a diagram schematically illustrating the disposition of power supply wiring lines and GND wiring lines in the solid-state imaging device 1*a* illustrated in FIG. 3B. FIGS. 5A and 5B simply illustrate the structures of the solid-state imaging devices 1 and 1*a*, and represent the schematic disposition of power supply wiring lines and GND wiring lines by illustrating the power supply wiring lines by two-dot chain lines and illustrating the GND wiring lines by one-dot chain lines. In addition, the size of the arrows in the diagrams represents the amount of currents flowing through the power supply wiring lines and the GND wiring lines in a simulated manner.

It is possible as illustrated in FIGS. 5A and 5B to consider that the power supply wiring lines mainly include vertical power supply wiring lines 303 extending in the z-axis direction from power supply terminals (VCCs) provided to the upper surface of the first substrate 110A (i.e., upper surfaces of the solid-state imaging devices 1 and 1*a*), and horizontal power supply wiring lines 304 extending in the horizontal direction in the multi-layered wiring layer 105 of the first substrate 110A, the multi-layered wiring layer 125 of the second substrate 110B, and the multi-layered wiring layer 135 of the third substrate 110C. The following also refers collectively to the vertical power supply wiring lines 303 and the horizontal power supply wiring lines 304 as power supply wiring lines 303 and 304. Note that the horizontal power supply wiring lines 304 may also exist actually in the multi-layered wiring layer 105 of the first substrate 110A and the multi-layered wiring layer 125 of the second substrate 110B, but are not illustrated in FIGS. 5A and 5B for the sake of simplicity. FIGS. 5A and 5B each illustrate only the horizontal power supply wiring line 304 in the multi-layered wiring layer 135 of the third substrate 110C.

In addition, it is possible to consider that the GND wiring lines mainly include vertical GND wiring lines 305 extending in the z-axis direction from GND terminals provided to the upper surface of the first substrate 110A, and horizontal GND wiring lines 306 extending in the horizontal direction in the multi-layered wiring layer 105 of the first substrate 110A, the multi-layered wiring layer 125 of the second substrate 110B, and the multi-layered wiring layer 135 of the third substrate 110C. The following also refers collectively to the vertical GND wiring lines 305 and the horizontal GND wiring lines 306 as GND wiring lines 305 and 306. Note that the horizontal GND wiring line 306 of the first substrate 110A is also referred to as horizontal GND wiring line 306*a*, the horizontal GND wiring line 306 of the second substrate 110B is also referred to as horizontal GND wiring line 306*b*, and the horizontal GND wiring line 306 of the third substrate 110C is also referred to as horizontal GND wiring line 306*c* to distinguish them.

Here, a case where the power consumption of the third substrate 110C is greater than the power consumption of the first substrate 110A is examined as an example. For example, it is assumed that the third substrate 110C is a logic substrate. The logic circuit is divided into a plurality of circuit blocks, and the circuit blocks that operate may change depending on processing content. That is, during a series of operations in the solid-state imaging devices 1 and 1*a*, the locations of the logic circuit that mainly operate may change. Therefore, the locations of the logic circuit through which the power supply currents flow are biased (e.g., the power supply currents are generated due to the charging and discharging of the transistor gate capacitance and the wiring capacitance associated with the operation of the circuit), and moreover the locations may change.

As illustrated in FIGS. 5A and 5B, two circuit blocks 301 and 302 in the logic circuit of the third substrate 110C are now brought into focus. When these two circuit blocks 301 and 302 operate, the current path is formed that passes by the power supply terminal, the power supply wiring lines 303 and 304, the circuit blocks 301 and 302, the GND wiring lines 305 and 306, and the GND terminal.

Here, it is assumed that the power consumption of the circuit block 301 at certain timing is greater than that of the circuit block 302. In this case, as illustrated in FIGS. 5A and 5B, more currents are supplied at this timing from the power supply wiring lines 303 and 304 to the circuit block 301 than to the circuit block 302. This difference in power consumption causes the vertical GND wiring line 305 (that is also referred to as vertical GND wiring line 305*a* to distinguish the vertical GND wiring lines 305) near the circuit block 301 to have a larger amount of currents flowing to the vertical GND wiring line 305 through the circuit blocks 301 and 302 than that of the vertical GND wiring line 305 (that is also referred to as vertical GND wiring 305*b* to distinguish the vertical GND wiring lines 305) near the circuit block 302.

The first substrate 110A and the second substrate 110B include the horizontal GND wiring lines 306*a* and 306*b*, and the imbalance of the amount of currents between the vertical GND wiring lines 305*a* and 305*b* is thus corrected by the horizontal GND wiring lines 306*a* and 306*b* of the first substrate 110A and the second substrate 110B on the way to the GND terminals on the upper surface of the first substrate 110A. That is, currents flow to the horizontal GND wiring lines 306*a* and 306*b* of the first substrate 110A and the second substrate 110B to correct the imbalance of the amount of currents between the vertical GND wiring lines 305*a* and 305*b*. Accordingly, as illustrated by the solid-line arrows in each of FIGS. 5A and 5B, a loop-shaped current path passing by the horizontal power supply wiring line 304, the circuit blocks 301 and 302, the horizontal GND wiring line 306*c*, the vertical GND wiring line 305*a*, and the horizontal GND wiring lines 306*a* and 306*b* is formed in each of the solid-state imaging devices 1 and 1*a*.

At this time, as illustrated in FIG. 5A, in the solid-state imaging device 1 in which the first substrate 110A and the second substrate 110B are bonded together F-to-F, the horizontal GND wiring lines 306*a* and 306*b* of the first substrate 110A and the second substrate 110B are both disposed relatively far from the horizontal power supply wiring line 304 of the third substrate 110C. Therefore, in the loop-shaped current path described above, the opening width of the loop is increased. This increases the inductance of the loop-shaped current path. That is, the impedance becomes high. The stability of the power supply currents may be thus decreased, and the performance of the entire solid-state imaging device 1 may be decreased.

Meanwhile, as illustrated in FIG. 5B, in the solid-state imaging device 1*a* in which the first substrate 110A and the second substrate 110B are bonded together F-to-B, the horizontal GND wiring line 306*a* of the first substrate 110A is disposed relatively far from the horizontal power supply wiring line 304 of the third substrate 110C, but the horizontal GND wiring line 306*b* of the second substrate 110B is disposed relatively close to the horizontal power supply wiring line 304 of the third substrate 110C. Therefore, in the loop-shaped current path described above, the opening width of the loop is decreased. This decreases the inductance of the loop-shaped current path. That is, the impedance becomes low. It is thus possible to further stabilize the power supply currents, and further improve the performance of the entire solid-state imaging device 1.

In this way, when the power consumption and the disposition of GND wiring lines are brought into focus, the solid-state imaging device 1*a* in which the first substrate 110A and the second substrate 110B are bonded together F-to-B is considered to achieve a more stable operation than the solid-state imaging device 1 in which the first substrate 110A and the second substrate 110B are bonded together F-to-F does in a case where the power consumption of the third substrate 110C is greater than the power consumption of the first substrate 110A. The solid-state imaging device 1*a* allows the horizontal GND wiring line 306*b* of the second substrate 110B to be disposed closer to the horizontal power supply wiring line 304 of the third substrate 110C. That is, it is possible to say that the solid-state imaging device 1*a* has a more preferable configuration.

Some designs of the respective substrates may, however, cause the first substrate 110A to consume more power than the third substrate 110C does. In this case, a more stable operation is considered expectable from the configuration of the solid-state imaging device 1 that allows the distance to be decreased between the horizontal power supply wiring line of the first substrate 110A and the horizontal ground wiring line 306*b* of the second substrate 110B rather than the solid-state imaging device 1*a*.

In summary, when considering the direction of the second substrate 110B on the basis of the power consumption and the disposition of the GND wiring lines, it is preferable that the solid-state imaging device 1 be configured in a manner that the front surface side of the second substrate 110B is directed toward the first substrate 110A in a case where the power consumption of the first substrate 110A is greater than the power consumption of the third substrate 110C. That is, it is preferable that the solid-state imaging device 1 be configured in a manner that the first substrate 110A and the second substrate 110B are bonded together F-to-F. Conversely, it is preferable that the solid-state imaging device 1*a* be configured in a manner that the front surface side of the second substrate 110B is directed toward the third substrate 110C in a case where the power consumption of the third substrate 110C is greater than the power consumption of the first substrate 110A. That is, it is preferable that the solid-state imaging device 1*a* be configured in a manner that the first substrate 110A and the second substrate 110B are bonded together F-to-B.

In the present embodiment, the direction of the second substrate 110B may be determined from such a viewpoint based on the power consumption and the disposition of GND wiring lines. The solid-state imaging devices 1 to 11*f* according to the present embodiment illustrated in FIG. 1 and FIGS. 10A to 19F described below are each configured, for example, to have the power consumption of the first substrate 110A greater than the power consumption of the third substrate 110C, and have the first substrate 110A and the second substrate 110B accordingly bonded together F-to-F. The solid-state imaging devices 1 to 11*f* may thus achieve a more stable operation.

Note that examples of a case where the power consumption of the third substrate 110C is greater than the power consumption of the first substrate 110A include a case where only a pixel unit is mounted on the first substrate 110A and many circuits (such as a pixel signal processing circuit, a logic circuit, and a memory circuit, for example) are mounted on the second substrate 110B and the third substrate 110C. Specific examples of such a configuration include a configuration in which only a pixel unit is mounted on the first substrate 110A, a pixel signal processing circuit and a memory circuit are mounted on the second substrate 110B, and a logic circuit is mounted on the third substrate 110C. At this time, a digital circuit (such as a digital circuit that, for example, generates a reference voltage for AD conversion) in the pixel signal processing circuit may be mounted on the third substrate 110C. Alternatively, in a case where a memory circuit that is more frequently accessed (e.g., memory circuit into or from which pixel signals are written or read out a plurality of times per frame) is mounted on the third substrate 110C, the third substrate 110C is considered to consume more power.

Meanwhile, examples of a case in which the power consumption of the first substrate 110A is greater than the power consumption of the third substrate 110C include a case in which a pixel unit and various circuits are mounted together on the first substrate 110A and the area of the first substrate 110A occupied by the various circuits is relatively large. Alternatively, in a case where a memory circuit that is less frequently accessed (e.g., memory circuit into or from which pixel signals are written or read out only once per frame) is mounted on the third substrate 110C, the third substrate 110C is considered to consume less power and the first substrate 110A is considered to relatively consume more power.

Note that, when the power consumption of the first substrate 110A and the power consumption of the third substrate 110C are compared with each other, the power consumption itself may be compared, or other indices that may represent the magnitude of the power consumption may be compared. Examples of the other indices include the number of gates (e.g., 100 gates and 1 M gates) mounted on the circuits of each substrate, the operating frequencies (e.g., 100 MHz and 1 GHz) of the circuits of each substrate, and the like.

Figure 5C:
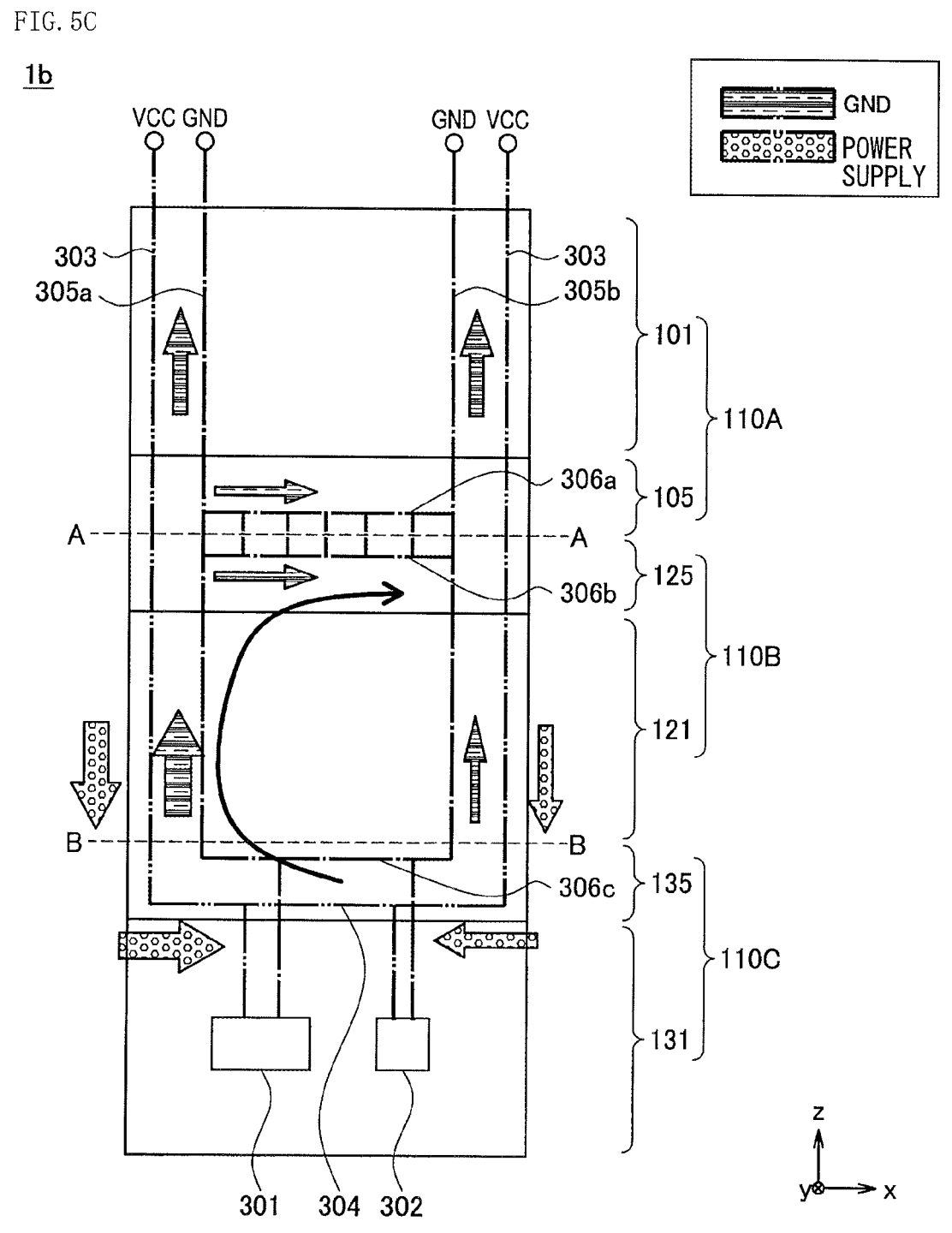

Here, as a method of decreasing impedance in the loop-shaped current path in the solid-state imaging device 1 illustrated in FIG. 5A in which the first substrate 110A and the second substrate 110B are bonded together F-to-F, a method of coupling the horizontal GND wiring line 306a of the first substrate 110A and the horizontal GND wiring line 306b of the second substrate 110B to each other by using a plurality of wiring lines (i.e., vertical GND wiring lines) extending in the z-axis direction is considered as illustrated in FIG. 5C. FIG. 5C is a diagram illustrating a configuration example for decreasing impedance in the solid-state imaging device 1 illustrated in FIG. 5A. Note that a solid-state imaging device 1b illustrated in FIG. 5C corresponds to the solid-state imaging device 1 illustrated in FIG. 5A in which the horizontal GND wiring line 306a of the first substrate 110A and the horizontal GND wiring line 306b of the second substrate 110B are coupled to each other by using a plurality of vertical GND wiring lines, and the other components are similar to those of the solid-state imaging device 1.

Adopting the configuration illustrated in FIG. 5C strengthens the horizontal GND wiring lines 306a and 306b, and allows the impedance to be decreased in the loop-shaped current path. It is thus considered possible to further improve the performance of the entire solid-state imaging device 1b. Note that FIG. 5C illustrates, as an example, a configuration that may allow the impedance of the loop-shaped current path to be decreased in a case where the power consumption of the third substrate 110C is greater than the power consumption of the first substrate 110A, and the first substrate 110A and the second substrate 110B are bonded together F-to-F. Meanwhile, it is sufficient if the horizontal GND wiring line 306b of the second substrate 110B and the horizontal GND wiring line 306c of the third substrate 110C are coupled to each other by using a plurality of vertical GND wiring lines in order to decrease the impedance of the loop-shaped current path in a case where the power consumption of the first substrate 110A is greater than the power consumption of the third substrate 110C, and the first substrate 110A and the second substrate 110B are bonded together F-to-B.

However, to achieve the configuration illustrated in FIG. 5C, the multi-layered wiring layer 105 of the first substrate 110A and the multi-layered wiring layer 125 of the second substrate 110B have to be provided with coupling structures for coupling the GND wiring lines thereof to each other. This imposes a constraint that takes into consideration the coupling structures to be provided on the disposition of the GND wiring lines and the disposition of the other wiring lines in the multi-layered wiring layers 105 and 125. Specifically, in the configuration illustrated in FIG. 5C, in the first substrate 110A and the second substrate 110B, the vertical GND wiring lines and the coupling structures for coupling the vertical GND wiring lines between the substrates to each other are distributed not only in outer peripheral portions of the chips, but also more in middle portions of the chips in the horizontal plane. The respective wiring lines thus have to be disposed by taking this distribution into consideration. That is, the degree of flexibility in designing the respective wiring lines in the multi-layered wiring layers 105 and 125 is decreased.

In contrast, as described above, in the present embodiment, the impedance of the loop-shaped current path is decreased by adjusting the direction of the second substrate 110B. This makes it possible, unlike the configuration illustrated in FIG. 5C, to dispose vertical GND wiring lines to distribute more vertical GND wiring lines in the outer peripheral portions of the chips in the horizontal plane. It is thus possible to decrease the impedance in the current path without decreasing the degree of flexibility in designing the wiring lines in the multi-layered wiring layers 105 and 125. That is, it is possible to stabilize the operations of the solid-state imaging devices 1 and 1a.

Note that it is possible to determine the density of the vertical GND wiring lines disposed in the outer peripheral portions of the chips and in the middle portions of the chips in the horizontal plane, for example, as follows. For example, in a case where the number of vertical GND wiring lines existing in the one middle region of nine regions obtained by equally dividing a chip as a 3×3 region in the horizontal plane is larger than the number of vertical GND wiring lines existing in the eight peripheral regions, it is possible to determine that the number of vertical GND wiring lines in the middle portion of the chip is large (i.e., it is possible to determine that the configuration of the solid-state imaging device 1b illustrated in FIG. 5C may be possibly applied). In contrast, in a case where the number of vertical GND wiring lines existing in the one middle region is smaller than the number of vertical GND wiring lines existing in the eight peripheral regions, it is possible to determine that the number of vertical GND wiring lines in the outer peripheral portion of the chip is large (i.e., it is possible to determine that the configurations of the solid-state imaging devices 1 and 1a illustrated in FIGS. 5A and 5B may be possibly applied).

Here, as an example, a case where a chip is equally divided into nine regions in the horizontal plane has been described, but the number of regions obtained by dividing a chip is not limited to the example. The number of regions obtained by dividing a chip may be changed as appropriate into the 16 regions of a 4×4 region, the 25 regions of a 5×5 region, or the like. It is sufficient if, for example, in a case where a chip is divided into 16 regions as a 4×4 region, the density is determined from the number of vertical GND wiring lines in the four middle regions and the 12 peripheral regions. Alternatively, it is sufficient if, in a case where a chip is divided into 25 regions as a 5×5 region, the density is determined from the number of vertical GND wiring lines in the one middle region and the 24 peripheral regions, or in the nine middle regions and the 16 peripheral regions.

4. Manufacturing Method

A manufacturing method of the solid-state imaging device according to the present embodiment will be described. Note that the configuration of the solid-state imaging device 1 illustrated in FIG. 1 is an example of the solid-state imaging device according to the present embodiment. The solid-state imaging device according to the present embodiment may include a coupling structure different from a coupling structure illustrated in FIG. 1. The following (5. Variations of Configuration of Solid-state Imaging Device) describes such variations of the configuration (a first configuration example to a tenth configuration example) by a different coupling structure in the solid-state imaging device. Herein, manufacturing methods related to some (a fourth configuration example to a sixth configuration example) of the configuration examples of the solid-state imaging device according to the present embodiment described in the following (5. Variations of Configuration of Solid-state Imaging Device) will be described as examples. Note that, in the following description of the respective manufacturing methods, it is assumed that the first substrate 110A, the second substrate 110B, and the third substrate 110C have been already fabricated, and a process of stacking the first substrate 110A, the second substrate 110B, and the third substrate 110C subsequent to such fabrication will be mainly described.

4-1. First Manufacturing Method

A first manufacturing method corresponds to a manufacturing method of the solid-state imaging devices 7a to 7j according to the sixth configuration example illustrated in FIGS. 15A to 15J to be described later. With reference to FIGS. 6A to 6E, the manufacturing method of the solid-state imaging device according to the sixth configuration example of the present embodiment will be described. FIGS. 6A to 6E are diagrams for describing the manufacturing method (the first manufacturing method) of the solid-state imaging device according to the sixth configuration example of the present embodiment. FIGS. 6A to 6E schematically illustrate a cross section parallel to the z-axis direction of a partial region of the solid-state imaging device according to the sixth configuration example in process order in the manufacturing method of the solid-state imaging device, and represent a process flow in the manufacturing method.

Figure 6A:
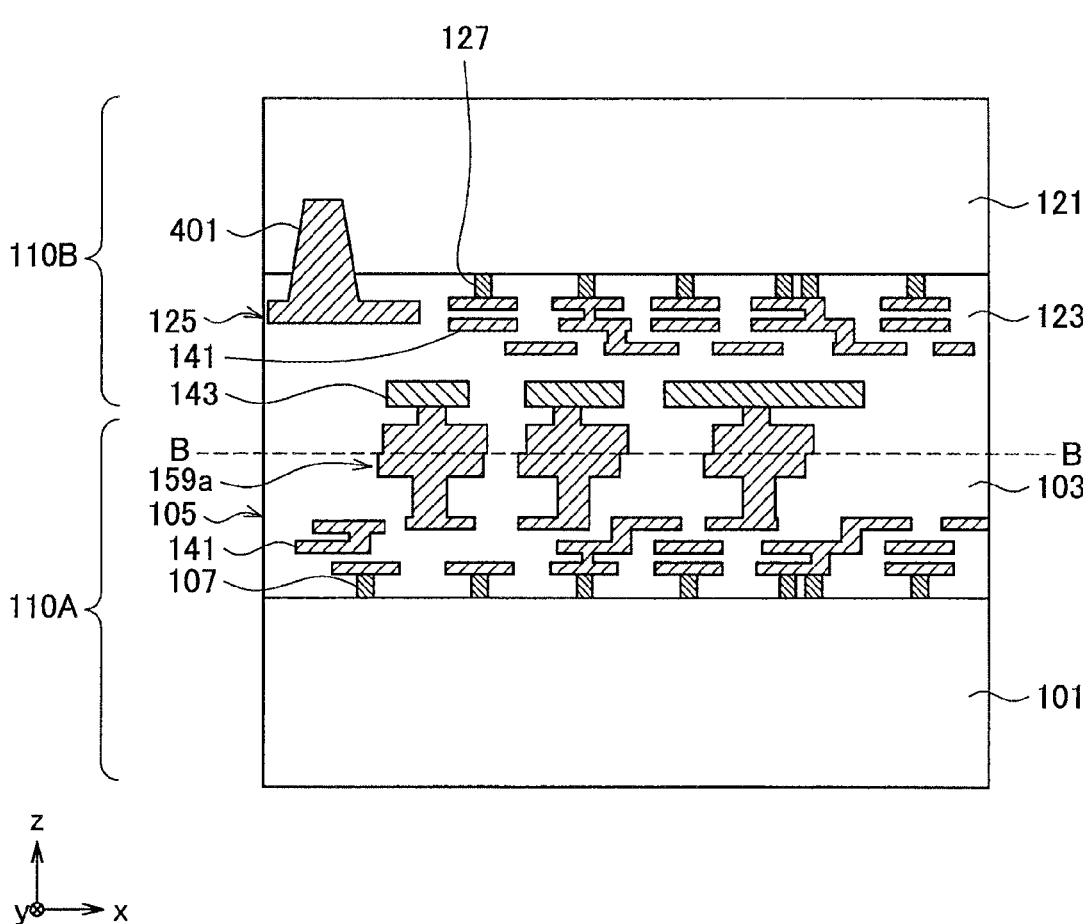
FIG. 6A is a diagram for describing a manufacturing method (a first manufacturing method) of a solid-state imaging device according to a sixth configuration example of the present embodiment.

In the manufacturing method of the solid-state imaging device according to the sixth configuration example, first, the first substrate 110A and the second substrate 110B are bonded together F-to-F (FIG. 6A). At this time, the first substrate 110A and the second substrate 110B are bonded together in a manner that an electrode formed on the front surface side of the first substrate 110A and an electrode formed on the front surface side of the second substrate 110B are in direct contact with each other on bonding surfaces thereof. That is, an electrode junction structure 159a is formed between the first substrate 110A and the second substrate 110B. Note that strictly speaking, the electrode junction structure 159a may be formed by performing heat treatment while the electrodes are in contact with each other, but both the structure before performing the heat treatment and the structure after performing the heat treatment are herein referred to as the electrode junction structure 159a for the sake of convenience. The heat treatment may be performed immediately after the process illustrated in FIG. 6A, or may be performed simultaneously on electrode junction structures 159a and 159b after a process illustrated in FIG. 6D to be described later.

Here, in the second substrate 110B, in formation of the multi-layered wiring layer 125, a via 401 is formed. The via 401 is electrically coupled to a predetermined wiring line in the multi-layered wiring layer 125 and reaches a predetermined depth from the front surface of the semiconductor substrate 121. The via 401 is ultimately included in a via of the electrode junction structure 159b that electrically couples the respective signal lines included in the second substrate 110B and the third substrate 110C to each other and electrically couples the respective power supply lines included in the second substrate 110B and the third substrate 110C to each other. The via 401 includes the first metal (e.g., Cu). However, the present embodiment is not limited to this example, and the via 401 may include another electrically-conductive material.

Figure 6B:
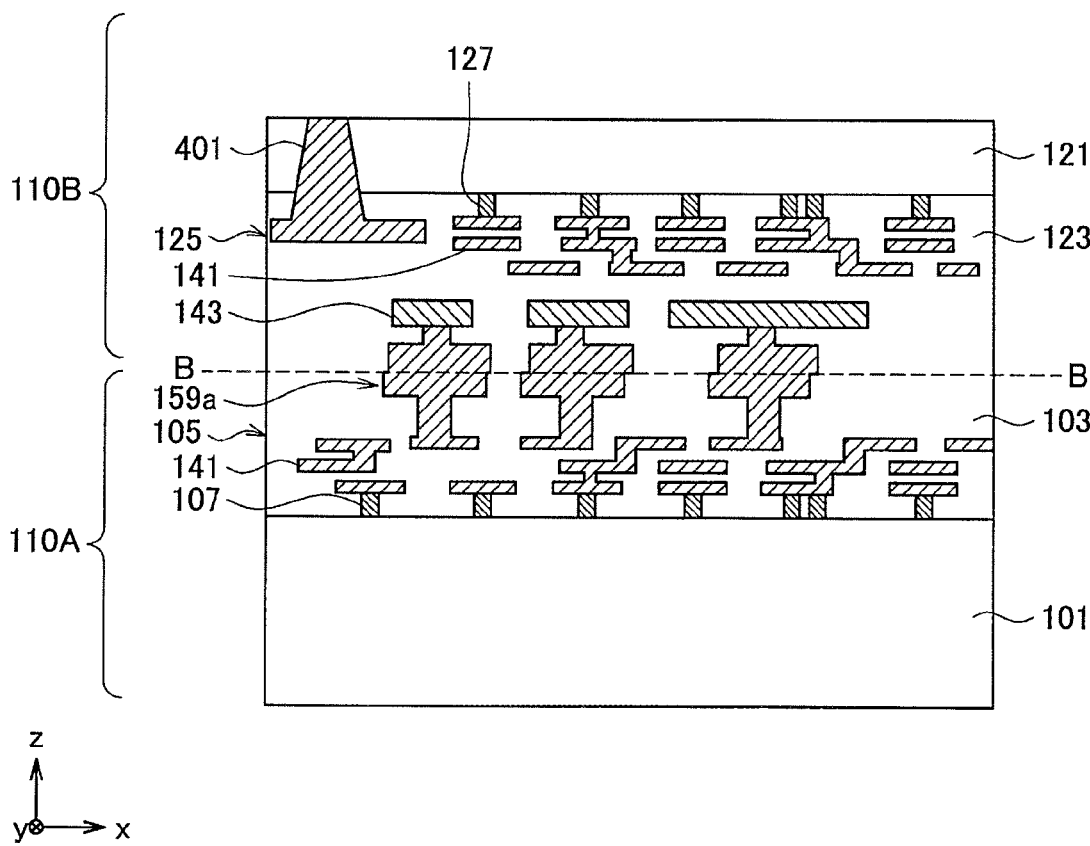
FIG. 6B is a diagram for describing the manufacturing method (the first manufacturing method) of the solid-state imaging device according to the sixth configuration example of the present embodiment.

Next, the semiconductor substrate 121 of the second substrate 110B is thinned from the back surface side (FIG. 6B). In such thinning processing, the semiconductor substrate 121 is thinned until an end of the via 401 is exposed, as illustrated in FIG. 6B. Note that, for example, various methods commonly used in wafer thinning processing, such as grinding by a grinder and CMP (Chemical Mechanical Polishing) may be applied as a specific method of the thinning processing.

Figure 6C:
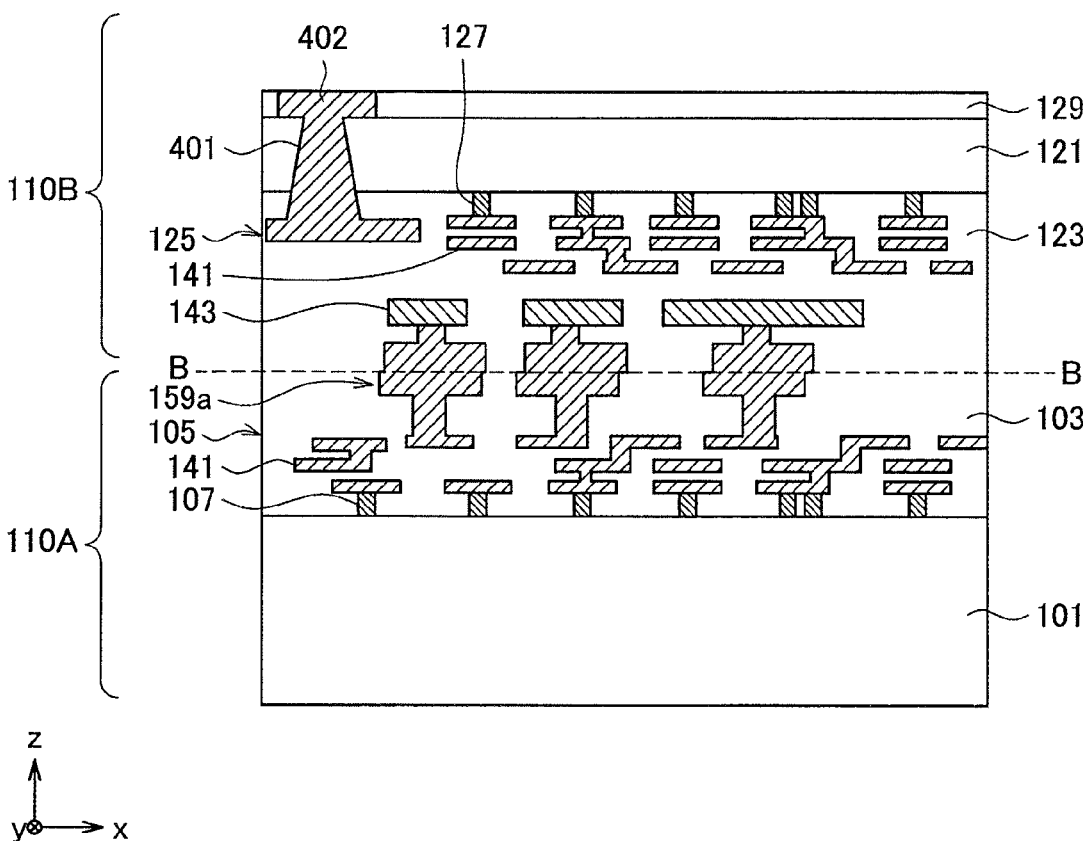
FIG. 6C is a diagram for describing the manufacturing method (the first manufacturing method) of the solid-state imaging device according to the sixth configuration example of the present embodiment.

Next, a redistribution line (RDL) is formed on the back surface side of the semiconductor substrate 121 of the second substrate 110B (FIG. 6C). Specifically, the insulating film 129 is formed on the back surface side of the semiconductor substrate 121, and a wiring pattern is formed inside the insulating film 129. The wiring pattern is formed using the first metal (e.g., Cu) by using, for example, a damascene method. In a case where the wiring pattern is formed using Cu, specifically, the insulating film 129 and the wiring pattern may be formed by sequentially performing a process of forming an insulating film including $SiO_2$ or the like by a CVD (Chemical Vapor Deposition) method, a process of processing the insulating film by photolithography and dry etching to form a groove (a wiring groove) in a region that is to become a wiring layer, a process of forming a metal film by embedding a metal in the formed wiring groove, and a process of removing an excess metal film (i.e., a metal film in a region other than a region in which the wiring groove is formed) in order to leave the metal film only in the region that is to become the wiring layer (i.e., the region in which the wiring groove is formed). At this time, in the process of forming the metal film, specifically, a process of forming a film including a barrier metal for suppressing diffusion of Cu by a sputtering method or a CVD method, a process of forming a film including Cu called a seed layer by a sputtering method, and a process of forming a Cu film by a plating deposition method (e.g., an ECD (Electro-Chemical Deposition) plating deposition method) may be sequentially performed. The seed layer is a film that is necessary to perform plating and serves as a growth starting point. In addition, in the process of removing the excess metal film, in order to remove the Cu film formed in the region other than the wiring groove, a CMP method is generally used in consideration of planarization. Here, as illustrated in the diagram, in the first manufacturing method, an electrode 402 electrically coupled to the via 401 is formed as the wiring pattern. The electrode 402 is formed in a manner that a metallic surface thereof is exposed from the insulating film 129. Note that although not illustrated, another wiring pattern may also be formed in another insulating film 129.

Figure 6D:
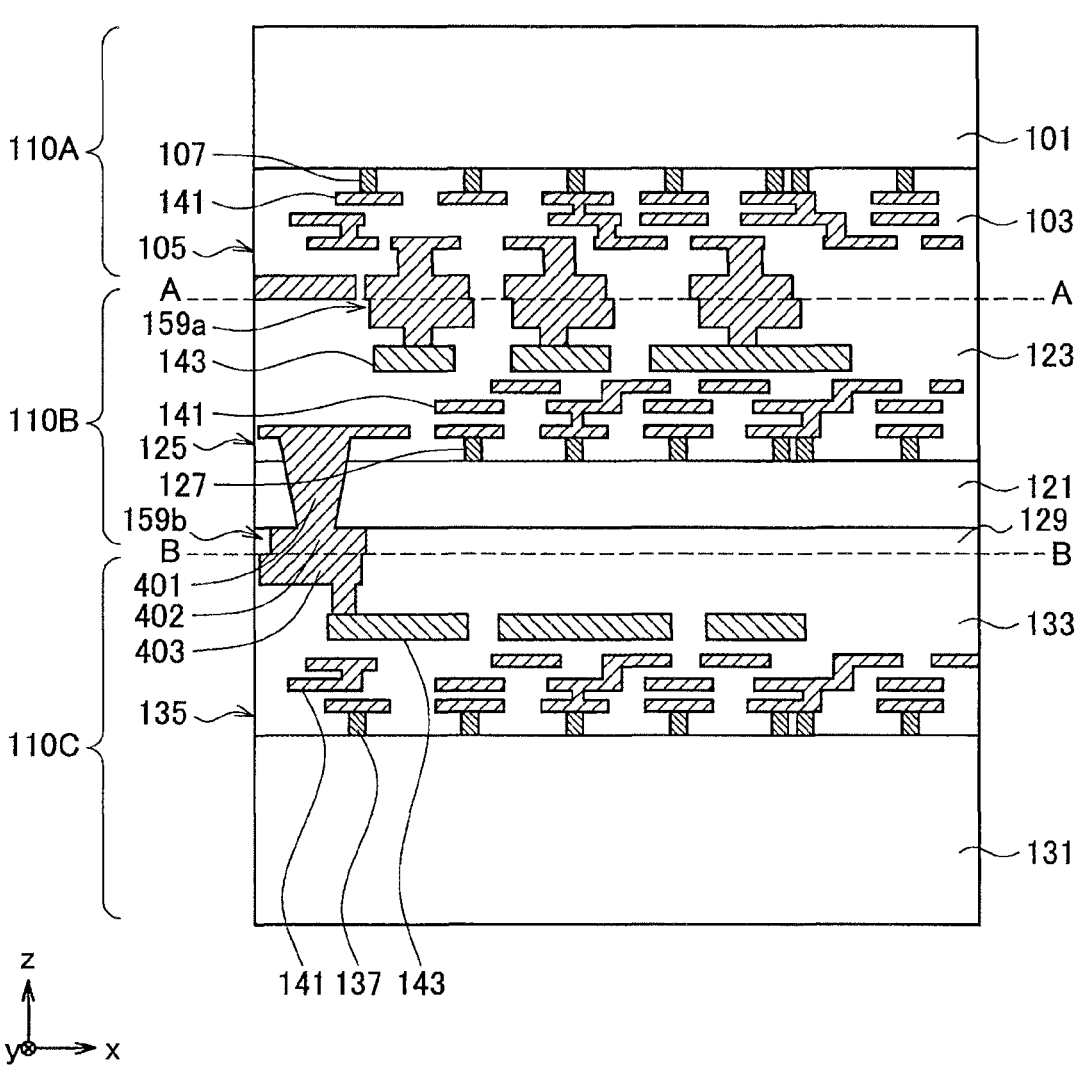
FIG. 6D is a diagram for describing the manufacturing method (the first manufacturing method) of the solid-state imaging device according to the sixth configuration example of the present embodiment.

Next, the second substrate 110B and the third substrate 110C are bonded together F-to-B (FIG. 6D). In the third substrate 110C, the multi-layered wiring layer 135 is formed in a manner that an electrode 403 is exposed on the front surface side of the insulating film 133, and the second substrate 110B and the third substrate 110C are bonded together in a manner that the above-described electrode 402 formed on the back surface side of the second substrate 110B and the electrode 403 formed on the front surface side of the third substrate 110C are in direct contact with each other on bonding surfaces thereof. Thereafter, heat treatment is performed to form the electrode junction structure 159*b*, in which both electrodes 402 and 403 are joined to each other, between the second substrate 110B and the third substrate 110C.

Figure 6E:
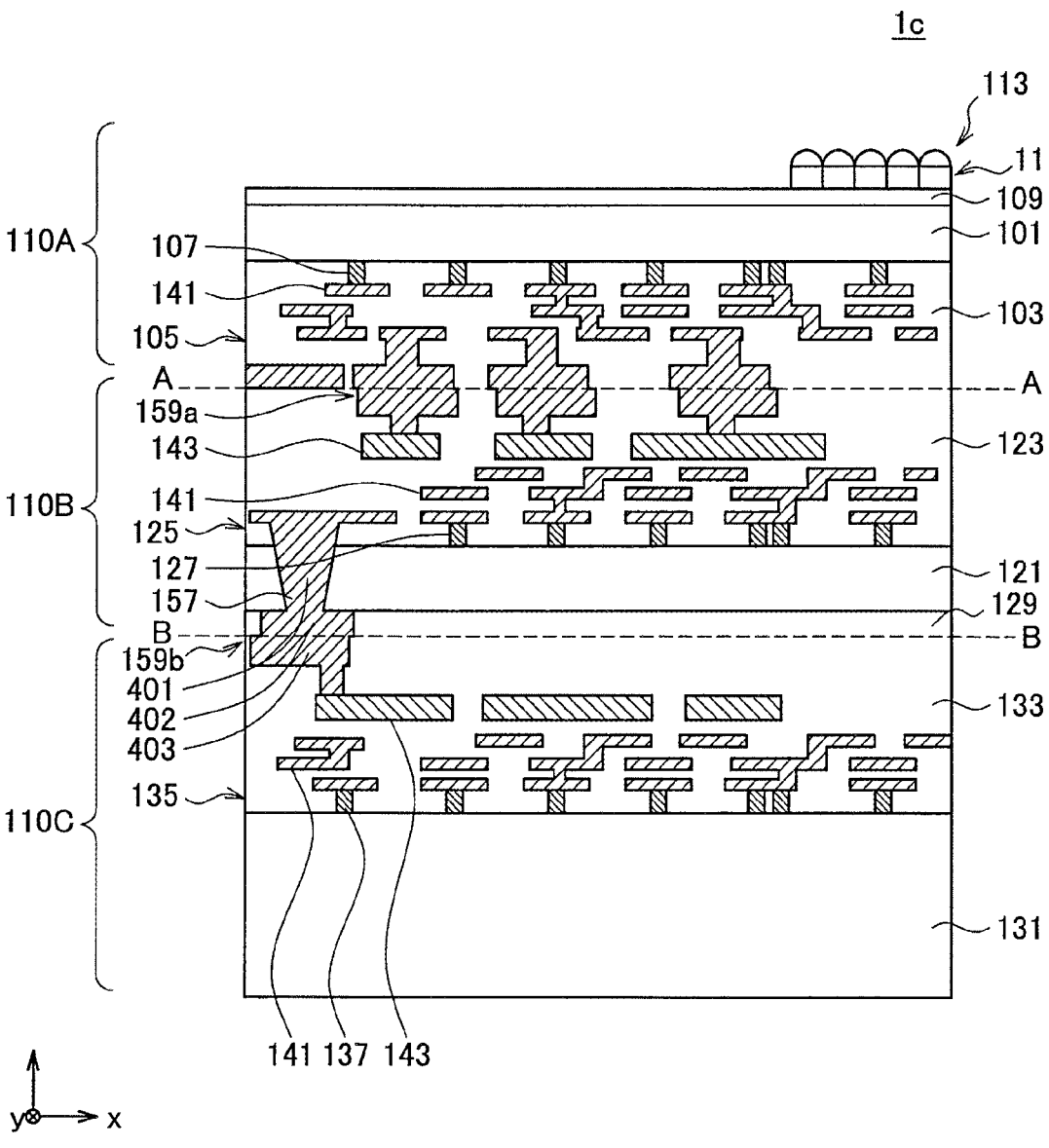
FIG. 6E is a diagram for describing the manufacturing method (the first manufacturing method) of the solid-state imaging device according to the sixth configuration example of the present embodiment.

Next, the semiconductor substrate 101 of the first substrate 110A is thinned from the back surface side. In this process, thinning processing may be performed by any of various known methods, similarly to the process illustrated in FIG. 6B described above. Then, the insulating film 109 is formed on the back surface of the thinned semiconductor substrate 101. The insulating film 109 is formed, for example, by forming a film including SiO$_2$ by a CVD method. The CF layer 111 and the ML array 113 are formed in a region corresponding to the pixel unit on the insulating film 109. Thus, the solid-state imaging device 1*c* according to the sixth configuration example is completed (FIG. 6E). Actually, the solid-state imaging device 1*c* may be provided with the pad opening 153 or the lead line opening 155 as an I/O unit, similarly to the solid-state imaging devices 7*a* to 7*j* illustrated in FIGS. 15A to 15J to be described later.

4-2. Second Manufacturing Method

A second manufacturing method also corresponds to the manufacturing method of the solid-state imaging devices 7*a* to 7*j* according to the sixth configuration example illustrated in FIGS. 15A to 15J to be described later, similarly to the first manufacturing method. However, the second manufacturing method corresponds to a manufacturing method differing from the first manufacturing method for the solid-state imaging device according to the sixth configuration example.

With reference to FIGS. 7A to 7E, another manufacturing method of the solid-state imaging device according to the sixth configuration example of the present embodiment will be described. FIGS. 7A to 7E are diagrams for describing another manufacturing method (the second manufacturing method) of the solid-state imaging device according to the sixth configuration example of the present embodiment. FIGS. 7A to 7E schematically illustrate a cross section parallel to the z-axis direction of a partial region of the solid-state imaging device according to the sixth configuration example in process order in the manufacturing method of the solid-state imaging device, and represent a process flow in the manufacturing method.

Figure 7A:
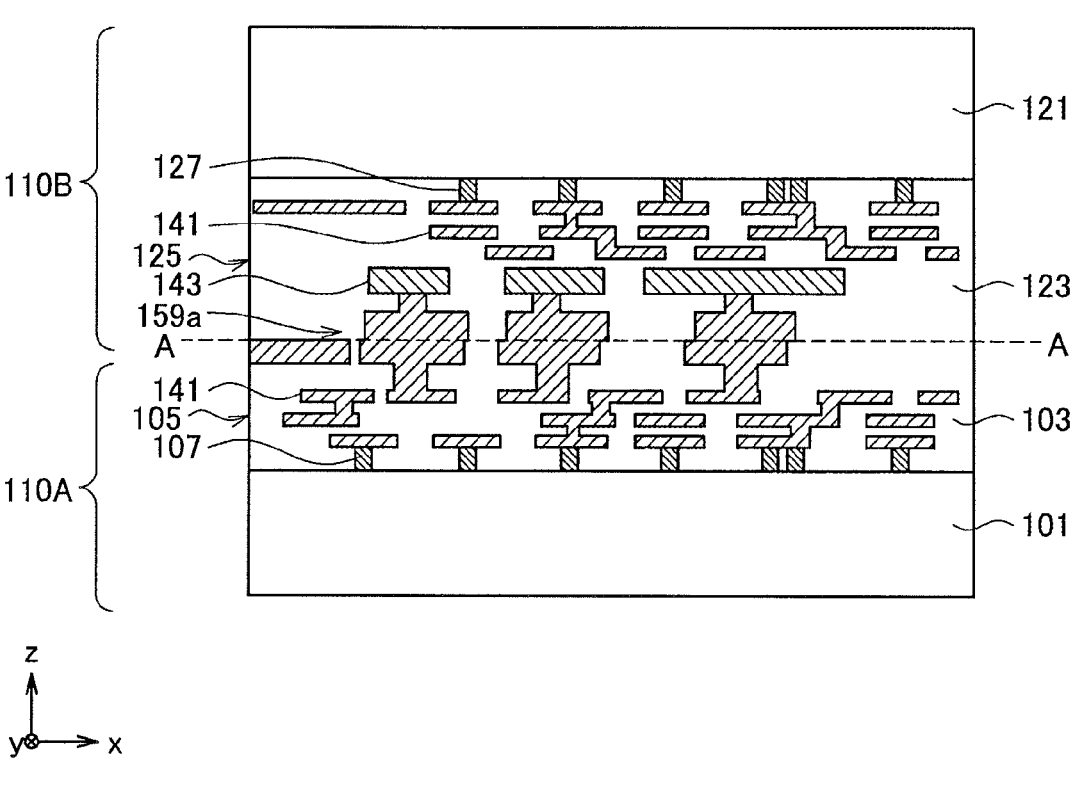
FIG. 7A is a diagram for describing another manufacturing method (a second manufacturing method) of the solid-state imaging device according to the sixth configuration example of the present embodiment.

In another manufacturing method of the solid-state imaging device according to the sixth configuration example, first, the first substrate 110A and the second substrate 110B are bonded together F-to-F (FIG. 7A). Through this process, the electrode junction structure 159*a* is formed between the first substrate 110A and the second substrate 110B. This process is similar to the process illustrated in FIG. 6A related to the first manufacturing method described above. However, in the second manufacturing method, the via 401 is not formed in the second substrate 110B.

Figure 7B:
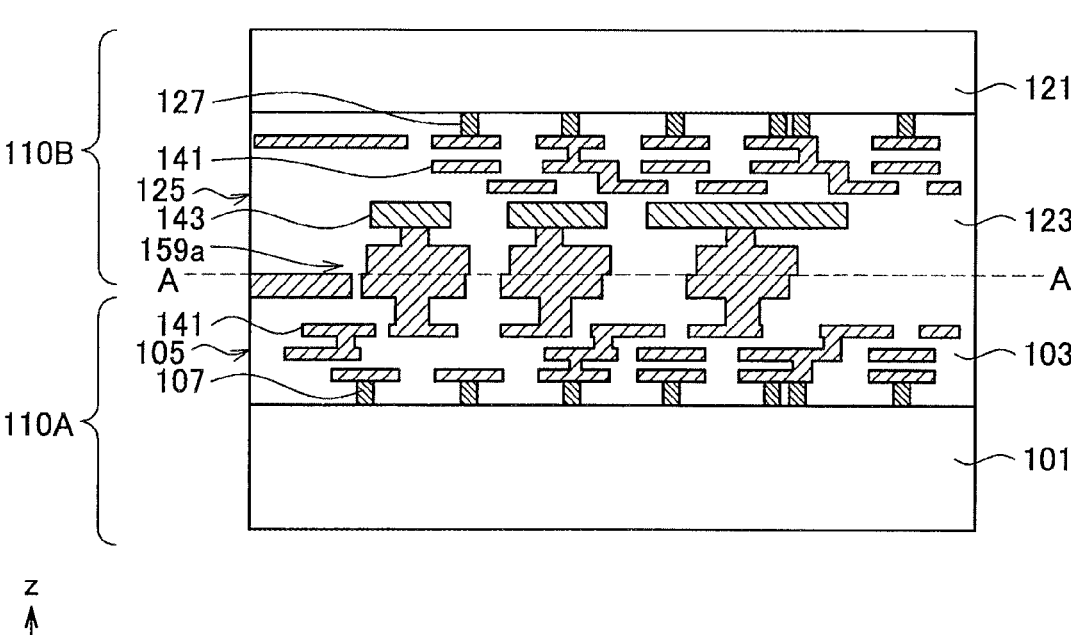
FIG. 7B is a diagram for describing another manufacturing method (the second manufacturing method) of the solid-state imaging device according to the sixth configuration example of the present embodiment.

Next, the semiconductor substrate 121 of the second substrate 110B is thinned from the back surface side (FIG. 7B). This process is similar to the process illustrated in FIG. 7B related to the first manufacturing method described above.

Figure 7C:
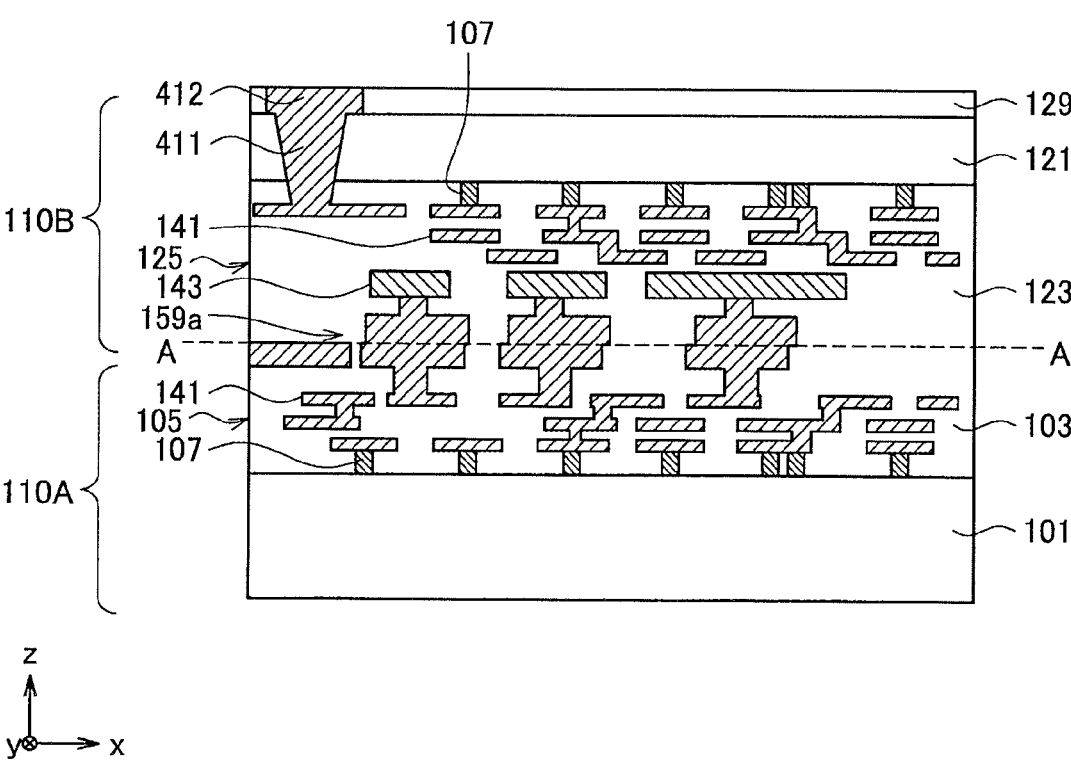
FIG. 7C is a diagram for describing another manufacturing method (the second manufacturing method) of the solid-state imaging device according to the sixth configuration example of the present embodiment.

Next, a redistribution line is formed on the back surface side of the semiconductor substrate 121 of the second substrate 110B (FIG. 7C). Specifically, the insulating film 129 is formed on the back surface side of the semiconductor substrate 121, and a wiring pattern is formed inside the insulating film 129. At this time, a via 411 is formed that penetrates the semiconductor substrate 121 from the back surface side of the semiconductor substrate 121, and an electrode 412 that is electrically coupled to the via 411 is formed in the wiring pattern. As a method of forming the via 411 and the electrode 412, for example, any of various known methods such as a dual damascene method may be used.

Figure 7D:
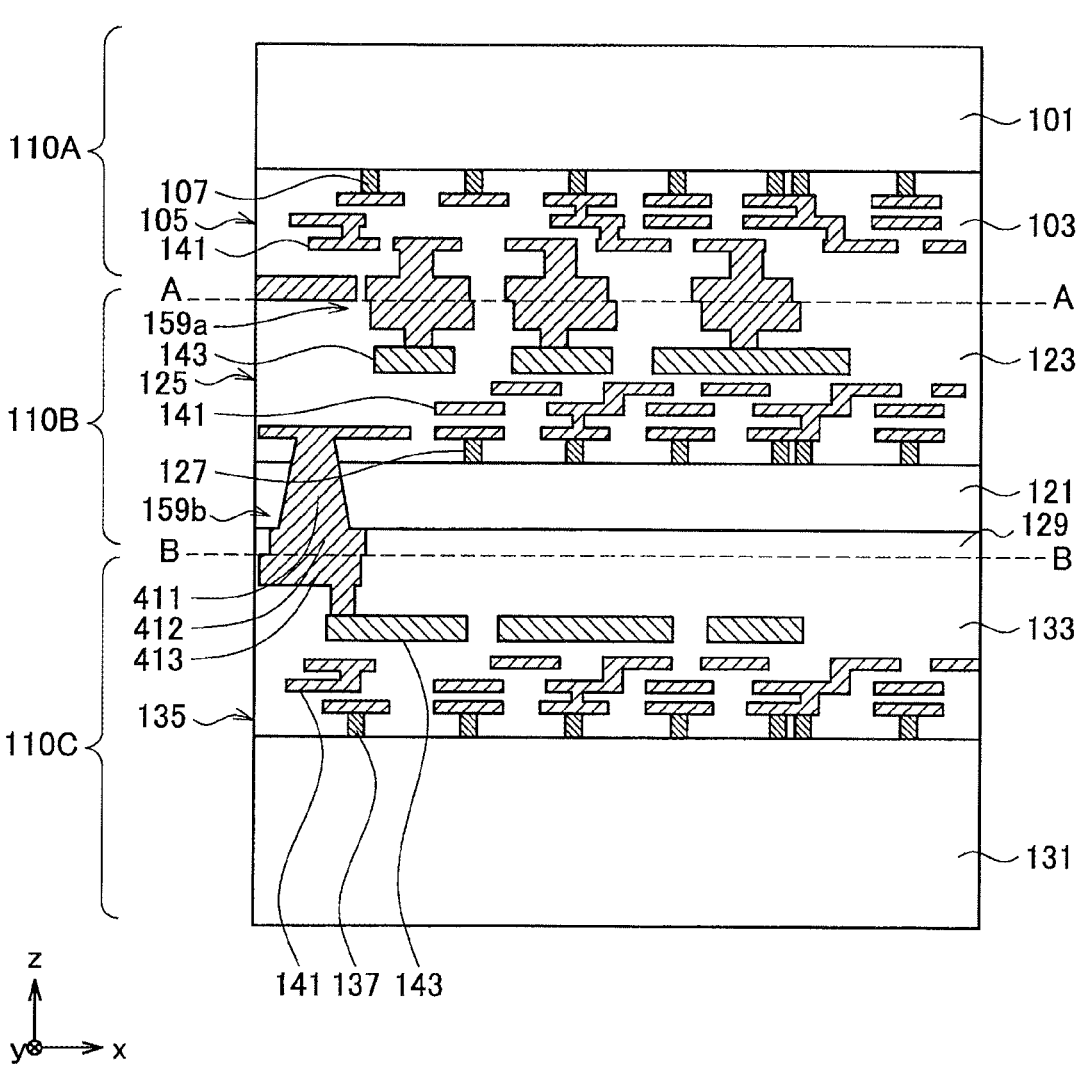
FIG. 7D is a diagram for describing another manufacturing method (the second manufacturing method) of the solid-state imaging device according to the sixth configuration example of the present embodiment.

The subsequent processes are similar to those of the first manufacturing method described above. Specifically, the second substrate 110B and the third substrate 110C are next bonded together F-to-B (FIG. 7D). At this time, the second substrate 110B and the third substrate 110C are bonded together in a manner that the above-described electrode 412 formed on the back surface side of the second substrate 110B and an electrode 413 formed on the front surface side of the third substrate 110C are in direct contact with each other on the bonding surfaces thereof. Thereafter, heat treatment is performed to form the electrode junction structure 159*b*, in which both the electrodes 412 and 413 are bonded to each other, between the second substrate 110B and the third substrate 110C.

Figure 7E:
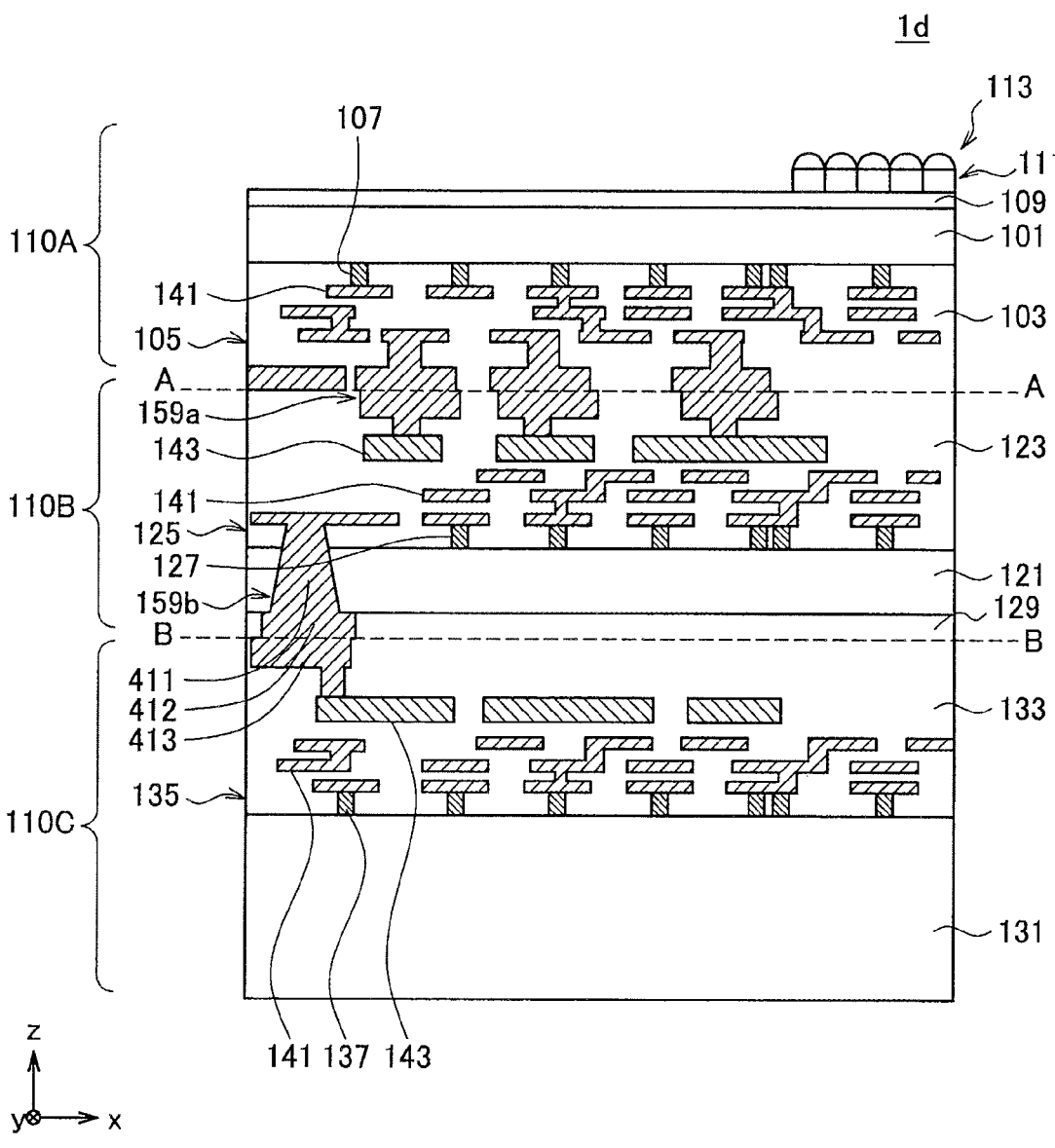
FIG. 7E is a diagram for describing another manufacturing method (the second manufacturing method) of the solid-state imaging device according to the sixth configuration example of the present embodiment.

Next, the semiconductor substrate 101 of the first substrate 110A is thinned from the back surface side. Then, the insulating film 109 is formed on the back surface of the thinned semiconductor substrate 101. The insulating film 109 is formed, for example, by forming a film including SiO$_2$ by a CVD method. The CF layer 111 and the ML array 113 are formed in a region corresponding to the pixel unit on the insulating film 109. Thus, the solid-state imaging device 1*d* according to the sixth configuration example is completed (FIG. 7E). Actually, the solid-state imaging device 1*d* may be provided with the pad opening 153 or the lead line opening 155 as an I/O unit, similarly to the solid-state imaging devices 7*a* to 7*j* illustrated in FIGS. 15A to 15J to be described later.

4-3. Third Manufacturing Method

A third manufacturing method corresponds to the manufacturing method of the solid-state imaging devices 6*a* to 6*f* according to the fifth configuration example illustrated in FIGS. 14A to 14F to be described later. With reference to FIGS. 8A to 8F, a manufacturing method of the solid-state imaging device according to the fifth configuration example of the present embodiment will be described. FIGS. 8A to 8F are diagrams for describing the manufacturing method (the third manufacturing method) of the solid-state imaging device according to the fifth configuration example of the present embodiment. FIGS. 8A to 8F schematically illustrate a cross section parallel to the z-axis direction of a partial region of the solid-state imaging device according to the fifth configuration example in process order in the manu-facturing method of the solid-state imaging device, and represent a process flow in the manufacturing method.

Figure 8A:
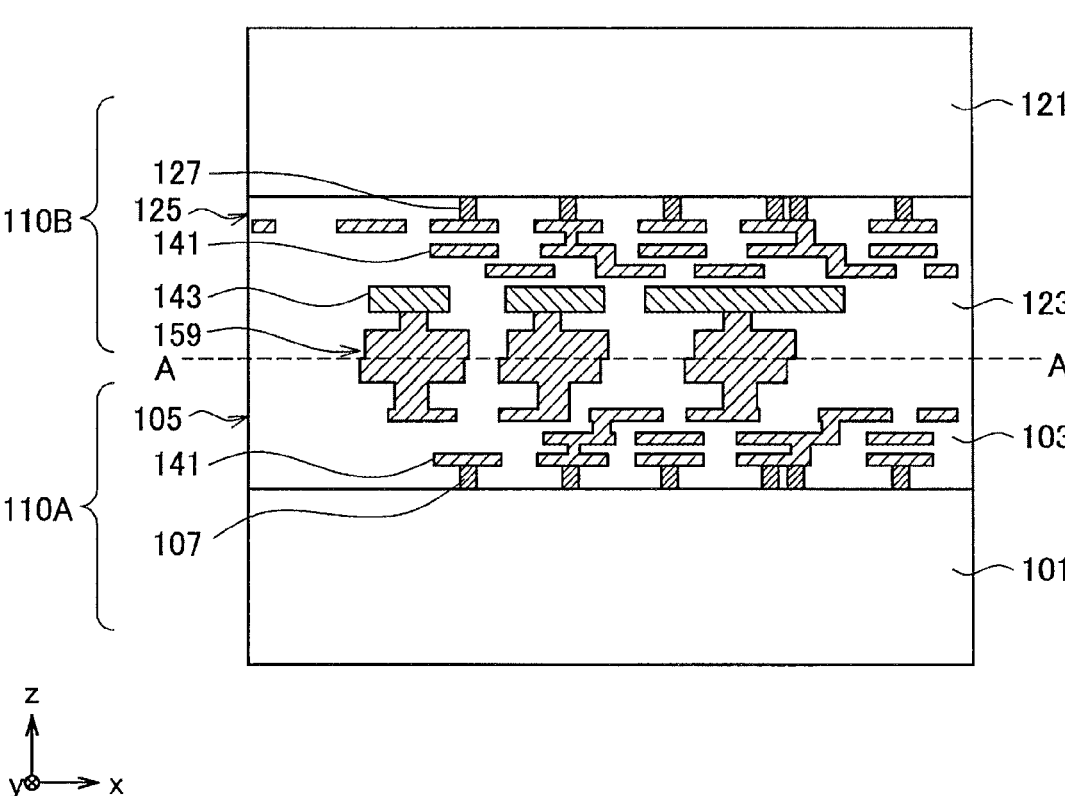
FIG. 8A is a diagram for describing a manufacturing method (a third manufacturing method) of a solid-state imaging device according to a fifth configuration example of the present embodiment.

In the manufacturing method of the solid-state imaging device according to the fifth configuration example, first, the first substrate 110A and the second substrate 110B are bonded together F-to-F (FIG. 8A). In this process, the electrode junction structure 159 is formed between the first substrate 110A and the second substrate 110B. This process is similar to the process illustrated in FIG. 7A according to the second manufacturing method described above.

Figure 8B:
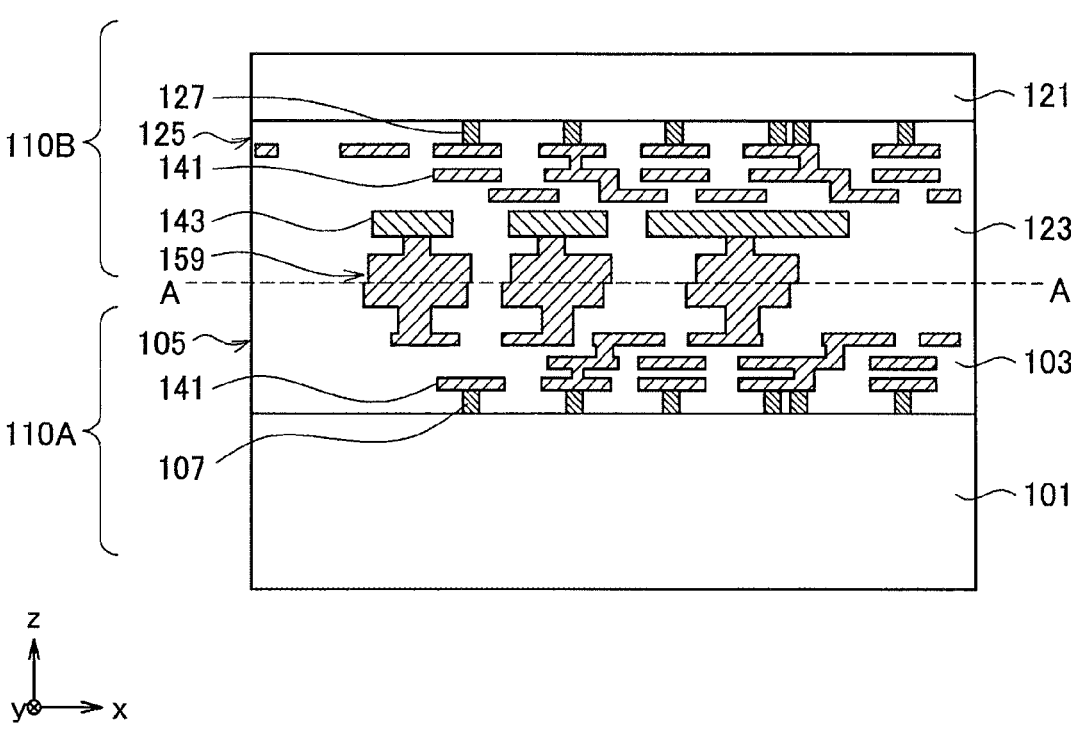
FIG. 8B is a diagram for describing the manufacturing method (the third manufacturing method) of the solid-state imaging device according to the fifth configuration example of the present embodiment.

Next, the semiconductor substrate 121 of the second substrate 110B is thinned from the back surface side (FIG. 8B). This process is similar to the process illustrated in FIG. 6B related to the first manufacturing method described above and the process illustrated in FIG. 7B related to the second manufacturing method described above.

Figure 8C:
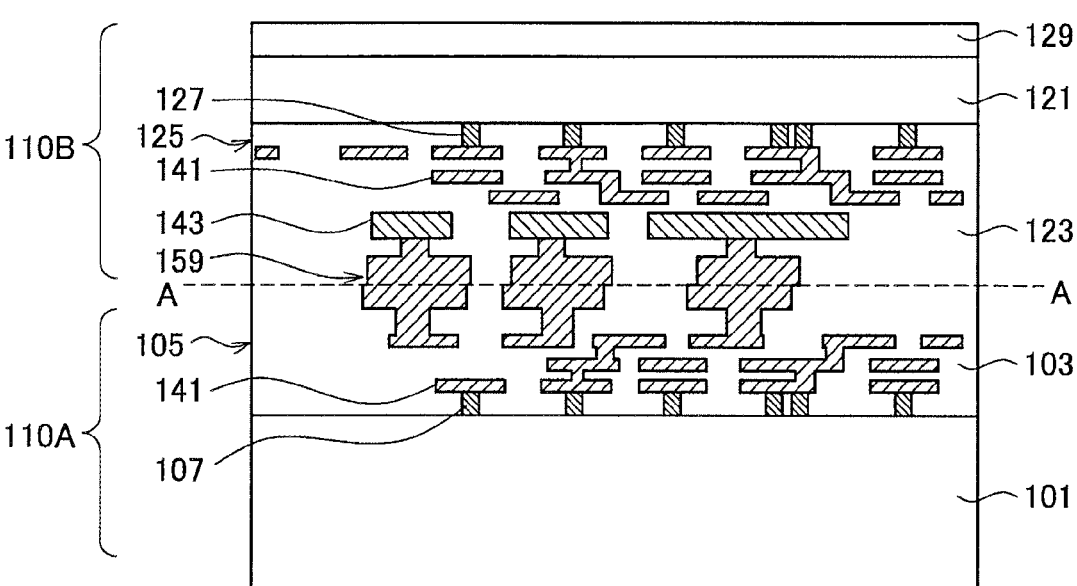
FIG. 8C is a diagram for describing the manufacturing method (the third manufacturing method) of the solid-state imaging device according to the fifth configuration example of the present embodiment.
Figure 8C:
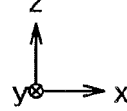

Next, the insulating film 129 is formed on the back surface side of the semiconductor substrate 121 of the second substrate 110B (FIG. 8C). The insulating film 129 is formed, for example, by forming a film including SiO$_2$ by a CVD method.

Figure 8D:
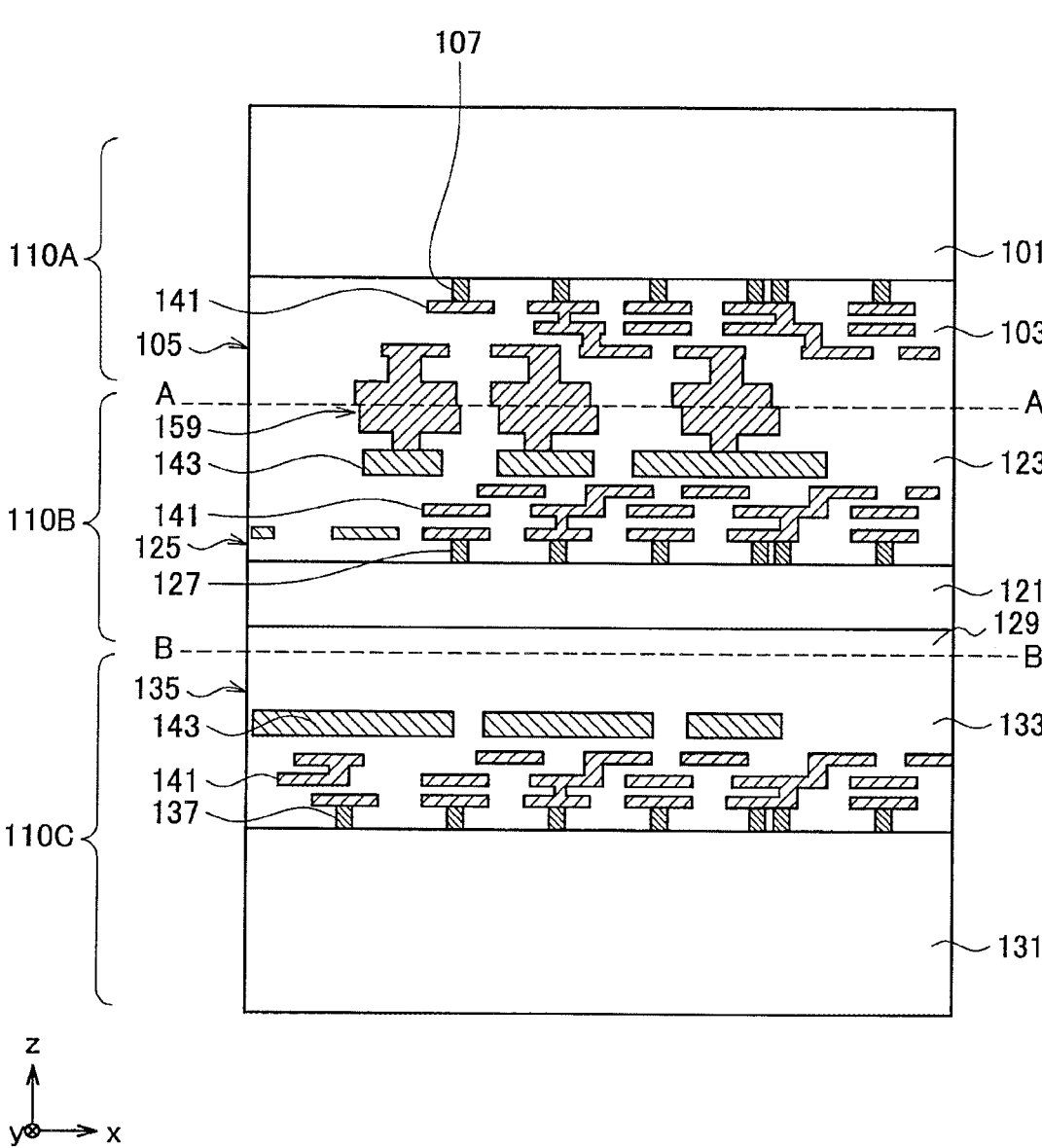
FIG. 8D is a diagram for describing the manufacturing method (the third manufacturing method) of the solid-state imaging device according to the fifth configuration example of the present embodiment.

Next, the second substrate 110B and the third substrate 110C are bonded together F-to-B (FIG. 8D). At this time, unlike the first and second manufacturing methods, elec-trodes are not formed on the back surface side of the second substrate 110B and the front surface side of the third substrate 110C, and no electrode junction structure is formed between the second substrate 110B and the third substrate 110C.

Figure 8E:
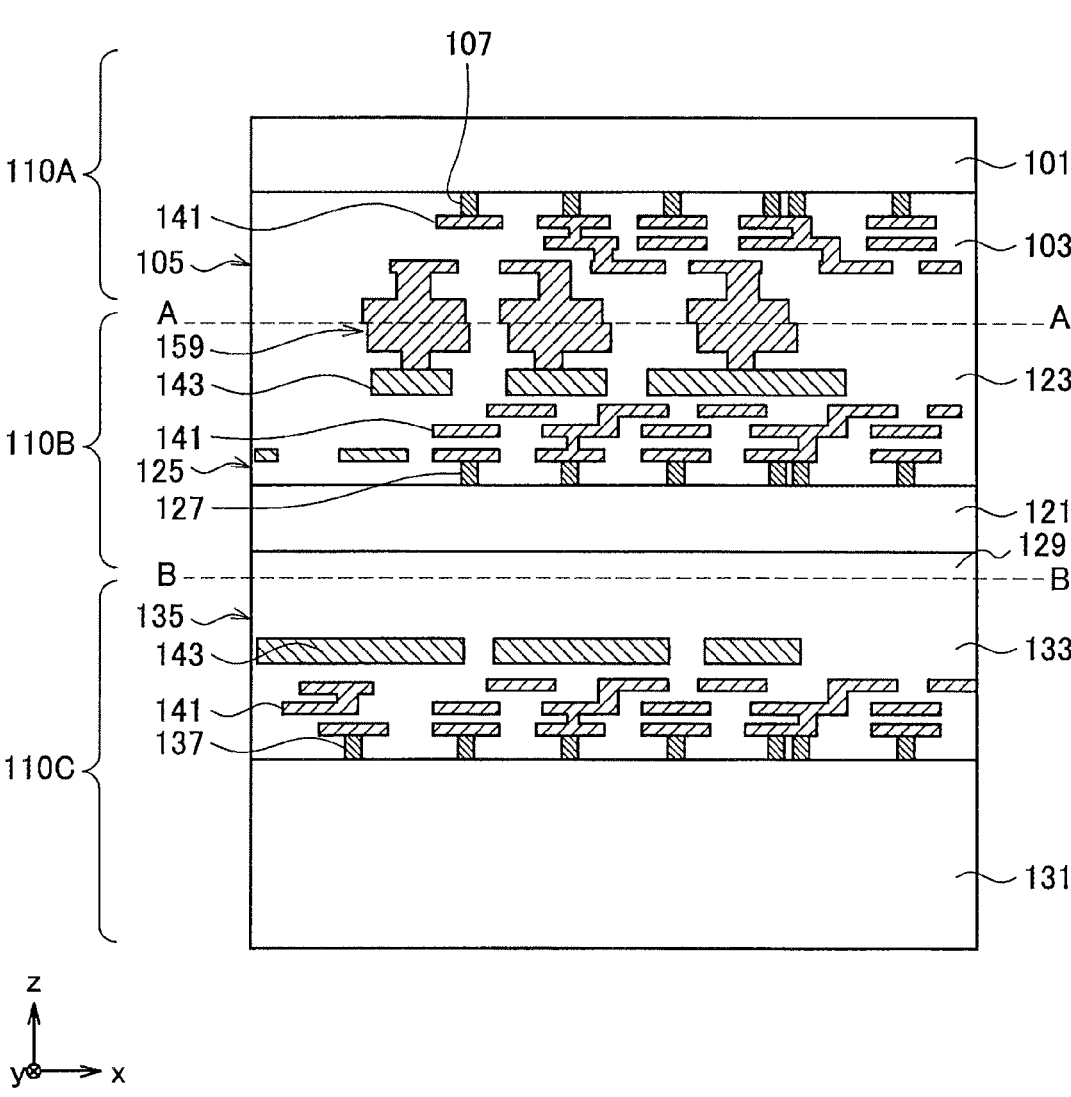
FIG. 8E is a diagram for describing the manufacturing method (the third manufacturing method) of the solid-state imaging device according to the fifth configuration example of the present embodiment.

Next, the semiconductor substrate 101 of the first sub-strate 110A is thinned from the back surface side (FIG. 8E). In this process, thinning processing may be performed by any of various known methods, similarly to the process illustrated in FIG. 8B described above.

Next, the insulating film 109 is formed on the back surface side of the semiconductor substrate 101 of the first substrate 110A. The insulating film 109 is formed, for example, by forming a film including SiO$_2$ by a CVD method. Thereafter, a TSV 421 is formed from above the insulating film 109 (i.e., from the back surface side of the first substrate 110A) to penetrate the semiconductor sub-strate 101 of the first substrate 110A and the second substrate 110B and reach a predetermined wiring line of the multi-layered wiring layer 135 of the third substrate 110C. The TSV 421 has a structure in which an electrically-conductive material (in the illustrated example, the first metal (e.g., Cu)) is embedded in one through hole provided from the back surface side of the first substrate 110A to expose a prede-termined wiring line in the multi-layered wiring layer 135 of the third substrate 110C while exposing a portion of a predetermined wiring line in the multi-layered wiring layer 125 of the second substrate 110B. That is, the predetermined wiring line in the multi-layered wiring layer 125 of the second substrate 110B and the predetermined wiring line in the multi-layered wiring layer 135 of the third substrate 110C may be electrically coupled to each other by the TSV 421. Note that in this manner, the TSV that electrically couples wiring lines of a plurality of substrates to each other by one through hole is also referred to as a shared contact. Using the shared contact provides an advantage that a TSV structure is achievable by a relatively simple process with a relatively small area.

Figure 8F:
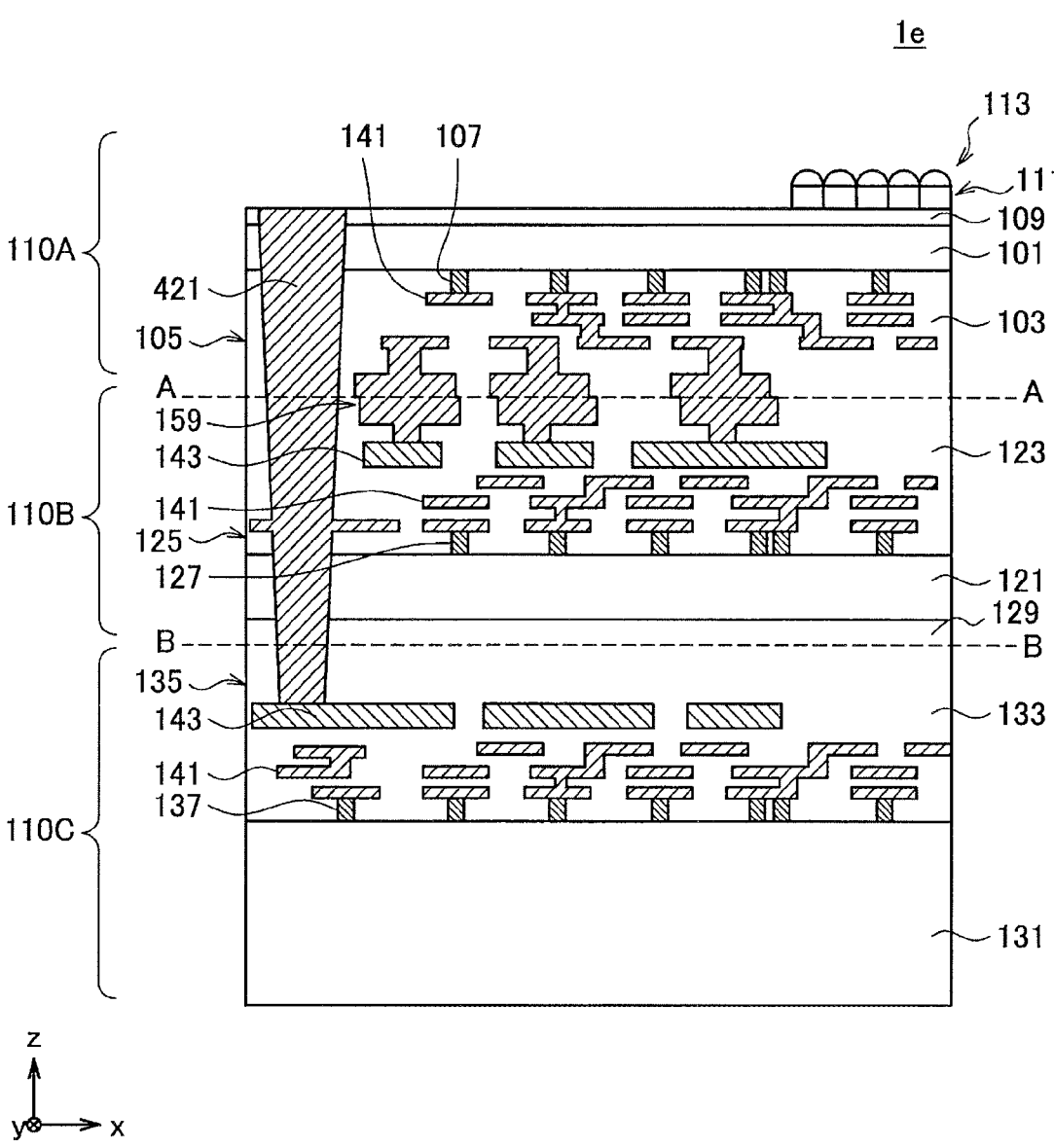
FIG. 8F is a diagram for describing the manufacturing method (the third manufacturing method) of the solid-state imaging device according to the fifth configuration example of the present embodiment.

Thereafter, the CF layer 111 and the ML array 113 are formed in a region corresponding to the pixel unit on the insulating film 109 on the back surface side of the semicon-ductor substrate 101. Thus, the solid-state imaging device 1e according to the fifth configuration example is completed (FIG. 8F). Actually, the solid-state imaging device 1d may be provided with the pad opening 153 or the lead line opening 155 as an I/O unit, similarly to the solid-state imaging devices 6a to 6f illustrated in FIGS. 14A to 14F to be described later.

Note that in the illustrated example, the TSV 421 is a coupling structure that electrically couples the respective signal lines included in the second substrate 110B and the third substrate 110C to each other and electrically couples the respective power supply lines included in the second substrate 110B and the third substrate 110C to each other, but the TSV 421 may be formed to electrically couple the signal line in the multi-layered wiring layer 105 of the first substrate 110A and the signal line in the multi-layered wiring layer 135 of the third substrate 110C to each other and electrically couple the power supply line in the multi-layered wiring layer 105 of the first substrate 110A and the power supply line in the multi-layered wiring layer 135 of the third substrate 110C to each other, or may be formed to electrically couple the signal line in the multi-layered wiring layer 105 of the first substrate 110A, the signal line in the multi-layered wiring layer 125 of the second substrate 110B, and the signal line in the multi-layered wiring layer 135 of the third substrate 110C to each other and electrically couple the power supply line in the multi-layered wiring layer 105 of the first substrate 110A, the power supply line in the multi-layered wiring layer 125 of the second substrate 110B, and the power supply line in the multi-layered wiring layer 135 of the third substrate 110C to each other.

4-4. Fourth Manufacturing Method

A fourth manufacturing method corresponds to the manu-facturing method of the solid-state imaging device 5a to 5c according to the fourth configuration example illustrated in FIGS. 13A to 13C to be described later. With reference to FIGS. 9A to 9G, a manufacturing method of the solid-state imaging device according to the fourth configuration example of the present embodiment will be described. FIGS. 9A to 9G are diagrams for describing the manufacturing method (the fourth manufacturing method) of the solid-state imaging device according to the fourth configuration example of the present embodiment. FIGS. 9A to 9G sche-matically illustrate a cross section parallel to the z-axis direction of a partial region of the solid-state imaging device according to the fourth configuration example in process order in the manufacturing method of the solid-state imaging device, and represent a process flow in the manufacturing method.

Figure 9A:
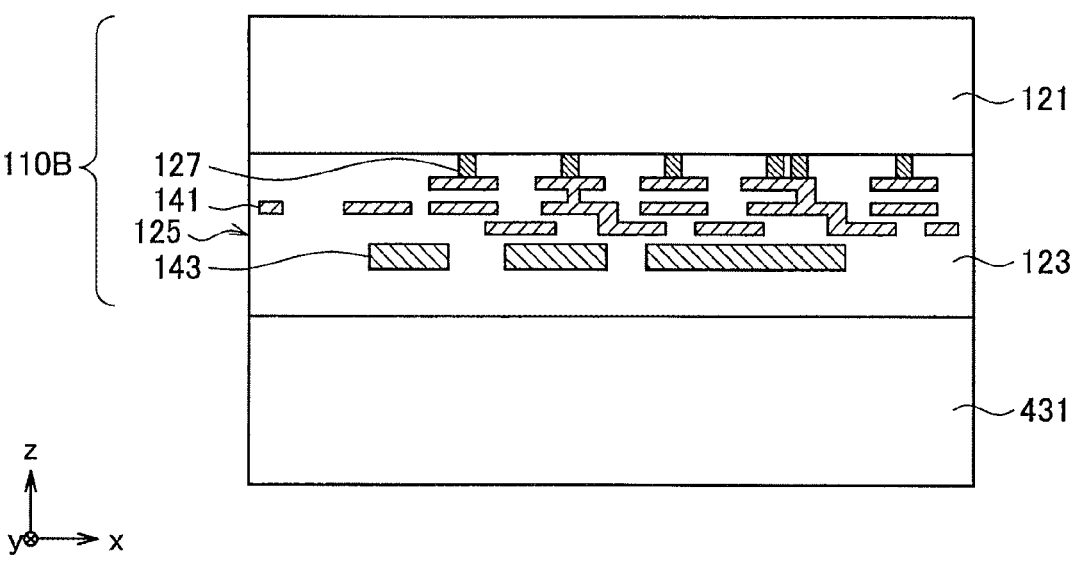
FIG. 9A is a diagram for describing a manufacturing method (a fourth manufacturing method) of a solid-state imaging device according to a fourth configuration example of the present embodiment.

In the manufacturing method of the solid-state imaging device according to the fourth configuration example, first, a support substrate 431 is bonded to the front surface side of the second substrate 110B (FIG. 9A).

Figure 9B:
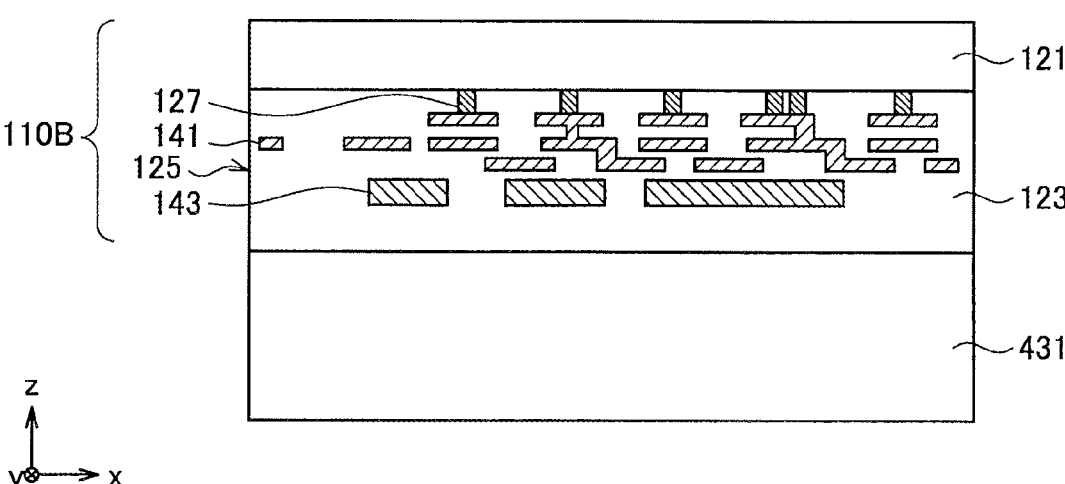
FIG. 9B is a diagram for describing the manufacturing method (the fourth manufacturing method) of the solid-state imaging device according to the fourth configuration example of the present embodiment.

Next, the semiconductor substrate 121 of the second substrate 110B is thinned from the back surface side (FIG. 9B). In this process, thinning processing may be performed by any of various known methods, similarly to the processes illustrated in FIG. 6B, FIG. 7B, and FIG. 8B described above.

Figure 9C:
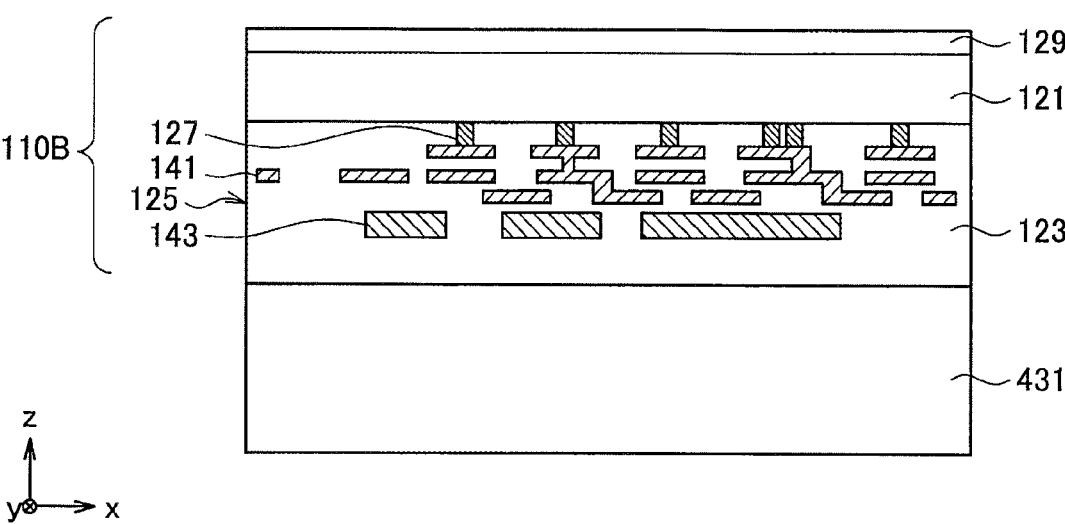
FIG. 9C is a diagram for describing the manufacturing method (the fourth manufacturing method) of the solid-state imaging device according to the fourth configuration example of the present embodiment.

Next, the insulating film 129 is formed on the back surface side of the semiconductor substrate 121 of the second substrate 110B (FIG. 9C). The insulating film 129 is formed, for example, by forming a film including SiO$_2$ by a CVD method.

Figure 9D:
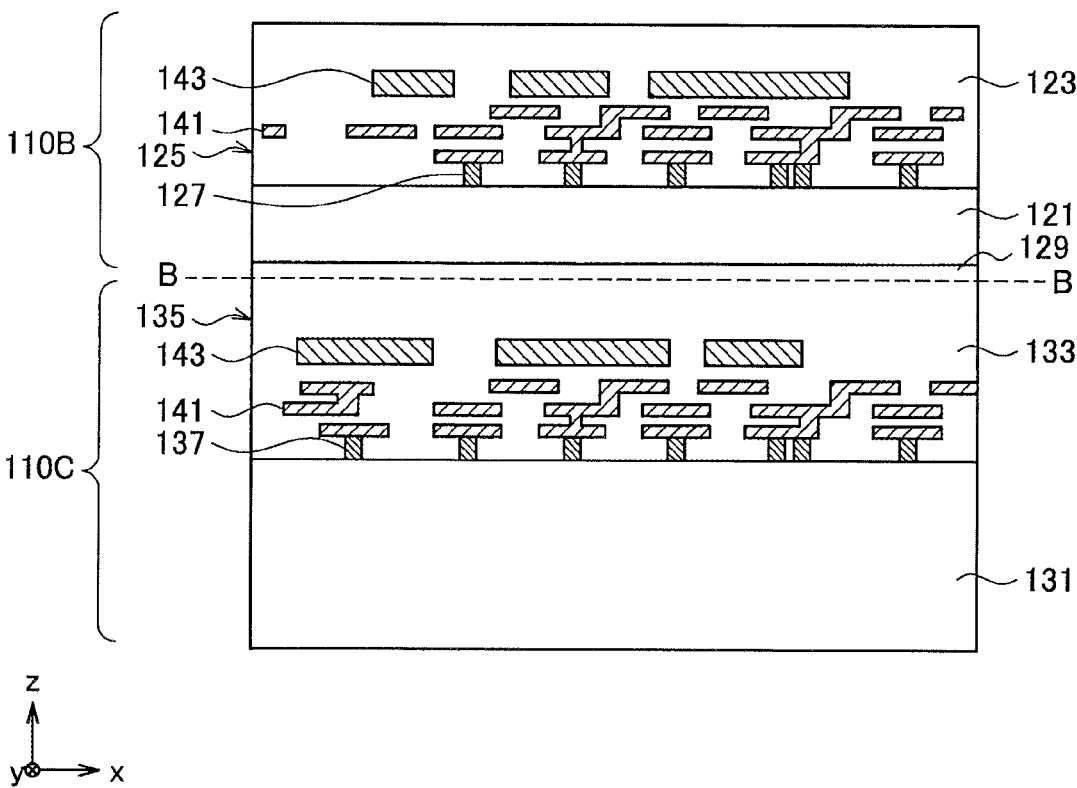
FIG. 9D is a diagram for describing the manufacturing method (the fourth manufacturing method) of the solid-state imaging device according to the fourth configuration example of the present embodiment.
Figure 9E:
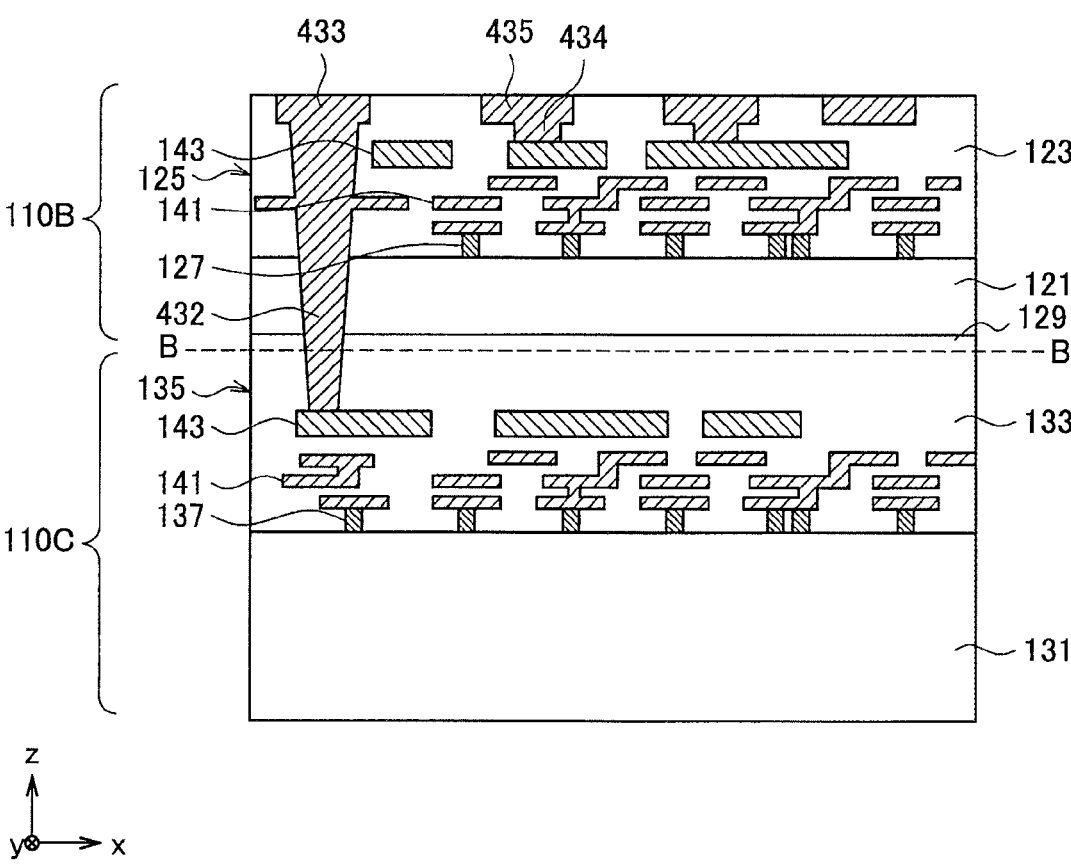
FIG. 9E is a diagram for describing the manufacturing method (the fourth manufacturing method) of the solid-state imaging device according to the fourth configuration example of the present embodiment.

Next, after the second substrate 110B and the third substrate 110C are bonded together F-to-B, the support substrate 431 is peeled off from the second substrate 110B (FIG. 9D). At this time, similarly to the third manufacturing method, electrodes are not formed on the back surface side of the second substrate 110B and the front surface side of the third substrate 110C, and the electrode junction structure 159 is not formed between the second substrate 110B and the third substrate 110C.

Next, the TSV 432 and an electrode 433, and a via 434 and an electrode 435 are formed from the front surface side of the second substrate 110B (i.e., from above the insulating film 123). The TSV 432 is a via that penetrates the second substrate 110B from the front surface side of the second substrate 110B and reaches a predetermined wiring line of the multi-layered wiring layer 135 of the third substrate 110C. The TSV 432 has a structure in which an electrically-conductive material (in the illustrated example, the first metal (e.g., Cu)) is embedded in one through hole provided from the front surface side of the second substrate 110B to expose a predetermined wiring line in the multi-layered wiring layer 135 of the third substrate 110C while exposing a portion of a predetermined wiring line in the multi-layered wiring layer 125 of the second substrate 110B. That is, the predetermined wiring line in the multi-layered wiring layer 125 of the second substrate 110B and the predetermined wiring line in the multi-layered wiring layer 135 of the third substrate 110C may be electrically coupled to each other by the TSV 432. The TSV 432 is a shared contact, similarly to the TSV 421 described above.

In addition, the electrode 433 is formed integrally with the TSV 432 in a manner that a metallic surface thereof is exposed from the insulating film 123. That is, the TSV 432 and the electrode 433 are formed by embedding an electrically-conductive material in one through hole corresponding to the TSV 432 and the electrode 433. The electrode 433 may be ultimately included in the electrode junction structure 159 that electrically couples the respective signal lines included in the first substrate 110A and the second substrate 110B to each other and electrically couples the respective power supply lines included in of the first substrate 110A and the second substrate 110B to each other. That is, in this configuration example, the shared contact type TSV 432 is a via that electrically couples the respective signal lines included in the substrates to each other and electrically couples the respective power supply lines included in the substrates, and is also a via included in the electrode junction structure 159.

In addition, the electrode 435 is formed in a manner that a metallic surface thereof is exposed from the insulating film 123, and the via 434 is formed to electrically couple the electrode 435 and a predetermined wiring line in the multi-layered wiring layer 125 to each other. The via 434 and the electrode 435 may be ultimately included in the electrode junction structure 159 that electrically couples the respective signal lines included in the first substrate 110A and the second substrate 110B to each other and electrically couple the respective power supply lines included in the first substrate 110A and the second substrate 110B to each other. Note that as a method of forming the TSV 432 and the electrode 433, and the via 434 and the electrode 435, for example, any of various known methods such as a dual damascene method may be used.

Figure 9F:
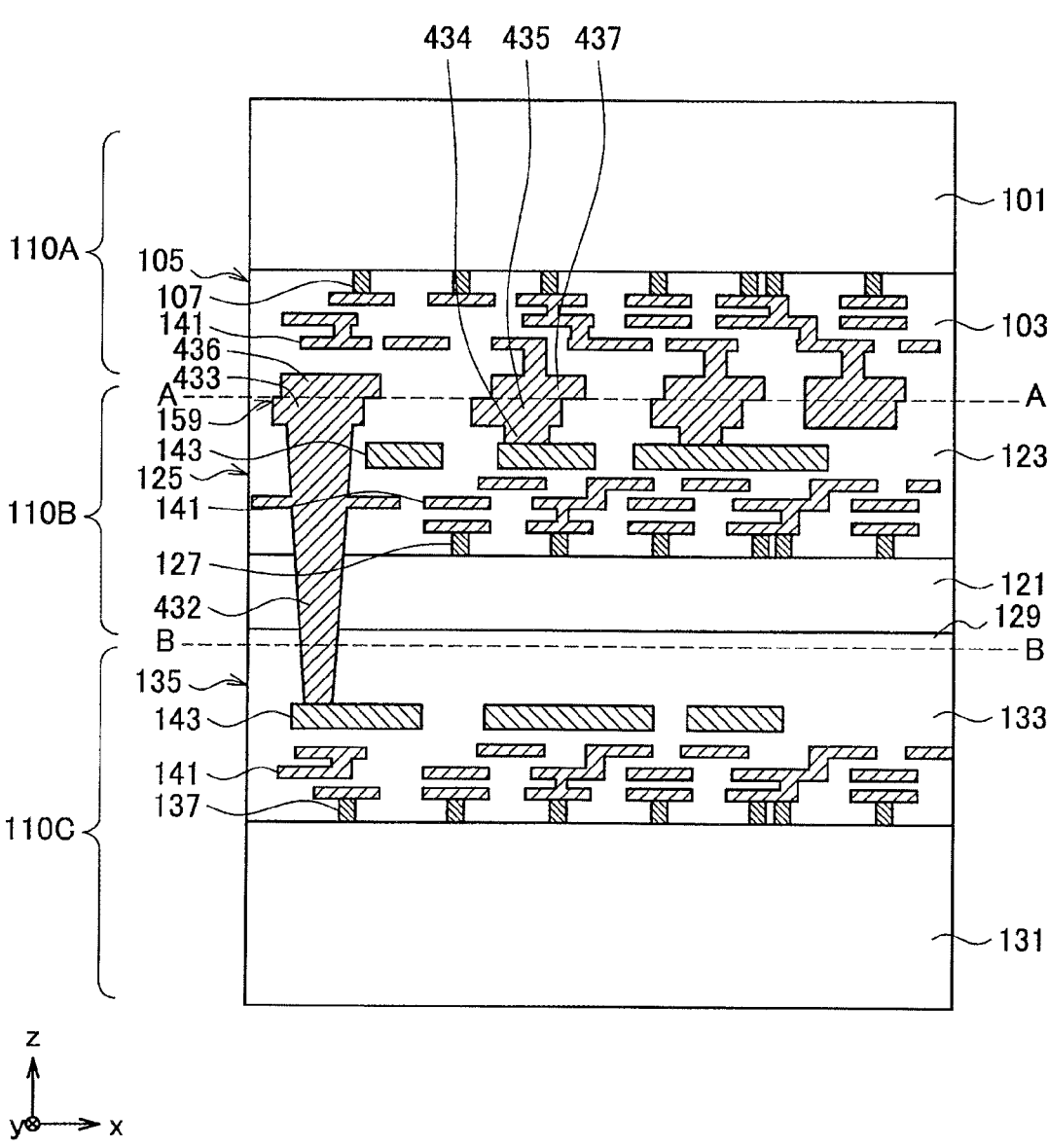
FIG. 9F is a diagram for describing the manufacturing method (the fourth manufacturing method) of the solid-state imaging device according to the fourth configuration example of the present embodiment.

Next, the first substrate 110A and the second substrate 110B are bonded together F-to-F (FIG. 9F). In the first substrate 110A, the multi-layered wiring layer 105 is formed in a manner that the electrodes 436 and 437 are exposed from the front surface side of the insulating film 103, and the first substrate 110A and the second substrate 110B are bonded together in a manner that the electrodes 436 and 437 formed on the front surface side of the first substrate 110A and the above-described electrodes 433 and 435 formed on the front surface side of the second substrate 110B are in direct contact with each other on the bonding surfaces thereof. Thereafter, heat treatment is performed to form the electrode junction structure 159 in which the electrodes 433 and 436 are joined to each other and the electrode 435 and 437 are joined to each other between the first substrate 110A and the second substrate 110B.

Figure 9G:
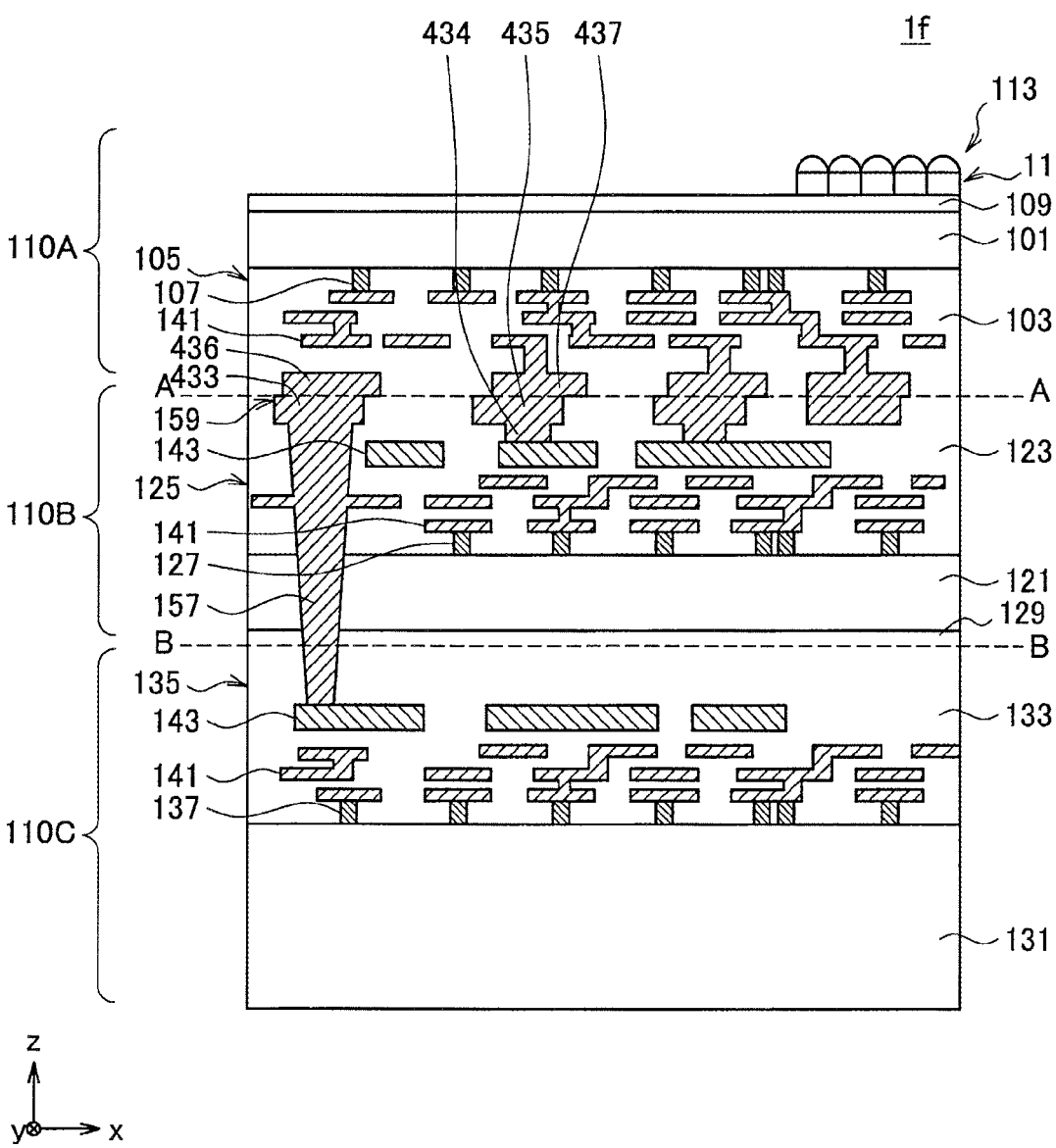
FIG. 9G is a diagram for describing the manufacturing method (the fourth manufacturing method) of the solid-state imaging device according to the fourth configuration example of the present embodiment.

Next, the semiconductor substrate 101 of the first substrate 110A is thinned from the back surface side. In this process, thinning processing may be performed by any of various known methods, similarly to the process illustrated in FIG. 9B described above. Then, the insulating film 109 is formed on the back surface of the thinned semiconductor substrate 101. The insulating film 109 is formed, for example, by forming a film including $SiO_2$ by a CVD method. The CF layer 111 and the ML array 113 are formed in a region corresponding to the pixel unit on the insulating film 109. Thus, the solid-state imaging device 1f according to the fourth configuration example is completed (FIG. 9G). Actually, the solid-state imaging device 1f may be provided with the pad opening 153 or the lead line opening 155 as an I/O unit, similarly to the solid-state imaging devices 5a to 5c illustrated in FIGS. 13A to 13C to be described later.

4-5. Summary

Some manufacturing methods of the solid-state imaging device according to the present embodiment have been described above. Here, each of the solid-state imaging devices 1c to 1f manufactured by the first to fourth manufacturing methods described above has the electrode junction structure 159 as the coupling structure that electrically couples the respective signal lines included in the first substrate 110A and the second substrate 110B to each other and electrically couples the respective power supply lines included in the first substrate 110A and the second substrate 110B to each other. However, as a coupling structure that electrically couples the respective signal lines included in the second substrate 110B and the third substrate 110C to each other and electrically couples the respective power supply lines included in the second substrate 110B and the third substrate 110C to each other, a coupling structure that the solid-state imaging devices 1c and 1d have and a coupling structure that the solid-state imaging devices 1e and 1f have are different from each other. Specifically, the solid-state imaging devices 1c and 1d have, as the coupling structure, the electrode junction structure 159b between the second substrate 110B and the third substrate 110C. The electrode junction structure 159b couples the respective signal lines included in the second substrate 110B and the third substrate 110C to each other and electrically couples the respective power supply lines included in the second substrate 110B and the third substrate 110C to each other. In contrast, the solid-state imaging devices 1c and 1d have, as the coupling structure, the shared contact type TSVs 421 and 432 that electrically couple the respective signal lines included in the second substrate 110B and the third substrate 110C to each other and electrically couple the respective power supply lines included in the second substrate 110B and the third substrate 110C to each other.

In the solid-state imaging devices 1c and 1d, a process for forming the electrode junction structure 159b is necessary; therefore, the number of processes tends to be larger than the number of processes for forming the solid-state imaging devices 1e and 1f. Accordingly, from the viewpoint of reducing the number of processes and manufacturing costs, it is preferable to adopt the third or fourth manufacturing method that allows the solid-state imaging devices 1e and 1f to be manufactured. In particular, in a case where the solid-state imaging device 1e is manufactured by the third manufacturing method, the TSV 421 is formed by one operation after the three substrates 110A, 110B, and 110C are stacked, which makes it possible to greatly reduce the number of processes.

Meanwhile, in the third manufacturing method, the TSV 421 is formed from the back surface side of the semiconductor substrate 101 (e.g., a Si substrate) of the first substrate 110A. Accordingly, it is necessary to perform alignment through the semiconductor substrate 101; therefore, the degree of technical difficulty is high. Further, in the above-described procedural example, although the TSV 421 is formed before the CF layer 111 and the ML array 113 are formed, but in a case where the TSV 421 is formed after the CF layer 111 and the ML array 113 are formed, it is necessary to form the TSV 421 under a predetermined thermal constraint in order not to damage these structures that may be formed using a resin material, which increases the degree of technical difficulty.

In contrast, in the fourth manufacturing method, the TSV 432 is formed from the front surface side of the second substrate 110B. Therefore, the above-described issue in alignment does not occur. In addition, the TSV 432 is formed before bonding the first substrate 110A; therefore, the above-described issue in the thermal constraint does not occur. Thus, it can be said that the fourth manufacturing method has a lower degree of technical difficulty than the third manufacturing method.

Here, the solid-state imaging device 1c manufactured by the first manufacturing method and the solid-state imaging device 1d manufactured by the second manufacturing method have a substantially similar structure as a final structure. However, a method of forming the vias 401 and 411 (i.e., TSVs 401 and 411) provided by penetrating the semiconductor substrate 121 of the second substrate 110B differs between the solid-state imaging device 1c and the solid-state imaging device 1d. The vias 401 and 411 are included in the electrode junction structure 159b that electrically couples the respective signal lines in the second substrate 110B and the third substrate 110C to each other and electrically couples the respective power supply lines included in the second substrate 110B and the third substrate 110C to each other.

Specifically, in the first manufacturing method, in a case where the second substrate 110B is fabricated, the via 401 that reaches a predetermined depth from the front surface side of the semiconductor substrate 121 is formed in advance. In contrast, in the second manufacturing method, after the first substrate 110A and the second substrate 110B are bonded together, the via 411 is formed from the back surface side of the semiconductor substrate 121 of the second substrate 110B.

In the second manufacturing method, similarly to the third manufacturing method described above, it is necessary to perform alignment through the semiconductor substrate 121; therefore, an increase in the degree of technical difficulty is a concern. In contrast, in the first manufacturing method, the via 401 is formed in advance before bonding the first substrate 110A and the second substrate 110B to each other, such an issue in alignment does not occur. Accordingly, it can be said that the first manufacturing method has a lower degree of technical difficulty than the second manufacturing method.

A method to be used to manufacture the solid-state imaging device according to the present embodiment may be appropriately determined from the methods in consideration of advantages and disadvantages described above. The manufacturing method of the solid-state imaging device according to the present embodiment is not limited to the methods described above, and other methods may be used. The solid-state imaging device according to the present embodiment may be manufactured by any of various known methods.

5. Variations of Configuration of Solid-State Imaging Device

Description is given of other configuration examples having different coupling structures of the solid-state imaging device according to the present embodiment. Note that the components of the respective solid-state imaging devices described below correspond to the components of the solid-state imaging device 1 illustrated in FIG. 1 in which a portion of the components is changed. The components that have already been described with reference to FIG. 1 are not thus described in detail. In addition, each of the diagrams illustrating a schematic configuration of each solid-state imaging device described below does not have a portion of the reference numerals attached in FIG. 1 in order to avoid complicating the diagram. In addition, FIG. 1 and each of the subsequent diagrams illustrate that members having the same type of hatching include the same material.

Here, the solid-state imaging devices according to the present embodiment is classified into 10 categories (the first configuration example to the tenth configuration example).

In each of the configurations of the solid-state imaging device according to the present embodiment, as in the solid-state imaging device 1 illustrated in FIG. 1, at least the electrode junction structure 159 (a structure in which the electrodes formed on the respective bonding surfaces of the first substrate 110A and the second substrate 110B are joined to each other in direct contact with each other) exists as a coupling structure that electrically couples the respective signal lines included in the first substrate 110A and the second substrate 110B to each other and electrically couples the respective power supply lines included in the first substrate 110A and the second substrate 110B to each other. In the solid-state imaging device, it is necessary to electrically couple all the respective signal lines included in the first substrate 110A, the second substrate 110B, and the third substrate 110C to each other and electrically couple all the respective power supply lines included in the first substrate 110A, the second substrate 110B, and the third substrate 110C to each other; therefore, the solid-state imaging device may be provided with a coupling structure for electrically coupling the respective signal lines included in the first substrate 110A and the third substrate 110C to each other and electrically coupling the respective power supply lines included in the first substrate 110A and the third substrate 110C to each other, and/or a coupling structure for electrically coupling the respective signal lines included in the second substrate 110B and the third substrate 110C to each other and electrically coupling the respective power supply lines included in the second substrate 110B and the third substrate 110C to each other, in addition to the above-described electrode junction structure 159. In the present embodiment, the solid-state imaging device is classified into 10 categories according to types of specific structures of these coupling structures.

The first configuration example (FIGS. 10A to 10E) is a configuration example in which the electrode junction structure 159 provided between the first substrate 110A and the second substrate 110B is provided as a coupling structure, but the twin contact type or shared contact type TSV 157 to be described later and another electrode junction structure 159 (i.e., the electrode junction structure 159 provided between the second substrate 110B and the third substrate 110C) do not exist. Accordingly, in the solid-state imaging device according to the first configuration example, electrical coupling between the respective signal lines included in the first substrate 110A and the third substrate 110C and between the respective power supply lines included in the first substrate 110A and the third substrate 110C, and/or electrical coupling between the respective signal lines included in the second substrate 110B and the third substrate 110C and between the respective power supply lines included in the second substrate 110B and the third substrate 110C are achieved through the I/O units. That is, the solid-state imaging device according to the first configuration example includes, as other coupling structures, the pad 151 that allows for electrical coupling between the respective signal lines included in the first substrate 110A and the third substrate 110C and between the respective power supply lines included in the first substrate 110A and the third substrate 110C and/or the pad 151 that allows for electrical coupling between the respective signal lines included in the second substrate 110B and the third substrate 110C and between the respective power supply lines included in the second substrate 110B and the third substrate 110C, together with the electrode junction structure 159 provided between the first substrate 110A and the second substrate 110B. Note that the solid-state imaging device 1 illustrated in FIG. 1 is also included in the first configuration example.

The second configuration example (FIGS. 11A to 11E) is a configuration example in which the twin contact type two-layer TSV 157 to be described later is provided as another coupling structure together with the electrode junction structure 159 provided between the first substrate 110A and the second substrate 110B. Here, the twin contact refers to a via having a structure in which electrically-conductive materials are embedded in a first through hole that exposes a predetermined wiring line and a second through hole that is different from the first through hole and exposes another wiring line different from the predetermined wiring line, or a structure in which films including electrically-conductive materials are formed on inner walls of the first through hole and the second through hole. In addition, in this specification, the two-layer TSV refers to a TSV provided to allow for electrical coupling between respective signal lines included in two adjacent substrates of the first substrate 110A, the second substrate 110B, and the third substrate 110C and between respective power supply lines included in the two adjacent substrates.

The third configuration example (FIGS. 12A to 12K) is a configuration example in which the twin contact type three-layer TSV 157 to be described later is provided as another coupling structure together with the electrode junction structure 159 provided between the first substrate 110A and the second substrate 110B. Note that in this specification, the three-layer TSV refers to a TSV extending over all the first substrate 110A, the second substrate 110B, and the third substrate 110C. The twin contact type three-layer TSV 157 formed from the back surface side of the first substrate 110A toward the third substrate 110C structurally allows for electrical coupling between the respective signal lines included in the first substrate 110A and the third substrate 110C and between the respective power supply lines included in the first substrate 110A and the third substrate 110C, or structurally allows for electrical coupling between the respective signal lines included in the second substrate 110B and the third substrate 110C and between the respective power supply lines included in the second substrate 110B and the third substrate 110C. In addition, the twin contact type three-layer TSV 157 formed from the back surface side of the third substrate 110C toward the first substrate 110A structurally allows for electrical coupling between the respective signal lines included in the first substrate 110A and the second substrate 110B and between the respective power supply lines included in the first substrate 110A and the second substrate 110B, or structurally allows for electrical coupling between the respective signal lines included in the first substrate 110A and the third substrate 110C and between the respective power supply lines included in the first substrate 110A and the third substrate 110C.

The fourth configuration example (FIGS. 13A to 13C) is a configuration example in which the shared contact type two-layer TSV 157 to be described later is provided as another coupling structure together with the electrode junction structure 159 provided between the first substrate 110A and the second substrate 110B. Here, the shared contact refers to a via having a structure in which an electrically-conductive material is embedded in one through hole provided to expose, while exposing a portion of a predetermined wiring line in one substrate, a predetermined wiring line in another substrate, or a structure in which a film including an electrically-conductive material is formed on an inner wall of the through hole. Each of the TSVs 421 and 432 illustrated in FIGS. 8F and 9G described above is a shared contact of a type in which the electrically-conductive material is embedded.

For example, in a case where the shared contact type TSV 157 that electrically couples the respective signal lines included in the first substrate 110A and the second substrate 110B to each other and electrically couples the respective power supply lines included in the first substrate 110A and the second substrate 110B to each other is formed from the back surface side of the first substrate 110A, first, a through hole is formed from the back surface side of the first substrate 110A for two wiring lines having an equal electric potential disposed side by side at a predetermined interval in the multi-layered wiring layer 105 of the first substrate 110A, and a wiring line located in the multi-layered wiring layer 125 of the second substrate 110B immediately below a space between the two wiring lines having an equal electric potential in the multi-layered wiring layer 105 of the first substrate 110A. The through hole has a diameter larger than that of the space between the two wiring lines having an equal electric potential, and is formed from immediately above the two wiring lines having an equal electric potential by dry etching. At this time, the through hole having the large diameter is formed not to expose the two wiring lines having an equal electric potential. Next, by photolithography and dry etching, a through hole having a diameter smaller than that of the space between the two wiring lines having an equal electric potential is formed to expose the wiring line in the multi-layered wiring layer 125 of the second substrate 110B located immediately below the space between the two wiring lines having an equal electric potential. Next, the through hole having the large diameter is grown by etchback, thereby exposing a portion of the two wiring lines having an equal electric potential in the multi-layered wiring layer 105 of the first substrate 110A. As a result, through the above processes, the through hole has a shape in which while a portion of the two wiring lines having an equal electric potential in the multi-layered wiring layer 105 of the first substrate 110A is exposed, the wiring line located immediately below the space between the two wiring lines in the multi-layered wiring layer 125 of the second substrate 110B is exposed. Then, an electrically-conductive material is embedded in the through hole, or a film including an electrically-conductive material is formed on an inner wall of the through hole, which makes it possible to form the shared contact type TSV. According to this method, the dry etching is not performed on the two wiring lines having an equal electric potential to form the through hole having the large diameter and the through hole having the small diameter, which makes it possible to suppress a situation in which corners of the two wiring lines having an equal electric potential are shaved and occurrence of contamination. This makes it possible to achieve a more reliable solid-state imaging device 1.

Note that in the above-described example, a case where the shared contact type TSV 157 that electrically couples the respective signal lines included in the first substrate 110A and the second substrate 110B to each other and electrically couples the respective power supply lines included in the first substrate 110A and the second substrate 110B to each other is formed from the back surface side of the first substrate 110A has been described, but the same applies to a case where the shared contact type TSV 157 that electrically couples the respective signal lines included in the second substrate 110B and the third substrate 110C to each other and electrically couples the respective power supply lines included in the second substrate 110B and the third substrate 110C to each other is formed from the front surface side of the second substrate 110B or from the back surface side of the third substrate 110C, and a case where the shared contact type three-layer TSV 157 to be described later is formed from the back surface side of the first substrate 110A or from the back surface side of the third substrate 110C. In addition, in the above-described example, the through hole is provided to pass through a space between two wiring lines disposed side by side with a predetermined interval, but, for example, a ring-shaped wiring line having an opening may be formed, and the through hole may be provided to pass through the opening of the wiring line.

Alternatively, it is possible to form the shared contact type TSV 157 by a method other than the method described above. For example, similarly to the case described above, in a case where the shared contact type TSV 157 that electrically couples the respective signal lines in the first substrate 110A and the second substrate 110B to each other and electrically couples the respective power supply lines included in the first substrate 110A and the second substrate 110B to each other is formed from the back surface side of the first substrate 110A, when a through hole having a diameter larger than that of the space between the two wiring lines having an equal electric potential in the multi-layered wiring layer 105 of the first substrate 110A is formed from the back surface side of the first substrate 110A from immediately above the two wiring lines having an equal electric potential by dry etching, the dry etching may be continued as it is without stopping the dry etching in the middle to prevent the two wiring lines having an equal electric potential from being exposed, while exposing a portion of the two wiring lines having an equal electric potential. In this case, for the through hole, etching of the two wiring lines having an equal electric potential hardly proceeds by etching selectivity between an electrically-conductive material (e.g., Cu) included in the two wiring lines having an equal electric potential and an insulating material (e.g., $SiO_2$) included in the insulating film 103, and the etching of the insulating film 103 may proceed in the space between the two wiring lines having an equal electric potential. As a result, the through hole has a shape in which the wiring line located immediately below the space between the two wiring lines in the multi-layered wiring layer 125 of the second substrate 110B is exposed while a portion of the two wiring lines having an equal electric potential in the multi-layered wiring layer 105 of the first substrate 110A is exposed. The shared contact type TSV 157 may be formed by embedding an electrically-conductive material in the through hole thus formed or by forming a film including an electrically-conductive material on the inner wall of the through hole.

Moreover, the shared contact type TSV 157 is not necessarily provided to pass through the space between the two wiring lines having an equal electric potential or the opening of the ring-shaped wiring line. For example, in a case where the through hole is formed, the number of wiring lines located in an upper layer (in the above-described example, the wiring line in the multi-layered wiring layer 105 of the first substrate 110A) may be one. Specifically, for example, in a case where the shared contact type TSV 157 that electrically couples the respective signal lines included in the first substrate 110A and the second substrate 110B to each other and electrically couples the respective power supply lines included in the first substrate 110A and the second substrate 110B to each other is formed from the back surface side of the first substrate 110A as described above, the through hole may be formed to have a shape in which the wiring line in the multi-layered wiring layer 125 of the second substrate 110B is exposed while a portion of one wiring line in the multi-layered wiring layer 105 of the first substrate 110A is exposed. Then, the shared contact type TSV 157 may be formed by embedding an electrically-conductive material in the through hole or by forming a film including an electrically-conductive material on the inner wall of the through hole. However, in this mode, there is one wiring line in the upper layer, which causes a concern that the through hole is formed without exposing the wiring line in the upper layer due to, for example, misalignment or the like, as compared with a case where the number of wiring lines in the upper layer is two, or a case where the wiring line in the upper layer has a ring shape having an opening, and a contact defect is thus likely to occur. Therefore, the mode in which the number of wiring lines is one is preferably applied to a case where it is possible to have a margin enough for overlap between the through hole and the one wiring line to be able to ensure contactability between the TSV 157 and the one wiring line.

The fifth configuration example (FIGS. 14A to 14F) is a configuration example in which the shared contact type three-layer TSV 157 to be described later is provided as another coupling structure together with the electrode junction structure 159 provided between the first substrate 110A and the second substrate 110B. The shared contact type three-layer TSV 157 structurally allows for electrical coupling between respective signal lines included on at least two substrates of the first substrate 110A, the second substrate 110B, and the third substrate 110C and between respective power supply lines included on the at least two substrates of the first substrate 110A, the second substrate 110B, and the third substrate 110C.

The sixth configuration example (FIGS. 15A to 15J) is a configuration example in which the electrode junction structure 159 is further provided between the second substrate 110B and the third substrate 110C as another coupling structure, together with the electrode junction structure 159 provided between the first substrate 110A and the second substrate 110B. In this specification, as in the sixth configuration example, in a case where the electrode junction structures 159 exist on both of the two bonding surfaces, for distinction between the electrode junction structures 159, the electrode junction structure 159 existing between the first substrate 110A and the second substrate 110B is referred to as the electrode junction structure 159a, and the electrode junction structure 159 existing between the second substrate 110B and the third substrate 110C is referred to as the electrode junction structure 159b.

The seventh configuration example (FIGS. 16A to 16F) is a configuration example in which, together with the electrode junction structure 159a provided between the first substrate 110A and the second substrate 110B, the electrode junction structure 159b provided between the second substrate 110B and the third substrate 110C and the twin contact type two-layer TSV 157 to be described later are provided as other coupling structures.

The eighth configuration example (FIGS. 17A to 17L) is a configuration example in which, together with the electrode junction structure 159a provided between the first substrate 110A and the second substrate 110B, the electrode junction structure 159b provided between the second substrate 110B and the third substrate 110C and the twin contact type three-layer TSV 157 to be described later are provided as other coupling structures.

The ninth configuration example (FIGS. 18A to 18C) is a configuration example in which, together with the electrode junction structure 159a provided between the first substrate 110A and the second substrate 110B, the electrode junction structure 159b provided between the second substrate 110B and the third substrate 110C and the shared contact type two-layer TSV 157 to be described later are provided as other coupling structures.

The seventh configuration example (FIGS. 19A to 19F) is a configuration example in which, together with the electrode junction structure 159a provided between the first substrate 110A and the second substrate 110B, the electrode junction structure 159b provided between the second substrate 110B and the third substrate 110C and the shared contact type three-layer TSV 157 to be described later are provided as other coupling structures.

Hereinafter, the first to tenth configuration examples will be described in order. Note that in the following respective diagrams, examples of coupling structures at least included in the solid-state imaging device according to the present embodiment are illustrated. The configurations illustrated in the following respective diagrams do not mean that the solid-state imaging device according to the present embodiment has only the illustrated coupling structures, and the solid-state imaging device may appropriately have a coupling structure other than the illustrated coupling structures. In the following description of the respective diagrams, the first metal wiring layer is, for example, a Cu wiring layer, and the second metal wiring layer is, for example, an Al wiring layer.

5-1. First Configuration Example

FIGS. 10A to 10E are vertical cross-sectional views of a schematic configuration of a solid-state imaging device according to the first configuration example of the present embodiment. The solid-state imaging device according to the present embodiment may have any of configurations illustrated in FIGS. 10A to 10E.

Figure 10A:
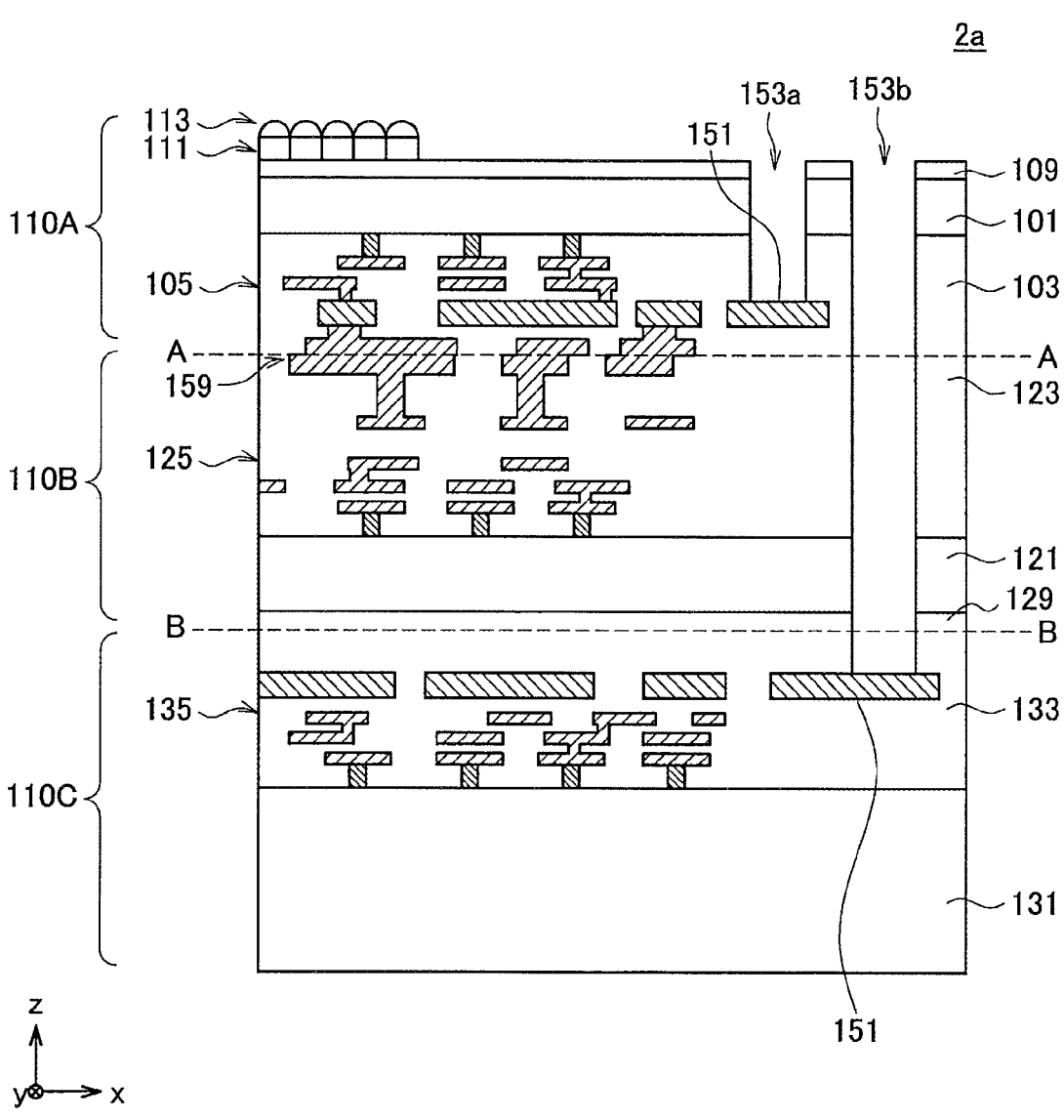
FIG. 10A is a vertical cross-sectional view of a schematic configuration of a solid-state imaging device according to a first configuration example of the present embodiment.

A solid-state imaging device 2a illustrated in FIG. 10A includes, as coupling structures, the electrode junction structure 159 provided between the first substrate 110A and the second substrate 110B, the pad 151 provided in the multi-layered wiring layer 105 of the first substrate 110A and the pad opening 153a exposing the pad 151, and the pad 151 provided in the multi-layered wiring layer 135 of the third substrate 110C and the pad opening 153b exposing the pad 151. The electrode junction structure 159 electrically couples respective signal lines included in the first substrate 110A and the second substrate 110B to each other and electrically couples the respective power supply lines included in the first substrate 110A and the second substrate 110B to each other. The pads 151 and the pad openings 153a and 153b may electrically couple the respective signal lines included in the first substrate 110A and the third substrate 110C to each other and electrically couple the respective power supply lines included in the first substrate 110A and the third substrate 110C to each other.

Figure 10B:
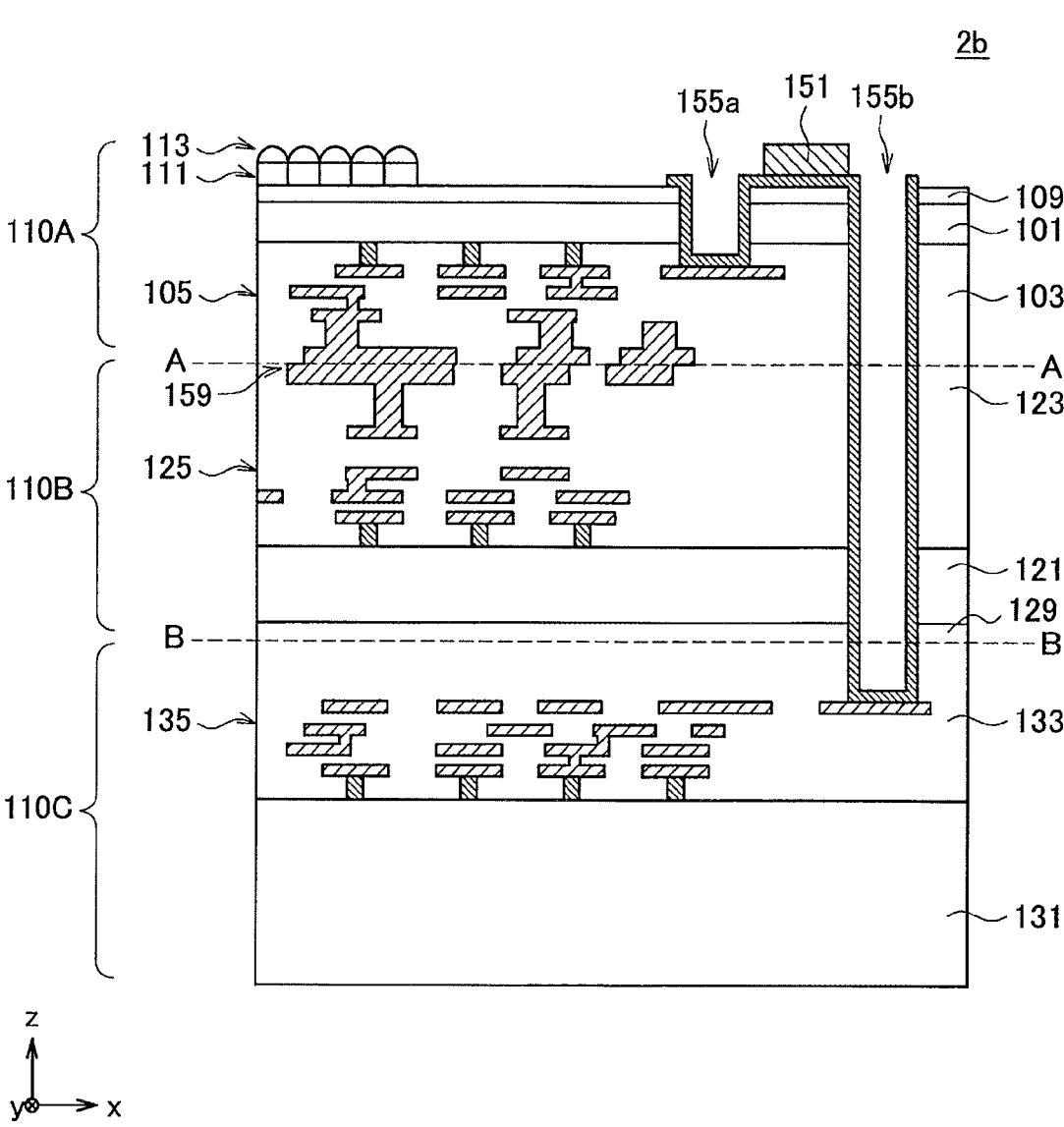
FIG. 10B is a vertical cross-sectional view of the schematic configuration of the solid-state imaging device according to the first configuration example of the present embodiment.

A solid-state imaging device 2b illustrated in FIG. 10B includes, as coupling structures, the electrode junction structure 159 provided between the first substrate 110A and the second substrate 110B, the lead line opening 155a drawing a predetermined wiring line in the multi-layered wiring layer 105 of the first substrate 110A, the lead line opening 155b drawing a predetermined wiring line in the multi-layered wiring layer 135 of the third substrate 110C, and the pad 151 disposed on a surface on the back side of the first substrate 110A and electrically coupled to the predetermined wiring lines by electrically-conductive materials included in the lead line openings 155a and 155b.

Each of the lead line openings 155a and 155b here is an opening for drawing a predetermined wiring line in a corresponding one of the substrates 110A, 110B, and 110C (in the illustrated example, a predetermined wiring line in the first substrate 110A and a predetermined wiring line the third substrate 110C) to the outside. Each of the lead line openings 155a and 155b has a structure in which a film including an electrically-conductive material (e.g., W) is formed on an inner wall of an opening formed to expose a wiring line that is a target to be drawn. This film including the electrically-conductive material extends from the inside of each of the lead line opening 155a and 155b onto the surface on the back side of the first substrate 110A as illustrated in the diagram. The pad 151 is formed on a film including the extended electrically-conductive material, and is electrically coupled, by the film including the electrically-conductive material, to the wiring lines in the substrates drawn by the lead line openings 155a and 155b. In the configuration illustrated in FIG. 10B, the lead line openings 155a and 155b are configured to draw a predetermined wiring line of the first metal wiring layer in the multi-layered wiring layer 105 of the first substrate 110A and a predetermined wiring line of the first metal wiring layer in the multi-layered wiring layer 135 of the third substrate 110C. Note that a film including an electrically-conductive material formed on the inner wall of an opening in the lead line opening 155 is not limited to W, and any of various known electrically-conductive materials may be used as the electrically-conductive material.

As illustrated in FIG. 10B, this specification also refers, as lead pad structure, to the structure in which the pad 151 disposed on the back surface side of the first substrate 110A is electrically coupled to the wiring lines drawn by the lead line openings 155*a* and 155*b*. Moreover, this specification also refers to a structure in which the pad opening 153*a* is provided for the pad 151 formed in the substrate as illustrated in FIG. 10A, for example, as embedded pad structure (the structure illustrated in FIG. 1 is also an embedded pad structure) in contrast to the lead pad structure. It can be said that the lead pad structure is a structure in which the pad 151 formed in the substrate in the embedded pad structure is drawn to the outside of the substrate (onto the surface on the back side of the first substrate 110A). Note that in this specification, in a case where a plurality of lead line openings 155 exists in the diagram as illustrated in FIG. 6D, the plurality of lead line openings 155 is distinguished by attaching different alphabets to ends of the reference numerals such as the lead line opening 155*a* and the lead line opening 155*b*, for the sake of convenience.

Moreover, in the configuration illustrated in FIG. 10B, the respective wiring lines drawn by the two lead line openings 155*a* and 155*b* are electrically coupled to the same pad 151. The present embodiment is not, however, limited to such an example, and a plurality of pads 151 may be provided to correspond to the respective wiring lines drawn by the lead line openings 155*a* and 155*b*.

Figure 10C:
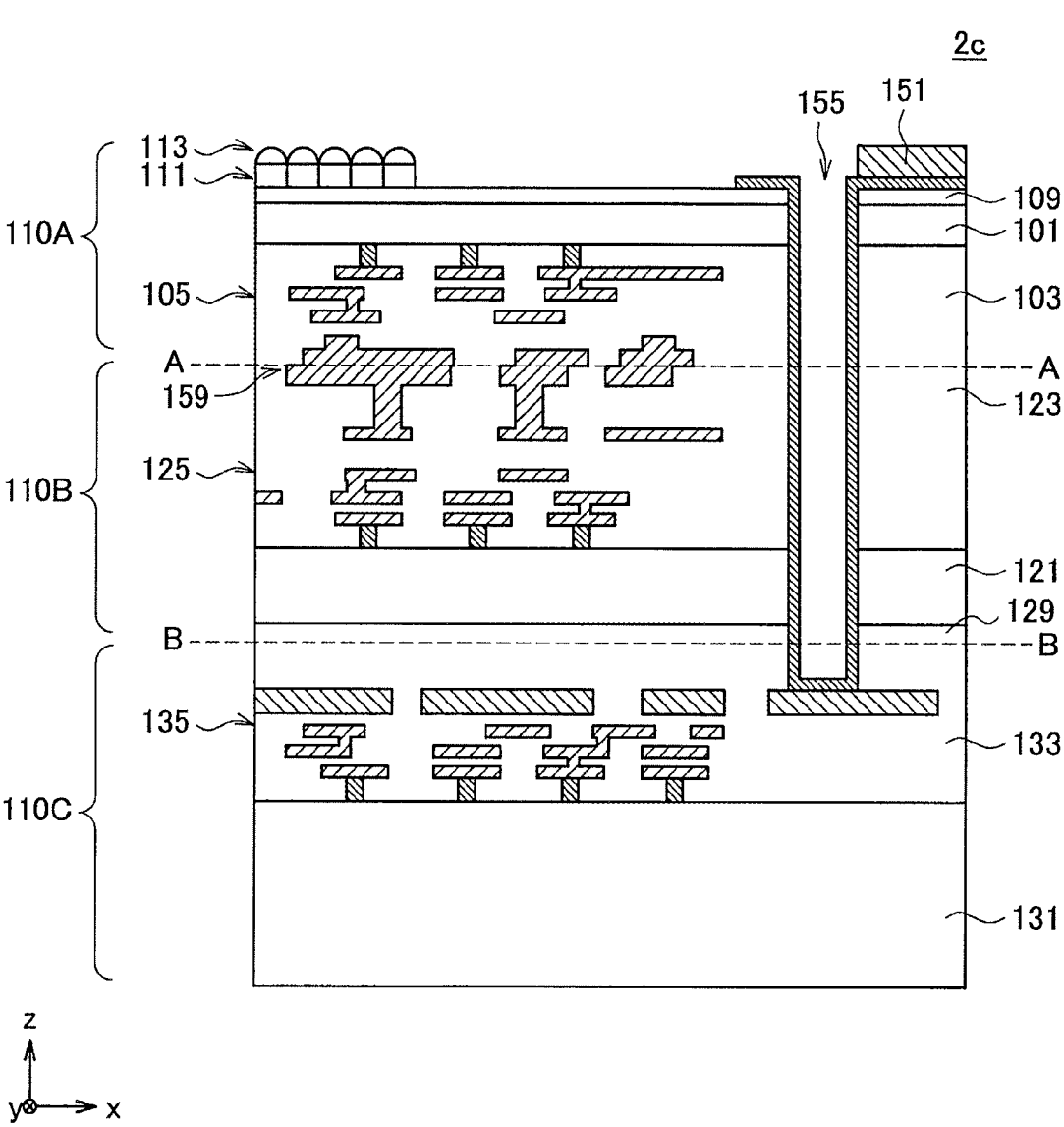
FIG. 10C is a vertical cross-sectional view of the schematic configuration of the solid-state imaging device according to the first configuration example of the present embodiment.

A solid-state imaging device 2*c* illustrated in FIG. 10C corresponds to the solid-state imaging device 2*b* illustrated in FIG. 10B in which the configuration of the lead pad structure pad is changed. Specifically, in the configuration illustrated in FIG. 10C, only one lead line opening 155 is provided for a predetermined wiring line in the multi-layered wiring layer 135 of the third substrate 110C. Moreover, in the configuration illustrated in FIG. 10C, the second metal wiring layer is provided in the multi-layered wiring layer 135 of the third substrate 110C, and the lead line opening 155 is configured to draw a predetermined wiring line of the second metal wiring layer.

Figure 10D:
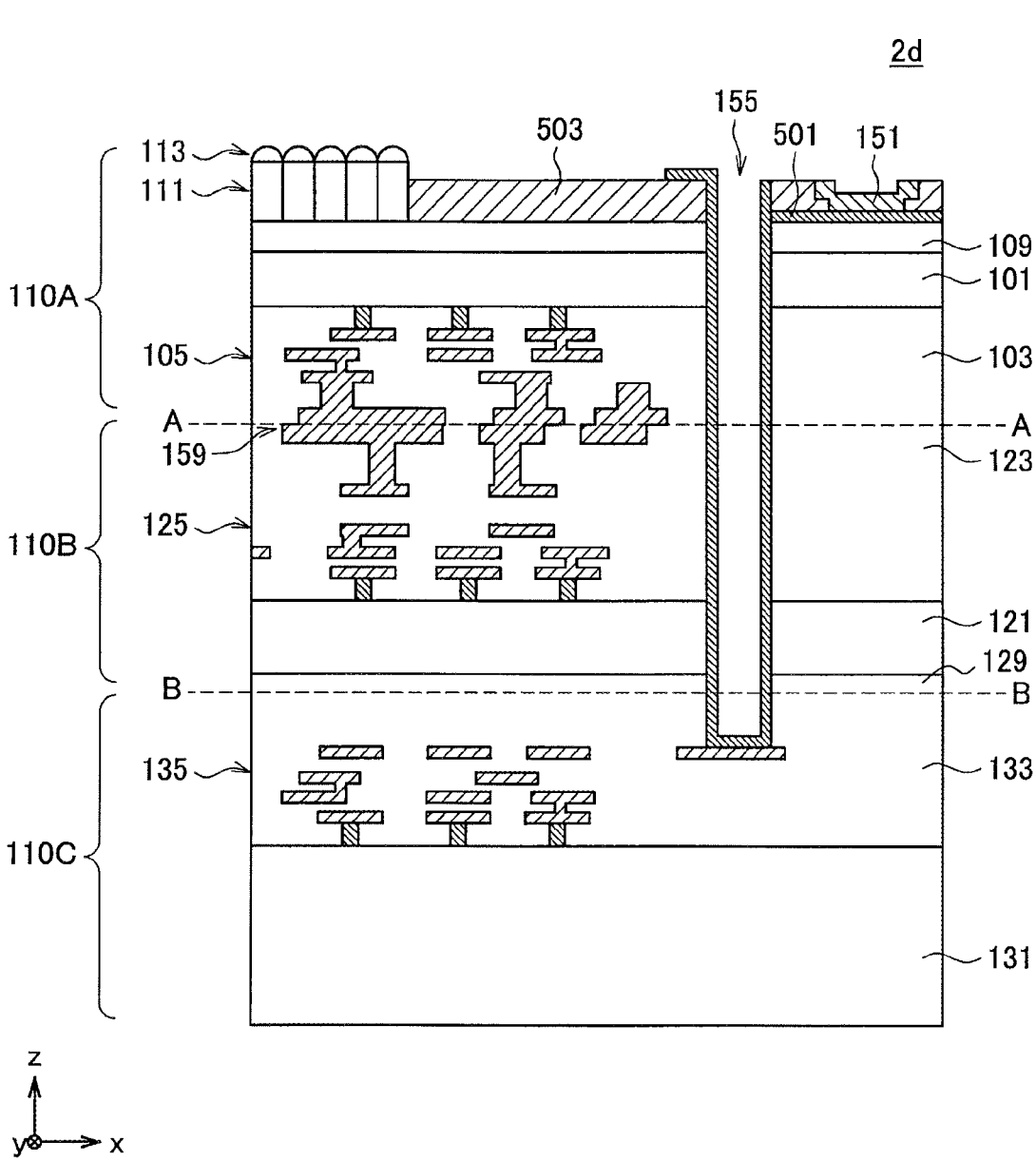
FIG. 10D is a vertical cross-sectional view of the schematic configuration of the solid-state imaging device according to the first configuration example of the present embodiment.

A solid-state imaging device 2*d* illustrated in FIG. 10D corresponds to the solid-state imaging device 2*c* illustrated in FIG. 10C in which the disposition of the pad 151 is changed. Specifically, in the solid-state imaging device 2*c* illustrated in FIG. 10C, the electrically-conductive material included in the lead line opening 155 extends to the surface on the back side of the first substrate 110A, and the pad 151 is formed on a film including the extended electrically-conductive material, but in the solid-state imaging device 2*d*, the pad 151 is formed on an electrically-conductive material film 501 extended in the first substrate 110A for another purpose irrespective of the lead line opening 155. Then, the electrically-conductive material included in the lead line opening 155 and the electrically-conductive material film 501 are electrically coupled to each other, thereby electrically coupling the wiring line drawn by the lead line opening 155 and the pad 151 to each other.

For example, in the pixel unit of the first substrate 110A, in order to suppress light leakage between adjacent pixels, a light-shielding film including a metal material and having openings in portions corresponding to respective pixels may be provided between a CF and the back surface of the semiconductor substrate 101 (i.e., between the CF and the PD of a diffusion layer of the semiconductor substrate 101) (the pixels are two-dimensionally arranged; therefore, the metal material included in the light-shielding film exists only between the pixels, i.e., exists in the shape of a grid in the pixel unit). For example, W may be used as the metal material.

In the configuration example illustrated in FIG. 10D, the metal material included in the light-shielding film is extended to a position where the I/O unit is formed of the outer periphery of the chip to function as the electrically-conductive material film 501 described above (although not illustrated, in FIG. 10D and FIG. 10E to be described later, the electrically-conductive material film 501 functioning as the light-shielding film also exists in the pixel unit). At this time, a resin film 503 including a resin material having insulating properties is formed on the electrically-conductive material film 501 (i.e., the light-shielding film) in a region other than the pixel unit not to expose the electrically-conductive material film 501. The material of the resin film 503 is not limited, but, for example, the resin film 503 may be formed using the same material as the CF. In this case, it is possible to form the resin film 503 simultaneously with the CF layer 111, which makes it possible to simplify the process.

The pad 151 is formed to be embedded in the resin film 503 in a manner that a bottom portion of the pad 151 is in contact with the electrically-conductive material film 501. Then, the lead line opening 155 is formed to allow a film including an electrically-conductive material formed on a side wall of the opening and the electrically-conductive material film 501 to be in contact with each other on the side wall. As a result, the wiring line drawn by the lead line opening 155 and the pad 151 are electrically coupled to each other. Note that in the configuration illustrated in FIG. 10D, the lead line opening 155 is configured to draw a predetermined wiring line of the first metal wiring layer in the multi-layered wiring layer 135 of the third substrate 110C.

Figure 10E:
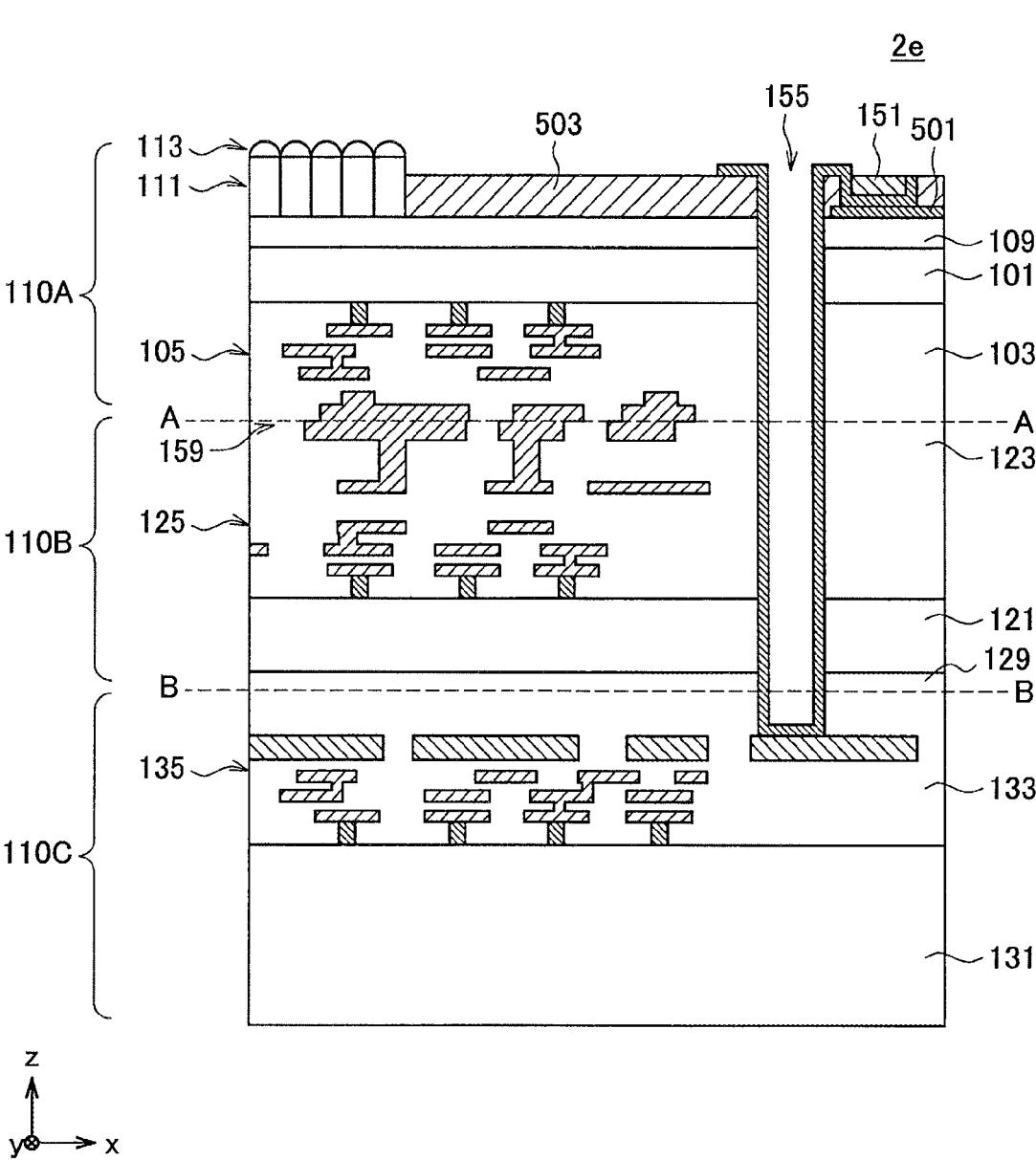
FIG. 10E is a vertical cross-sectional view of the schematic configuration of the solid-state imaging device according to the first configuration example of the present embodiment.

A solid-state imaging device 2*e* illustrated in FIG. 10E corresponds to the solid-state imaging device 2*d* illustrated in FIG. 10D in which the disposition of the pad 151 is changed. Specifically, also in the solid-state imaging device 2*e*, similarly to the solid-state imaging device 2*d*, the wiring line drawn by the lead line opening 155 and the pad 151 are electrically coupled to each other through the electrically-conductive material film 501, but in the solid-state imaging device 2*e*, the electrically-conductive material included in the lead line opening 155 is extended on the electrically-conductive material film 501 to be in contact with the electrically-conductive material film 501, and the pad 151 is formed on a film including the extended electrically-conductive material. That is, the lead pad structure illustrated in FIG. 10E has a structure in which the electrically-conductive material included in the lead line opening 155 and the pad are embedded in the resin film 503, as illustrated in the diagram. Note that in the configuration illustrated in FIG. 10E, the lead line opening 155 is configured to draw a predetermined wiring line of the second metallic wiring layer in the multi-layered wiring layer 135 of the third substrate 110C.

Note that this specification also refers to the lead pad structure in which the pad 151 is embedded in a film on the surface on the back side of the first substrate 110A as illustrated in FIGS. 10D and 10E as an embedded lead pad structure. The embedded lead pad structure also encompasses a structure in which the pad 151 is embedded in the insulating film 109, such as a structure illustrated in FIG. 11E to be described later. Further, In contrast, a lead pad structure in which the pad 151 is disposed on the surface on the back side of the first substrate 110A without being embedded in a film, as illustrated in FIGS. 10B and 10C, is also referred to as a non-embedded lead pad structure.

Although not illustrated, in the configurations illustrated in FIGS. 10C to 10E, in addition to the illustrated lead pad structure, the embedded pad structure and/or the lead pad structure are provided in the first substrate 110A and/or the second substrate 110B. These structures may electrically couple the respective signal lines included in the first substrate 110A and the third substrate 110C to each other and electrically couple the respective power supply lines included in the first substrate 110A and the third substrate 110C to each other, and/or may electrically couple the respective signal lines included in the second substrate 110B and the third substrate 110C to each other and electrically couple the respective power supply lines included in the second substrate 110B and the third substrate 110C to each other.

Although not illustrated in other diagrams, any of the solid-state imaging devices according to the present embodiment may be provided with the electrically-conductive material film 501 that may function as a light-shielding film as illustrated in FIGS. 10D and 10E.

5-2. Second Configuration Example

FIGS. 11A to 11E are vertical cross-sectional views of a schematic configuration of a solid-state imaging device according to the second configuration example of the present embodiment. The solid-state imaging device according to the present embodiment may have any of configurations illustrated in FIGS. 11A to 11E.

Figure 11A:
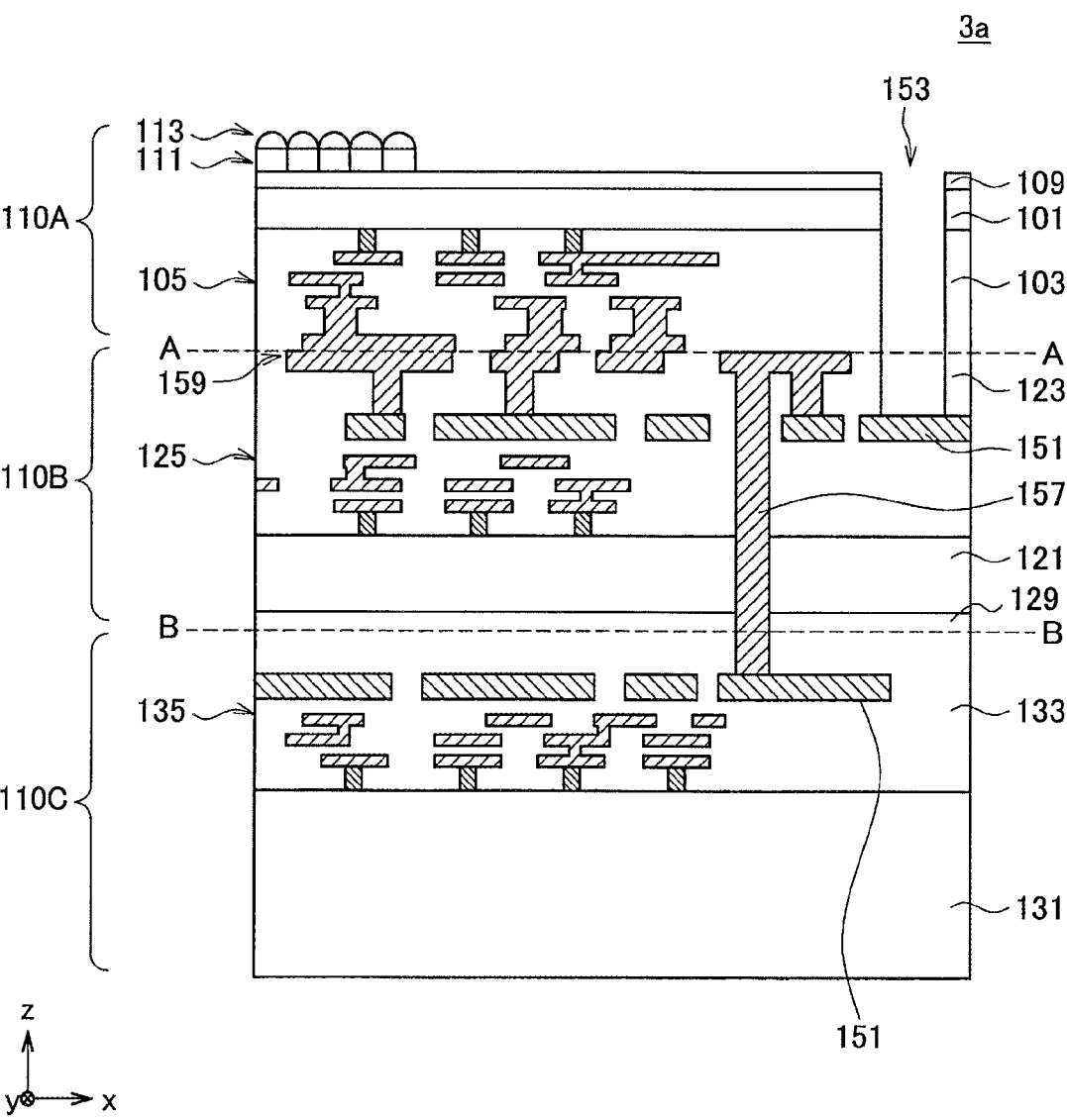
FIG. 11A is a vertical cross-sectional view of a schematic configuration of a solid-state imaging device according to a second configuration example of the present embodiment.

A solid-state imaging device 3a illustrated in FIG. 11A includes, as coupling structures, the electrode junction structure 159 provided between the first substrate 110A and the second substrate 110B, the twin contact type two-layer TSV 157, and an embedded pad structure for the second substrate 110B (i.e., the pad 151 provided in the multi-layered wiring layer 125 of the second substrate 110B, and the pad opening 153 exposing the pad 151). The electrode junction structure 159 electrically couples the respective signal lines included in the first substrate 110A and the second substrate 110B to each other and electrically couples the respective power supply lines included in the first substrate 110A and the second substrate 110B to each other. Moreover, the TSV 157 is provided from the front surface side of the second substrate 110B toward the third substrate 110C to electrically couple the respective signal lines included in the second substrate 110B and the third substrate 110C to each other and electrically couple the respective power supply lines included in the second substrate 110B and the third substrate 110C to each other. Note that in the configuration illustrated in FIG. 11A, the TSV 157 electrically couples a predetermined wiring line of the second metal wiring layer in the multi-layered wiring layer 125 of the second substrate 110B and a predetermined wiring line of the second metal wiring layer in the multi-layered wiring layer 135 of the third substrate 110C to each other.

Figure 11B:
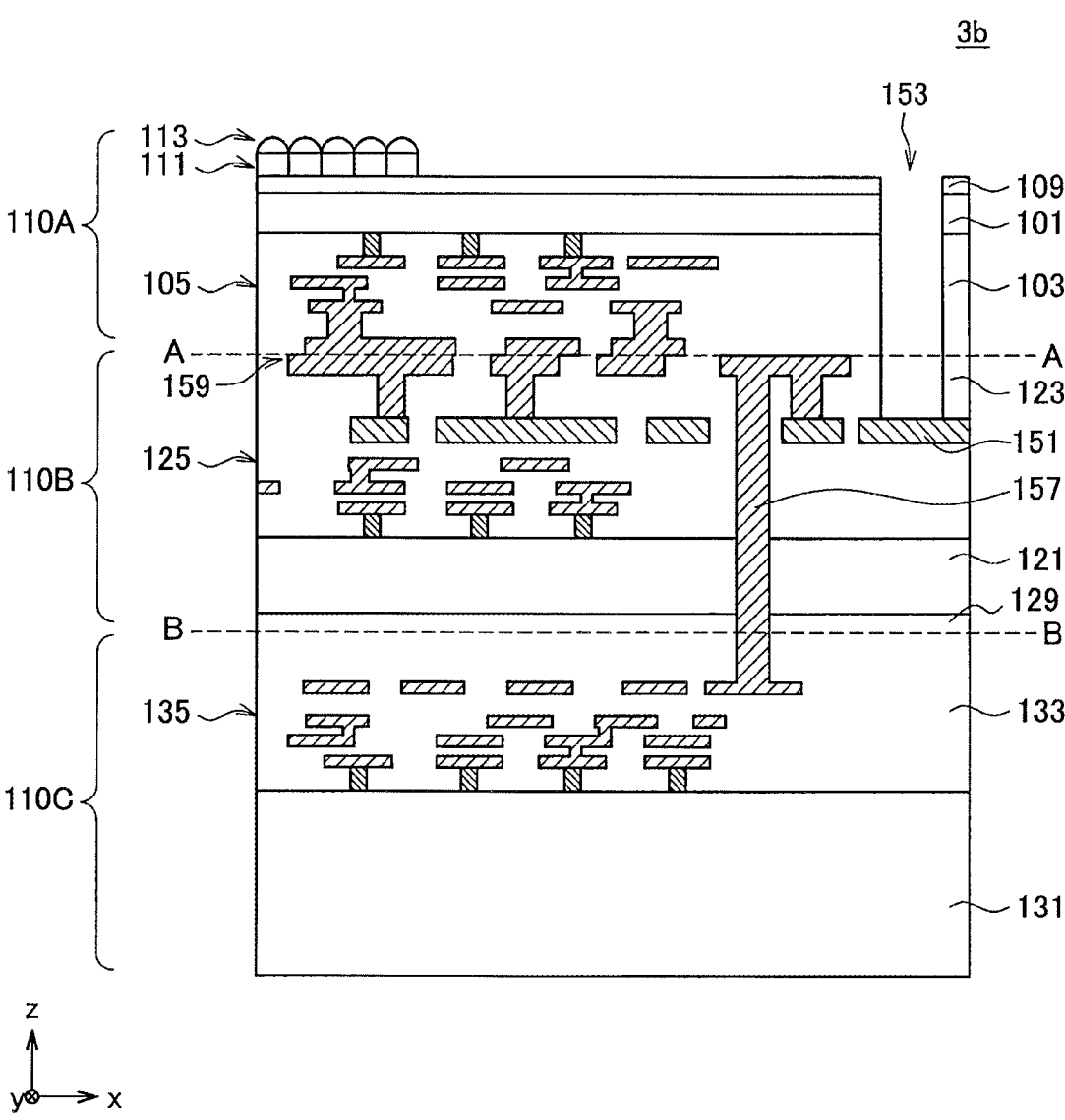
FIG. 11B is a vertical cross-sectional view of the schematic configuration of the solid-state imaging device according to the second configuration example of the present embodiment.

A solid-state imaging device 3b illustrated in FIG. 11B corresponds to the solid-state imaging device 3a illustrated in FIG. 11A in which the type (material) of the wiring lines electrically coupled to each other by the twin contact type two-layer TSV 157. Specifically, in the configuration illustrated in FIG. 11B, the TSV 157 electrically couples a predetermined wiring line of the second metal wiring layer in the multi-layered wiring layer 125 of the second substrate 110B and a predetermined wiring line of the first metal wiring layer in the multi-layered wiring layer 135 of the third substrate 110C to each other.

Figure 11C:
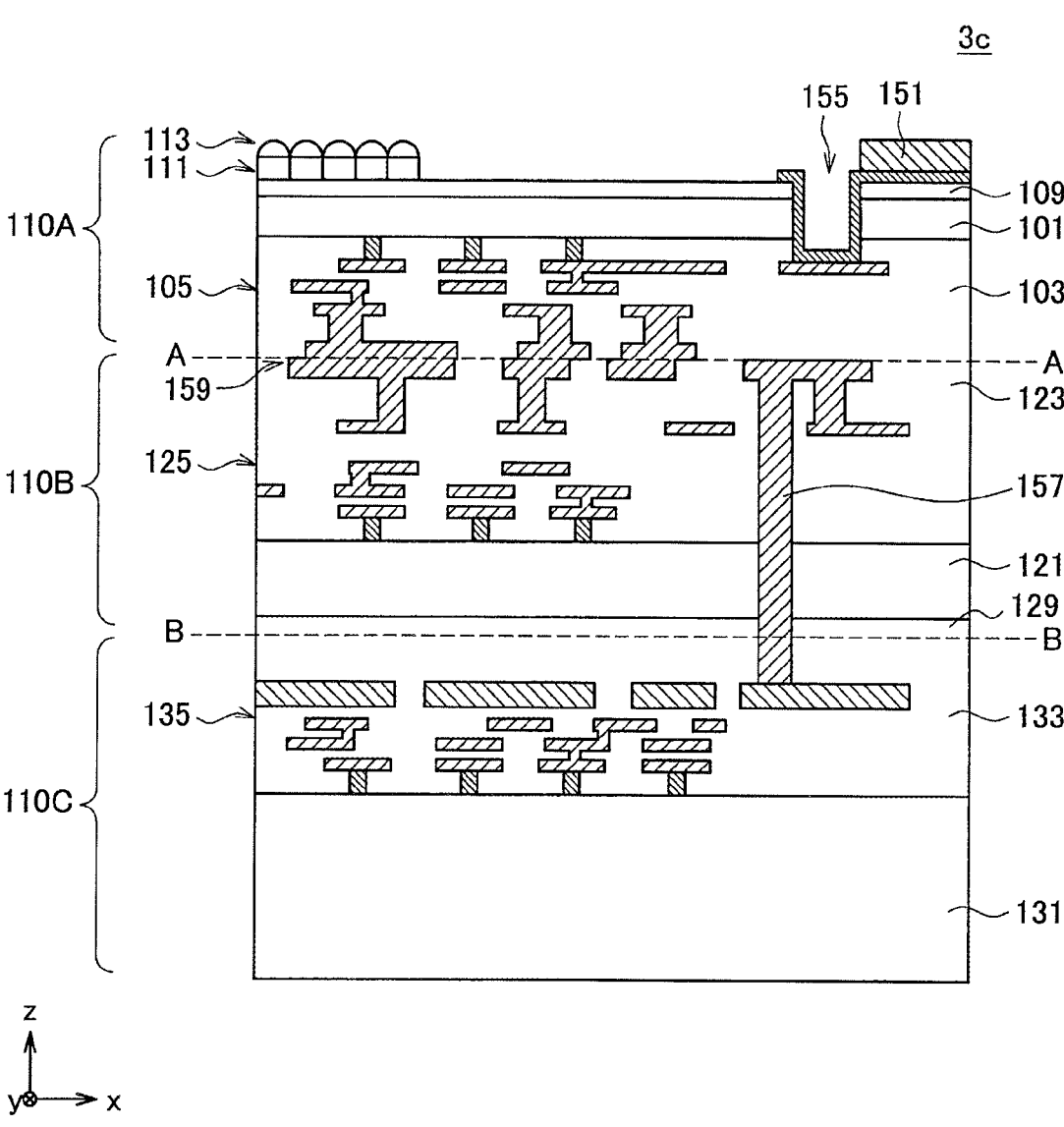
FIG. 11C is a vertical cross-sectional view of the schematic configuration of the solid-state imaging device according to the second configuration example of the present embodiment.

A solid-state imaging device 3c illustrated in FIG. 11C corresponds to the solid-state imaging device 3a illustrated in FIG. 11A in which the embedded pad structure and the types of wiring lines electrically coupled to each other by the twin contact type two-layer TSV 157 are changed. Specifically, in the configuration illustrated in FIG. 11C, a non-embedded lead pad structure for a predetermined wiring line in the multi-layered wiring layer 105 of the first substrate 110A (i.e., the lead line opening 155 for the predetermined wiring line in the multi-layered wiring layer 105 of the first substrate 110A and the pad 151 on the surface on the back side of the first substrate 110A) is provided instead of the embedded pad structure. Further, in the configuration illustrated in FIG. 11C, the TSV 157 electrically couples a predetermined wiring line of the first metal wiring layer in the multi-layered wiring layer 125 of the second substrate 110B and a predetermined wiring line of the second metal wiring layer in the multi-layered wiring layer 135 of the third substrate 110C to each other.

Figure 11D:
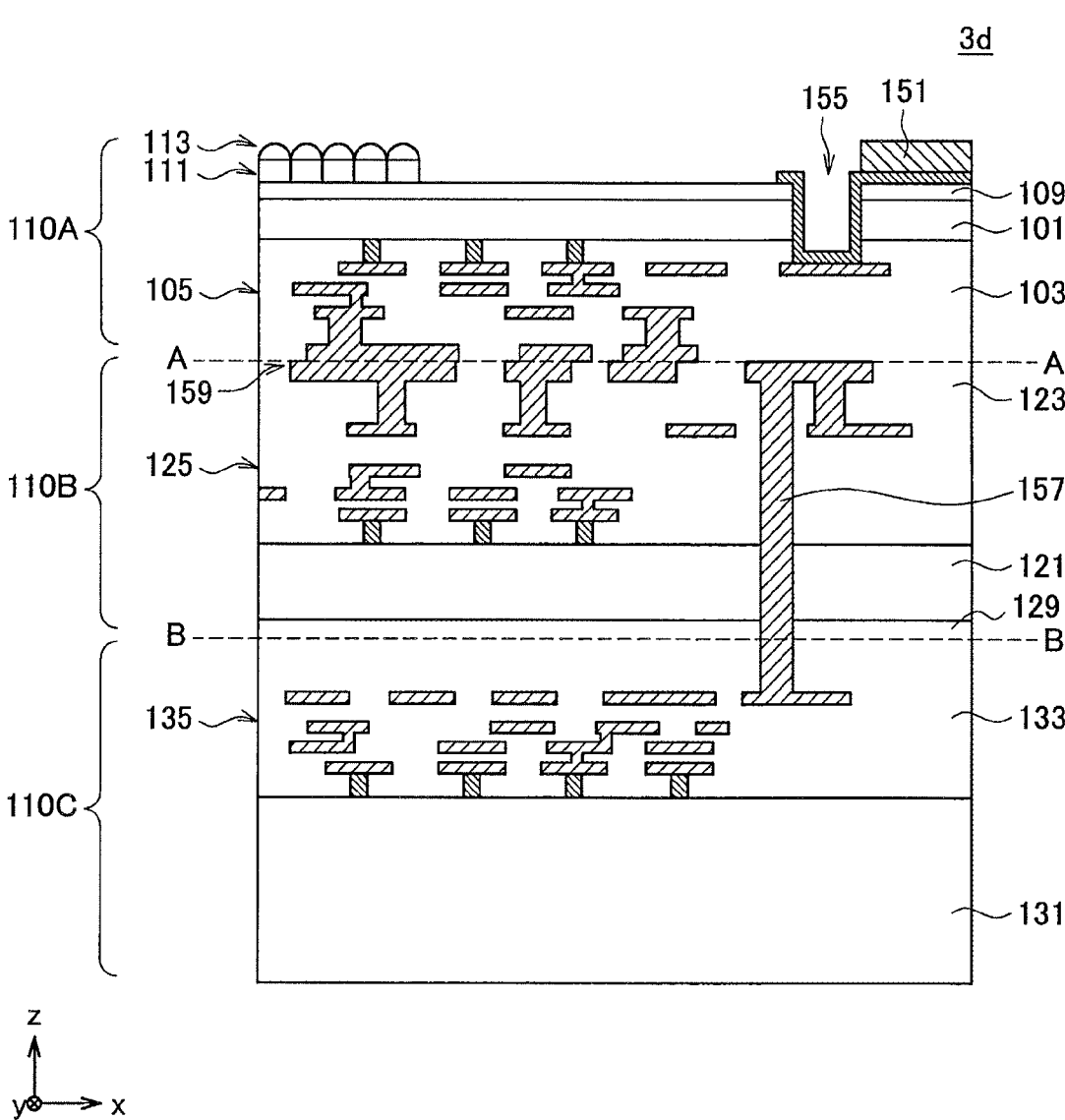
FIG. 11D is a vertical cross-sectional view of the schematic configuration of the solid-state imaging device according to the second configuration example of the present embodiment.

A solid-state imaging device 3d illustrated in FIG. 11D corresponds to the solid-state imaging device 3c illustrated in FIG. 11C in which the types of wiring lines electrically coupled to each other by the twin contact type two-layer TSV 157 are changed. Specifically, in the configuration illustrated in FIG. 11D, the TSV 157 electrically couples a predetermined wiring line of the first metal wiring layer in the multi-layered wiring layer 125 of the second substrate 110B and a predetermined wiring line of the first metal wiring layer in the multi-layered wiring layer 135 of the third substrate 110C to each other.

Figure 11E:
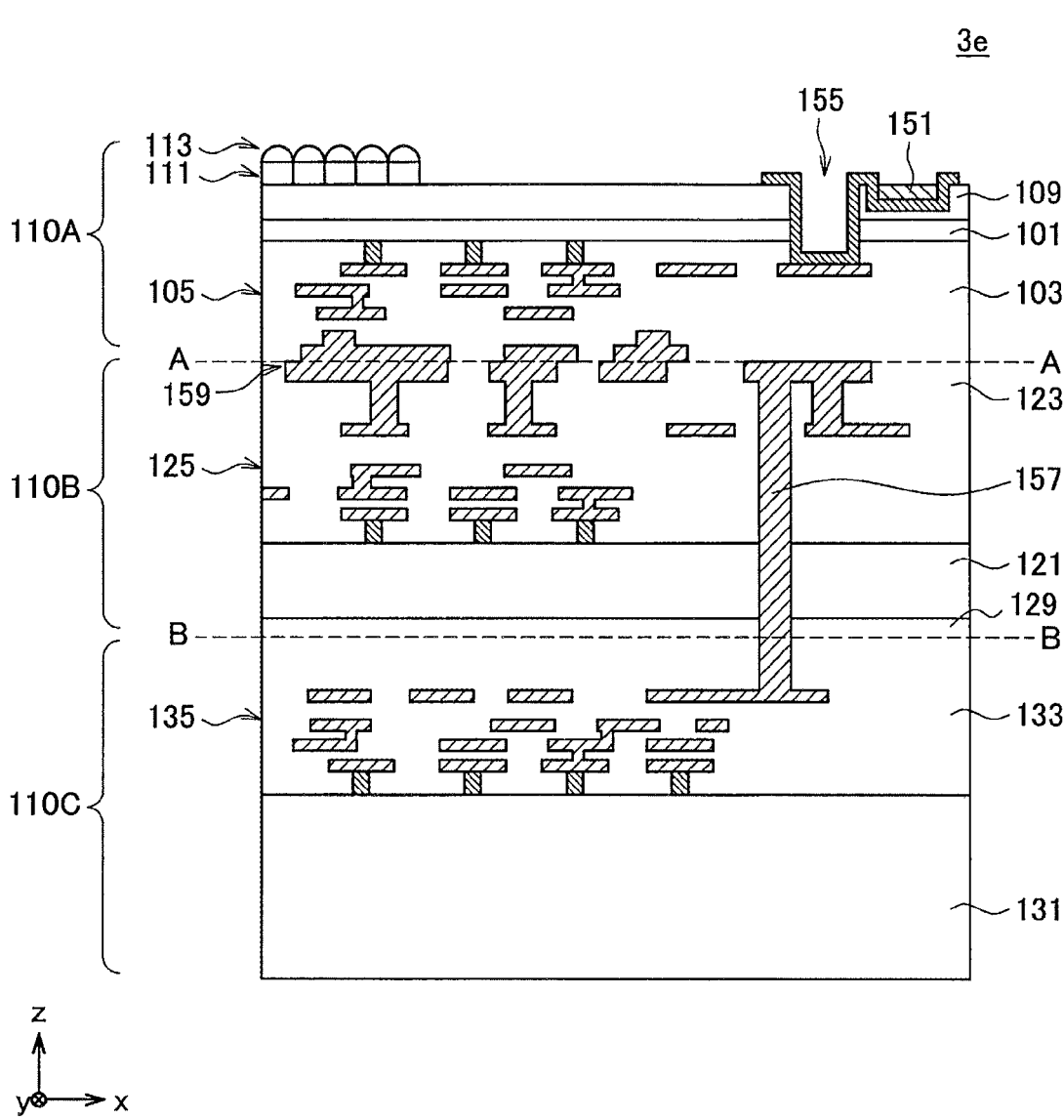
FIG. 11E is a vertical cross-sectional view of the schematic configuration of the solid-state imaging device according to the second configuration example of the present embodiment.

A solid-state imaging device 3e illustrated in FIG. 11E corresponds to the solid-state imaging device 3d illustrated in FIG. 11D in which the configuration of the lead pad structure is changed. Specifically, in the configuration illustrated in FIG. 11E, an embedded lead pad structure in which a film including an electrically-conductive material included in the lead line opening 155 and the pad 151 formed on the film are both embedded in the insulating film 109 is provided as the lead pad structure.

Note that in the respective configurations illustrated in FIGS. 11A to 11E, the types of wiring lines electrically coupled to each other by the twin contact type two-layer TSV 157 are not limited. The TSV 157 may be coupled to a predetermined wiring line of the first metal wiring layer or may be coupled to a predetermined wiring line of the second metal wiring layer. For example, in the configuration illustrated in FIG. 11E, one or both of the wiring lines to which the TSV 157 is coupled may be changed to a predetermined wiring line of the second metal wiring layer. Moreover, each of the multi-layered wiring layers 105, 125, and 135 may include only the first metal wiring layer, may include only the second metal wiring layer, or may include both the first metal wiring layer and the second metal wiring layer.

Further, in the respective configurations illustrated in FIGS. 11A to 11E, the TSV 157 is formed from the front surface side of the second substrate 110B toward the third substrate 110C, but the present embodiment is not limited to such an example. The TSV 157 may be formed from the back surface side of the third substrate 110C toward the second substrate 110B.

5-3. Third Configuration Example

FIGS. 12A to 12K are vertical cross-sectional views of a schematic configuration of a solid-state imaging device according to the third configuration example of the present embodiment. The solid-state imaging device according to the present embodiment may have any of configurations illustrated in FIGS. 12A to 12K.

Figure 12A:
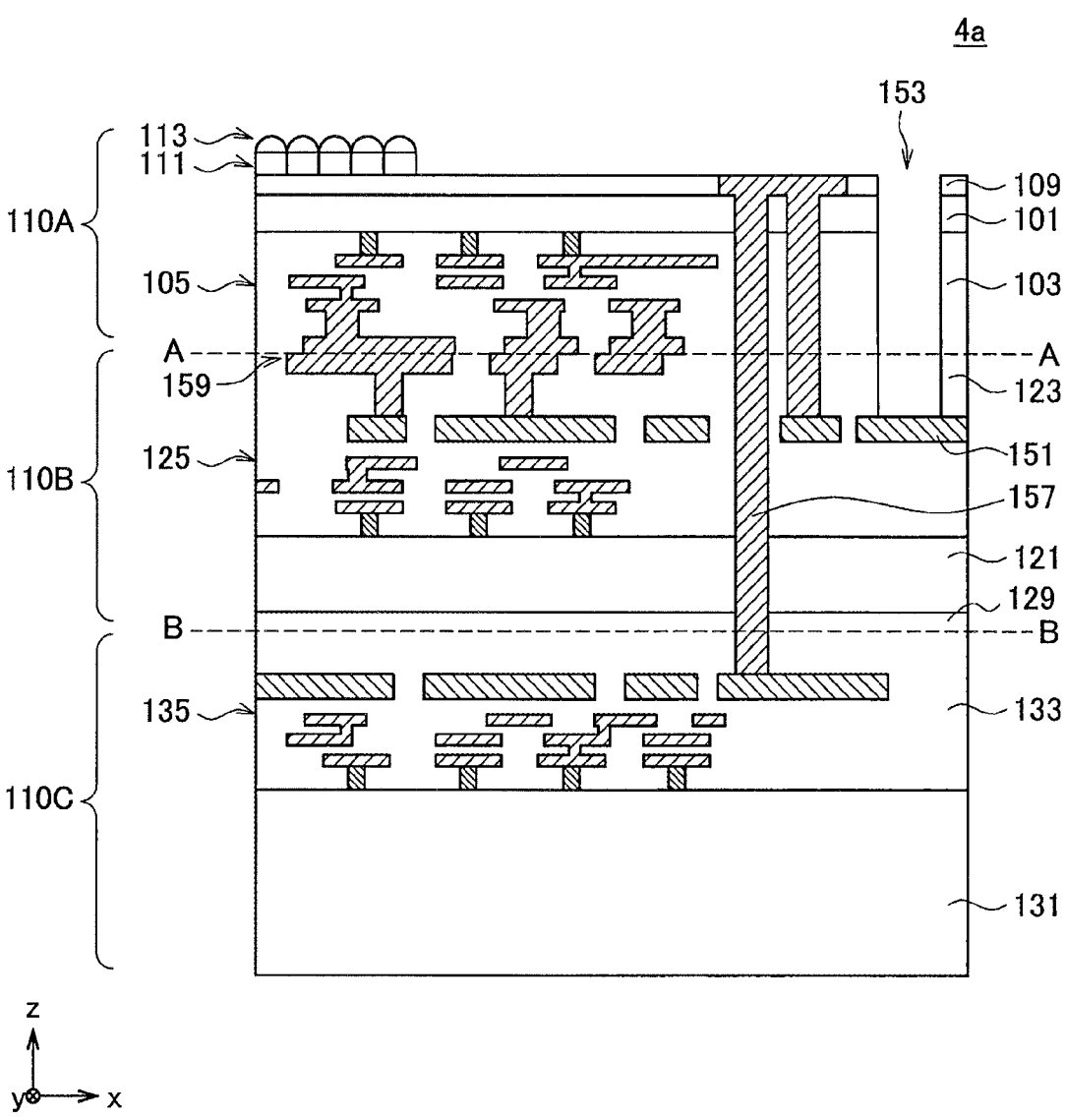
FIG. 12A is a vertical cross-sectional view of a schematic configuration of a solid-state imaging device according to a third configuration example of the present embodiment.

A solid-state imaging device 4a illustrated in FIG. 12A has, as coupling structures, the electrode junction structure 159 provided between the first substrate 110A and the second substrate 110B, the twin contact type three-layer TSV 157, and an embedded pad structure for the second substrate 110B (i.e., the pad 151 provided in the multi-layered wiring layer 125 of the second substrate 110B, and the pad opening 153 exposing the pad 151). The electrode junction structure 159 electrically couples the respective signal lines included in the first substrate 110A and the second substrate 110B to each other and electrically couples the respective power supply lines included in the first substrate 110A and the second substrate 110B to each other. Moreover, the TSV 157 is formed from the back surface side of the first substrate 110A, and is provided to electrically couple the respective signal lines included in the second substrate 110B and the third substrate 110C to each other and electrically couple the respective power supply lines included in the second substrate 110B and the third substrate 110C to each other. Note that in the configuration illustrated in FIG. 12A, the TSV 157 electrically couples a predetermined wiring line of the second metal wiring layer in the multi-layered wiring layer 125 of the second substrate 110B and a predetermined wiring line of the second metal wiring layer in the multi-layered wiring layer 135 of the third substrate 110C to each other.

Figure 12B:
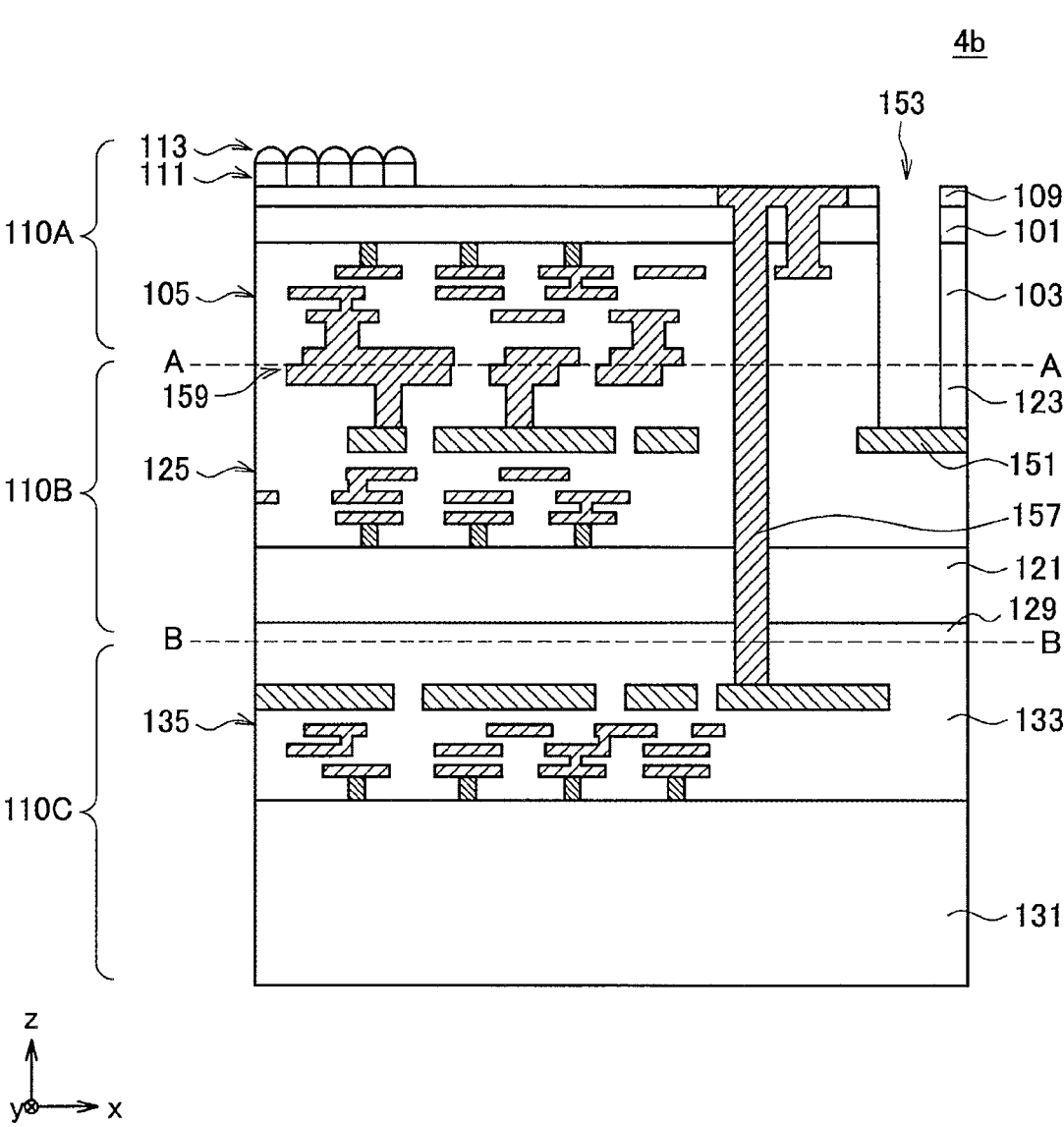
FIG. 12B is a vertical cross-sectional view of the schematic configuration of the solid-state imaging device according to the third configuration example of the present embodiment.

A solid-state imaging device 4b illustrated in FIG. 12B corresponds to the solid-state imaging device 4a illustrated in FIG. 12A in which the configuration of the twin contact type three-layer the TSV 157 is changed. Specifically, in the configuration illustrated in FIG. 12B, the TSV 157 is provided to electrically couple the respective signal lines included in the first substrate 110A and the third substrate 110C to each other and electrically couple the respective power supply lines included in the first substrate 110A and the third substrate 110C to each other. Moreover, in the configuration illustrated in FIG. 12B, the TSV 157 electrically couples a predetermined wiring line of the first metal wiring layer in the multi-layered wiring layer 125 of the second substrate 110B and a predetermined wiring line of the second metal wiring layer in the multi-layered wiring layer 135 of the third substrate 110C to each other.

Figure 12C:
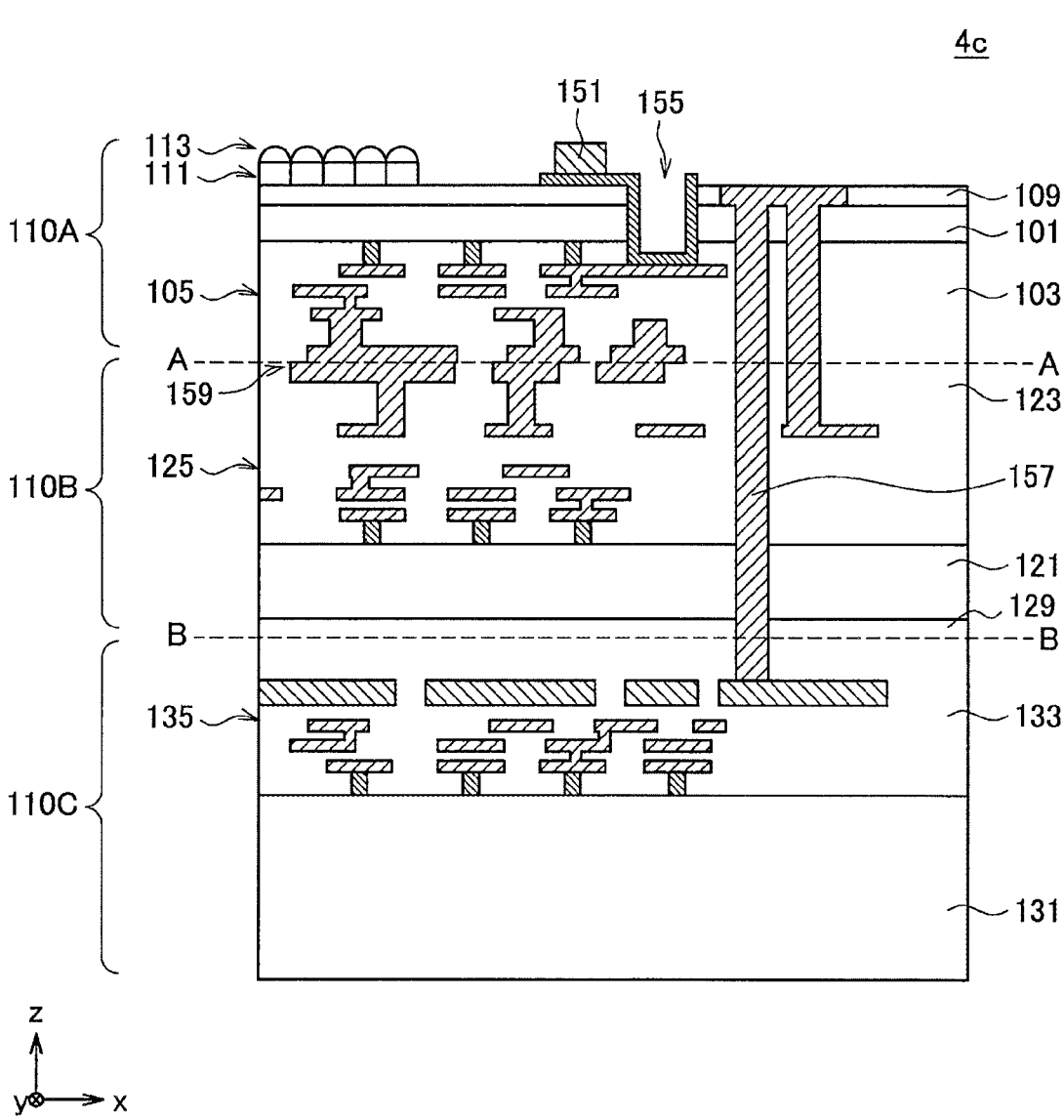
FIG. 12C is a vertical cross-sectional view of the schematic configuration of the solid-state imaging device according to the third configuration example of the present embodiment.

A solid-state imaging device 4c illustrated in FIG. 12C corresponds to the solid-state imaging device 4a illustrated in FIG. 12A in which the embedded pad structure and the types of wiring lines electrically coupled to each other by the twin contact type three-layer TSV 157 are changed. Specifically, in the configuration illustrated in FIG. 12C, a non-embedded lead pad structure for a predetermined wiring line in the multi-layered wiring layer 105 of the first substrate 110A (i.e., the lead line opening 155 for the predetermined wiring line in the multi-layered wiring layer 105 of the first substrate 110A and the pad 151 on the surface on the back side of the first substrate 110A) is provided instead of the embedded pad structure. Moreover, in the configuration illustrated in FIG. 12C, the TSV 157 electrically couples a predetermined wiring line of the first metal wiring layer in the multi-layered wiring layer 125 of the second substrate 110B and a predetermined wiring line of the second metal wiring layer in the multi-layered wiring layer 135 of the third substrate 110C to each other.

Figure 12D:
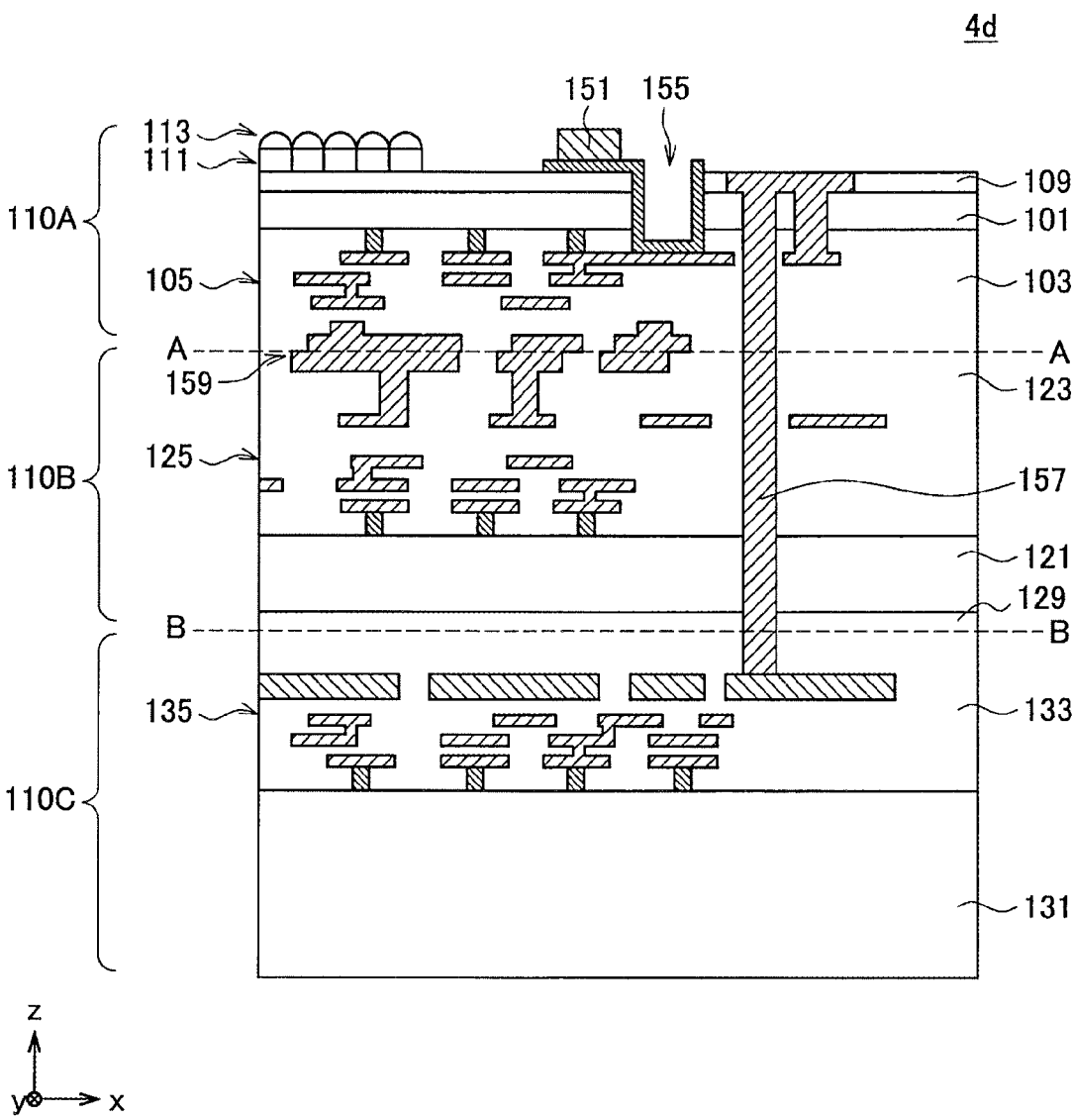
FIG. 12D is a vertical cross-sectional view of the schematic configuration of the solid-state imaging device according to the third configuration example of the present embodiment.

A solid-state imaging device 4d illustrated in FIG. 12D corresponds to the solid-state imaging device 4c illustrated in FIG. 12C in which the configuration of the twin contact type three-layer TSV 157 is changed. Specifically, in the configuration illustrated in FIG. 12D, the TSV 157 is provided to electrically couple the respective signal lines included in the first substrate 110A and the third substrate 110C to each other and electrically couple the respective power supply lines included in the first substrate 110A and the third substrate 110C to each other. Moreover, in the configuration illustrated in FIG. 12D, the TSV 157 electrically couples a predetermined wiring line of the first metal wiring layer in the multi-layered wiring layer 125 of the first substrate 110A and a predetermined wiring line of the second metal wiring layer in the multi-layered wiring layer 135 of the third substrate 110C to each other.

Figure 12E:
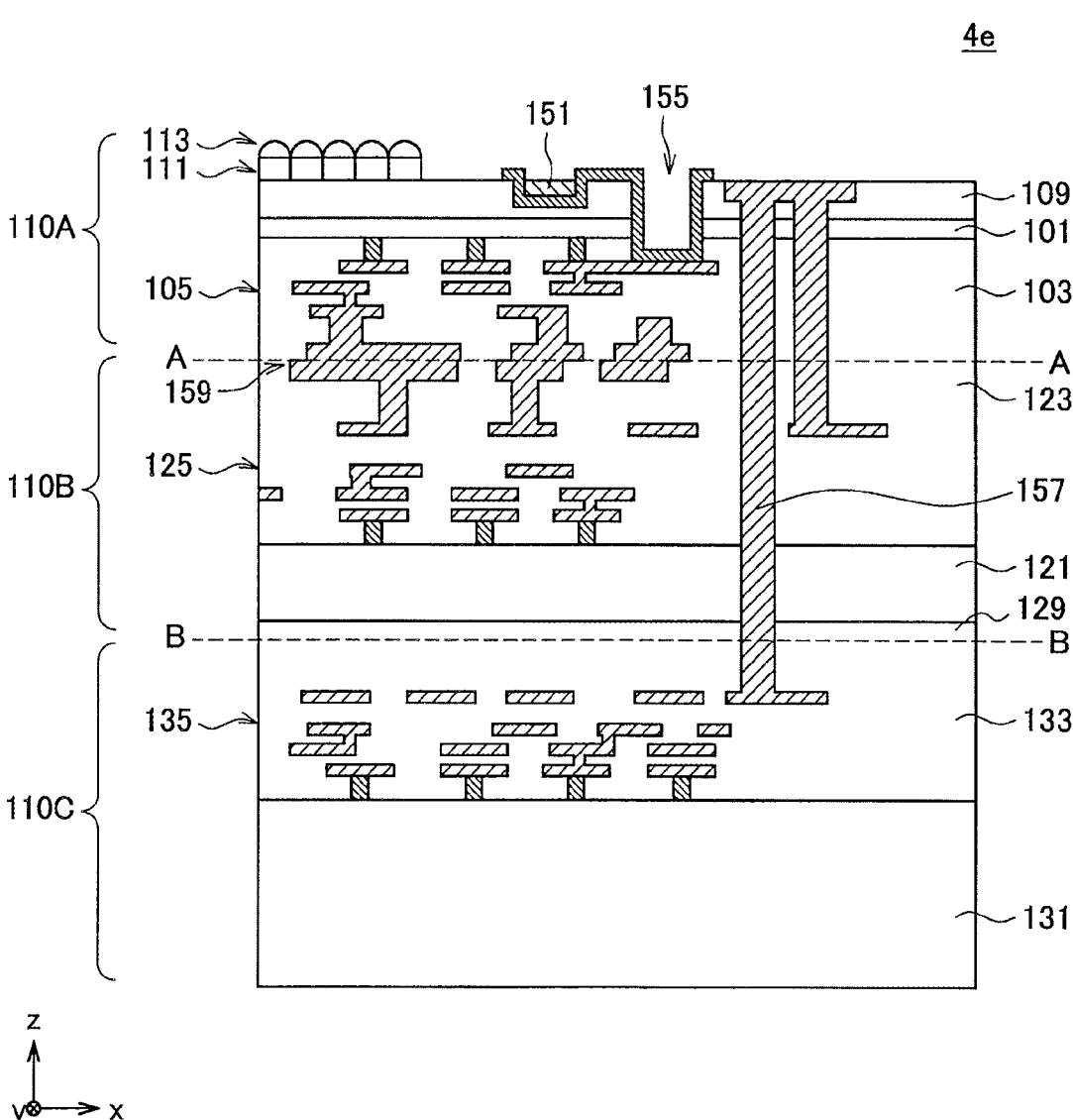
FIG. 12E is a vertical cross-sectional view of the schematic configuration of the solid-state imaging device according to the third configuration example of the present embodiment.

A solid-state imaging device 4e illustrated in FIG. 12E corresponds to the solid-state imaging device 4c illustrated in FIG. 12C in which the configuration of the lead pad structure and the types of wiring lines electrically coupled to each other by the twin contact type three-layer TSV 157 are changed. Specifically, in the configuration illustrated in FIG. 12E, an embedded lead pad structure is provided as the lead pad structure instead of the non-embedded lead pad structure. Moreover, in the configuration illustrated in FIG. 12E, the TSV 157 electrically couples a predetermined wiring line of the first metal wiring layer in the multi-layered wiring layer 125 of the second substrate 110B and a predetermined wiring line of the first metal wiring layer in the multi-layered wiring layer 135 of the third substrate 110C to each other.

Figure 12F:
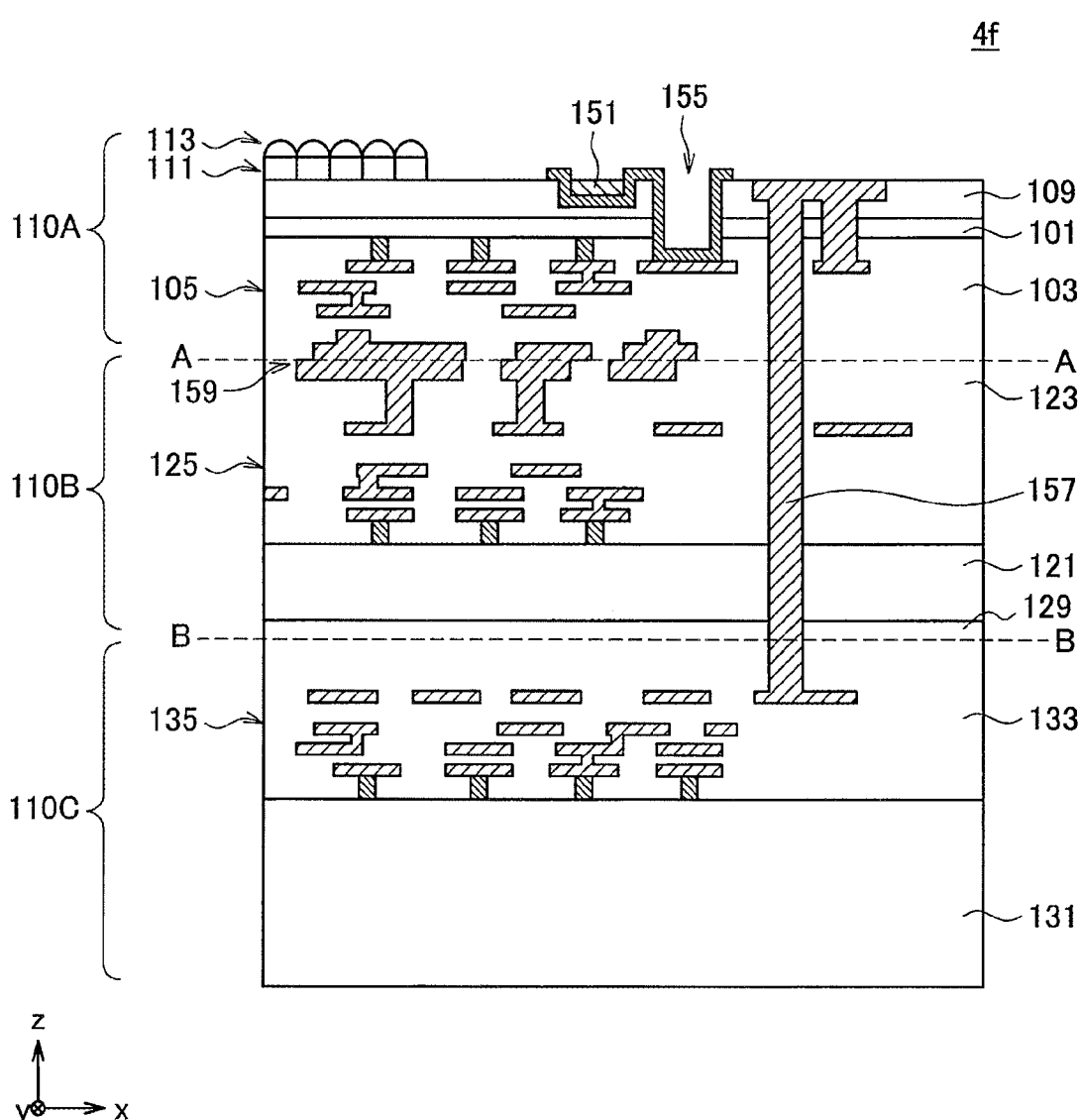
FIG. 12F is a vertical cross-sectional view of the schematic configuration of the solid-state imaging device according to the third configuration example of the present embodiment.

A solid-state imaging device 4f illustrated in FIG. 12F corresponds to the solid-state imaging device 4d illustrated in FIG. 12D in which the configuration of the lead pad structure and the types of wiring lines electrically coupled to each other by the twin contact type three-layer TSV 157 are changed. Specifically, in the configuration illustrated in FIG. 12F, an embedded lead pad structure is provided as the lead pad structure instead of the non-embedded lead pad structure. Moreover, in the configuration illustrated in FIG. 12F, the TSV 157 electrically couples a predetermined wiring line of the first metal wiring layer in the multi-layered wiring layer 125 of the first substrate 110A and a predetermined wiring line of the first metal wiring layer in the multi-layered wiring layer 135 of the third substrate 110C to each other.

Figure 12G:
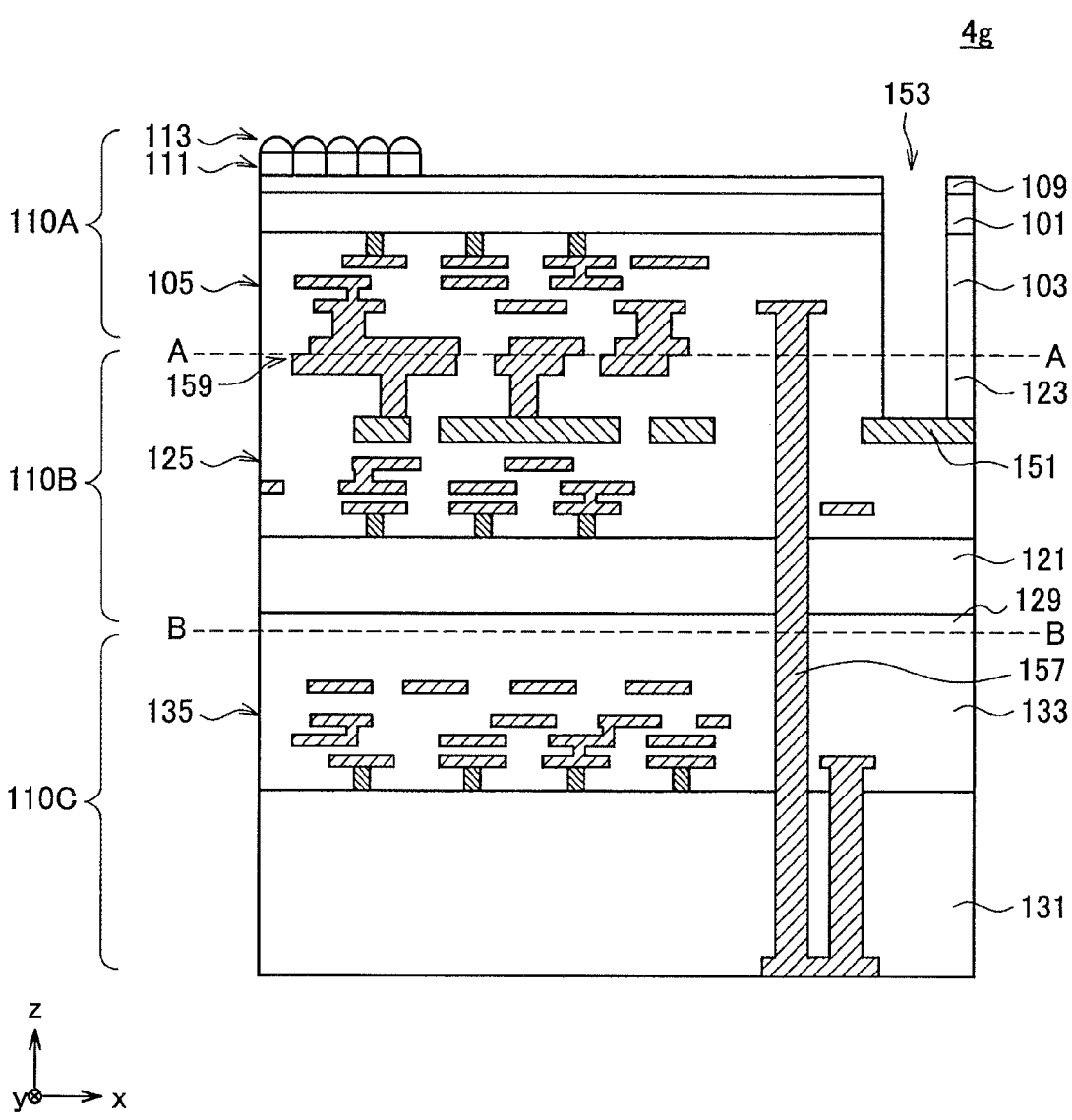
FIG. 12G is a vertical cross-sectional view of the schematic configuration of the solid-state imaging device according to the third configuration example of the present embodiment.

A solid-state imaging device 4g illustrated in FIG. 12G corresponds to the solid-state imaging device 4a illustrated in FIG. 12A in which the configuration of the twin contact type three-layer TSV 157 is changed. Specifically, in the configuration illustrated in FIG. 12G, the TSV 157 is provided from the back surface side of the third substrate 110C to electrically couple the respective signal lines included in the first substrate 110A and the third substrate 110C to each other and electrically couple the respective power supply lines included in the first substrate 110A and the third substrate 110C to each other. Note that in the configuration illustrated in FIG. 12G, the TSV 157 electrically couples a predetermined wiring line of the first metal wiring layer in the multi-layered wiring layer 125 of the first substrate 110A and a predetermined wiring line of the first metal wiring layer in the multi-layered wiring layer 135 of the third substrate 110C to each other.

Figure 12H:
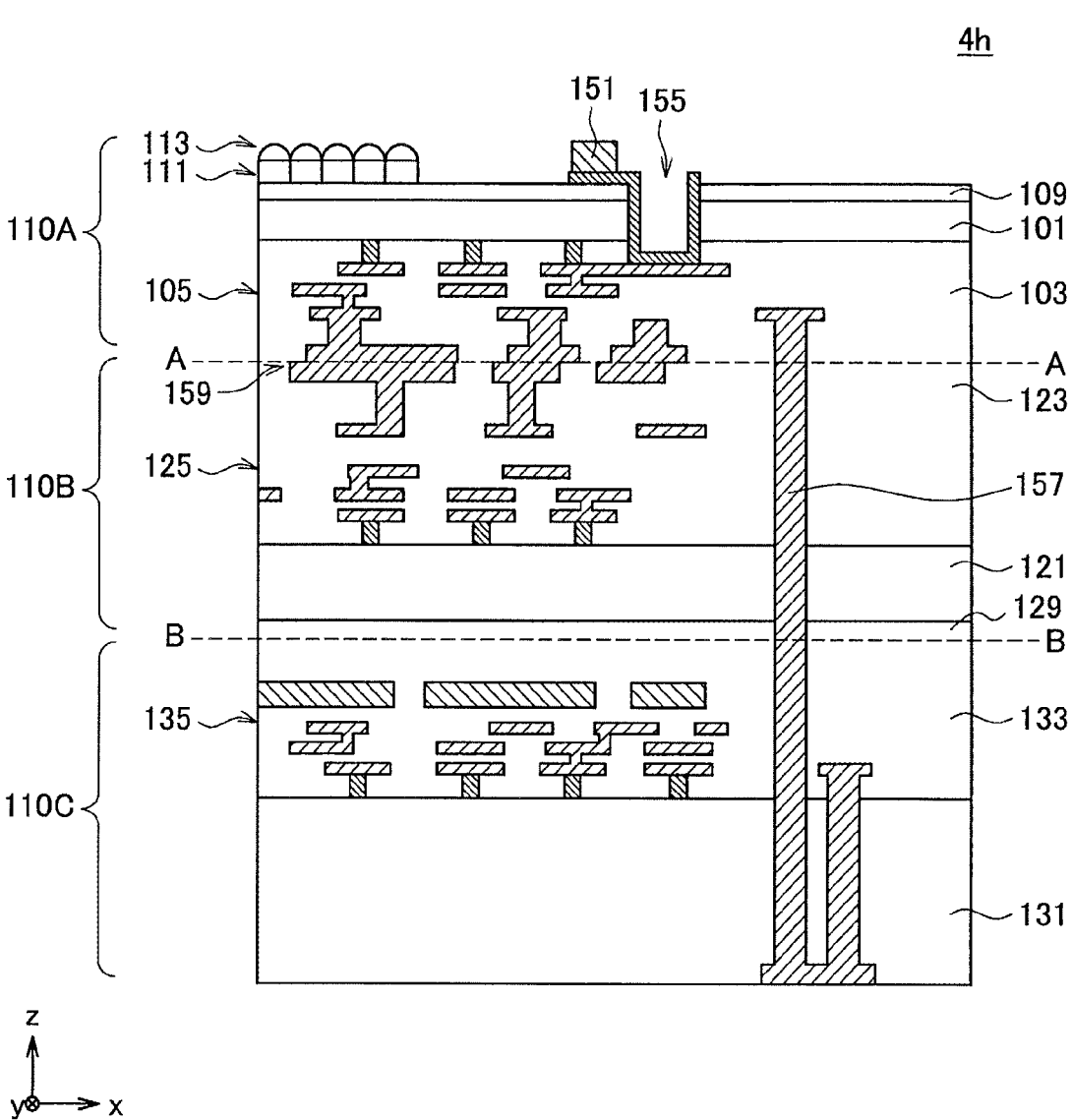
FIG. 12H is a vertical cross-sectional view of the schematic configuration of the solid-state imaging device according to the third configuration example of the present embodiment.

A solid-state imaging device 4h illustrated in FIG. 12H corresponds to the solid-state imaging device 4g illustrated in FIG. 12G in which the embedded pad structure is changed. Specifically, in the configuration illustrated in FIG. 12H, instead of the embedded pad structure, a non-embedded lead pad structure is provided for a predetermined wiring line in the multi-layered wiring layer 105 of the first substrate 110A.

Figure 12I:
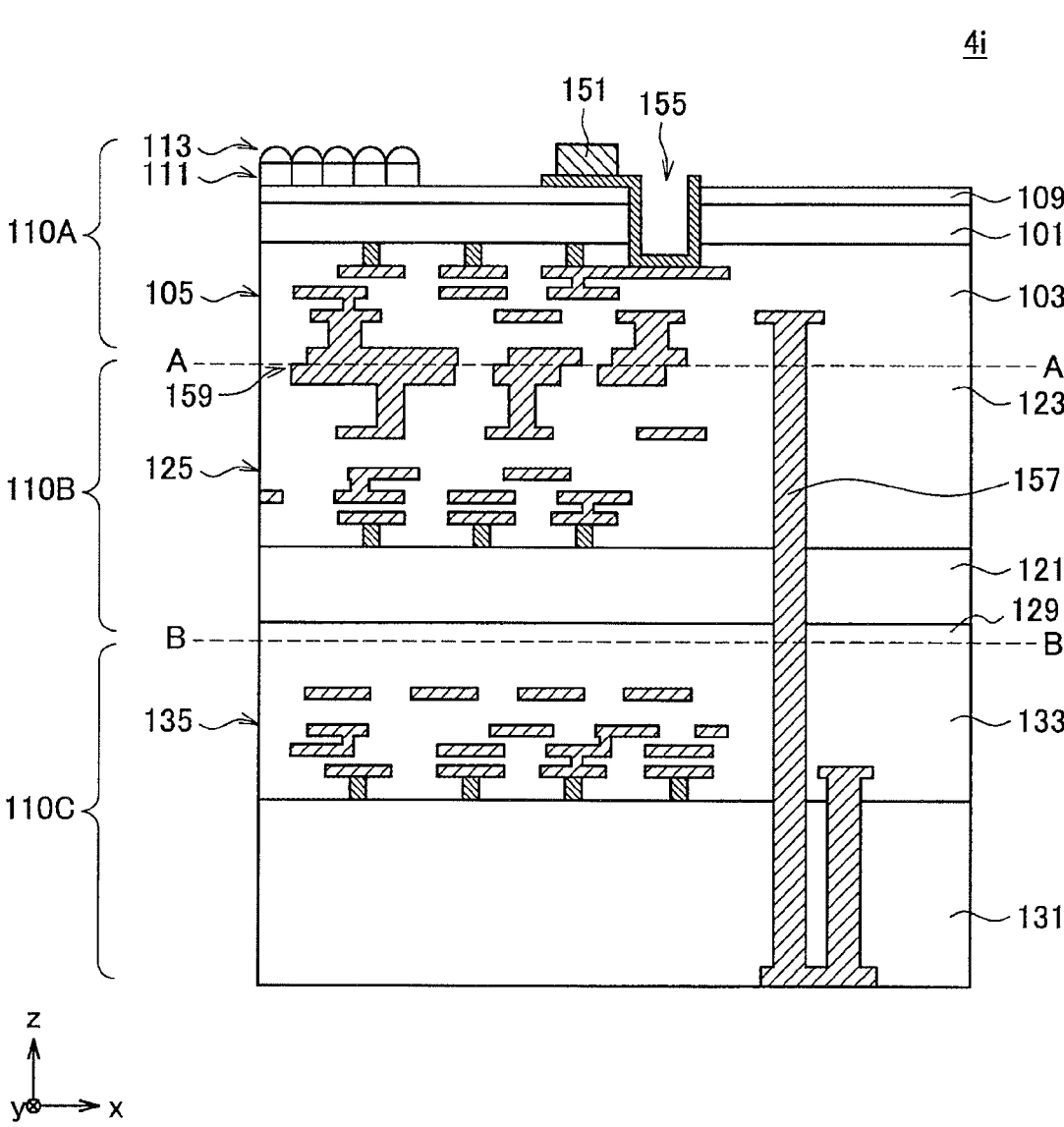
FIG. 12I is a vertical cross-sectional view of the schematic configuration of the solid-state imaging device according to the third configuration example of the present embodiment.

A solid-state imaging device 4i illustrated in FIG. 12I corresponds to the solid-state imaging device 4h illustrated in FIG. 12H in which the configuration of the multi-layered wiring layer 135 of the third substrate 110C is changed. Specifically, in the configuration illustrated in FIG. 12H, the multi-layered wiring layer 135 includes both the first metal wiring layer and the second metal wiring layer, but in the configuration illustrated in FIG. 12I, the multi-layered wiring layer 135 include only the first metal wiring layer.

Figure 12J:
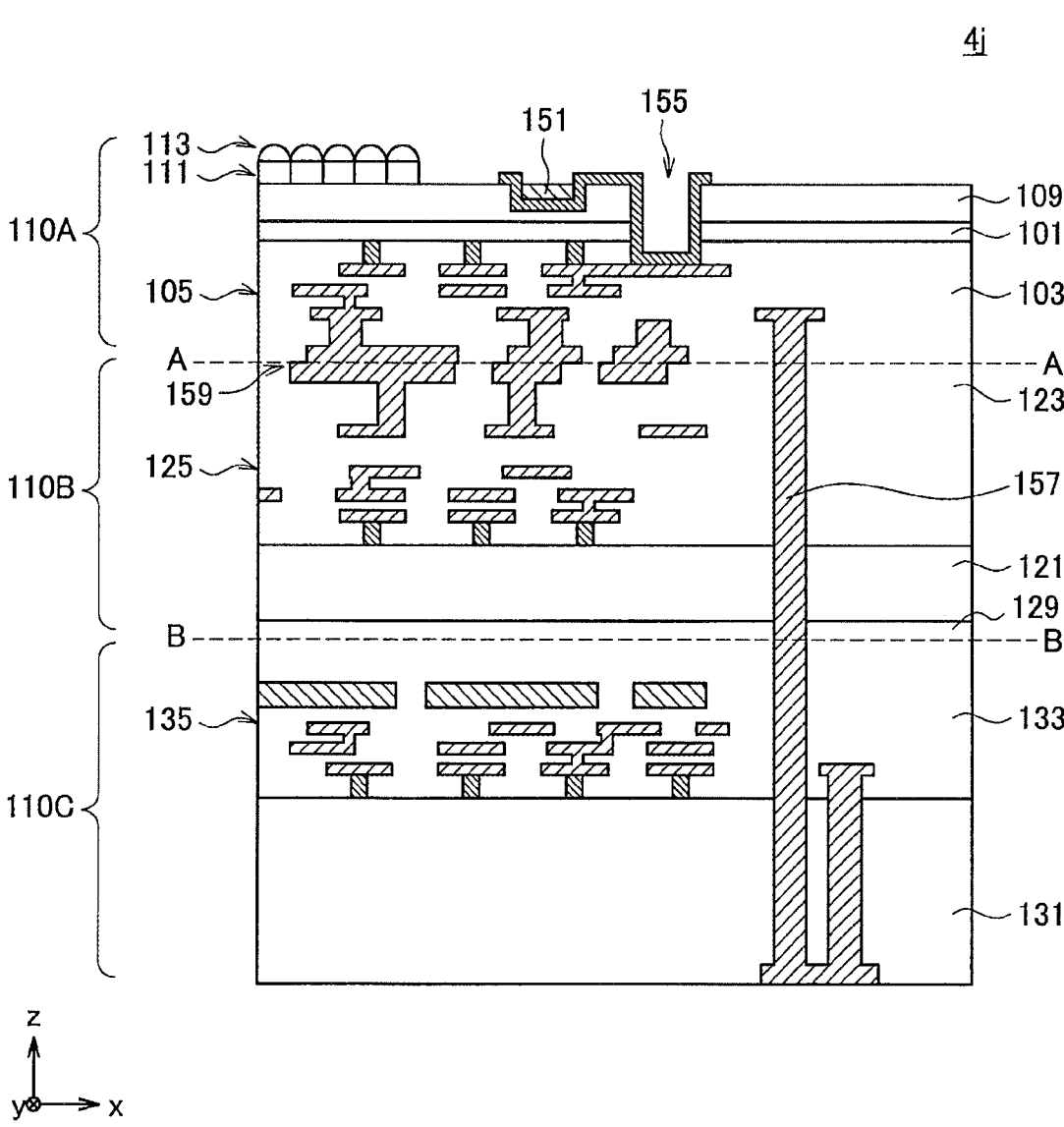
FIG. 12J is a vertical cross-sectional view of the schematic configuration of the solid-state imaging device according to the third configuration example of the present embodiment.

A solid-state imaging device 4j illustrated in FIG. 12J corresponds to the solid-state imaging device 4h illustrated in FIG. 12H in which the configuration of the lead pad structure is changed. Specifically, in the configuration illustrated in FIG. 12J, an embedded lead pad structure is provided as the lead pad structure instead of the non-embedded lead pad structure.

Figure 12K:
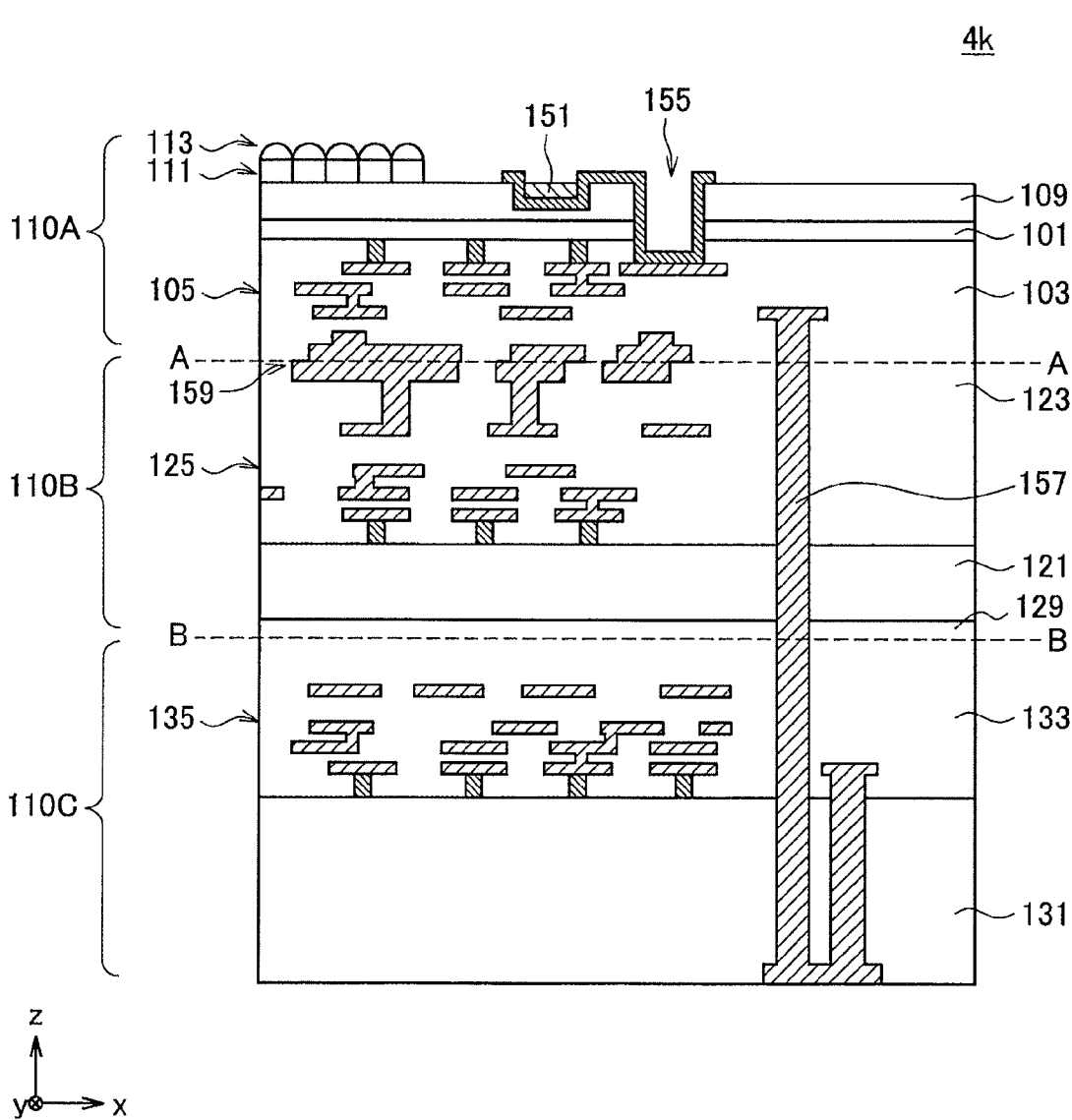
FIG. 12K is a vertical cross-sectional view of the schematic configuration of the solid-state imaging device according to the third configuration example of the present embodiment.

A solid-state imaging device 4k illustrated in FIG. 12K corresponds to the solid-state imaging device 4j illustrated in FIG. 12J in which the configuration of the multi-layered wiring layer 135 of the third substrate 110C is changed. Specifically, in the configuration illustrated in FIG. 12J, the multi-layered wiring layer 135 includes both the first metal wiring layer and the second metal wiring layer, but in the configuration illustrated in FIG. 12K, the multi-layered wiring layer 135 includes only the first metal wiring layer.

Note that in the respective configurations illustrated in FIGS. 12A to 12K, the types of wiring lines to which the twin contact type three-layer TSV 157 is coupled are not limited. The TSV 157 may be coupled to a predetermined wiring line of the first metal wiring layer, or may be coupled to a predetermined wiring line of the second metal wiring layer. Moreover, each of the multi-layered wiring layers 105, 125, and 135 may include only the first metal wiring layer, may include only the second metal wiring layer, or may include both the first metal wiring layer and the second metal wiring layer. For example, in the configuration illustrated in FIG. 12G, the multi-layered wiring layer 135 of the third substrate 110C may include both the first metal wiring layer and the second metal wiring layer.

Further, it is sufficient if the twin contact type three-layer TSV 157 electrically couples the respective signal lines included in two substrates of the first substrate 110A, the second substrate 110B, and the third substrate 110C to each other and electrically couples the respective power supply lines included in the two substrates of the first substrate 110A, the second substrate 110B, and the third substrate 110C to each other in accordance with a direction in which the TSV 157 is formed, and the substrates including the respective signal lines electrically coupled to each other by the TSV 157 and the respective power supply lines electrically coupled to each other by the TSV 157 may be optionally changed.

5-4. Fourth Configuration Example

Figure 13A:
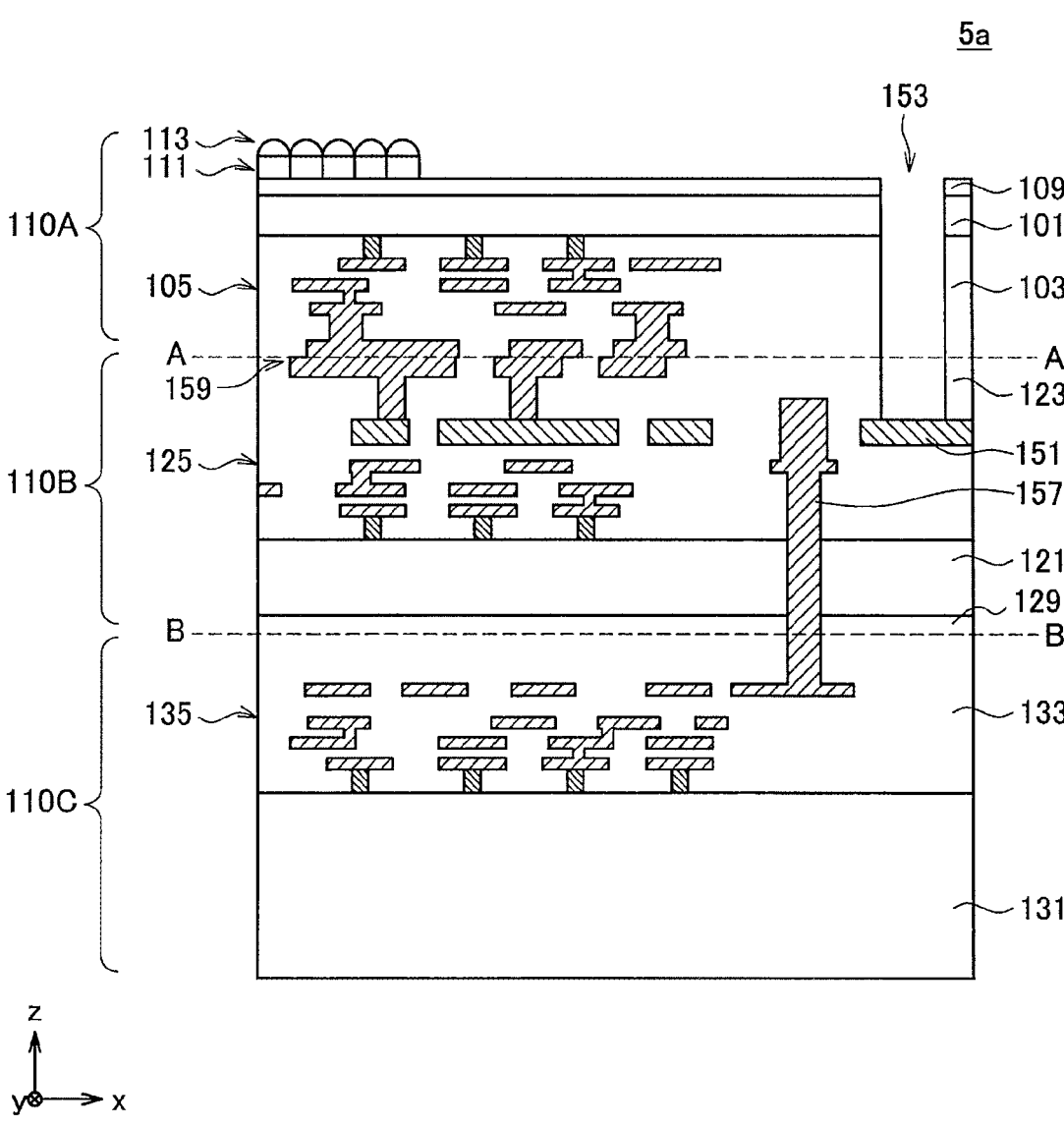
FIG. 13A is a vertical cross-sectional view of a schematic configuration of a solid-state imaging device according to a fourth configuration example of the present embodiment.
Figure 13B:
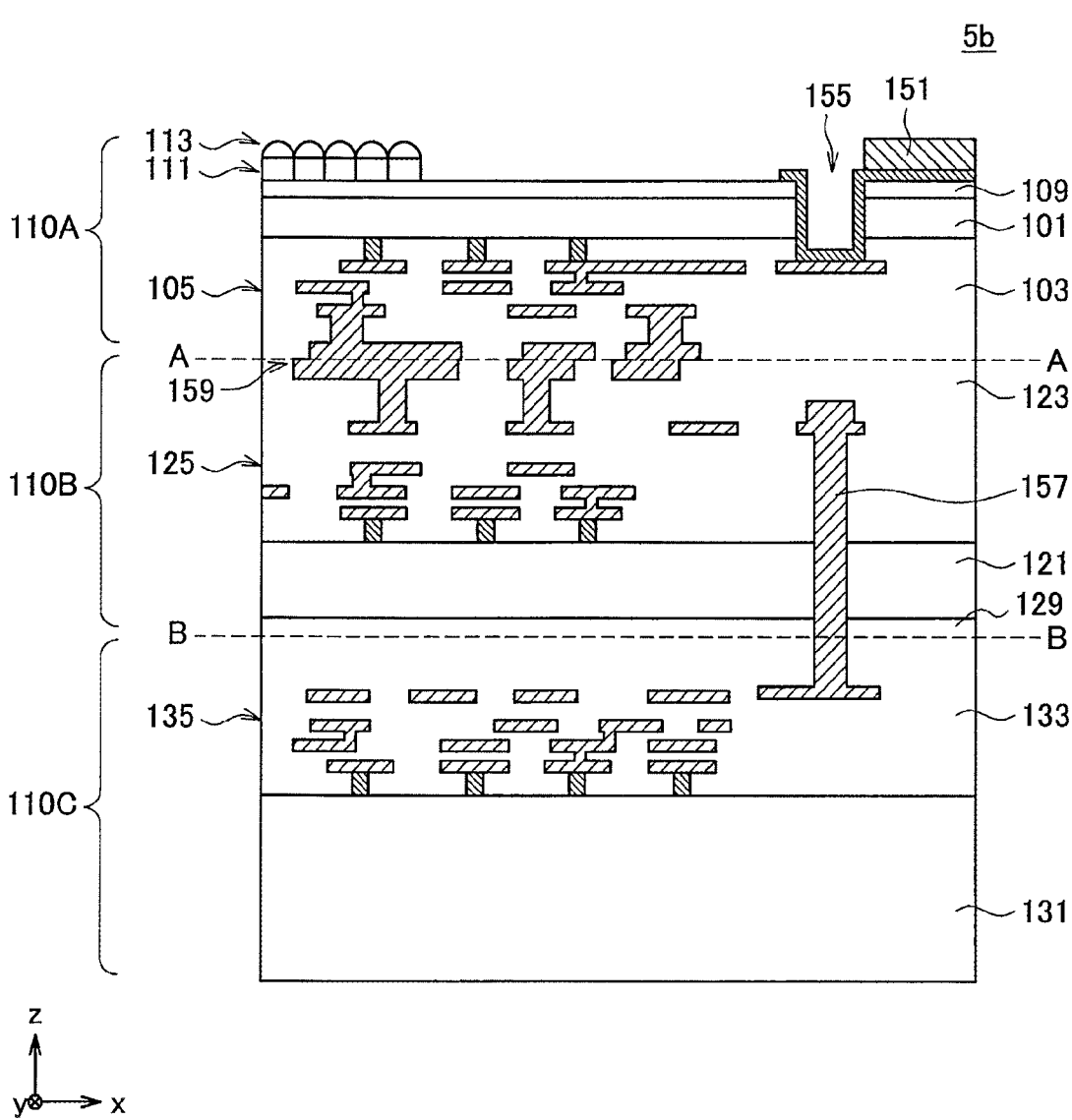
FIG. 13B is a vertical cross-sectional view of the schematic configuration of the solid-state imaging device according to the fourth configuration example of the present embodiment.
Figure 13C:
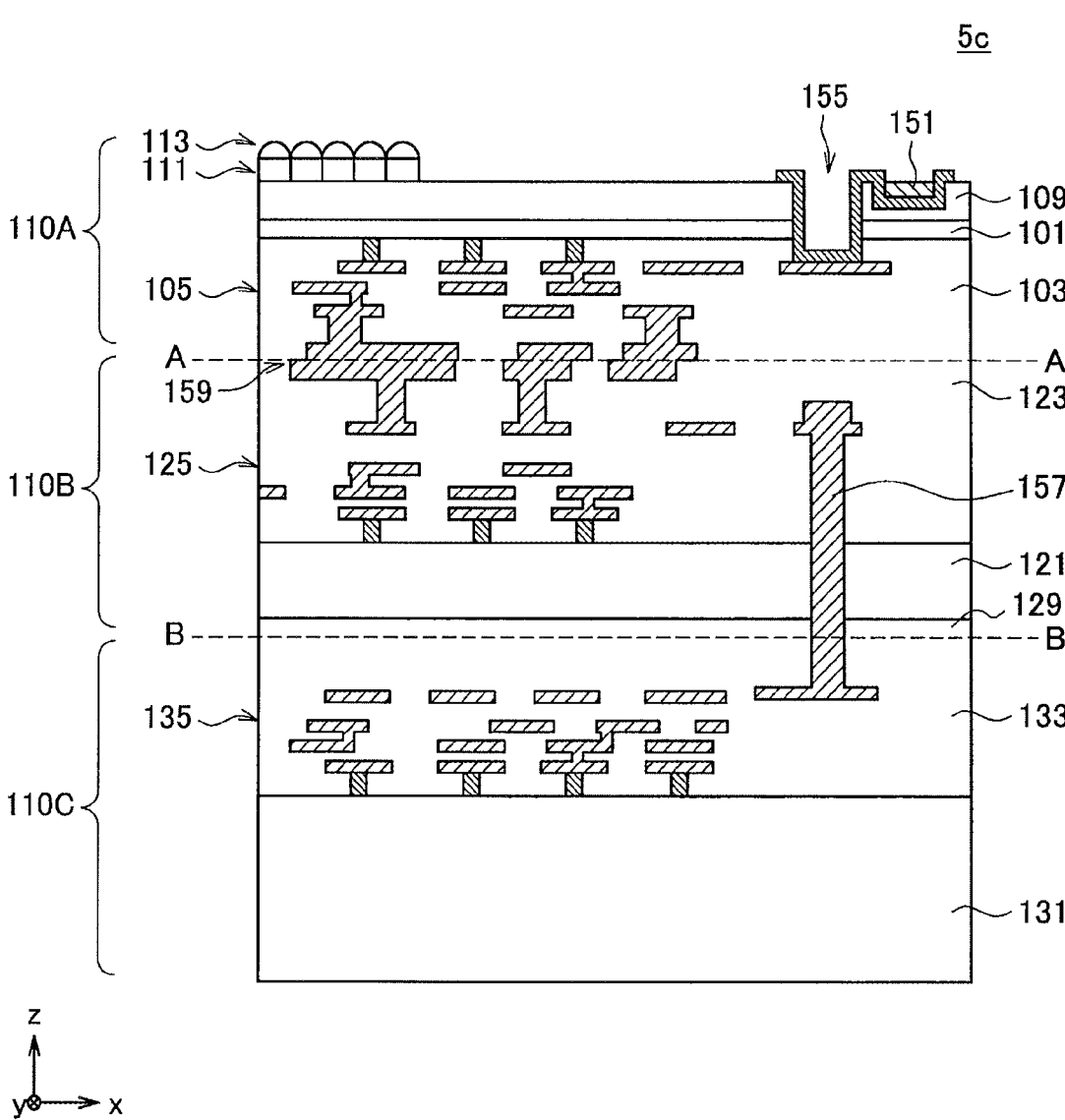
FIG. 13C is a vertical cross-sectional view of the schematic configuration of the solid-state imaging device according to the fourth configuration example of the present embodiment.

FIGS. 13A to 13C are vertical cross-sectional views of a schematic configuration of a solid-state imaging device according to the fourth configuration example of the present embodiment. The solid-state imaging device according to the present embodiment may have any of configurations illustrated in FIGS. 13A to 13C.

A solid-state imaging device 5a illustrated in FIG. 13A includes, as coupling structures, the electrode junction structure 159 provided between the first substrate 110A and the second substrate 110B, the shared contact type two-layer TSV 157, and an embedded pad structure for the second substrate 110B (i.e., the pad 151 provided in the multi-layered wiring layer 125 of the second substrate 110B, and the pad opening 153 exposing the pad 151). The electrode junction structure 159 electrically couples the respective signal lines included in the first substrate 110A and the second substrate 110B to each other and electrically couples the respective power supply lines included in the first substrate 110A and the second substrate 110B to each other.

Moreover, the TSV 157 is formed from the front surface side of the second substrate 110B toward the third substrate 110C, and is provided to electrically couple the respective signal lines included in the second substrate 110B and the third substrate 110C to each other and electrically couple the respective power supply lines included in the second substrate 110B and the third substrate 110C to each other. Note that in the configuration illustrated in FIG. 13A, the TSV 157 electrically couples a predetermined wiring line of the first metal wiring layer in the multi-layered wiring layer 125 of the second substrate 110B and a predetermined wiring line of the first metal wiring layer in the multi-layered wiring layer 135 of the third substrate 110C to each other.

A solid-state imaging device 5b illustrated in FIG. 13B corresponds to the solid-state imaging device 5a illustrated in FIG. 13A in which the embedded pad structure is changed. Specifically, in the configuration illustrated in FIG. 13B, a non-embedded lead pad structure for a predetermined wiring line in the multi-layered wiring layer 105 of the first substrate 110A (i.e., the lead line opening 155 for the predetermined wiring line in the multi-layered wiring layer 105 of the first substrate 110A and the pad 151 on the surface on the back side of the first substrate 110A) is provided instead of the embedded pad structure.

A solid-state imaging device 5c illustrated in FIG. 13C corresponds to the solid-state imaging device 5b illustrated in FIG. 13B in which the configuration of the lead pad structure is changed. Specifically, in the configuration illustrated in FIG. 13C, an embedded lead pad structure is provided as the lead pad structure instead of the non-embedded lead pad structure.

Note that in the respective configurations illustrated in FIGS. 13A to 13C, the types of wiring lines to which the shared contact type two-layer TSV 157 is coupled are not limited. The TSV 157 may be coupled to a predetermined wiring line of the first metal wiring layer or may be coupled to a predetermined wiring line of the second metal wiring layer. For example, in the respective configurations illustrated in FIGS. 13A to 13C, one or both of the wiring lines to which the TSV 157 is coupled may be changed to a predetermined wiring line of the second metal wiring layer. Moreover, each of the multi-layered wiring layers 105, 125, and 135 may include only the first metal wiring layer, may include only the second metal wiring layer, or may include both the first metal wiring layer and the second metal wiring layer.

In addition, in the respective configurations illustrated in FIGS. 13A to 13C, the TSV 157 is formed from the front surface side of the second substrate 110B toward the third substrate 110C, but the present embodiment is not limited to such an example. The TSV 157 may be formed from the back surface side of the third substrate 110C toward the second substrate 110B.

5-5. Fifth Configuration Example

FIGS. 14A to 14F are vertical cross-sectional views of a schematic configuration of a solid-state imaging device according to the fifth configuration example of the present embodiment. The solid-state imaging device according to the present embodiment may have the configuration illustrated in FIGS. 14A to 14F.

Figure 14A:
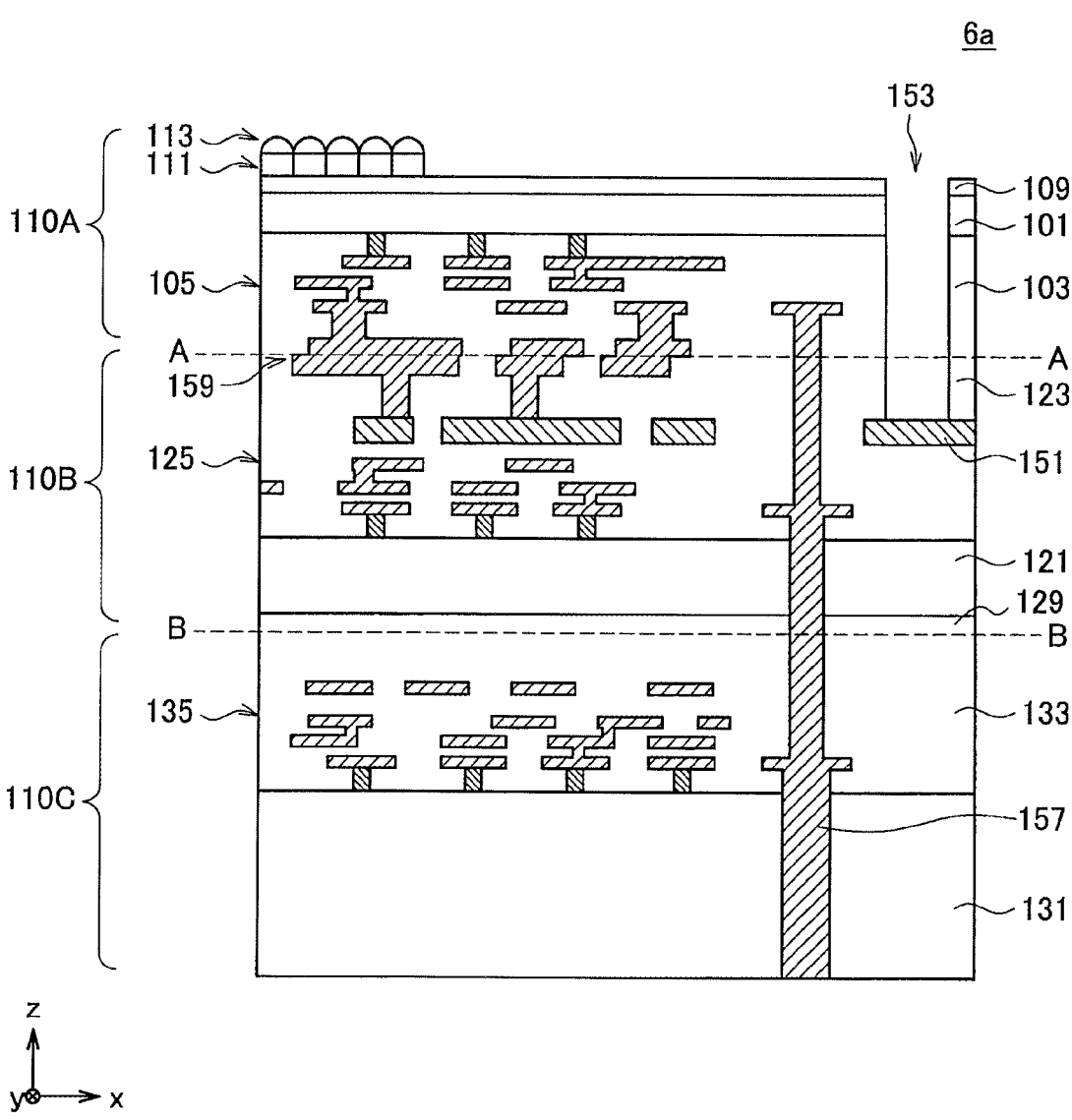
FIG. 14A is a vertical cross-sectional view of a schematic configuration of a solid-state imaging device according to a fifth configuration example of the present embodiment.

A solid-state imaging device 6a illustrated in FIG. 14A includes, as coupling structures, the electrode junction structure 159 provided between the first substrate 110A and the second substrate 110B, the shared contact type three-layer TSV 157, and an embedded pad structure for the second substrate 110B (i.e., the pad 151 provided in the multi-layered wiring layer 125 of the second substrate 110B, and the pad opening 153 exposing the pad 151). The electrode junction structure 159 electrically couples the respective signal lines included in the first substrate 110A and the second substrate 110B to each other and electrically couples the respective power supply lines included in the first substrate 110A and the second substrate 110B to each other. Moreover, the TSV 157 is formed from the back surface side of the third substrate 110C, and is provided to electrically couple the first substrate 110A, the second substrate 110B, and the third substrate 110C to each other. Note that in the configuration illustrated in FIG. 14A, the TSV 157 electrically couples a predetermined wiring line of the first metal wiring layer in the multi-layered wiring layer 125 of the first substrate 110A, a predetermined wiring line of the first metal wiring layer in the multi-layered wiring layer 125 of the second substrate 110B, and a predetermined wiring line of the first metal wiring layer in the multi-layered wiring layer 135 of the third substrate 110C to each other.

Figure 14B:
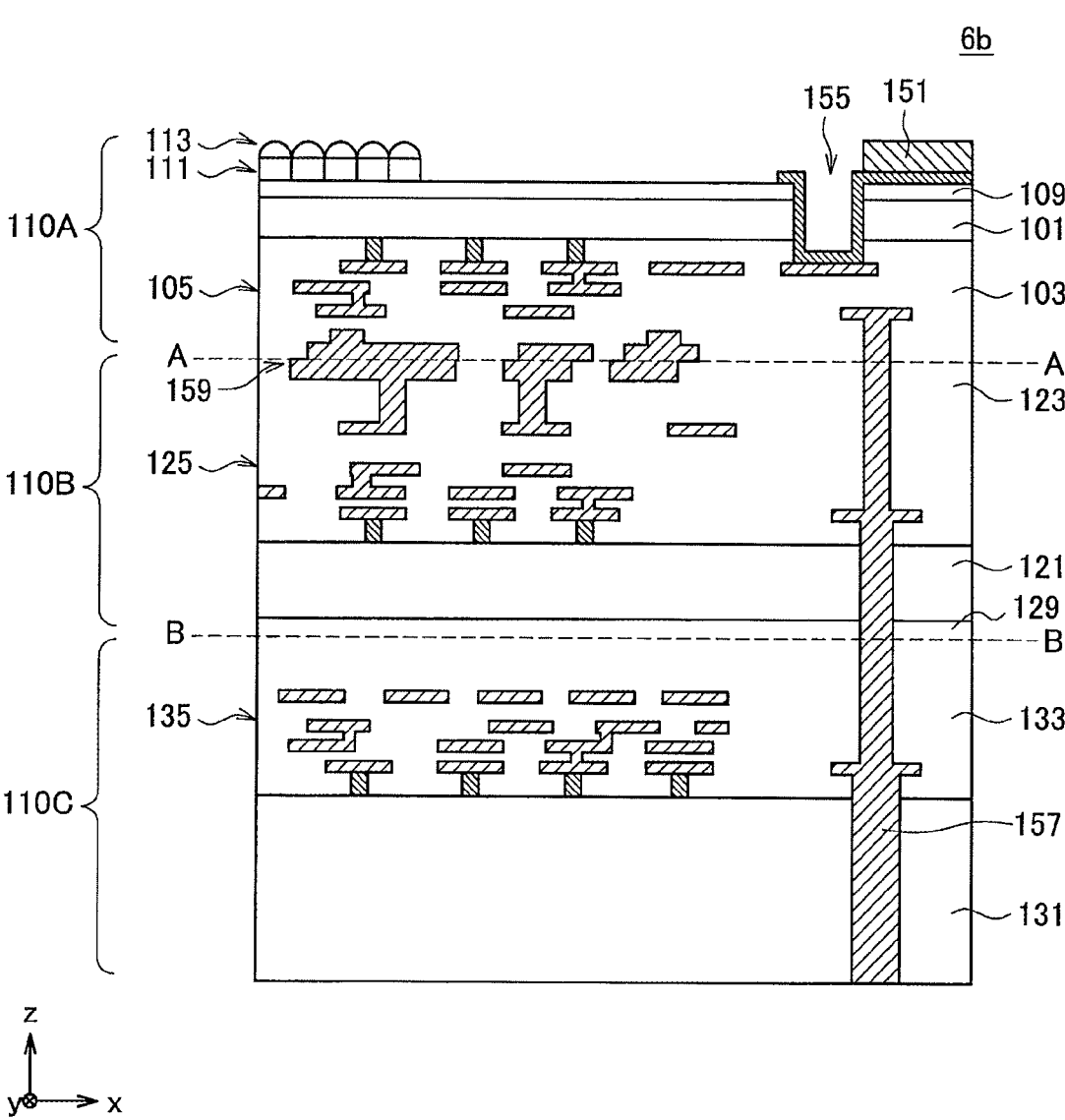
FIG. 14B is a vertical cross-sectional view of the schematic configuration of the solid-state imaging device according to the fifth configuration example of the present embodiment.

A solid-state imaging device 6b illustrated in FIG. 14B corresponds to the solid-state imaging device 6a illustrated in FIG. 14A in which the embedded pad structure is changed. Specifically, in the configuration illustrated in FIG. 14B, a non-embedded lead pad structure for a predetermined wiring line in the multi-layered wiring layer 105 of the first substrate 110A (i.e., the lead line opening 155 for the predetermined wiring line in the multi-layered wiring layer 105 of the first substrate 110A and the pad 151 on the surface on the back side of the first substrate 110A) is provided instead of the embedded pad structure.

Figure 14C:
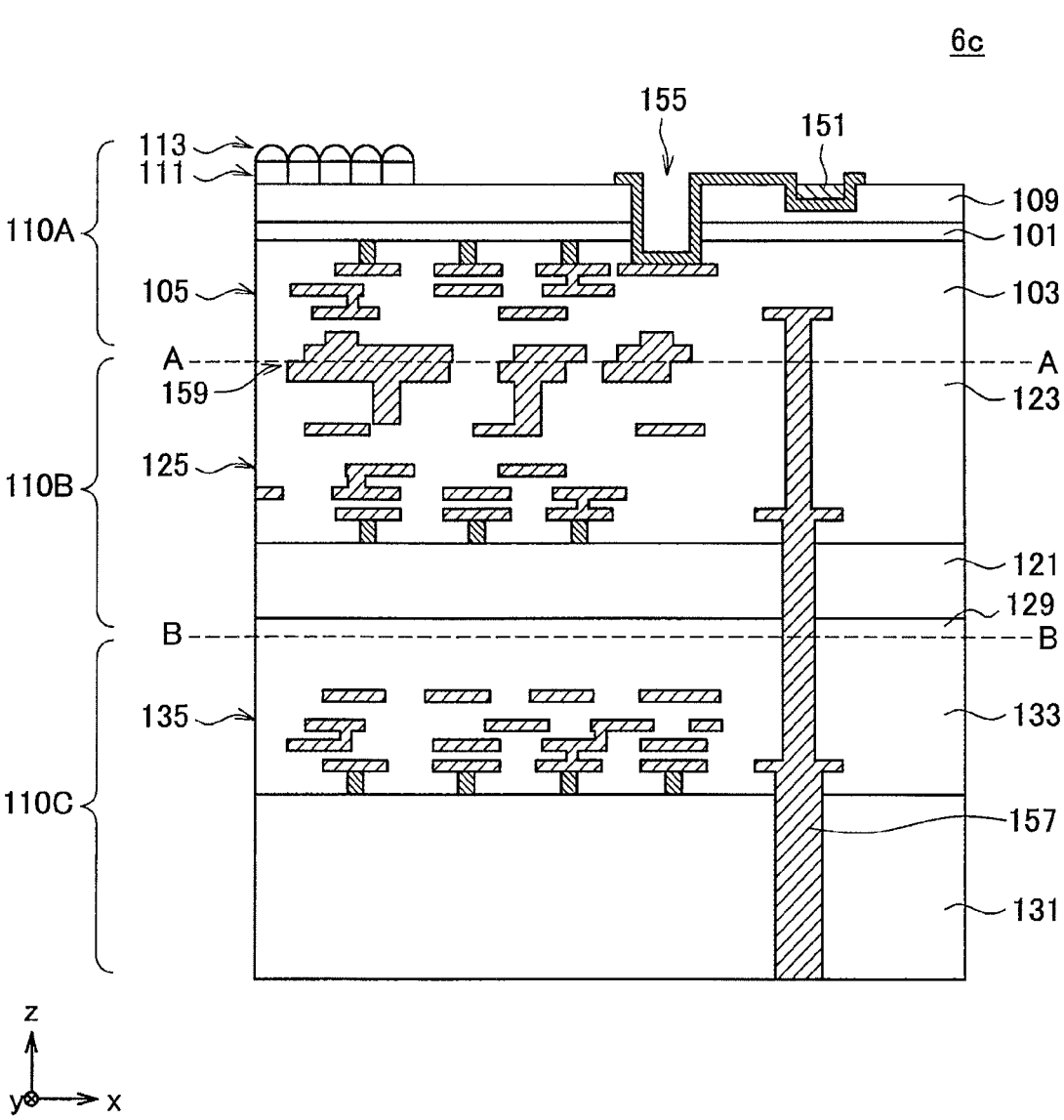
FIG. 14C is a vertical cross-sectional view of the schematic configuration of the solid-state imaging device according to the fifth configuration example of the present embodiment.

A solid-state imaging device 6c illustrated in FIG. 14C corresponds to the solid-state imaging device 6b illustrated in FIG. 14B in which the configuration of the lead pad structure is changed. Specifically, in the configuration illustrated in FIG. 14C, an embedded lead pad structure is provided as the lead pad structure instead of the non-embedded lead pad structure.

Figure 14D:
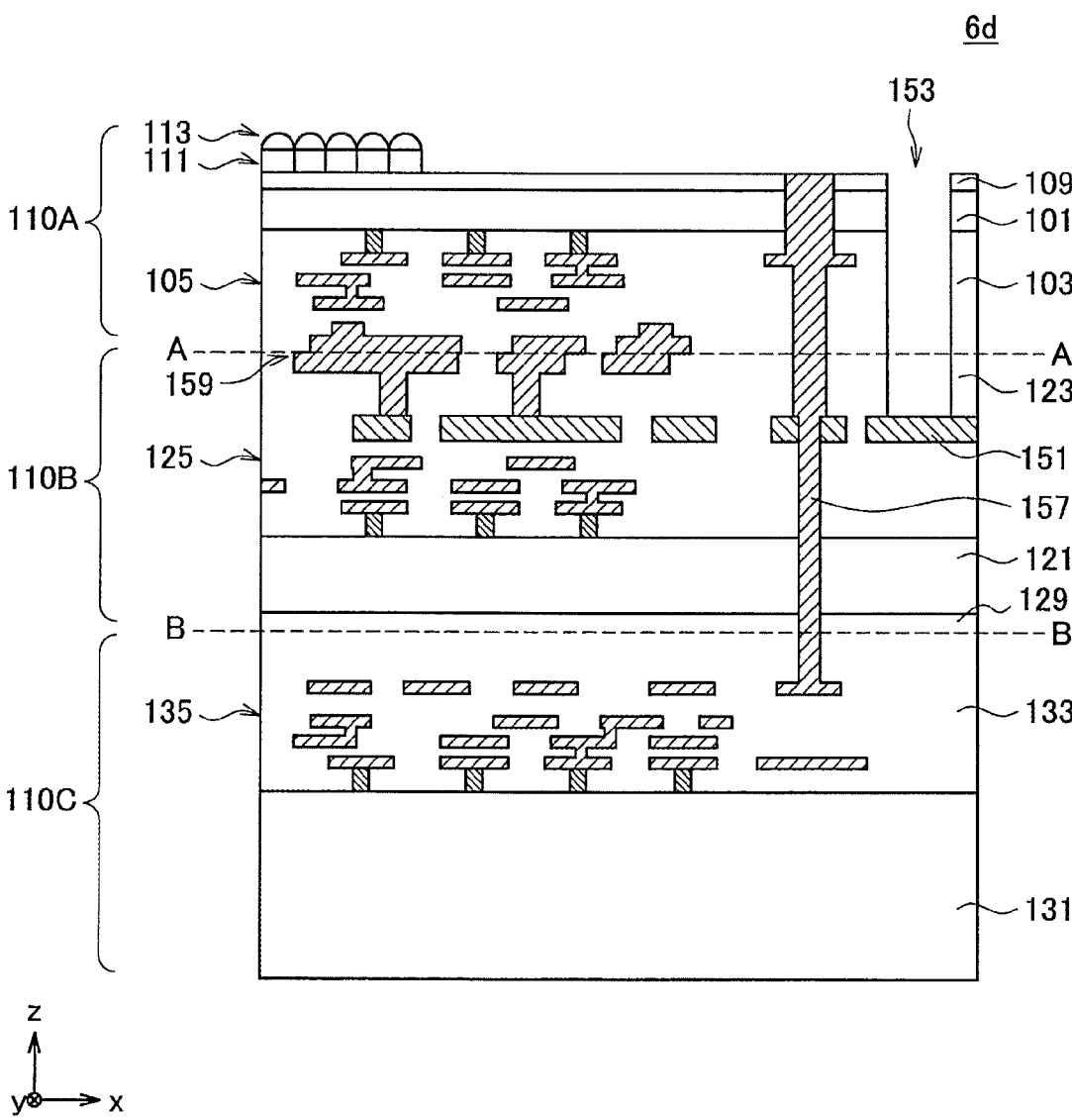
FIG. 14D is a vertical cross-sectional view of the schematic configuration of the solid-state imaging device according to the fifth configuration example of the present embodiment.

A solid-state imaging device 6d illustrated in FIG. 14D corresponds to the solid-state imaging device 6a illustrated in FIG. 14A in which the configuration of the shared contact type three-layer TSV 157 is changed. Specifically, in the configuration illustrated in FIG. 14D, the TSV 157 is formed from the back surface side of the first substrate 110A, and is provided to electrically couple the respective signal lines included in the first substrate 110A, the second substrate 110B, and the third substrate 110C to each other and electrically couple the respective power supply lines included in the first substrate 110A, the second substrate 110B, and the third substrate 110C to each other. Note that in the configuration illustrated in FIG. 14D, the TSV 157 electrically couples a predetermined wiring line of the first metal wiring layer in the multi-layered wiring layer 125 of the first substrate 110A, a predetermined wiring line of the second metal wiring layer in the multi-layered wiring layer 125 of the second substrate 110B, and a predetermined wiring line of the first metal wiring layer in the multi-layered wiring layer 135 of the third substrate 110C to each other.

Figure 14E:
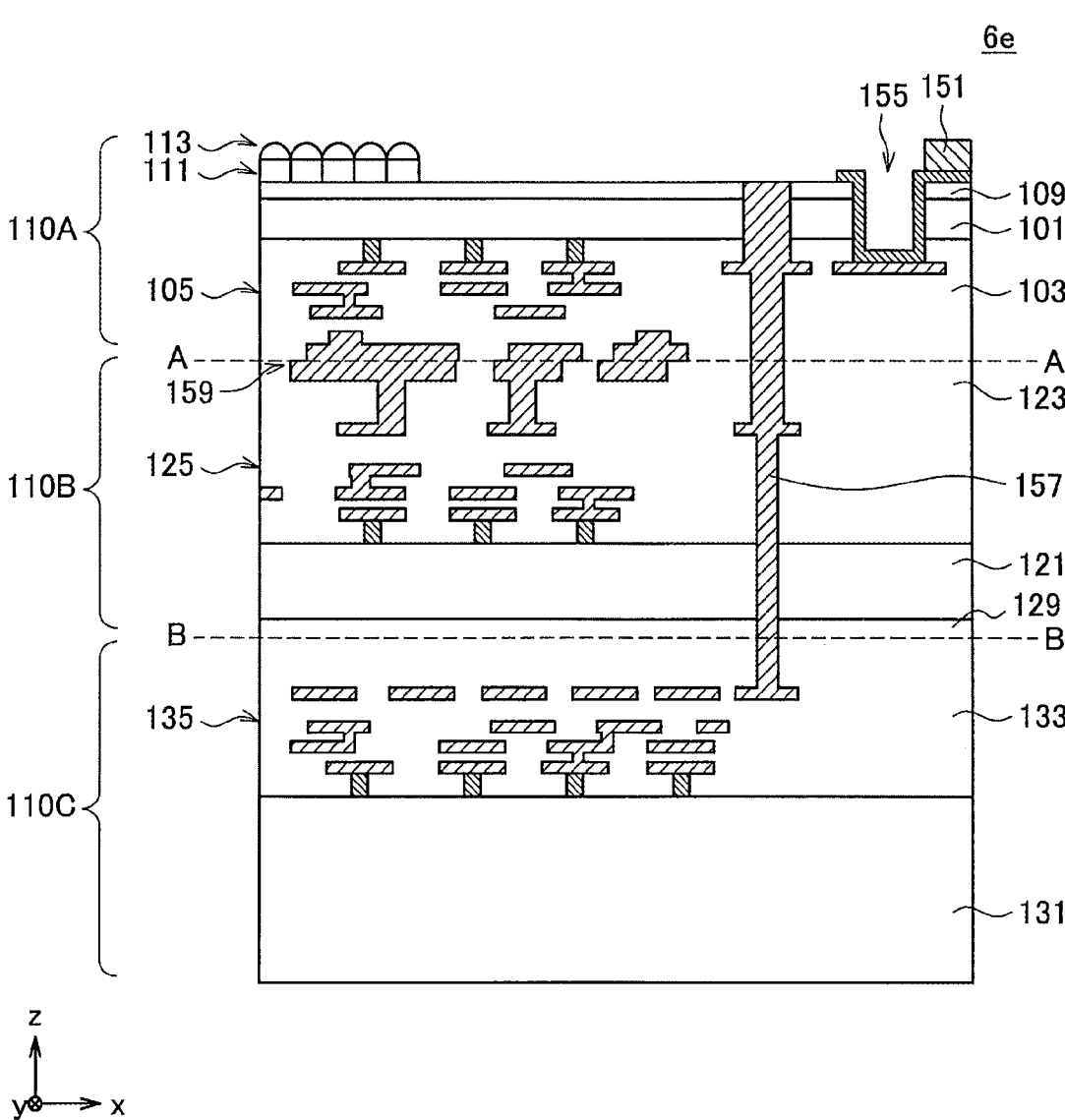
FIG. 14E is a vertical cross-sectional view of the schematic configuration of the solid-state imaging device according to the fifth configuration example of the present embodiment.

A solid-state imaging device 6e illustrated in FIG. 14E corresponds to the solid-state imaging device 6d illustrated in FIG. 14D in which the embedded pad structure and the types of wiring lines electrically coupled to each other by the shared contact type three-layer TSV 157 are changed. Specifically, in the configuration illustrated in FIG. 14E, a non-embedded lead pad structure for a predetermined wiring line in the multi-layered wiring layer 105 of the first substrate 110A (i.e., the lead line opening 155 for the predetermined wiring line in the multi-layered wiring layer 105 of the first substrate 110A and the pad 151 on the surface on the back side of the first substrate 110A) is provided instead of the embedded pad structure. Moreover, the TSV 157 electrically couples a predetermined wiring line of the first metal wiring layer in the multi-layered wiring layer 125 of the first substrate 110A, a predetermined wiring line of the first metal wiring layer in the multi-layered wiring layer 125 of the second substrate 110B, and a predetermined wiring line of the first metal wiring layer in the multi-layered wiring layer 135 of the third substrate 110C to each other.

Figure 14F:
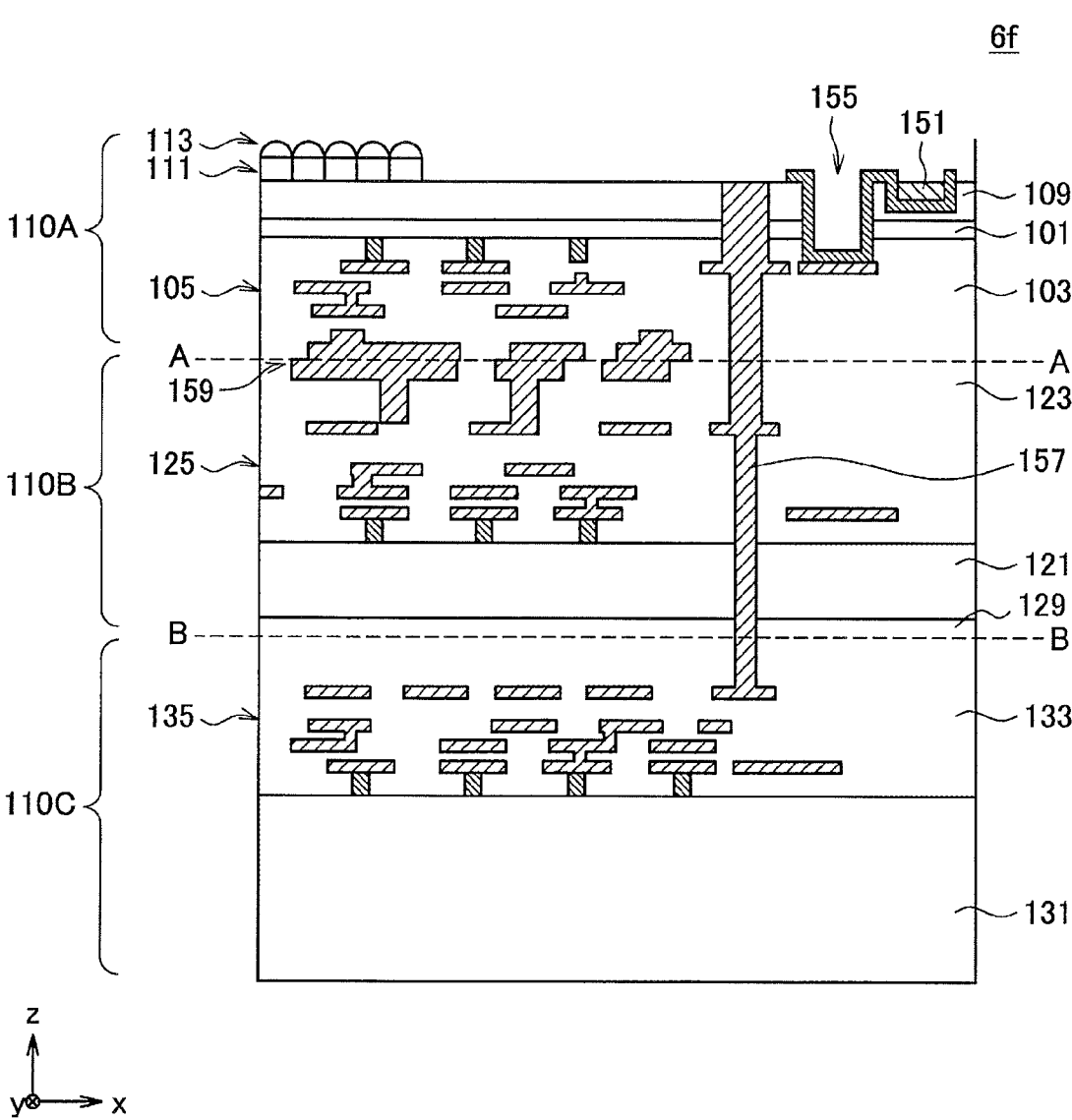
FIG. 14F is a vertical cross-sectional view of the schematic configuration of the solid-state imaging device according to the fifth configuration example of the present embodiment.

A solid-state imaging device 6f illustrated in FIG. 14F corresponds to the solid-state imaging device 6e illustrated in FIG. 14E in which the configuration of the lead pad structure is changed. Specifically, in the configuration illustrated in FIG. 14F, an embedded lead pad structure is provided as the lead pad structure instead of the non-embedded lead pad structure.

Note that in the respective configurations illustrated in FIGS. 14A to 14F, the types of wiring lines to which the shared contact type three-layer TSV 157 is coupled are not limited. The TSV 157 may be coupled to a predetermined wiring line of the first metal wiring layer or may be coupled to a predetermined wiring line of the second metal wiring layer. For example, in the respective configurations illustrated in FIGS. 14A to 14F, the wiring line of the first metal wiring layer to which the TSV 157 is coupled may be changed to a wiring line of the second metal wiring layer, and the wiring line of the second metal wiring layer to which the TSV 157 is coupled may be changed to a wiring line of the first metal wiring layer. Moreover, each of the multi-layered wiring layers 105, 125, and 135 may include only the first metal wiring layer, may include only the second metal wiring layer, or may include both the first metal wiring layer and the second metal wiring layer. For example, in the respective configurations illustrated in FIGS. 14A to 14F, the multi-layered wiring layer 135 of the third substrate 110C may include both the first metal wiring layer and the second metal wiring layer.

Further, it is sufficient if the shared contact type three-layer TSV 157 electrically couples the respective signal lines included in at least two substrates of the first substrate 110A, the second substrate 110B, and the third substrate 110C to each other and electrically couples the respective power supply lines included in the at least two substrates of the first substrate 110A, the second substrate 110B, and the third substrate 110C to each other, and the substrates including the respective signal lines electrically coupled to each other by the TSV 157 and the respective power supply lines electrically coupled to each other by the TSV 157 may be optionally changed.

5-6. Sixth Configuration Example

FIGS. 15A to 15J are vertical cross-sectional views of a schematic configuration of a solid-state imaging device according to the sixth configuration example of the present embodiment. The solid-state imaging device according to the present embodiment may have any of configurations illustrated in FIGS. 15A to 15J.

Figure 15A:
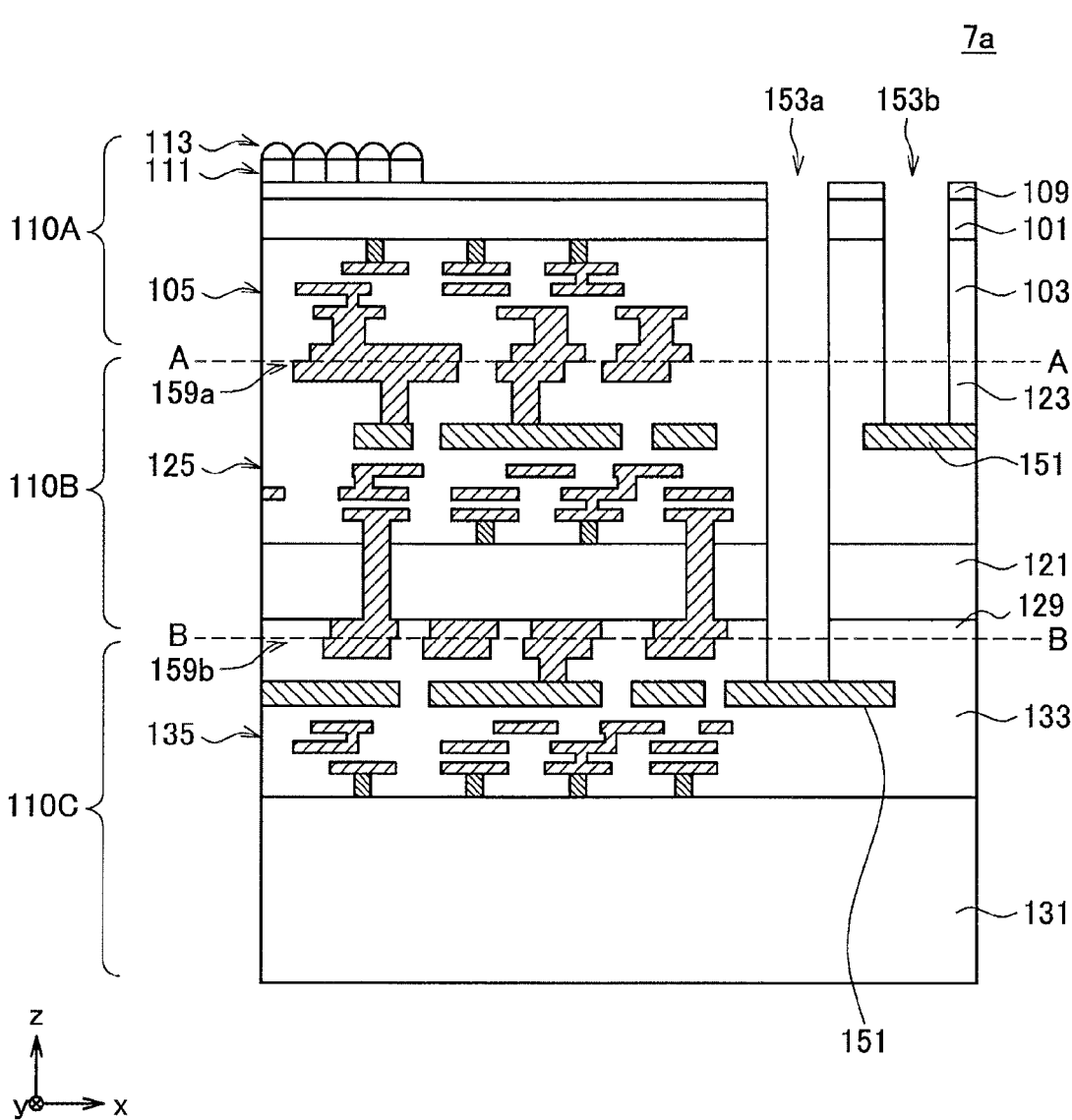
FIG. 15A is a vertical cross-sectional view of a schematic configuration of a solid-state imaging device according to a sixth configuration example of the present embodiment.

A solid-state imaging device 7a illustrated in FIG. 15A includes, as coupling structures, the electrode junction structure 159a provided between the first substrate 110A and the second substrate 110B, the electrode junction structure 159b provided between the second substrate 110B and the third substrate 110C, an embedded pad structure for the second substrate 110B (i.e., the pad 151 provided in the multi-layered wiring layer 125 of the second substrate 110B and the pad opening 153b exposing the pad 151), and an embedded pad structure for the third substrate 110C (i.e., the pad 151 provided in the multi-layered wiring layer 135 of the third substrate 110C and the pad opening 153a exposing the pad 151). The electrode junction structure 159a electrically couples the respective signal lines included in the first substrate 110A and the second substrate 110B to each other and electrically couples the respective power supply lines included in the first substrate 110A and the second substrate 110B to each other. Moreover, the electrode junction structure 159b electrically couples the respective signal lines included in the second substrate 110B and the third substrate 110C to each other and electrically couples the respective power supply lines included in the second substrate 110B and the third substrate 110C to each other. Further, the two embedded pad structures electrically couple the respective signal lines included in the second substrate 110B and the third substrate 110C to each other and electrically couple the respective power supply lines included in the second substrate 110B and the third substrate 110C to each other.

Figure 15B:
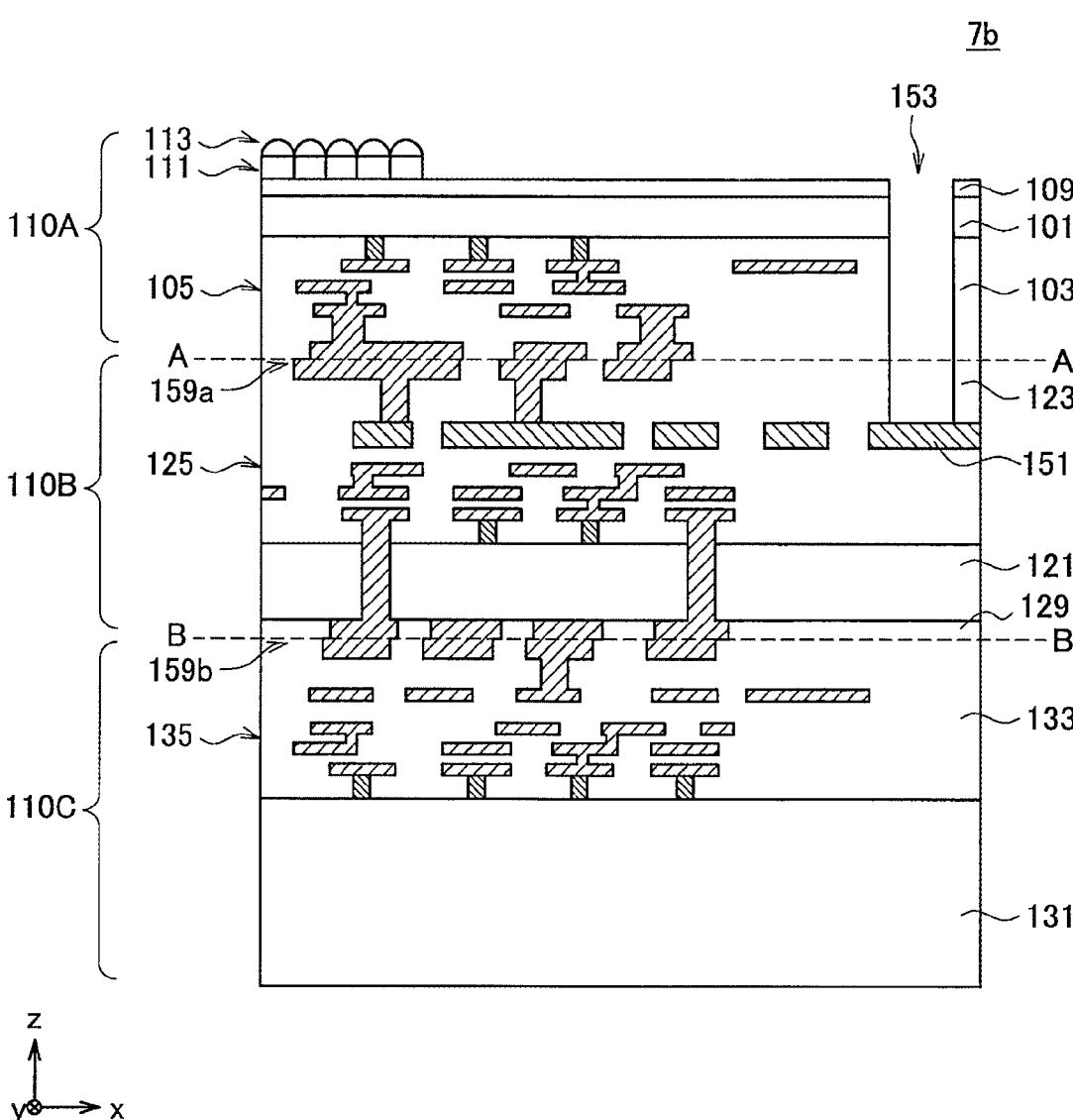
FIG. 15B is a vertical cross-sectional view of the schematic configuration of the solid-state imaging device according to the sixth configuration example of the present embodiment.

A solid-state imaging device 7b illustrated in FIG. 15B corresponds to the solid-state imaging device 7a illustrated in FIG. 15A in which the embedded pad structures are changed. Specifically, in the configuration illustrated in FIG. 15B, only the embedded pad structure for the pad 151 of the second substrate 110B is provided.

Figure 15C:
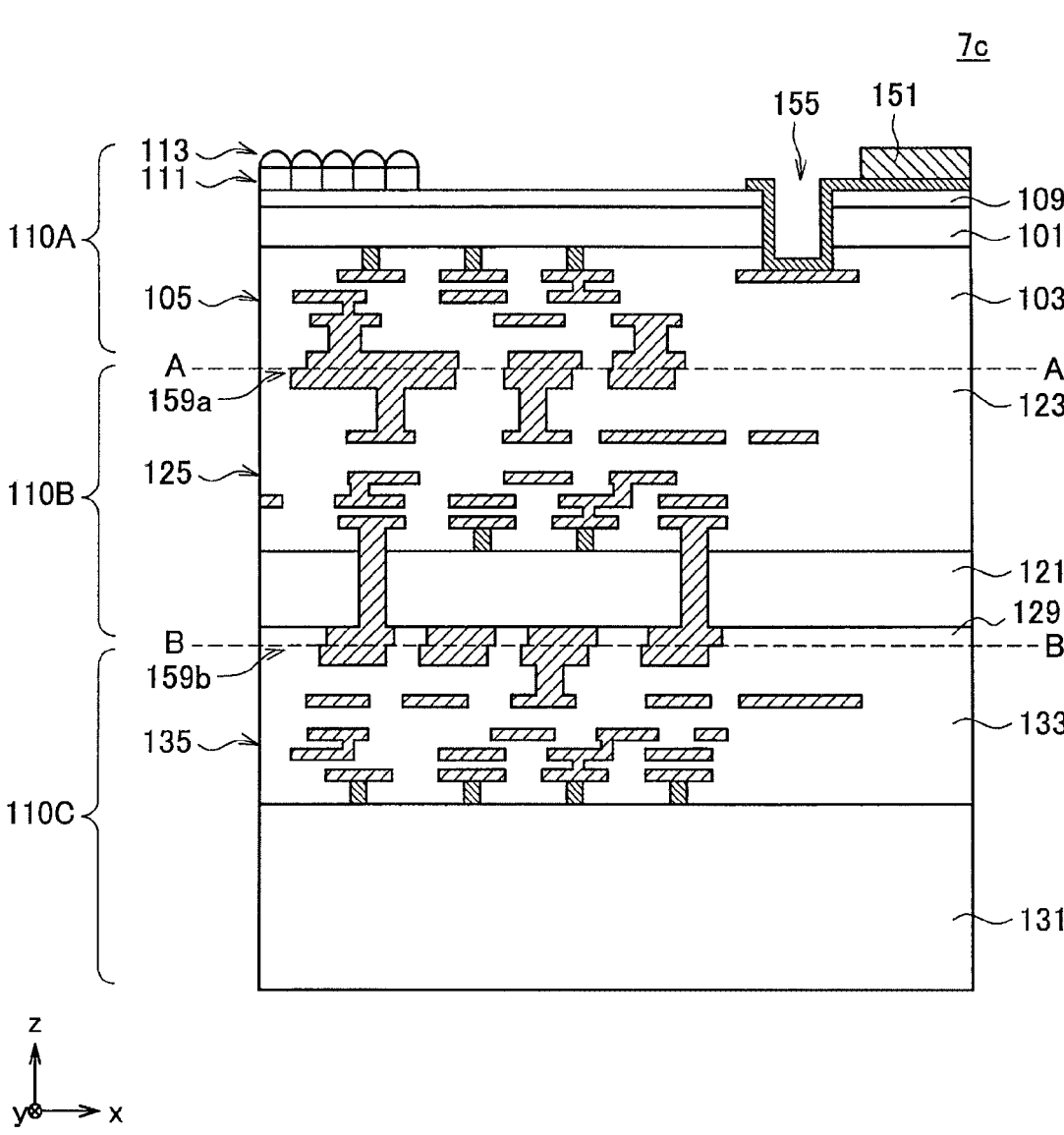
FIG. 15C is a vertical cross-sectional view of the schematic configuration of the solid-state imaging device according to the sixth configuration example of the present embodiment.

A solid-state imaging device 7c illustrated in FIG. 15C corresponds to the solid-state imaging device 7b illustrated in FIG. 15B in which the embedded pad structure is changed. Specifically, in the configuration illustrated in FIG. 15C, a non-embedded lead pad structure for a predetermined wiring line in the multi-layered wiring layer 105 of the first substrate 110A (i.e., the lead line opening 155 for the predetermined wiring line in the multi-layered wiring layer 105 of the first substrate 110A and the pad 151 on the surface on the back side of the first substrate 110A) is provided instead of the embedded pad structure.

Figure 15D:
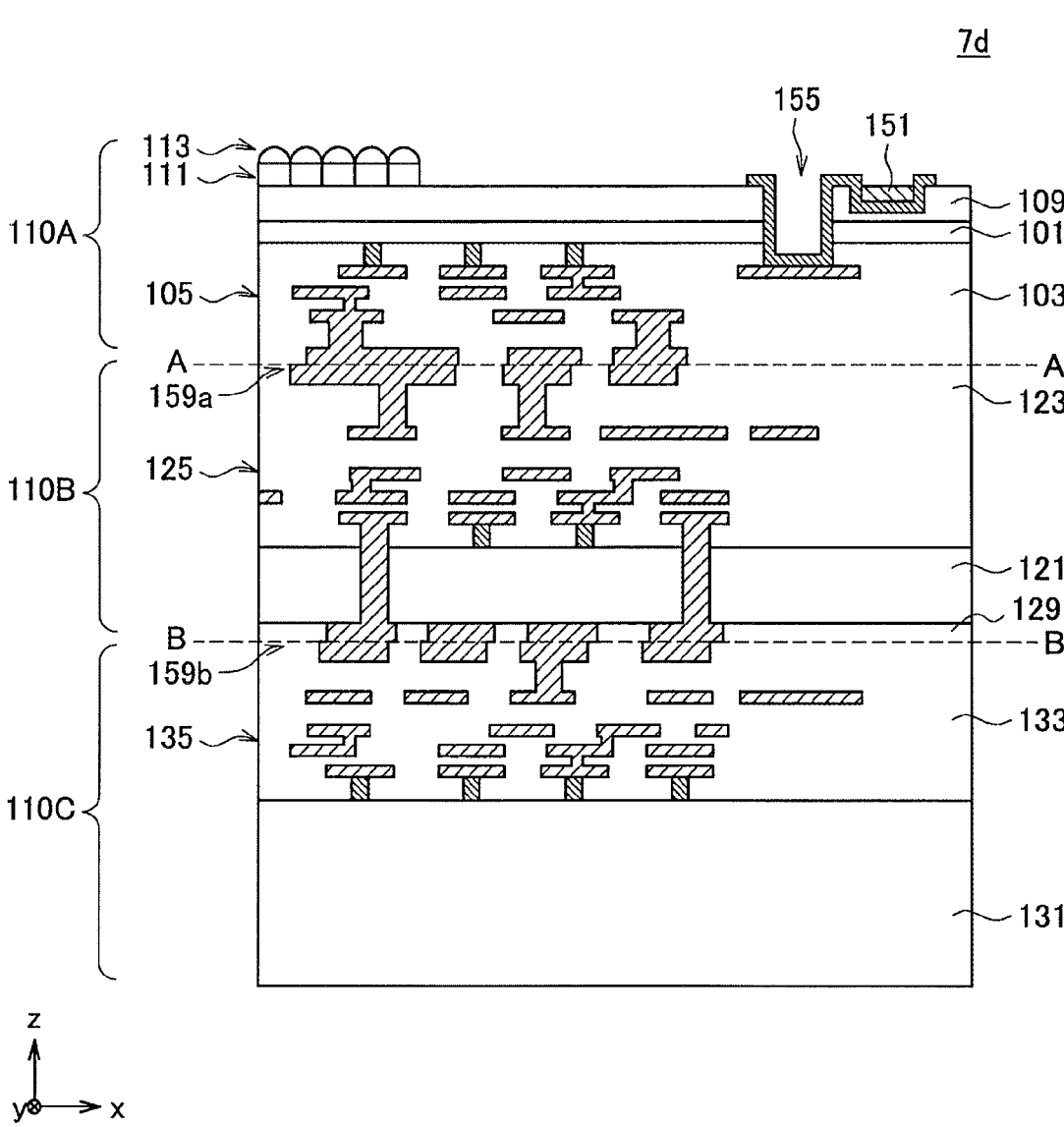
FIG. 15D is a vertical cross-sectional view of the schematic configuration of the solid-state imaging device according to the sixth configuration example of the present embodiment.

A solid-state imaging device 7d illustrated in FIG. 15D corresponds to the solid-state imaging device 7c illustrated in FIG. 15C in which the configuration of the lead pad structure is changed. Specifically, in the configuration illustrated in FIG. 15D, an embedded lead pad structure is provided as the lead pad structure instead of the non-embedded lead pad structure.

Figure 15E:
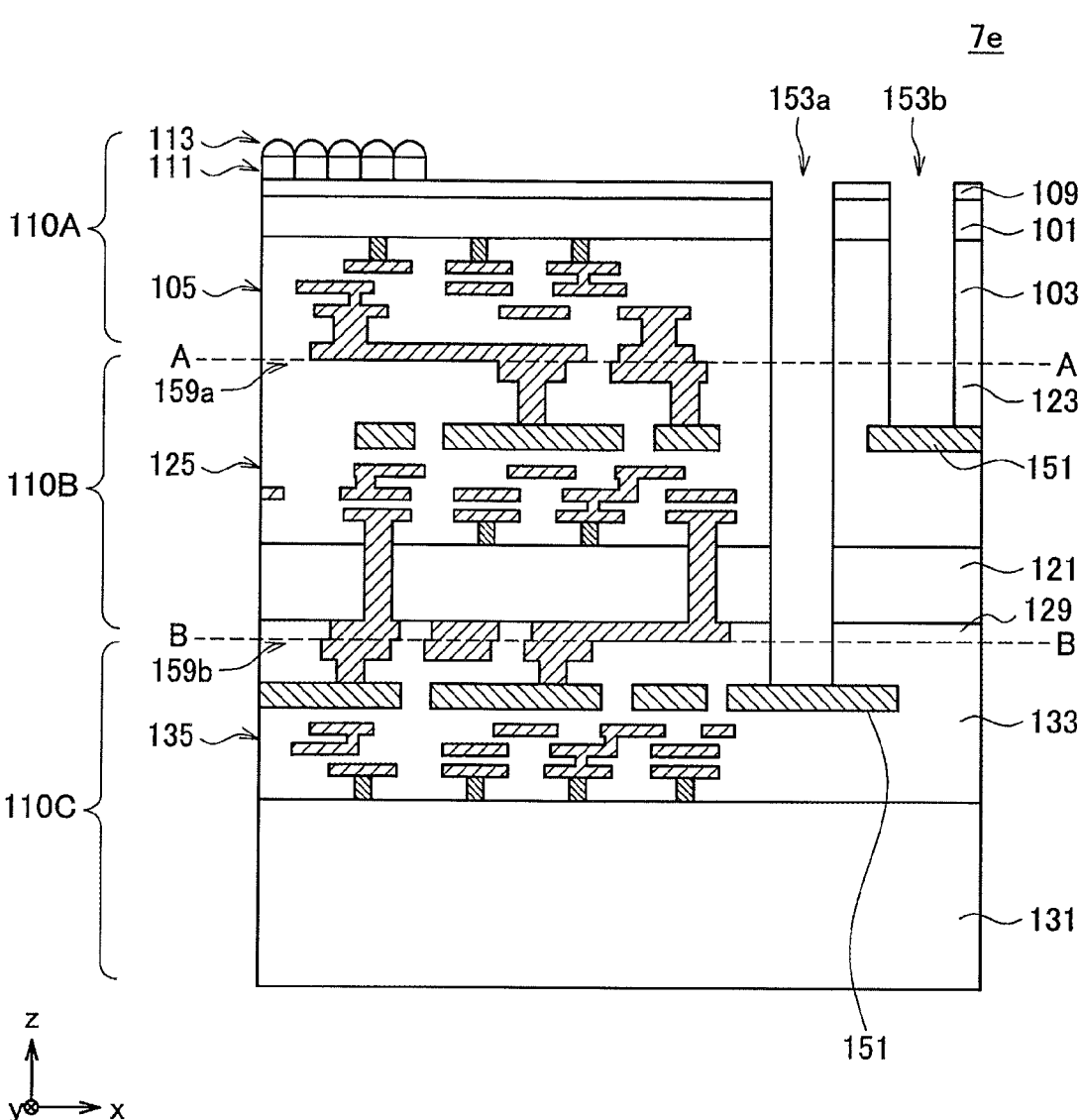
FIG. 15E is a vertical cross-sectional view of the schematic configuration of the solid-state imaging device according to the sixth configuration example of the present embodiment.

A solid-state imaging device 7e illustrated in FIG. 15E corresponds to the solid-state imaging device 7a illustrated in FIG. 15A in which the configurations of the electrode junction structures 159a and 159b are changed. Specifically, in the configuration illustrated in FIG. 15A, the electrode junction structures 159a and 159b are provided to electrically couple wiring lines, which are disposed in different substrates and exist at substantially the same position in the horizontal plane, to each other. In contrast, in the configuration illustrated in FIG. 15E, the electrode junction structure 159a is formed to extend a portion of an electrode on the first substrate 110A side of electrodes included in the electrode junction structure 159a in a horizontal in-plane direction, and is configured to electrically couple a wiring line in the multi-layered wiring layer 105 of the first substrate 110A and a wiring line in the multi-layered wiring layer 125 of the second substrate 110B, which exist at different positions in the horizontal plane, to each other. Similarly, the electrode junction structure 159b is formed to extend a portion of an electrode on the second substrate 110B side of electrodes included in the electrode junction structure 159b in the horizontal in-plane direction, and is configured to electrically couple a wiring line in the multi-layered wiring layer 125 of the second substrate 110B and a wiring line in the multi-layered wiring layer 135 of the third substrate 110C, which exist at different positions in the horizontal plane, to each other.

According to this configuration, it is possible for the electrodes extending in the horizontal in-plane direction of the electrodes included in the electrode junction structures 159a and 159b to have a function as an electrode as well as a function as a wiring line. That is, it is possible to use the electrodes included in the electrode junction structures 159a and 159b also as wiring lines, which improves the degree of flexibility in designing the wiring lines of the substrates 110A, 110B, and 110C.

Figure 15F:
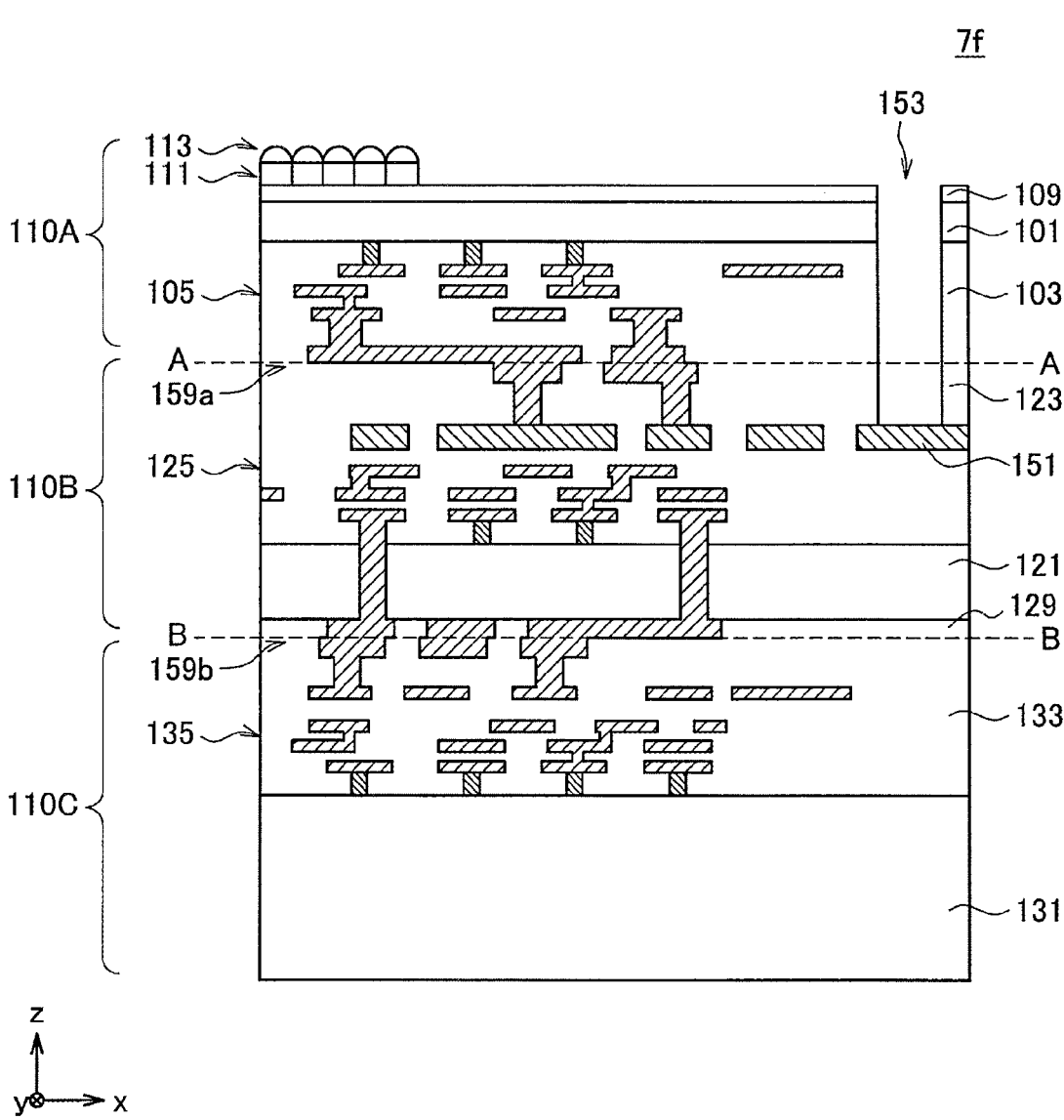
FIG. 15F is a vertical cross-sectional view of the schematic configuration of the solid-state imaging device according to the sixth configuration example of the present embodiment.

A solid-state imaging device 7f illustrated in FIG. 15F corresponds to the solid-state imaging device 7b illustrated in FIG. 15B in which the configurations of the electrode junction structures 159a and 159b are changed. Specifically, in the configuration illustrated in FIG. 15F, similarly to the configuration illustrated in FIG. 15E, the electrode junction structures 159a and 159b each are formed to extend a portion of an electrode thereof in the horizontal in-plane direction, and are configured to electrically couple wiring lines, which are disposed in the different substrates and exist at different positions in the horizontal plane, to each other.

Figure 15G:
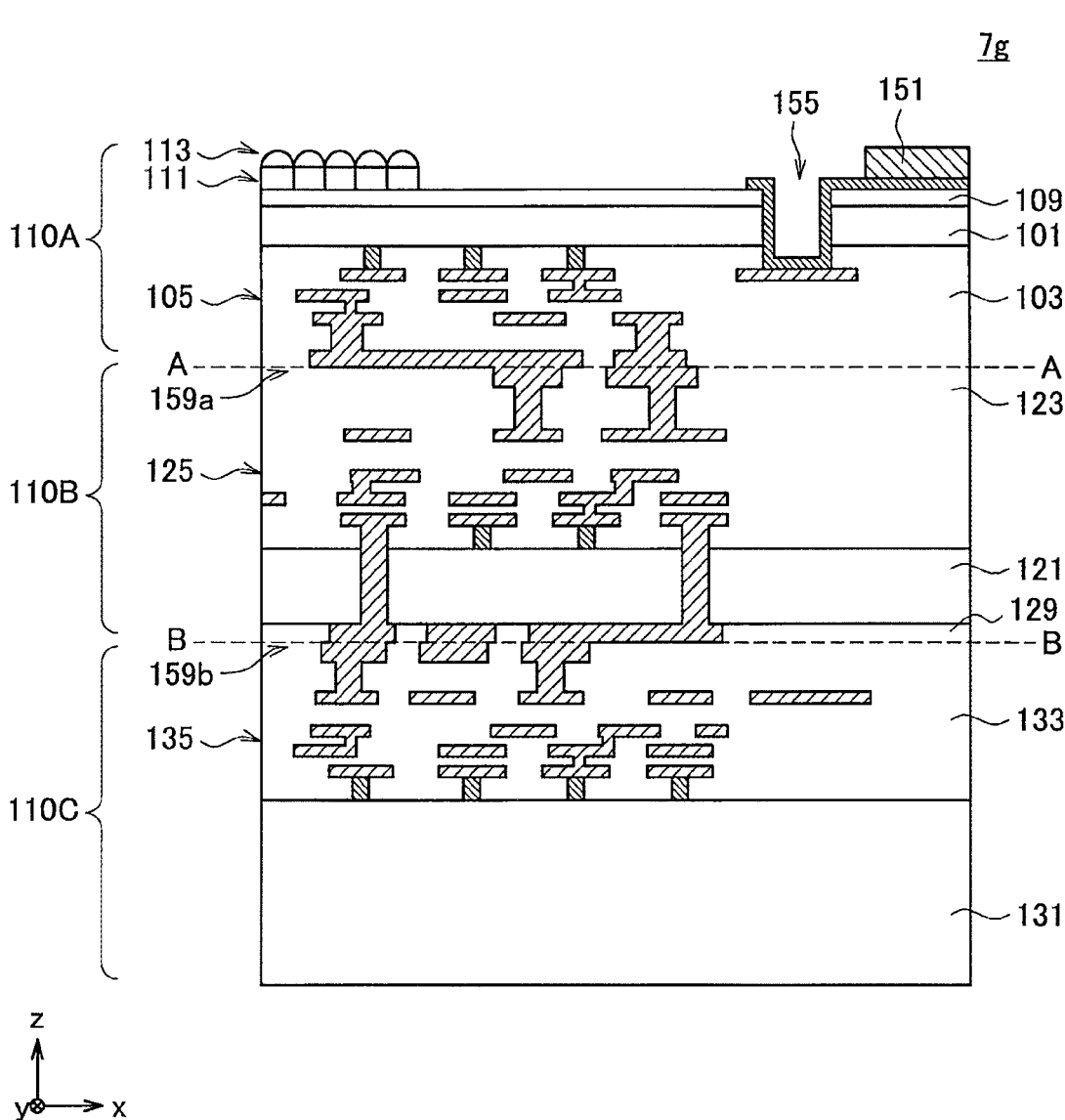
FIG. 15G is a vertical cross-sectional view of the schematic configuration of the solid-state imaging device according to the sixth configuration example of the present embodiment.

A solid-state imaging device 7g illustrated in FIG. 15G corresponds to the solid-state imaging device 7c illustrated in FIG. 15C in which the configurations of the electrode junction structures 159a and 159b are changed. Specifically, in the configuration illustrated in FIG. 15G, similarly to the configuration illustrated in FIG. 15E, the electrode junction structures 159a and 159b each are formed to extend a portion of an electrode thereof in the horizontal in-plane direction, and are configured to electrically couple wiring lines, which are disposed in different substrates and exist at different positions in the horizontal plane, to each other.

Figure 15H:
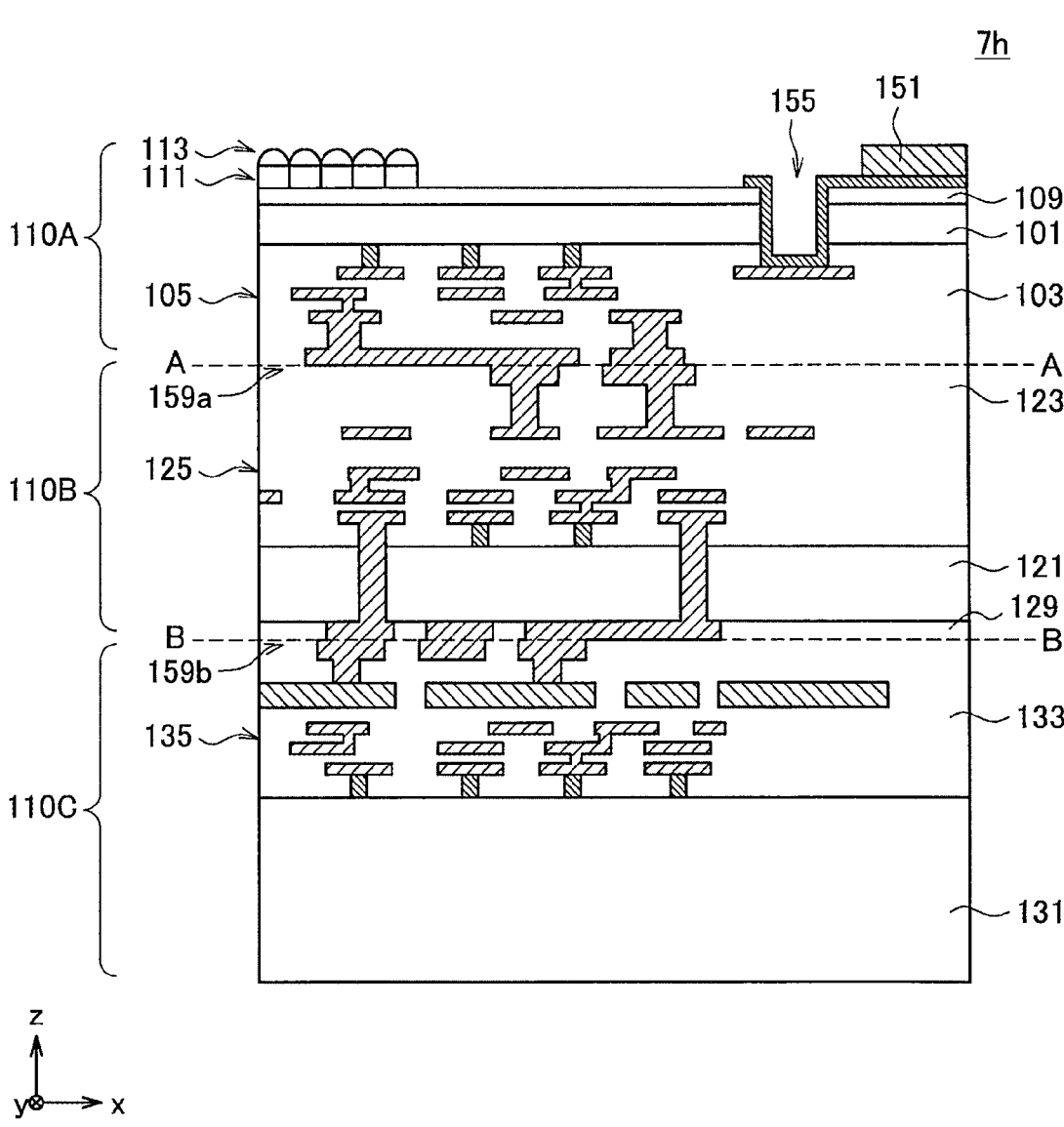
FIG. 15H is a vertical cross-sectional view of the schematic configuration of the solid-state imaging device according to the sixth configuration example of the present embodiment.

A solid-state imaging device 7h illustrated in FIG. 15H corresponds to the solid-state imaging device 7g illustrated in FIG. 15G in which the configuration of the multi-layered wiring layer 135 of the third substrate 110C is changed. Specifically, in the configuration illustrated in FIG. 15G, the multi-layered wiring layer 135 includes only the first metal wiring layer, but in the configuration illustrated in FIG. 15H, the multi-layered wiring layer 135 include both the first metal wiring layer and the second metal wiring layer.

Figure 15I:
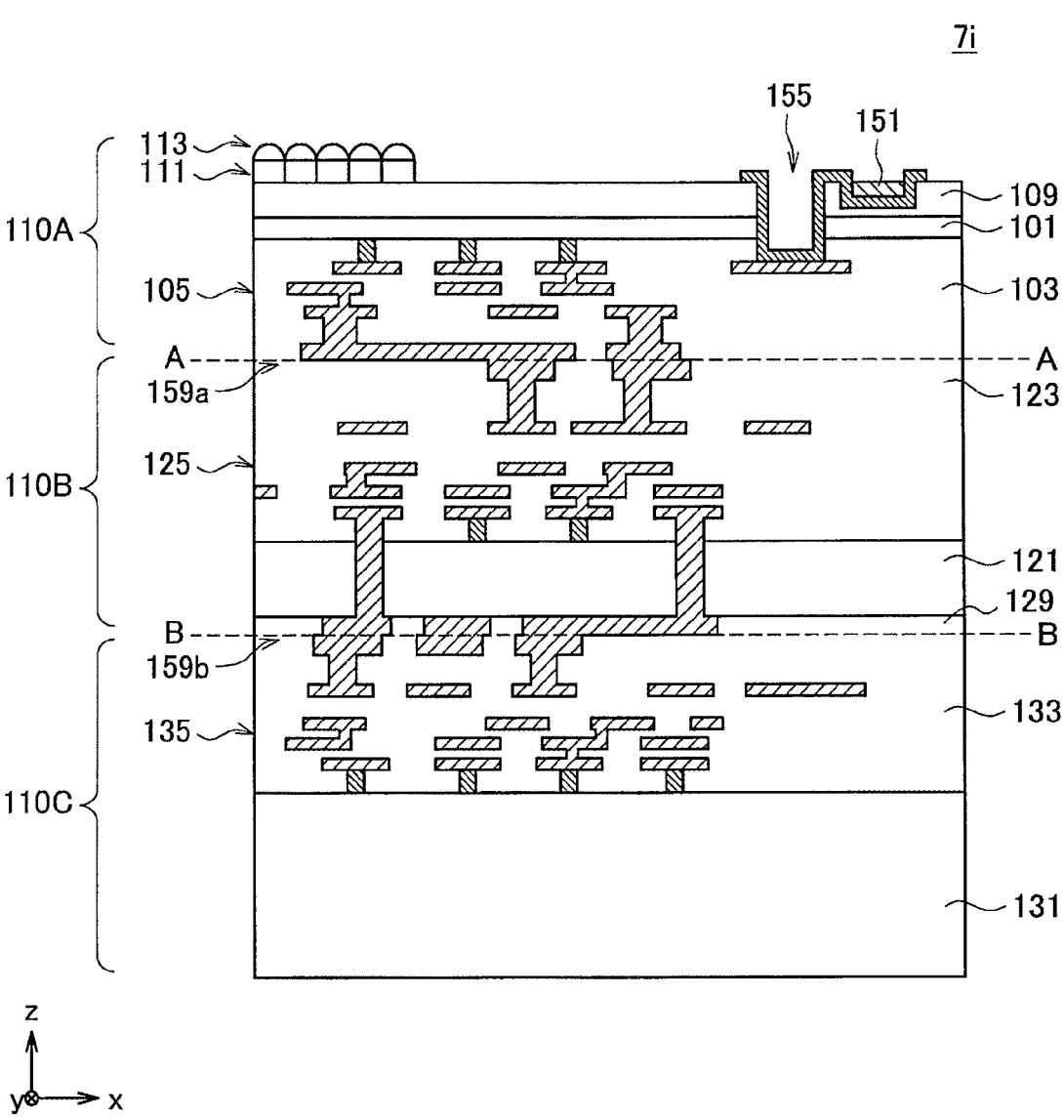
FIG. 15I is a vertical cross-sectional view of the schematic configuration of the solid-state imaging device according to the sixth configuration example of the present embodiment.

A solid-state imaging device 7i illustrated in FIG. 15I corresponds to the solid-state imaging device 7d illustrated in FIG. 15D in which the configurations of the electrode junction structures 159a and 159b are changed. Specifically, in the configuration illustrated in FIG. 15I, similarly to the configuration illustrated in FIG. 15E, the electrode junction structures 159a and 159b each are formed to extend a portion of an electrode thereof in the horizontal in-plane direction, and are configured to electrically couple wiring lines, which are disposed in different substrates and exist at different positions in the horizontal plane, to each other.

Figure 15J:
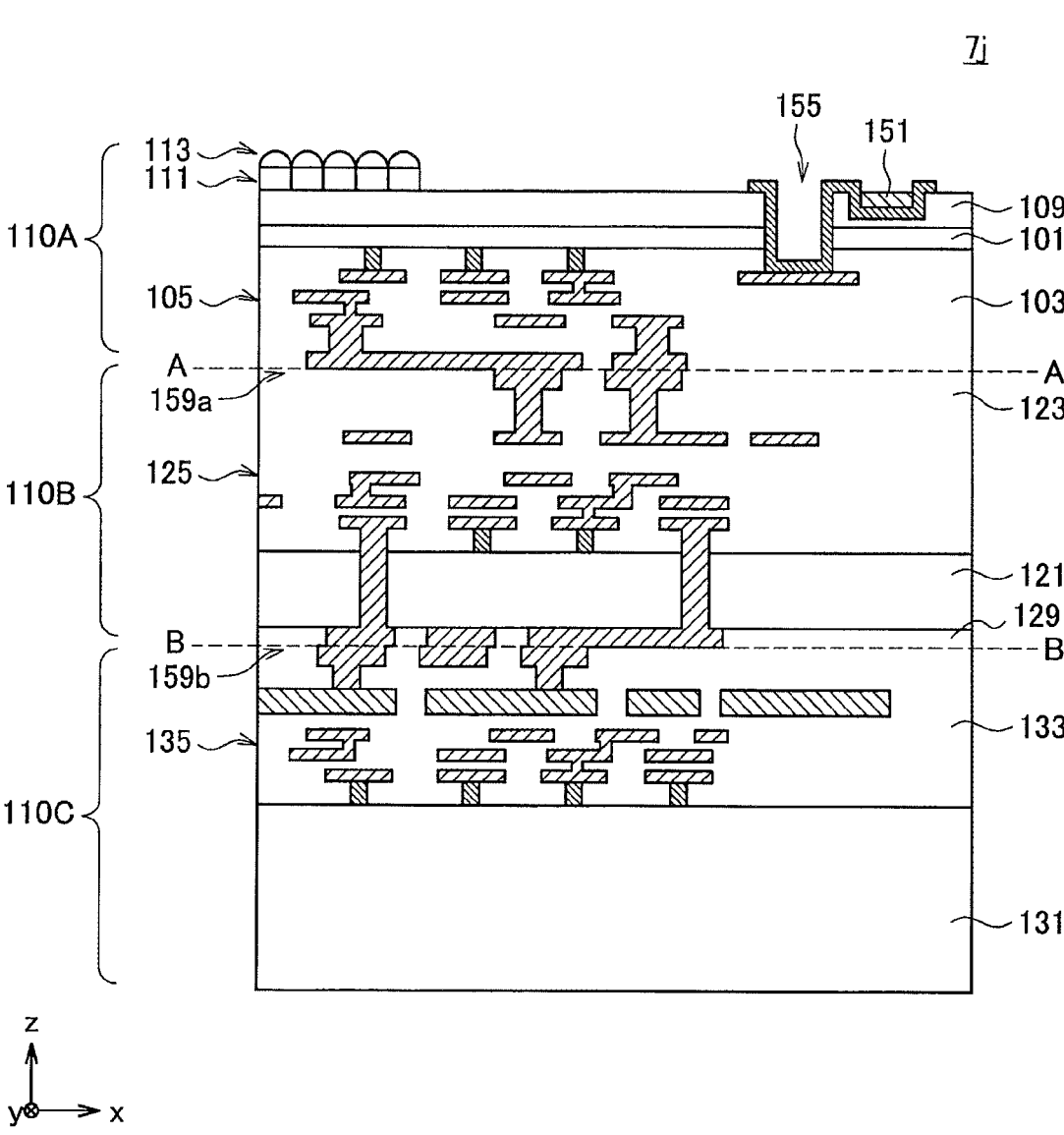
FIG. 15J is a vertical cross-sectional view of the schematic configuration of the solid-state imaging device according to the sixth configuration example of the present embodiment.

A solid-state imaging device 7j illustrated in FIG. 15J corresponds to the solid-state imaging device 7i illustrated in FIG. 15I in which the configuration of the multi-layered wiring layer 135 of the third substrate 110C is changed. Specifically, in the configuration illustrated in FIG. 15I, the multi-layered wiring layer 135 includes only the first metal wiring layer, but in the configuration illustrated in FIG. 15J, the multi-layered wiring layer 135 includes both the first metal wiring layer and the second metal wiring layer.

In the respective configurations illustrated in FIGS. 15A to 15J, each of each of the multi-layered wiring layers 105, 125, and 135 may include only the first metal wiring layer, may include only the second metal wiring layer, or may include both the first metal wiring layer and the second metal wiring layer. For example, in the respective configurations illustrated in FIGS. 15A to 15D, in the illustrated example, the multi-layered wiring layer 135 of the third substrate 110C includes only the first metal wiring layer, but the multi-layered wiring layer 135 may include both the first metal wiring layer and the second metal wiring layer.

5-7. Seventh Configuration Example

FIGS. 16A to 16F are vertical cross-sectional views of a schematic configuration of a solid-state imaging device according to the seventh configuration example of the present embodiment. The solid-state imaging device according to the present embodiment may have any of configurations illustrated in FIGS. 16A to 16F.

Figure 16A:
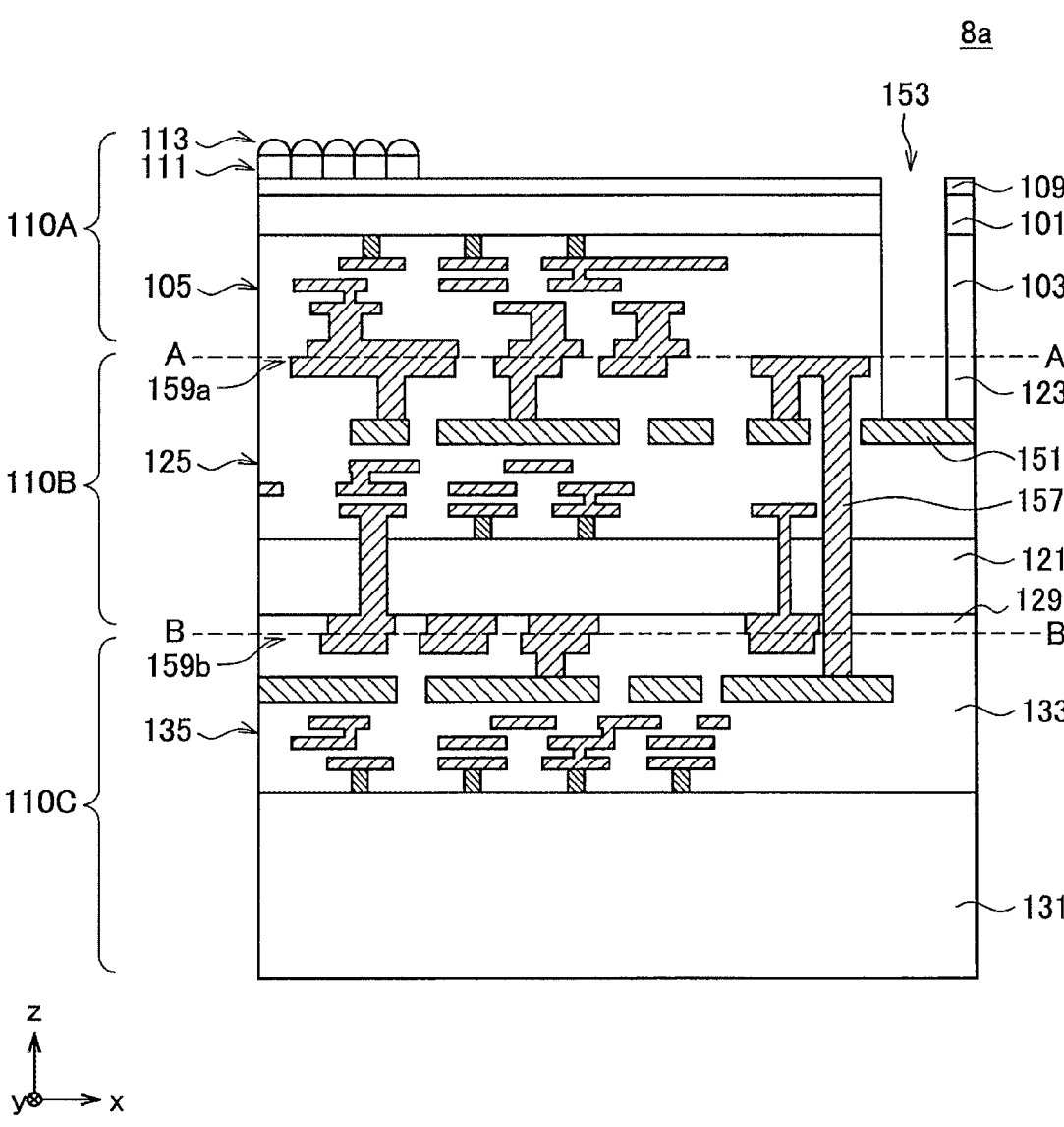
FIG. 16A is a vertical cross-sectional view of a schematic configuration of a solid-state imaging device according to a seventh configuration example of the present embodiment.

A solid-state imaging device 8a illustrated in FIG. 16A include, as coupling structures, the electrode junction structure 159a provided between the first substrate 110A and the second substrate 110B, the electrode junction structure 159b provided between the second substrate 110B and the third substrate 110C, the twin contact type two-layer TSV 157, and an embedded pad structure for the second substrate 110B (i.e., the pad 151 provided in the multi-layered wiring layer 125 of the second substrate 110B and the pad opening 153b exposing the pad 151). The electrode junction structure 159a electrically couples the respective signal lines included in the first substrate 110A and the second substrate 110B to each other and electrically couples the respective power supply lines included in the first substrate 110A and the second substrate 110B to each other. Moreover, the electrode junction structure 159b electrically couples the respective signal lines included in the second substrate 110B and the third substrate 110C to each other and electrically couples the respective power supply lines included in the second substrate 110B and the third substrate 110C to each other. Further, the TSV 157 is formed from the front surface side of the second substrate 110B toward the third substrate 110C, and is provided to electrically couple the respective signal lines included in the second substrate 110B and the third substrate 110C to each other and electrically couple the respective power supply lines included in the second substrate 110B and the third substrate 110C to each other. Note that in the configuration illustrated in FIG. 16A, the TSV 157 electrically couples a predetermined wiring line of the second metal wiring layer in the multi-layered wiring layer 125 of the second substrate 110B and a predetermined wiring line of the second metal wiring layer in the multi-layered wiring layer 135 of the third substrate 110C to each other.

Figure 16B:
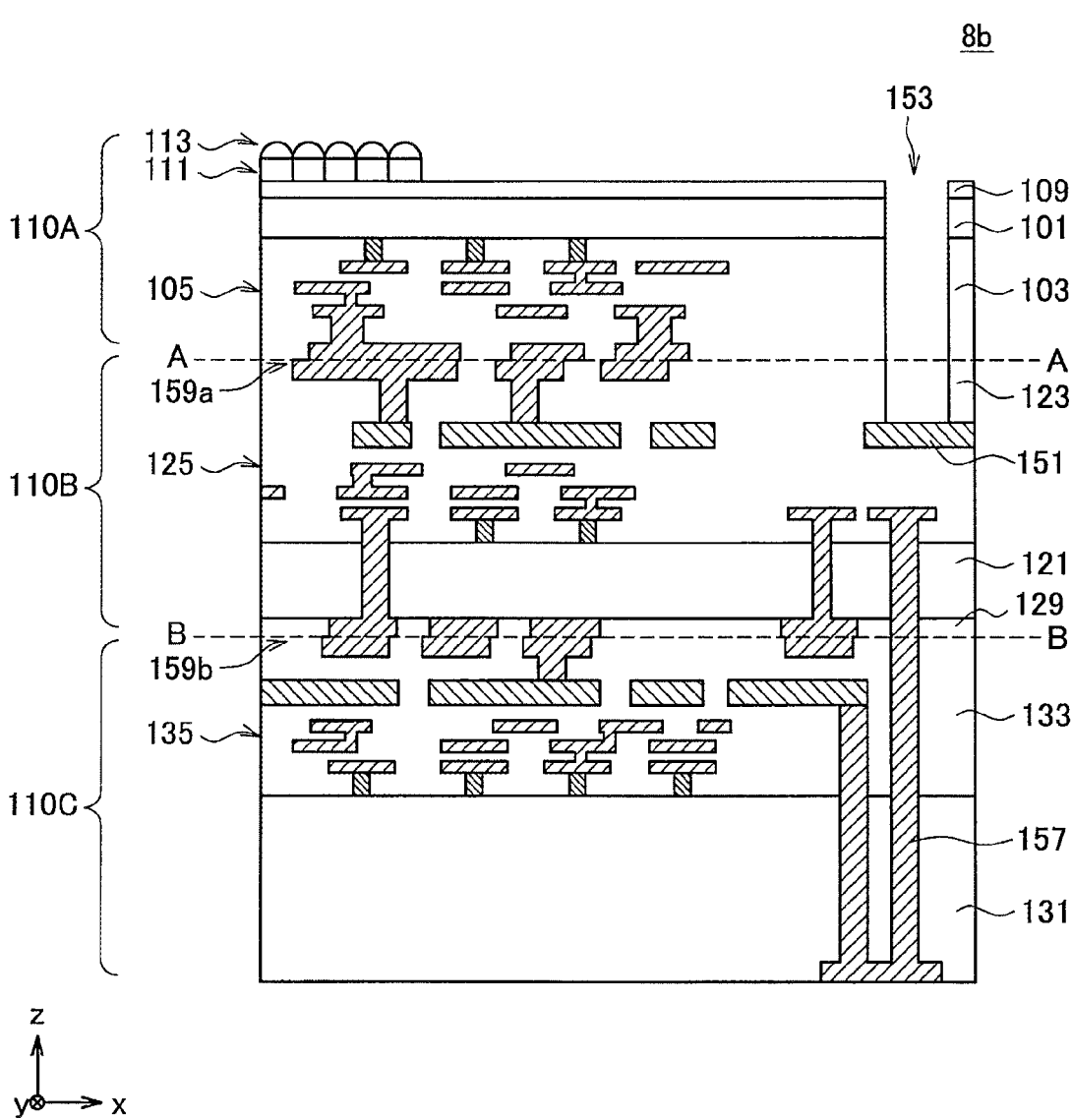
FIG. 16B is a vertical cross-sectional view of the schematic configuration of the solid-state imaging device according to the seventh configuration example of the present embodiment.

A solid-state imaging device 8b illustrated in FIG. 16B corresponds to the solid-state imaging device 8a illustrated in FIG. 16A in which the configuration of the twin contact type two-layer TSV 157 is changed. Specifically, in the configuration illustrated in FIG. 16B, the TSV 157 is formed from the back surface side of the third substrate 110C toward the second substrate 110B. Moreover, in the configuration illustrated in FIG. 16B, the TSV 157 electrically couples a predetermined wiring line of the first metal wiring layer in the multi-layered wiring layer 125 of the second substrate 110B and a predetermined wiring line of the second metal wiring layer in the multi-layered wiring layer 135 of the third substrate 110C to each other.

Figure 16C:
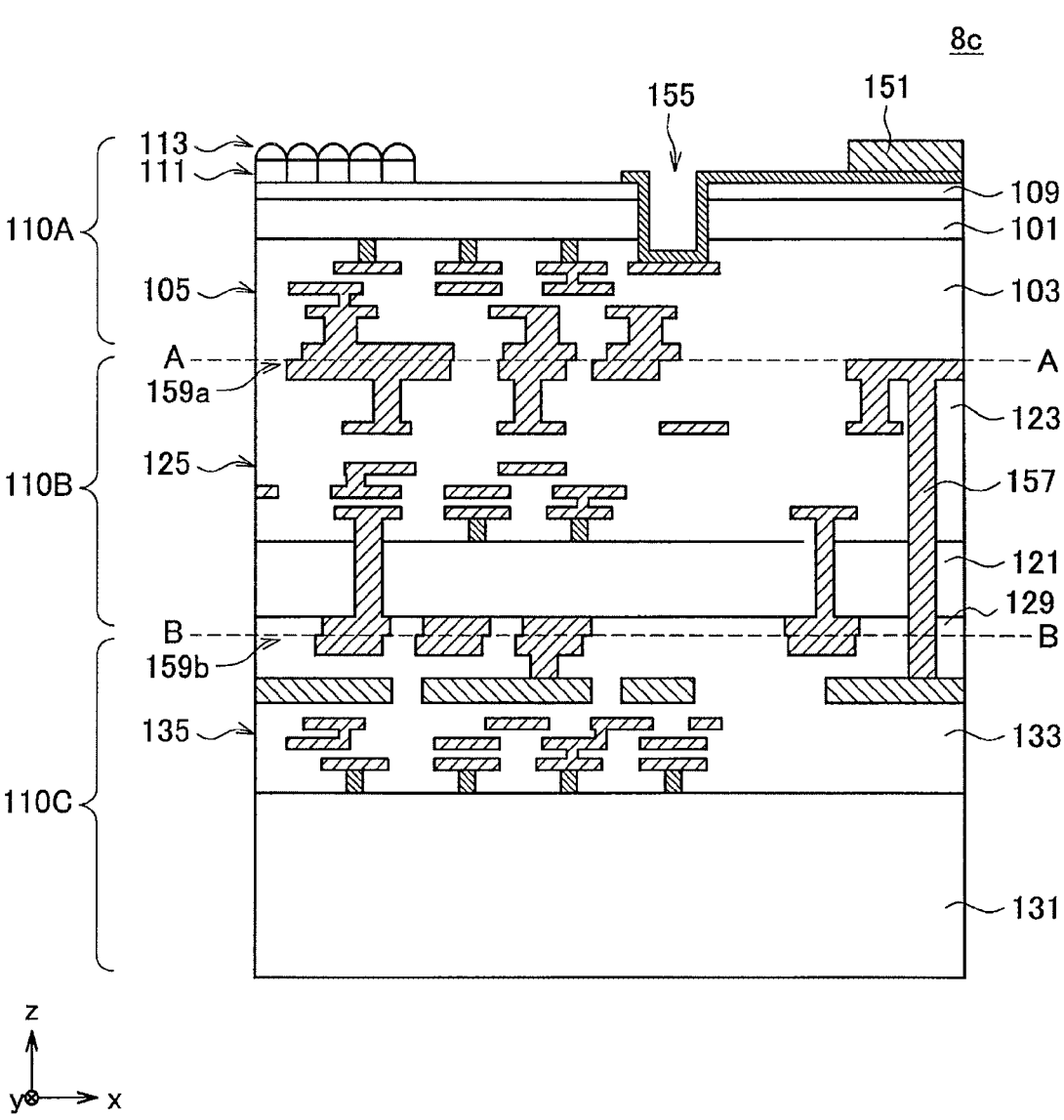
FIG. 16C is a vertical cross-sectional view of the schematic configuration of the solid-state imaging device according to the seventh configuration example of the present embodiment.

A solid-state imaging device 8c illustrated in FIG. 16C corresponds to the solid-state imaging device 8a illustrated in FIG. 16A in which the embedded pad structure and the types of wiring lines electrically coupled to each other by the twin contact type two-layer TSV 157 are changed. Specifically, in the configuration illustrated in FIG. 16C, a non-embedded lead pad structure for a predetermined wiring line in the multi-layered wiring layer 105 of the first substrate 110A (i.e., the lead line opening 155 for the predetermined wiring line in the multi-layered wiring layer 105 of the first substrate 110A and the pad 151 on the surface on the back side of the first substrate 110A) is provided instead of the embedded pad structure. Moreover, in the configuration illustrated in FIG. 16C, the TSV 157 electrically couples a predetermined wiring line of the first metal wiring layer in the multi-layered wiring layer 125 of the second substrate 110B and a predetermined wiring line of the second metal wiring layer in the multi-layered wiring layer 135 of the third substrate 110C to each other.

Figure 16D:
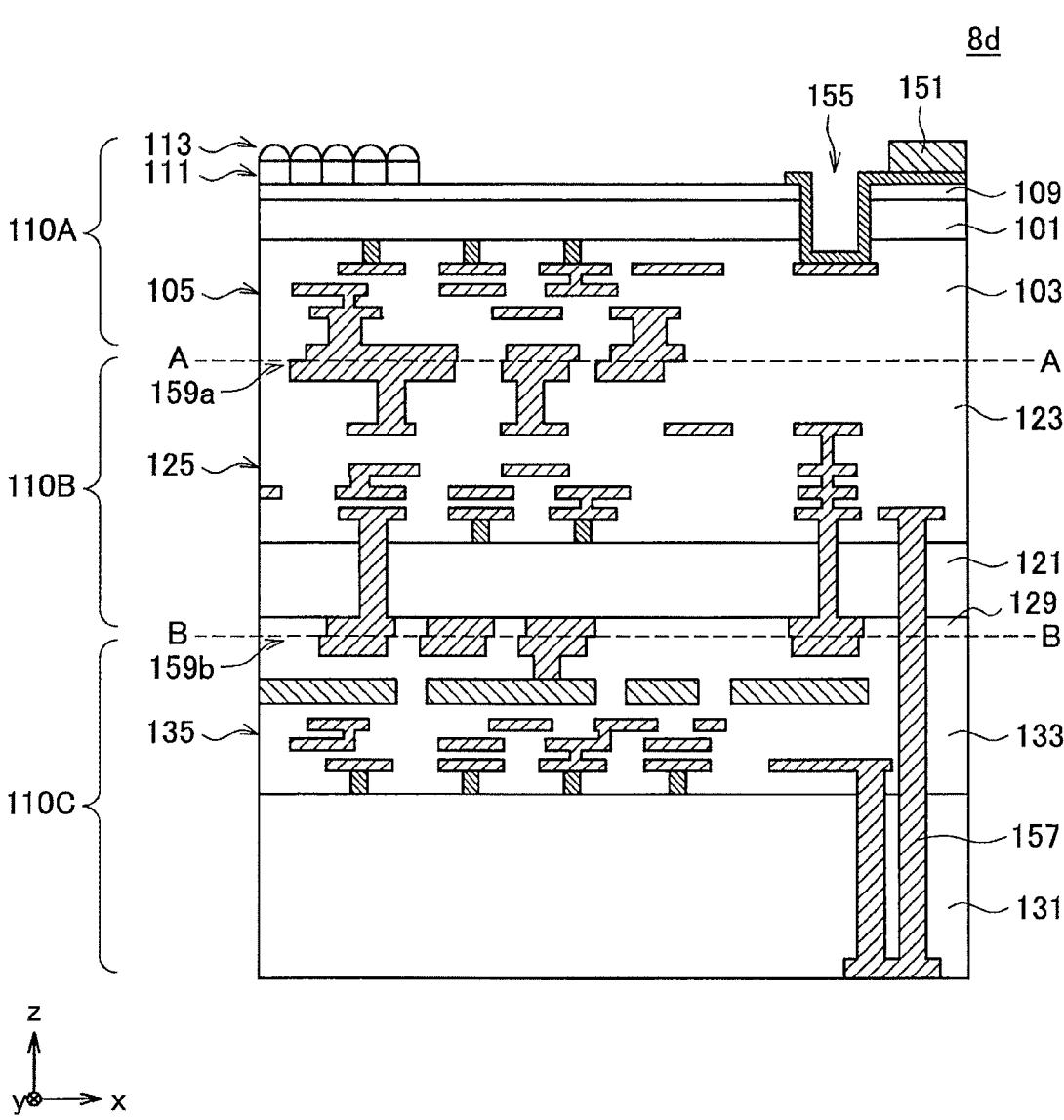
FIG. 16D is a vertical cross-sectional view of the schematic configuration of the solid-state imaging device according to the seventh configuration example of the present embodiment.

A solid-state imaging device 8d illustrated in FIG. 16D corresponds to the solid-state imaging device 8c illustrated in FIG. 16C in which the configuration of the twin contact type two-layer TSV 157 is changed. Specifically, in the configuration illustrated in FIG. 16D, the TSV 157 is formed from the back surface side of the third substrate 110C toward the second substrate 110B. Moreover, in the configuration illustrated in FIG. 16D, the TSV 157 electrically couples a predetermined wiring line of the first metal wiring layer in the multi-layered wiring layer 125 of the second substrate 110B and a predetermined wiring line of the first metal wiring layer in the multi-layered wiring layer 135 of the third substrate 110C to each other.

Figure 16E:
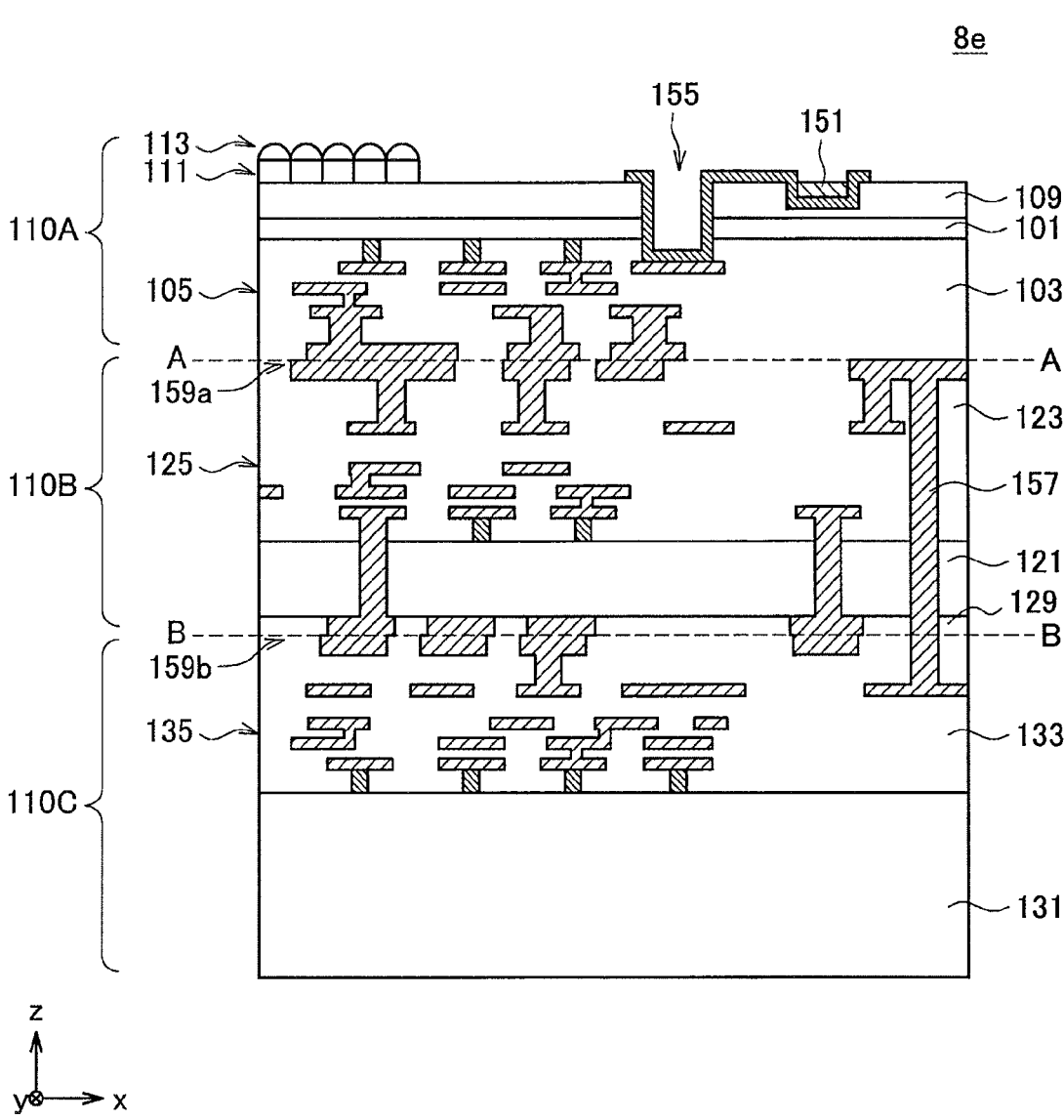
FIG. 16E is a vertical cross-sectional view of the schematic configuration of the solid-state imaging device according to the seventh configuration example of the present embodiment.

A solid-state imaging device 8e illustrated in FIG. 16E corresponds to the solid-state imaging device 8c illustrated in FIG. 16C in which the configuration of the lead pad structure and the types of wiring lines electrically coupled to each other by the twin contact type two-layer TSV 157 are changed. Specifically, in the configuration illustrated in FIG. 16E, an embedded lead pad structure is provided as the lead pad structure instead of the non-embedded lead pad structure. Moreover, in the configuration illustrated in FIG. 16E, the TSV 157 electrically couples a predetermined wiring line of the first metal wiring layer in the multi-layered wiring layer 125 of the second substrate 110B and a predetermined wiring line of the first metal wiring layer in the multi-layered wiring layer 135 of the third substrate 110C to each other.

Figure 16F:
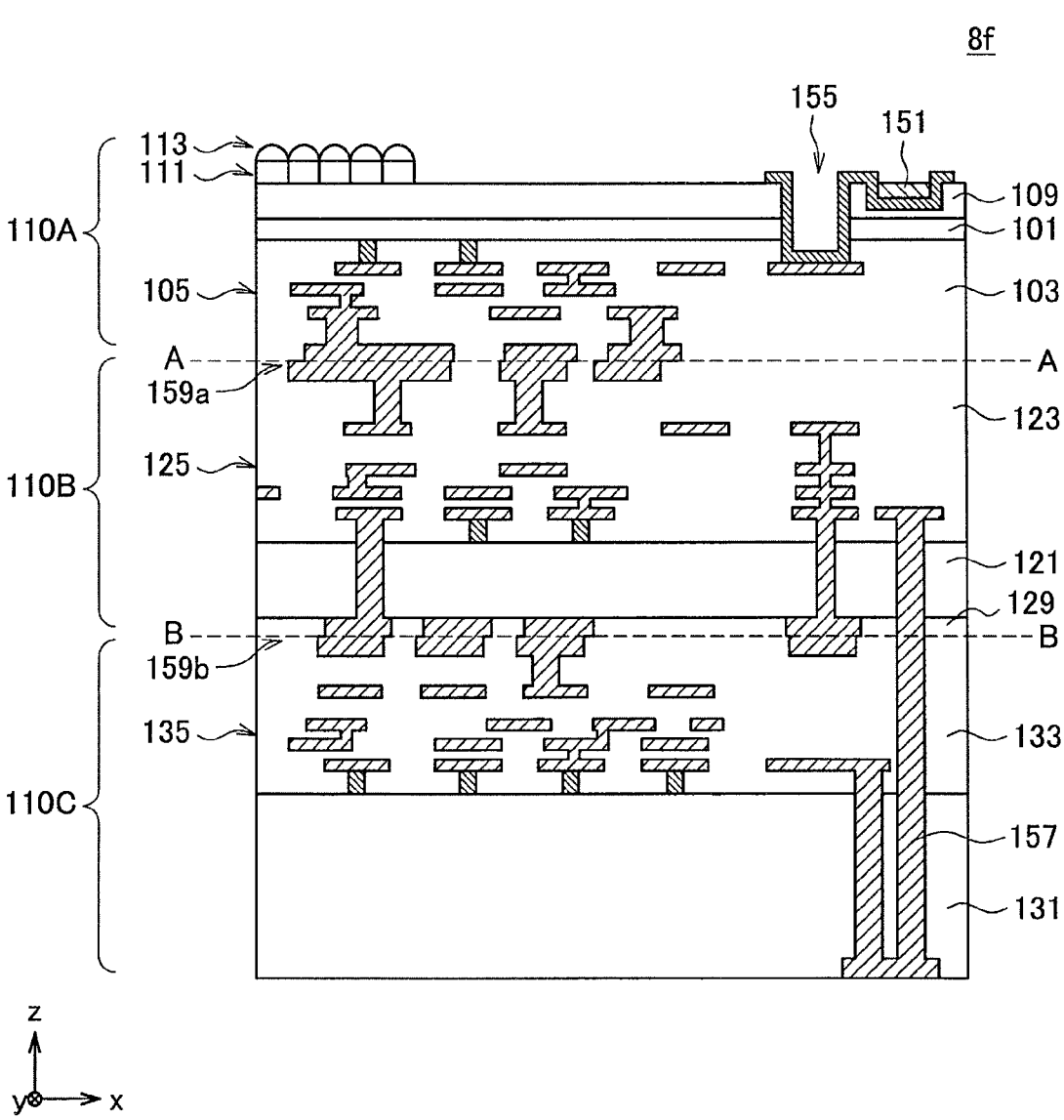
FIG. 16F is a vertical cross-sectional view of the schematic configuration of the solid-state imaging device according to the seventh configuration example of the present embodiment.

A solid-state imaging device 8f illustrated in FIG. 16F corresponds to the solid-state imaging device 8e illustrated in FIG. 16E in which the configuration of the twin contact type two-layer TSV 157 is changed. Specifically, in the configuration illustrated in FIG. 16F, the TSV 157 is formed from the back surface side of the third substrate 110C toward the second substrate 110B.

Note that in the respective configurations illustrated in FIGS. 16A to 16F, the types of wiring lines to which the twin contact type two-layer TSV 157 is coupled are not limited. The TSV 157 may be coupled to a predetermined wiring line of the first metal wiring layer or may be coupled to a predetermined wiring line of the second metal wiring layer. Moreover, each of the multi-layered wiring layers 105, 125, and 135 may include only the first metal wiring layer, may include only the second metal wiring layer, or may include both the first metal wiring layer and the second metal wiring layer.

5-8. Eighth Configuration Example

FIGS. 17A to 17L are vertical cross-sectional views of a schematic configuration of a solid-state imaging device according to the eighth configuration example of the present embodiment. The solid-state imaging device according to the present embodiment may have any of configurations illustrated in FIGS. 17A to 17L.

Figure 17A:
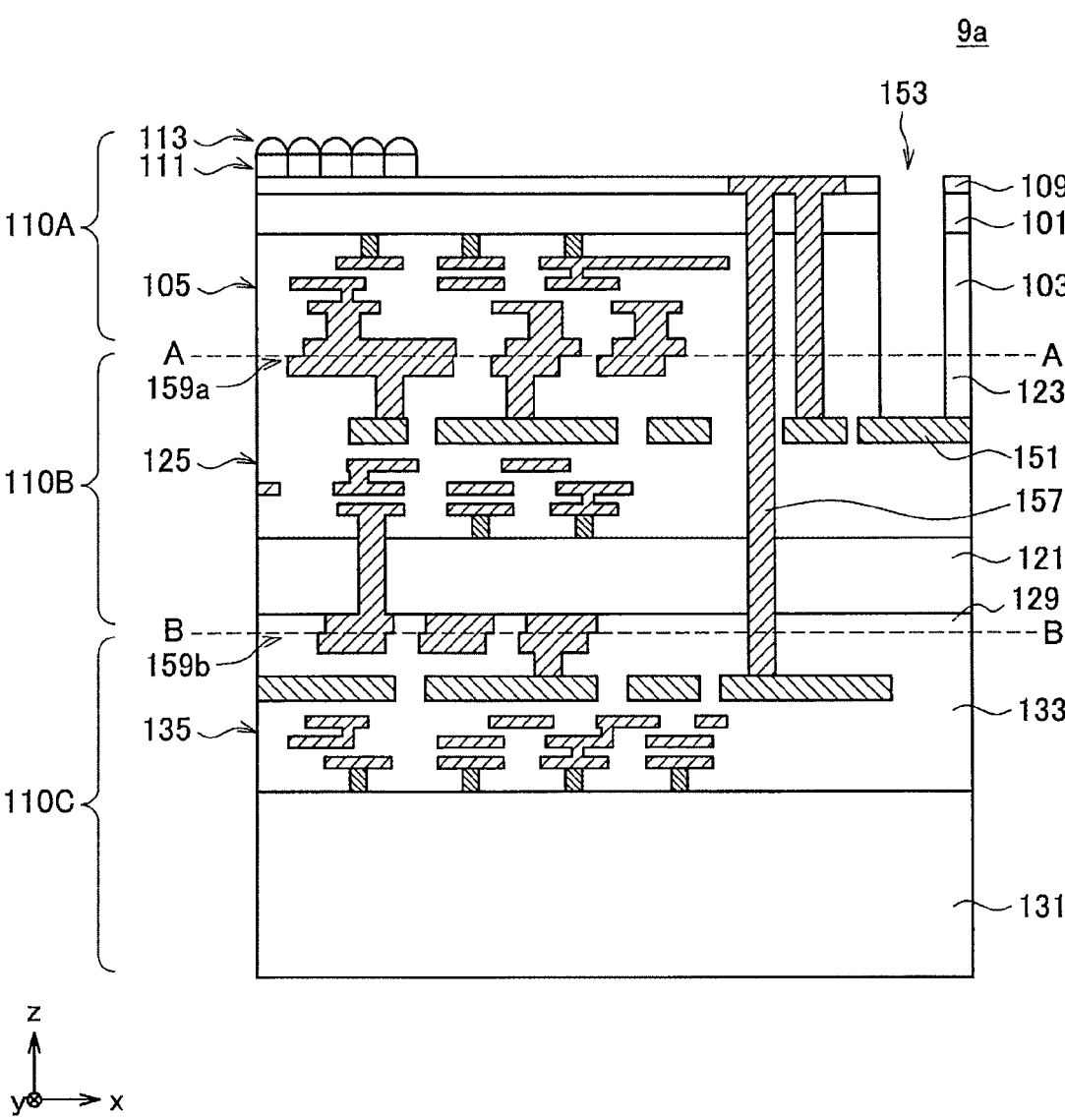
FIG. 17A is a vertical cross-sectional view of a schematic configuration of a solid-state imaging device according to an eighth configuration example of the present embodiment.

A solid-state imaging device 9a illustrated in FIG. 17A includes, as coupling structures, the electrode junction structure 159a provided between the first substrate 110A and the second substrate 110B, the electrode junction structure 159b provided between the second substrate 110B and the third substrate 110C, the twin contact type three-layer TSV 157, and an embedded pad structure for the second substrate 110B (i.e., the pad 151 provided in the multi-layered wiring layer 125 of the second substrate 110B and the pad opening 153 exposing the pad 151). The electrode junction structure 159a electrically couples the respective signal lines included in the first substrate 110A and the second substrate 110B to each other and electrically couples the respective power supply lines included in the first substrate 110A and the second substrate 110B to each other. The electrode junction structure 159b electrically couples the respective signal lines included in the second substrate 110B and the third substrate 110C to each other and electrically couples the respective power supply lines included in the second substrate 110B and the third substrate 110C to each other. Moreover, the TSV 157 is formed from the back surface side of the first substrate 110A, and is provided to electrically couple the respective signal lines included in the second substrate 110B and the third substrate 110C to each other and electrically couple the respective power supply lines included in the second substrate 110B and the third substrate 110C to each other. Note that in the configuration illustrated in FIG. 17A, the TSV 157 electrically couples a predetermined wiring line of the second metal wiring layer in the multi-layered wiring layer 125 of the second substrate 110B and a predetermined wiring line of the second metal wiring layer in the multi-layered wiring layer 135 of the third substrate 110C to each other.

Figure 17B:
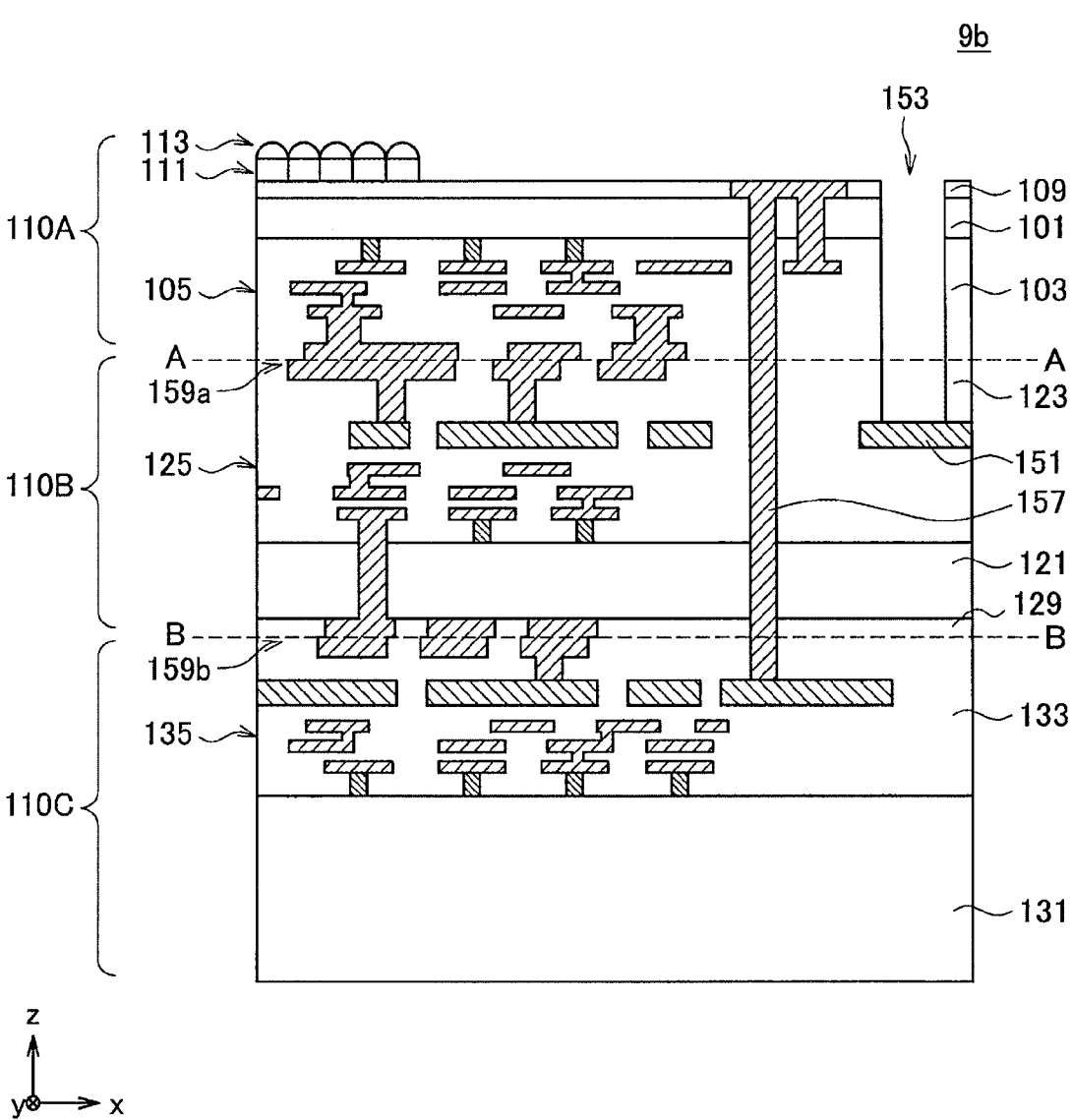
FIG. 17B is a vertical cross-sectional view of the schematic configuration of the solid-state imaging device according to the eighth configuration example of the present embodiment.

A solid-state imaging device 9b illustrated in FIG. 17B corresponds to the solid-state imaging device 9a illustrated in FIG. 17A in which the configuration of the twin contact type three-layer TSV 157 is changed. Specifically, in the configuration illustrated in FIG. 17B, the TSV 157 is provided to electrically couple the respective signal lines included in the first substrate 110A and the third substrate 110C to each other and electrically couple the respective power supply lines included in the first substrate 110A and the third substrate 110C to each other. Note that in the configuration illustrated in FIG. 17B, the TSV 157 electrically couples a predetermined wiring line of the first metal wiring layer in the multi-layered wiring layer 105 of the first substrate 110A and a predetermined wiring line of the second metal wiring layer in the multi-layered wiring layer 135 of the third substrate 110C to each other.

Figure 17C:
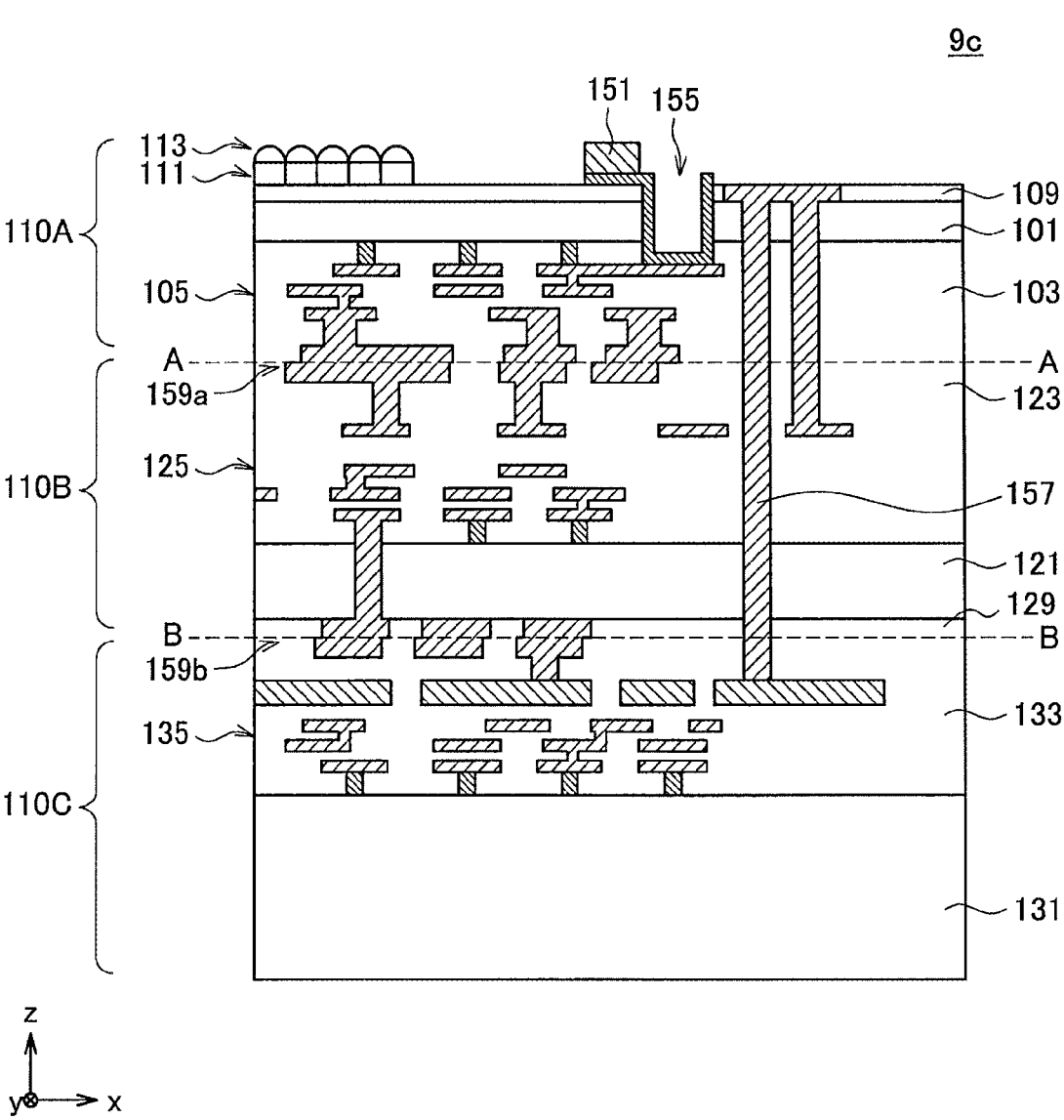
FIG. 17C is a vertical cross-sectional view of the schematic configuration of the solid-state imaging device according to the eighth configuration example of the present embodiment.

A solid-state imaging device 9c illustrated in FIG. 17C corresponds to the solid-state imaging device 9a illustrated in FIG. 17A in which the embedded pad structure and the types of wiring lines electrically coupled to each other by the twin contact type three-layer TSV 157 are changed. Specifically, in the configuration illustrated in FIG. 17C, a non-embedded lead pad structure for a predetermined wiring line in the multi-layered wiring layer 105 of the first substrate 110A (i.e., the lead line opening 155 for the predetermined wiring line in the multi-layered wiring layer 105 of the first substrate 110A and the pad 151 on the surface on the back side of the first substrate 110A) is provided instead of the embedded pad structure. Moreover, in the configuration illustrated in FIG. 17C, the TSV 157 electrically couples a predetermined wiring line of the first metal wiring layer in the multi-layered wiring layer 125 of the second substrate 110B and a predetermined wiring line of the second metal wiring layer in the multi-layered wiring layer 135 of the third substrate 110C to each other.

Figure 17D:
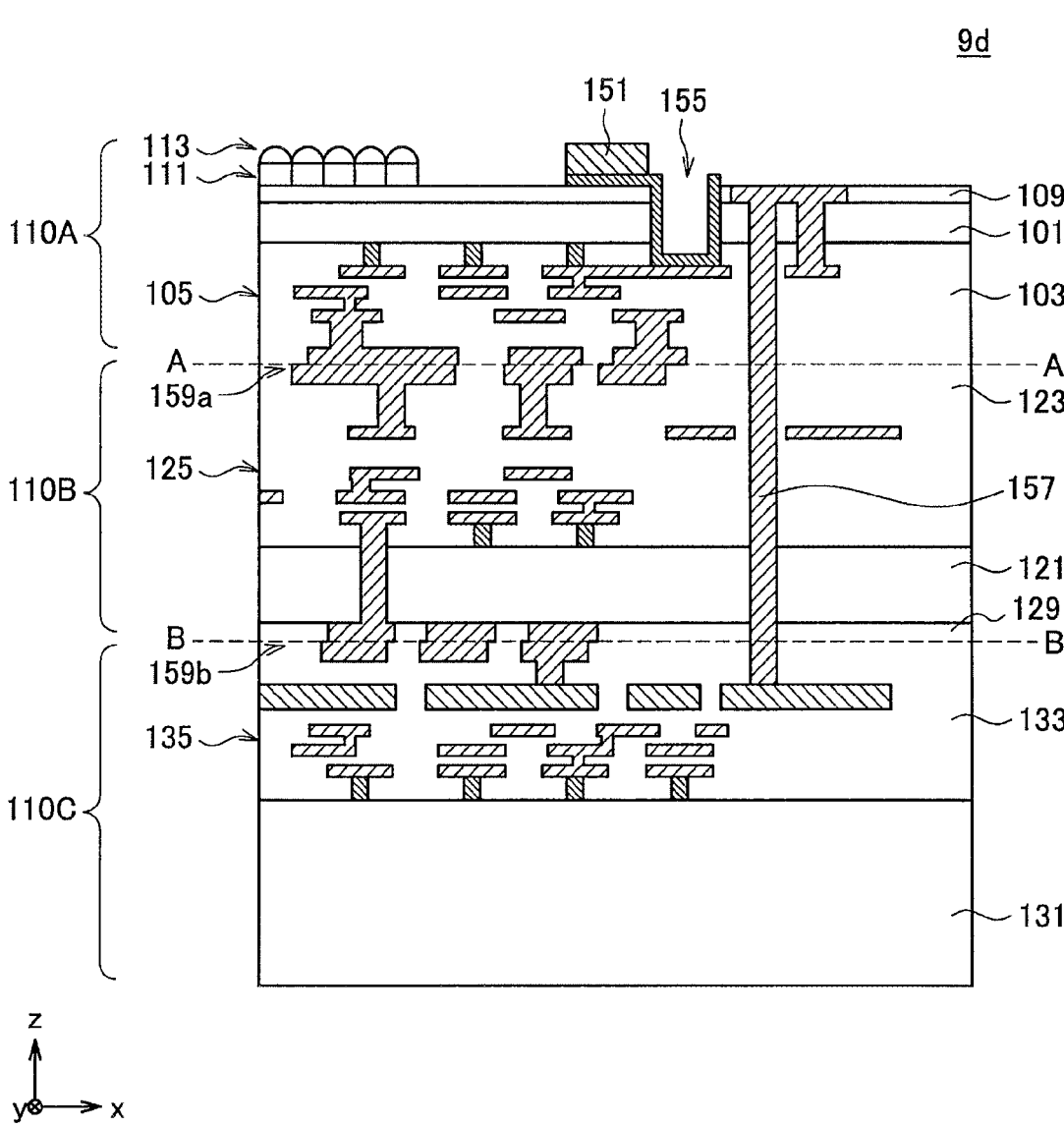
FIG. 17D is a vertical cross-sectional view of the schematic configuration of the solid-state imaging device according to the eighth configuration example of the present embodiment.

A solid-state imaging device 9d illustrated in FIG. 17D corresponds to the solid-state imaging device 9c illustrated in FIG. 17C in which the configuration of the twin contact type three-layer TSV 157 is changed. Specifically, in the configuration illustrated in FIG. 17D, the TSV 157 is provided to electrically couple the respective signal lines in the first substrate 110A and the third substrate 110C to each other and electrically couple the respective power supply lines included in the first substrate 110A and the third substrate 110C to each other.

Figure 17E:
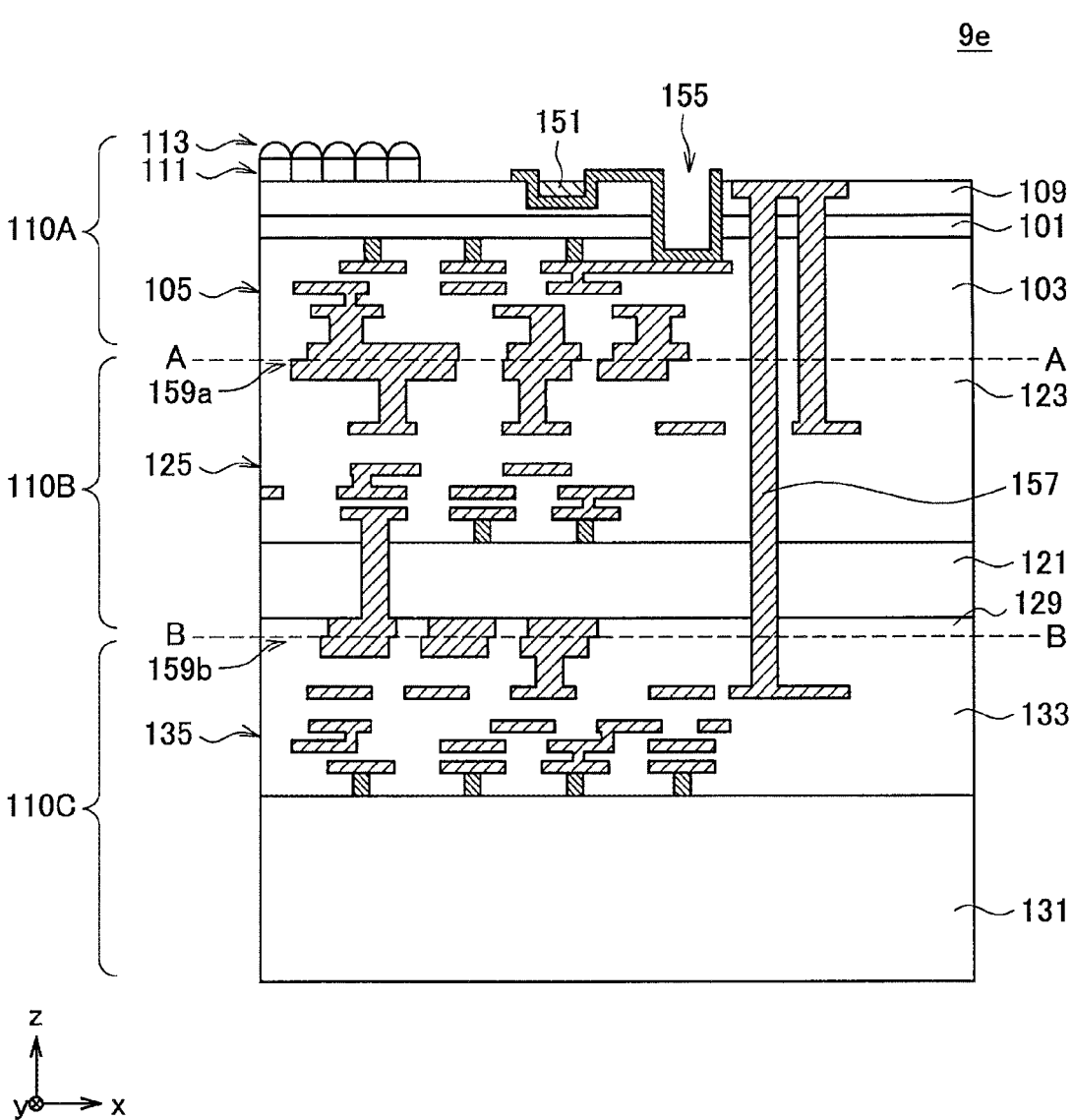
FIG. 17E is a vertical cross-sectional view of the schematic configuration of the solid-state imaging device according to the eighth configuration example of the present embodiment.

A solid-state imaging device 9e illustrated in FIG. 17E corresponds to the solid-state imaging device 9c illustrated in FIG. 17C in which the configuration of the lead pad structure and the types of wiring lines electrically coupled to each other by the twin contact type three-layer TSV 157 are changed. Specifically, in the configuration illustrated in FIG. 17E, an embedded lead pad structure is provided as the lead pad structure instead of the non-embedded lead pad structure. Moreover, in the configuration illustrated in FIG. 17E, the TSV 157 electrically couples a predetermined wiring line of the first metal wiring layer in the multi-layered wiring layer 125 of the second substrate 110B and a predetermined wiring line of the first metal wiring layer in the multi-layered wiring layer 135 of the third substrate 110C to each other.

Figure 17F:
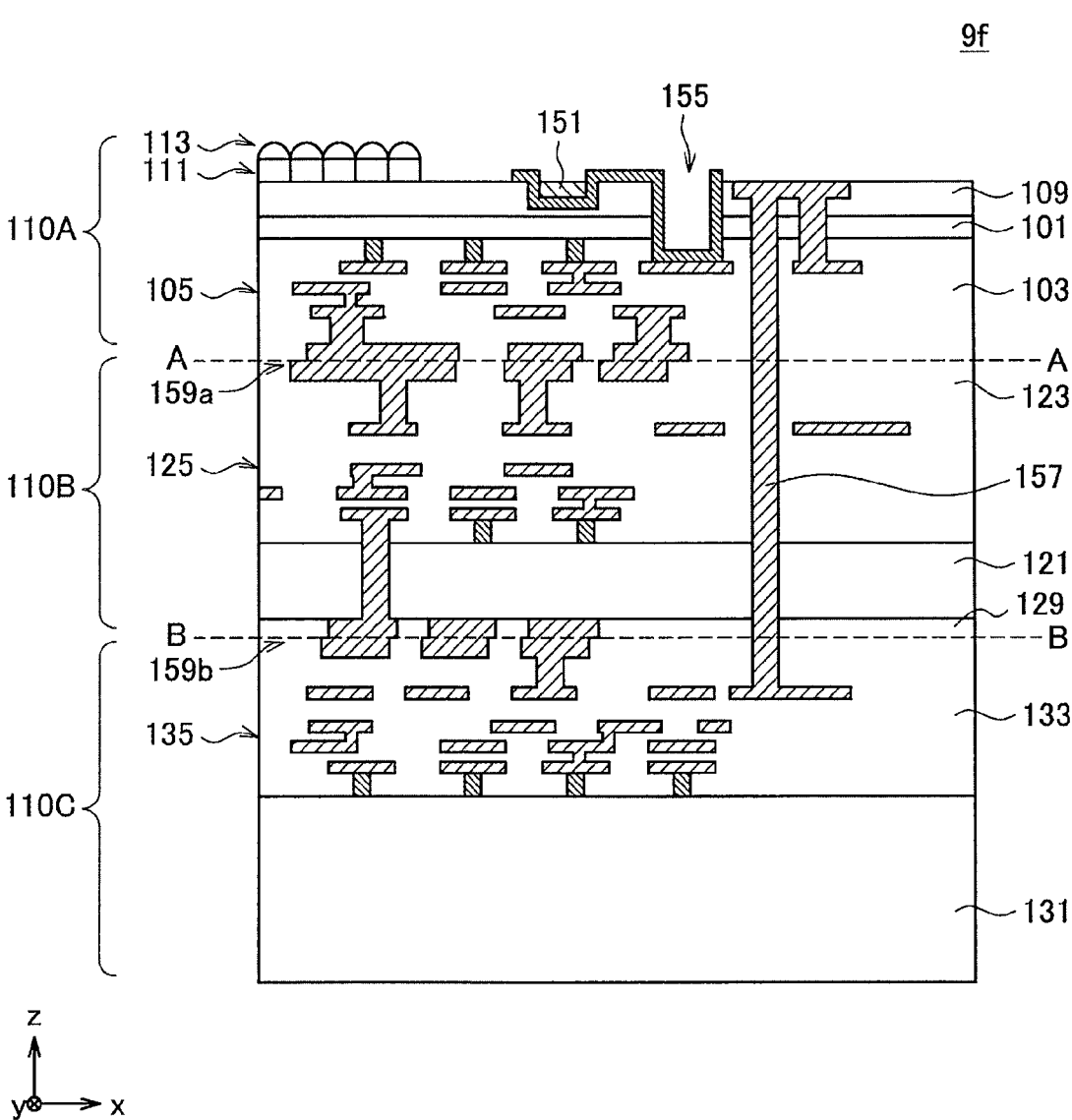
FIG. 17F is a vertical cross-sectional view of the schematic configuration of the solid-state imaging device according to the eighth configuration example of the present embodiment.

A solid-state imaging device 9f illustrated in FIG. 17F corresponds to the solid-state imaging device 9e illustrated in FIG. 17E in which the configuration of the twin contact type three-layer TSV 157 is changed. Specifically, in the configuration illustrated in FIG. 17F, the TSV 157 is provided to electrically couple the respective signal lines included in the first substrate 110A and the third substrate 110C to each other and electrically couple the respective power supply lines included in the first substrate 110A and the third substrate 110C to each other.

Figure 17G:
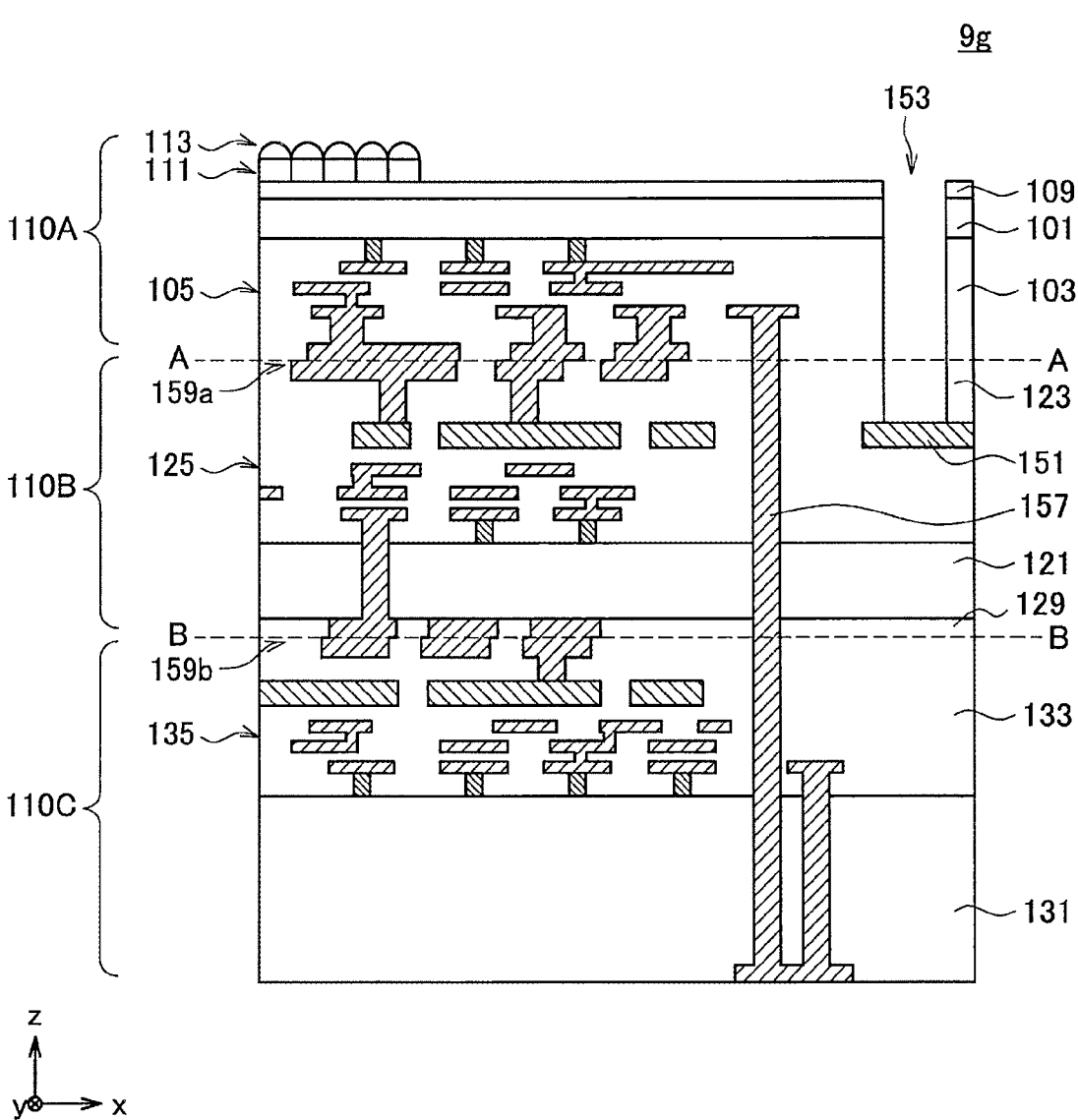
FIG. 17G is a vertical cross-sectional view of the schematic configuration of the solid-state imaging device according to the eighth configuration example of the present embodiment.

A solid-state imaging device 9g illustrated in FIG. 17G corresponds to the solid-state imaging device 9a illustrated in FIG. 17A in which the configuration of the twin contact type three-layer TSV 157 is changed. Specifically, in the configuration illustrated in FIG. 17G, the TSV 157 is provided from the back surface side of the third substrate 110C to electrically couple the respective signal lines included in the first substrate 110A and the third substrate 110C to each other and electrically couple the respective power supply lines included in the first substrate 110A and the third substrate 110C to each other. Moreover, in the configuration illustrated in FIG. 17G, the TSV 157 electrically couples a predetermined wiring line of the first metal wiring layer in the multi-layered wiring layer 125 of the first substrate 110A and a predetermined wiring line of the first metal wiring layer in the multi-layered wiring layer 135 of the third substrate 110C to each other.

Figure 17H:
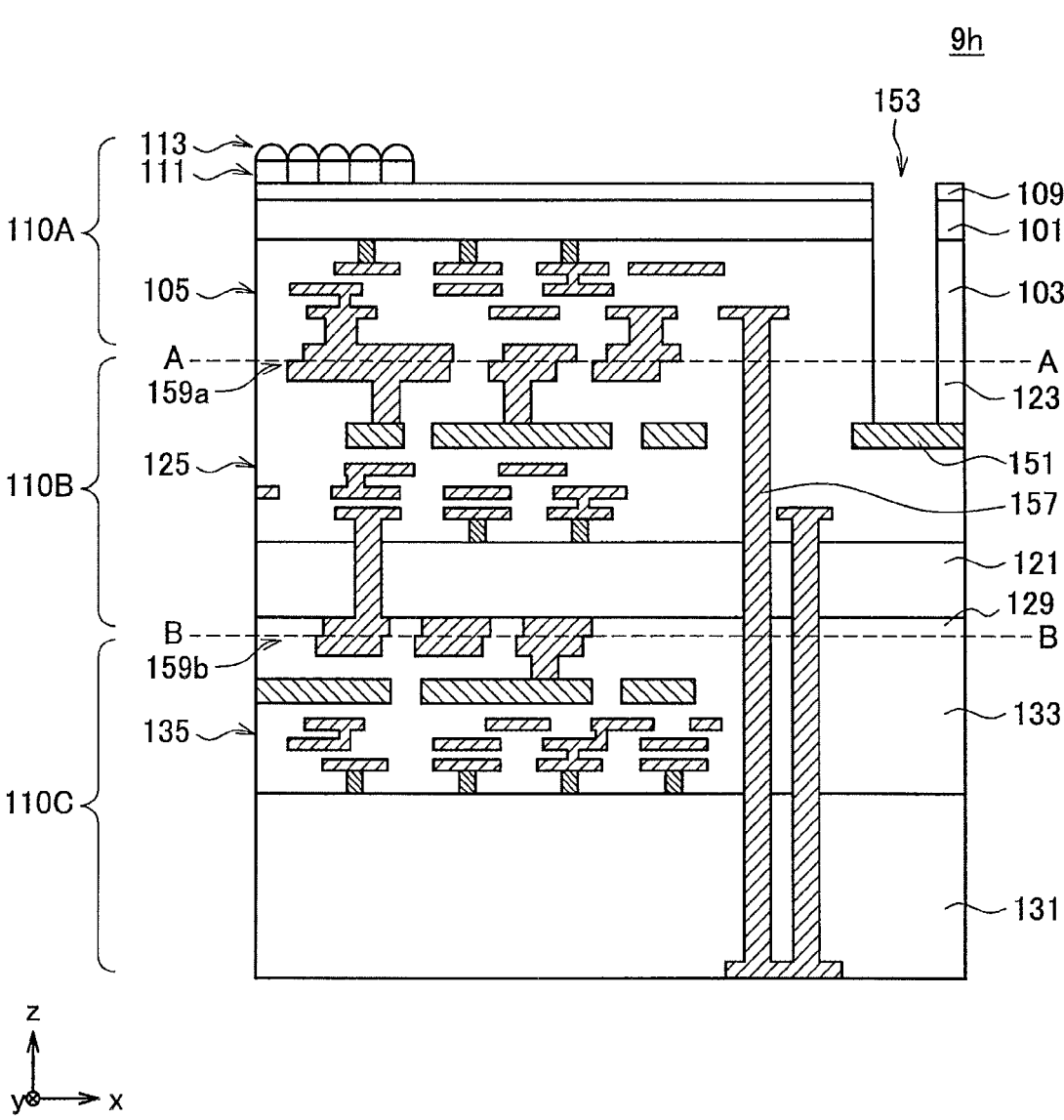
FIG. 17H is a vertical cross-sectional view of the schematic configuration of the solid-state imaging device according to the eighth configuration example of the present embodiment.

A solid-state imaging device 9h illustrated in FIG. 17H corresponds to the solid-state imaging device 9g illustrated in FIG. 17G in which the configuration of the twin contact type three-layer TSV 157 is changed. Specifically, in the configuration illustrated in FIG. 17H, the TSV 157 is provided to electrically couple the respective signal lines included in the first substrate 110A and the second substrate 110B to each other and electrically couple the respective power supply lines included in the first substrate 110A and the second substrate 110B to each other. Moreover, in the configuration illustrated in FIG. 17H, the TSV 157 electrically couples a predetermined wiring line of the first metal wiring layer in the multi-layered wiring layer 105 of the first substrate 110A and a predetermined wiring line of the first metal wiring layer in the multi-layered wiring layer 125 of the second substrate 110B to each other.

Figure 17I:
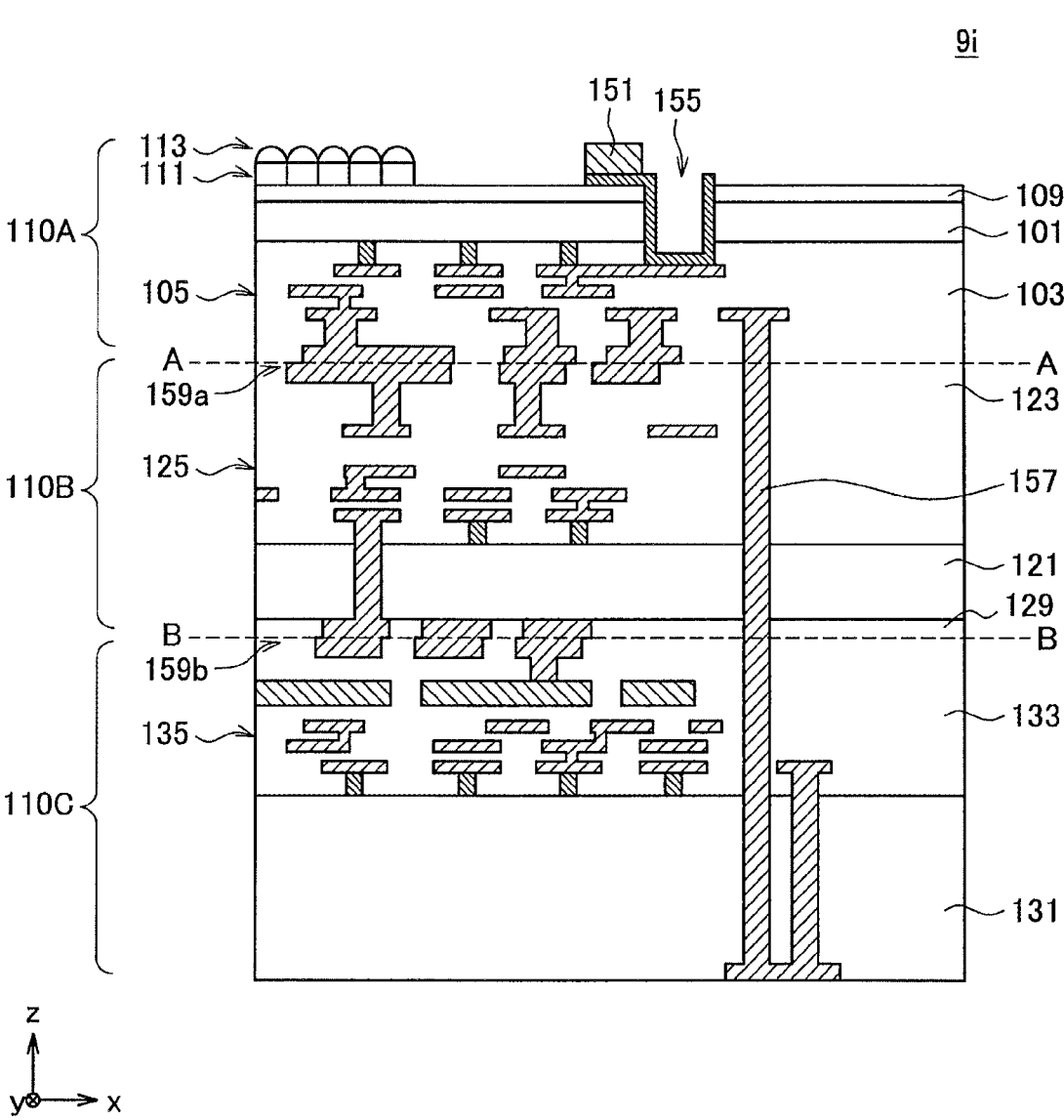
FIG. 17I is a vertical cross-sectional view of the schematic configuration of the solid-state imaging device according to the eighth configuration example of the present embodiment.

A solid-state imaging device 9i illustrated in FIG. 17I corresponds to the solid-state imaging device 9g illustrated in FIG. 17G in which the embedded pad structure is changed. Specifically, in the configuration illustrated in FIG. 17I, a non-embedded lead pad structure for a predetermined wiring line in the multi-layered wiring layer 105 of the first substrate 110A (i.e., the lead line opening 155 for the predetermined wiring line in the multi-layered wiring layer 105 of the first substrate 110A and the pad 151 on the surface on the back side of the first substrate 110A) is provided instead of the embedded pad structure.

Figure 17J:
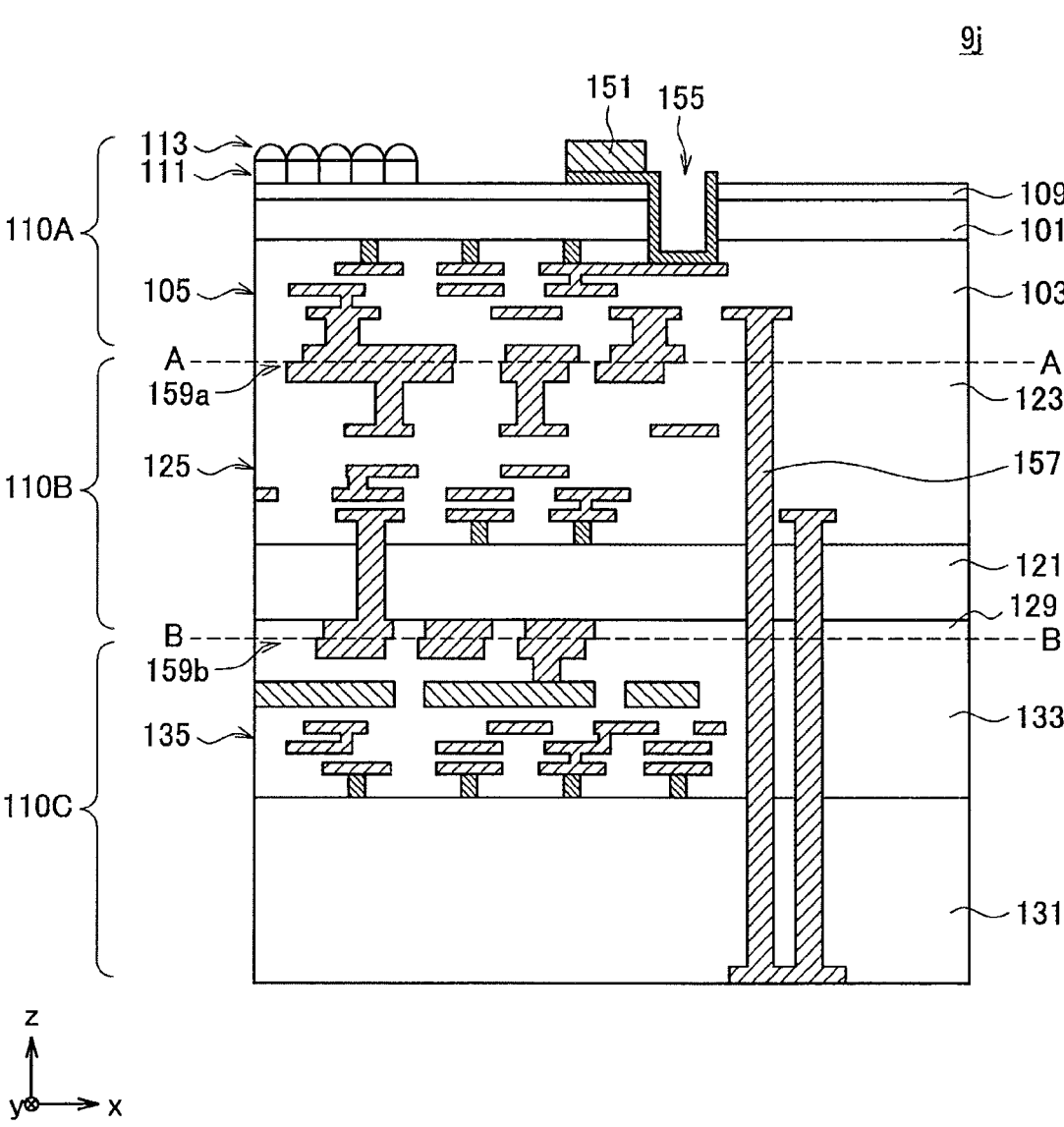
FIG. 17J is a vertical cross-sectional view of the schematic configuration of the solid-state imaging device according to the eighth configuration example of the present embodiment.

A solid-state imaging device 9j illustrated in FIG. 17J corresponds to the solid-state imaging device 9i illustrated in FIG. 17I in which the configuration of the twin contact type three-layer TSV 157 is changed. Specifically, in the configuration illustrated in FIG. 17J, the TSV 157 is provided to electrically couple the respective signal lines included in the first substrate 110A and the second substrate 110B to each other and electrically couple the respective power supply lines included in the first substrate 110A and the second substrate 110B to each other. Moreover, in the configuration illustrated in FIG. 17J, the TSV 157 electrically couples a predetermined wiring line of the first metal wiring layer in the multi-layered wiring layer 105 of the first substrate 110A and a predetermined wiring line of the first metal wiring layer in the multi-layered wiring layer 125 of the second substrate 110B to each other.

Figure 17K:
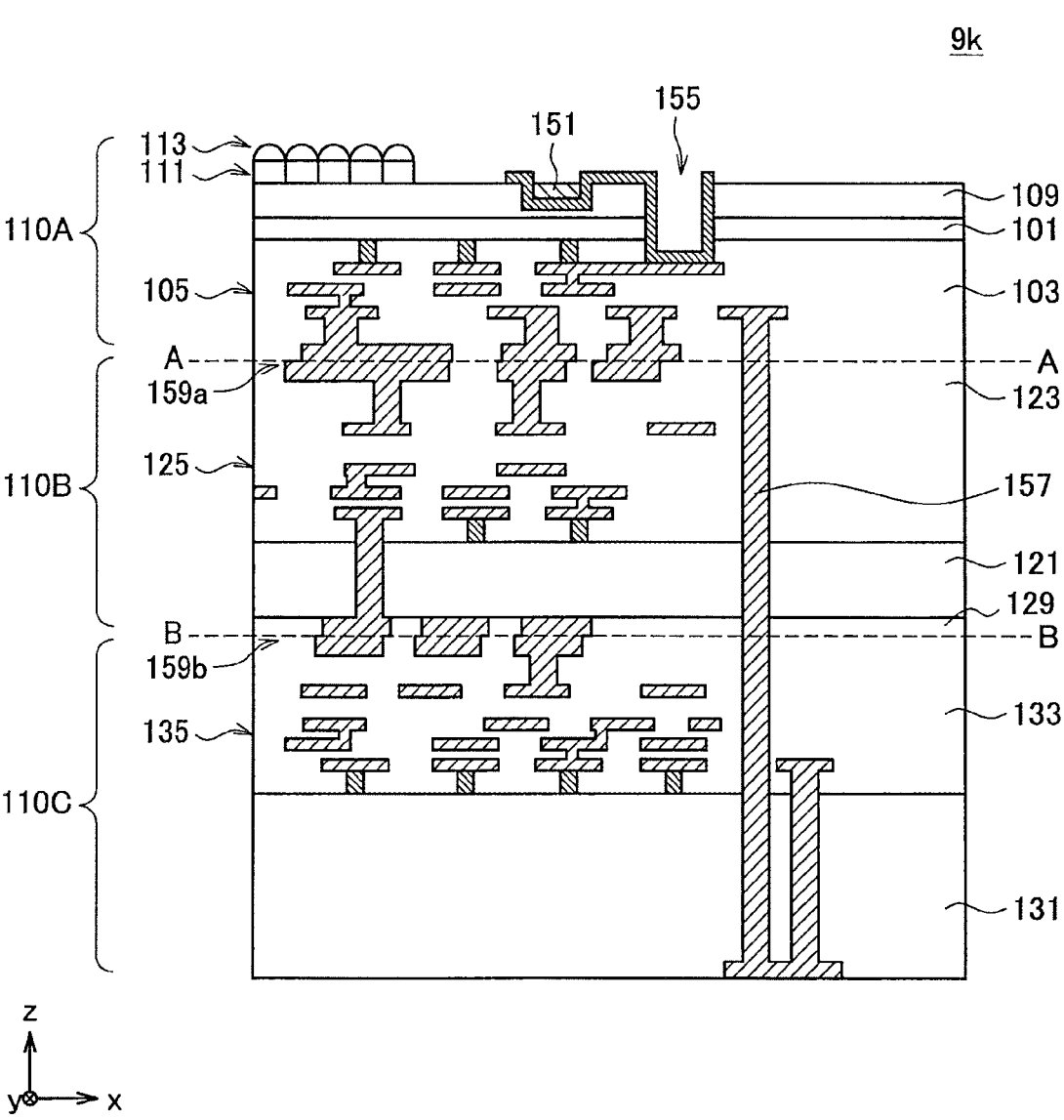
FIG. 17K is a vertical cross-sectional view of the schematic configuration of the solid-state imaging device according to the eighth configuration example of the present embodiment.

A solid-state imaging device 9k illustrated in FIG. 17K corresponds to the solid-state imaging device 9i illustrated in FIG. 17I in which the configuration of the lead pad structure is changed. Specifically, in the configuration illustrated in FIG. 17K, an embedded lead pad structure is provided as the lead pad structure instead of the non-embedded lead pad structure.

Figure 17L:
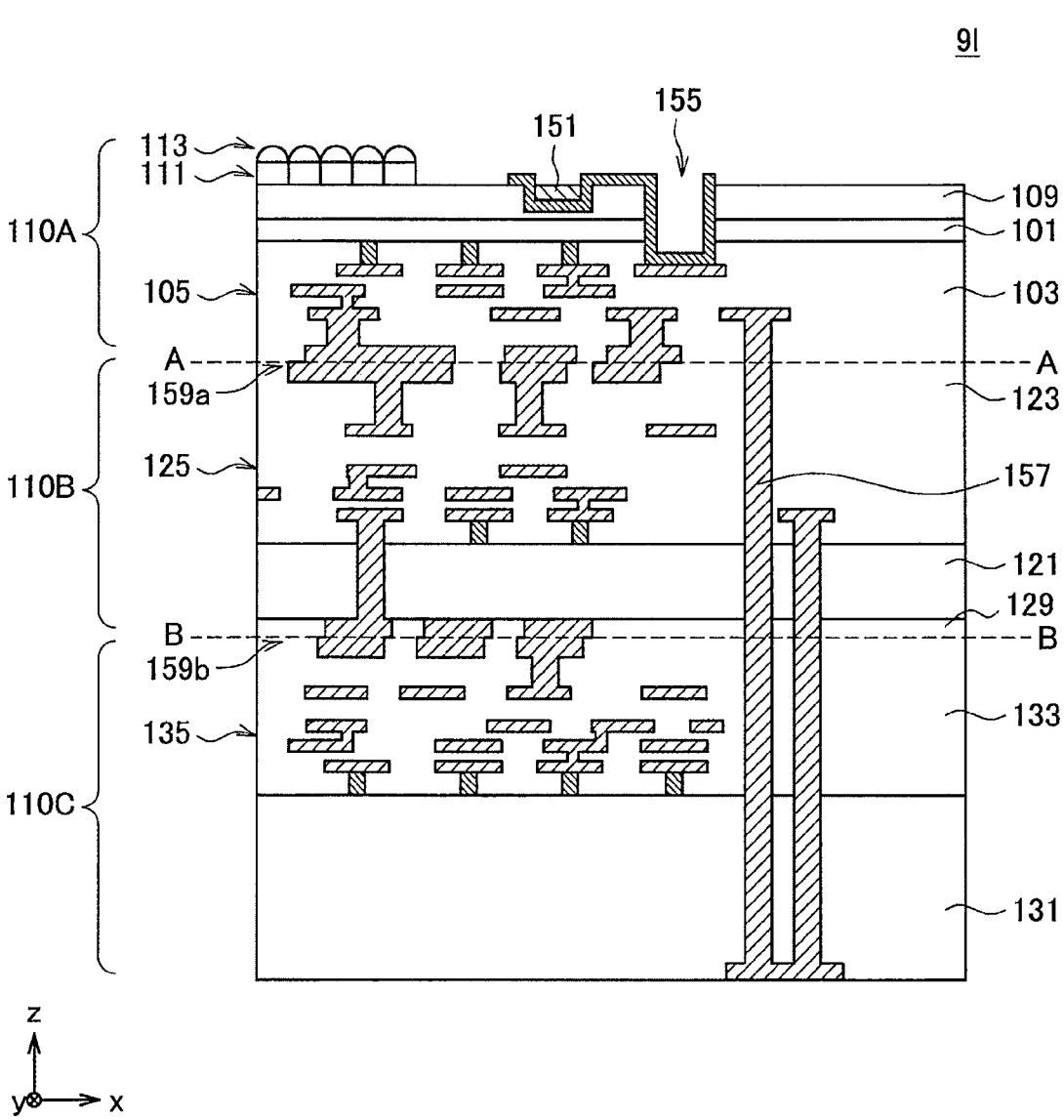
FIG. 17L is a vertical cross-sectional view of the schematic configuration of the solid-state imaging device according to the eighth configuration example of the present embodiment.

A solid-state imaging device 9l illustrated in FIG. 17L corresponds to the solid-state imaging device 9j illustrated in FIG. 17J in which the configuration of the lead pad structure is changed. Specifically, in the configuration illustrated in FIG. 17L, an embedded lead pad structure is provided as the lead pad structure instead of the non-embedded lead pad structure.

Note that in the respective configurations illustrated in FIGS. 17A to 17L, the types of wiring lines to which the twin contact type three-layer TSV 157 is coupled are not limited. The TSV 157 may be coupled to a predetermined wiring line of the first metal wiring layer or may be coupled to a predetermined wiring line of the second metal wiring layer. Moreover, each of the multi-layered wiring layers 105, 125, and 135 may include only the first metal wiring layer, may include only the second metal wiring layer, or may include both the first metal wiring layer and the second metal wiring layer.

Further, it is sufficient if the twin contact type three-layer TSV 157 electrically couples the respective signal lines included in two substrates of the first substrate 110A, the second substrate 110B, and the third substrate 110C to each other and electrically couples the respective power supply lines included in the two substrates of the first substrate 110A, the second substrate 110B, and the third substrate 110C to each other in accordance with a direction in which the TSV 157 is formed, and the substrates including the respective signal lines electrically coupled to each other by the TSV 157 and the respective power supply lines electrically coupled to each other by the TSV 157 may be optionally changed.

5-9. Ninth Configuration Example

Figure 18A:
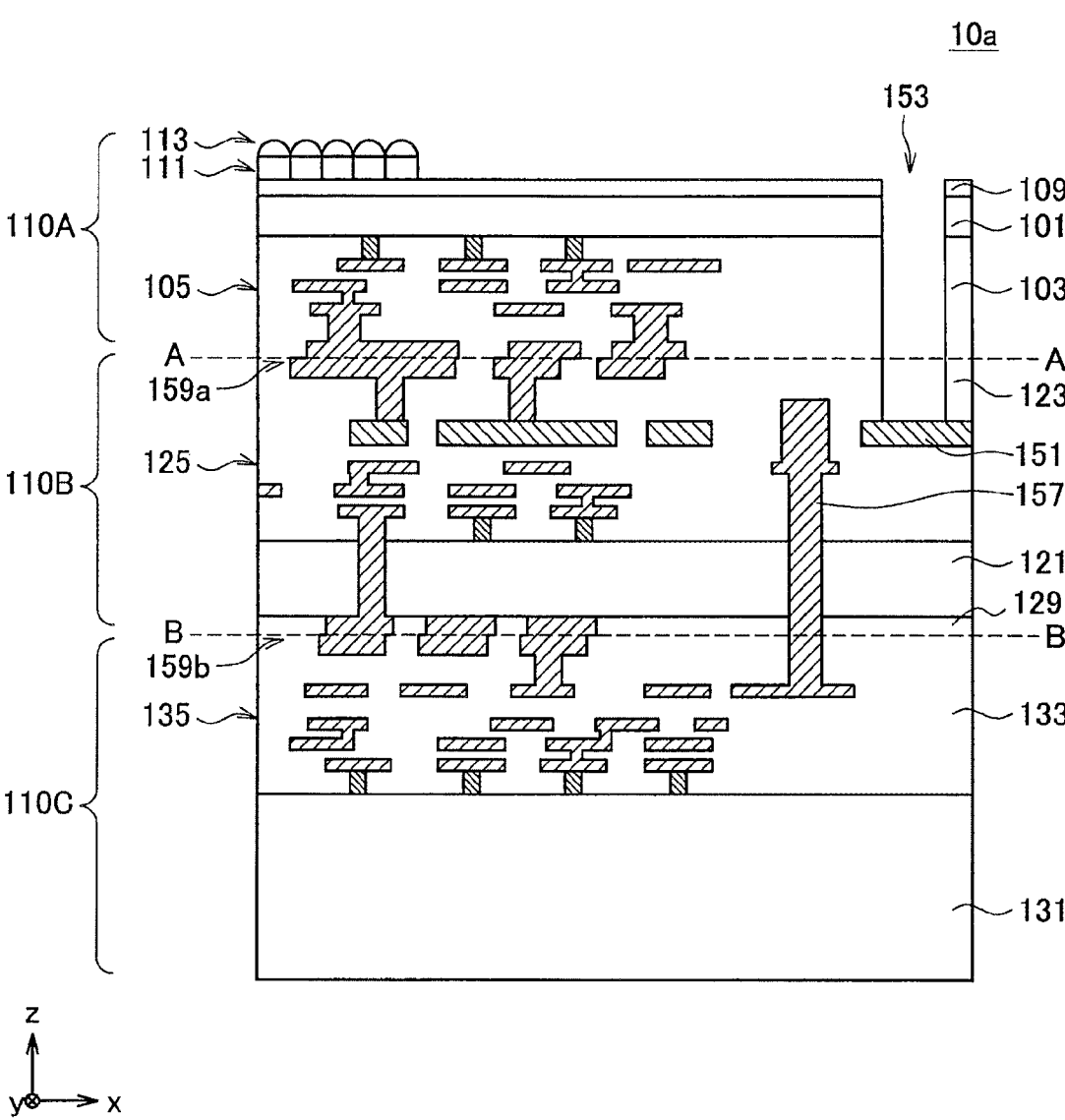
FIG. 18A is a vertical cross-sectional view of a schematic configuration of a solid-state imaging device according to a ninth configuration example of the present embodiment.
Figure 18B:
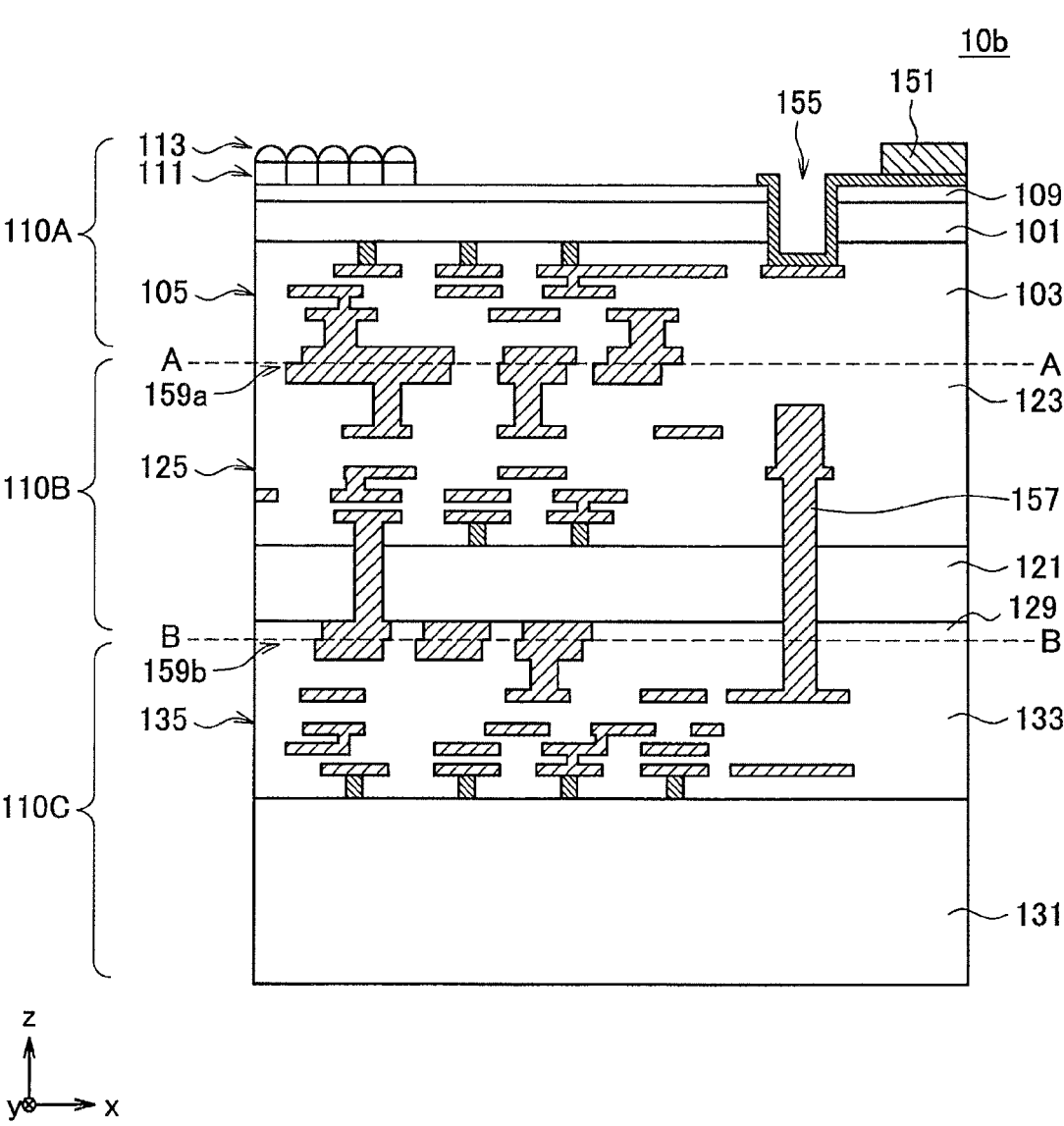
FIG. 18B is a vertical cross-sectional view of the schematic configuration of the solid-state imaging device according to the ninth configuration example of the present embodiment.
Figure 18C:
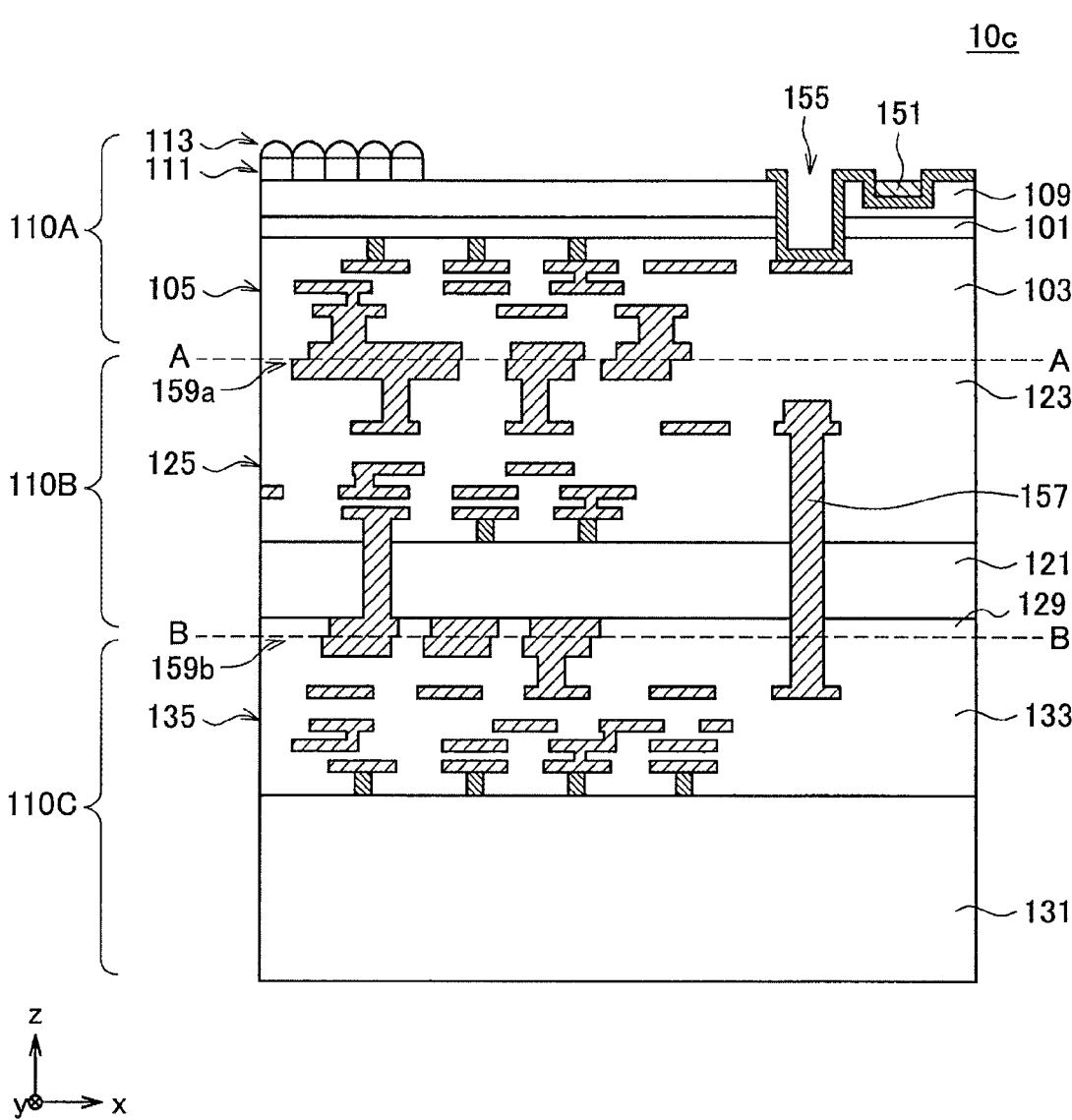
FIG. 18C is a vertical cross-sectional view of the schematic configuration of the solid-state imaging device according to the ninth configuration example of the present embodiment.

FIGS. 18A to 18C are vertical cross-sectional views of a schematic configuration of a solid-state imaging device according to the ninth configuration example of the present embodiment. The solid-state imaging device according to the present embodiment may have any of configurations illustrated in FIGS. 18A to 18C.

A solid-state imaging device 10a illustrated in FIG. 18A includes, as coupling structures, the electrode junction structure 159a provided between the first substrate 110A and the second substrate 110B, the electrode junction structure 159b provided between the second substrate 110B and the third substrate 110C, the shared contact type two-layer TSV 157, and an embedded pad structure for the second substrate 110B (i.e., the pad 151 provided in the multi-layered wiring layer 125 of the second substrate 110B and the pad opening 153 exposing the pad 151). The electrode junction structure 159a electrically couples the respective signal lines included in the first substrate 110A and the second substrate 110B to each other and electrically couples the respective power supply lines included in the first substrate 110A and the second substrate 110B to each other. Moreover, the electrode junction structure 159b electrically couples the respective signal lines included in the second substrate 110B and the third substrate 110C to each other and electrically couples the respective power supply lines included in the second substrate 110B and the third substrate 110C to each other. Further, the TSV 157 is formed from the front surface side of the second substrate toward the third substrate, and is provided to electrically couple the respective signal lines included in the second substrate 110B and the third substrate 110C to each other and electrically couple the respective power supply lines included in the second substrate 110B and the third substrate 110C to each other. Note that in the configuration illustrated in FIG. 18A, the TSV 157 electrically couples a predetermined wiring line of the first metal wiring layer in the multi-layered wiring layer 125 of the second substrate 110B and a predetermined wiring line of the first metal wiring layer in the multi-layered wiring layer 135 of the third substrate 110C to each other.

A solid-state imaging device 10b illustrated in FIG. 18B corresponds to the solid-state imaging device 10a illustrated in FIG. 18A in which the embedded pad structure is changed. Specifically, in the configuration illustrated in FIG. 18B, a non-embedded lead pad structure for a predetermined wiring line in the multi-layered wiring layer 105 of the first substrate 110A (i.e., the lead line opening 155 for the predetermined wiring line in the multi-layered wiring layer 105 of the first substrate 110A and the pad 151 on the surface on the back side of the first substrate 110A) is provided instead of the embedded pad structure.

A solid-state imaging device 10c illustrated in FIG. 18C corresponds to the solid-state imaging device 10b illustrated in FIG. 18B in which the configuration of the lead pad structure is changed. Specifically, in the configuration illustrated in FIG. 18C, an embedded lead pad structure is provided as the lead pad structure instead of the non-embedded lead pad structure.

Note that in the respective configurations illustrated in FIGS. 18A to 18C, the types of wiring lines to which the shared contact type two-layer TSV 157 is coupled are not limited. The TSV 157 may be coupled to a predetermined wiring line of the first metal wiring layer or may be coupled to a predetermined wiring line of the second metal wiring layer. For example, in the respective configurations illustrated in FIGS. 18A to 18C, one or both of the wiring lines to which the TSV 157 is coupled may be changed to a predetermined wiring line of the second metal wiring layer. Moreover, each of the multi-layered wiring layers 105, 125, and 135 may include only the first metal wiring layer, may include only the second metal wiring layer, or may include both the first metal wiring layer and the second metal wiring layer.

Further, in the respective configurations illustrated in FIGS. 18A to 18C, the TSV 157 is formed from the front surface side of the second substrate 110B toward the third substrate 110C, but the present embodiment is not limited to such an example. The TSV 157 may be formed from the back surface side of the third substrate 110C toward the second substrate 110B.

5-10. Tenth Configuration Example

FIGS. 19A to 19F are vertical cross-sectional views of a schematic configuration of a solid-state imaging device according to the tenth configuration example of the present embodiment. The solid-state imaging device according to the present embodiment may have any of configurations illustrated in FIGS. 19A to 19F.

Figure 19A:
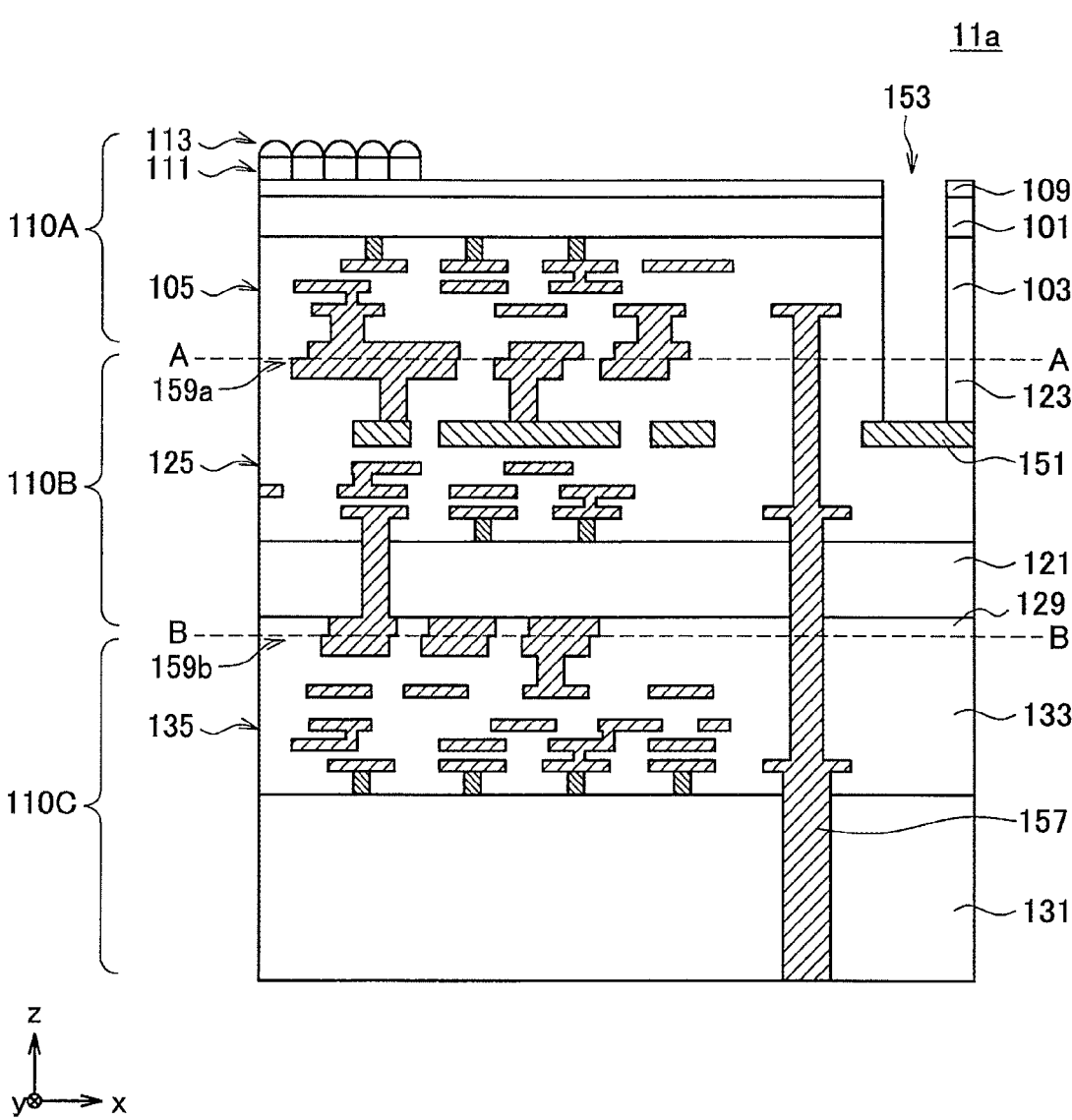
FIG. 19A is a vertical cross-sectional view of a schematic configuration of a solid-state imaging device according to a tenth configuration example of the present embodiment.

The solid-state imaging device 11a illustrated in FIG. 19A include, as coupling structures, the electrode junction structure 159a provided between the first substrate 110A and the second substrate 110B, the electrode junction structure 159b provided between the second substrate 110B and the third substrate 110C, the shared contact type three-layer TSV 157, and an embedded pad structure for the second substrate 110B (i.e., the pad 151 provided in the multi-layered wiring layer 125 of the second substrate 110B and the pad opening 153 exposing the pad 151). The electrode junction structure 159a electrically couples the respective signal lines included in the first substrate 110A and the second substrate 110B to each other and electrically couples the respective power supply lines included in the first substrate 110A and the second substrate 110B to each other. Moreover, the electrode junction structure 159b electrically couples the respective signal lines included in the second substrate 110B and the third substrate 110C to each other and electrically couples the respective power supply lines included in the second substrate 110B and the third substrate 110C to each other. Further, the TSV 157 is formed from the back surface side of the third substrate 110C, and is provided to electrically couple the respective signal lines included in the first substrate 110A, the second substrate 110B, and the third substrate 110C to each other and electrically couple the respective power supply lines included in the first substrate 110A, the second substrate 110B, and the third substrate 110C to each other. Note that in the configuration illustrated in FIG. 19A, the TSV 157 electrically couples a predetermined wiring line of the first metal wiring layer in the multi-layered wiring layer 125 of the first substrate 110A, a predetermined wiring line of the first metal wiring layer in the multi-layered wiring layer 125 of the second substrate 110B, and a predetermined wiring line of the first metal wiring layer in the multi-layered wiring layer 135 of the third substrate 110C to each other.

Figure 19B:
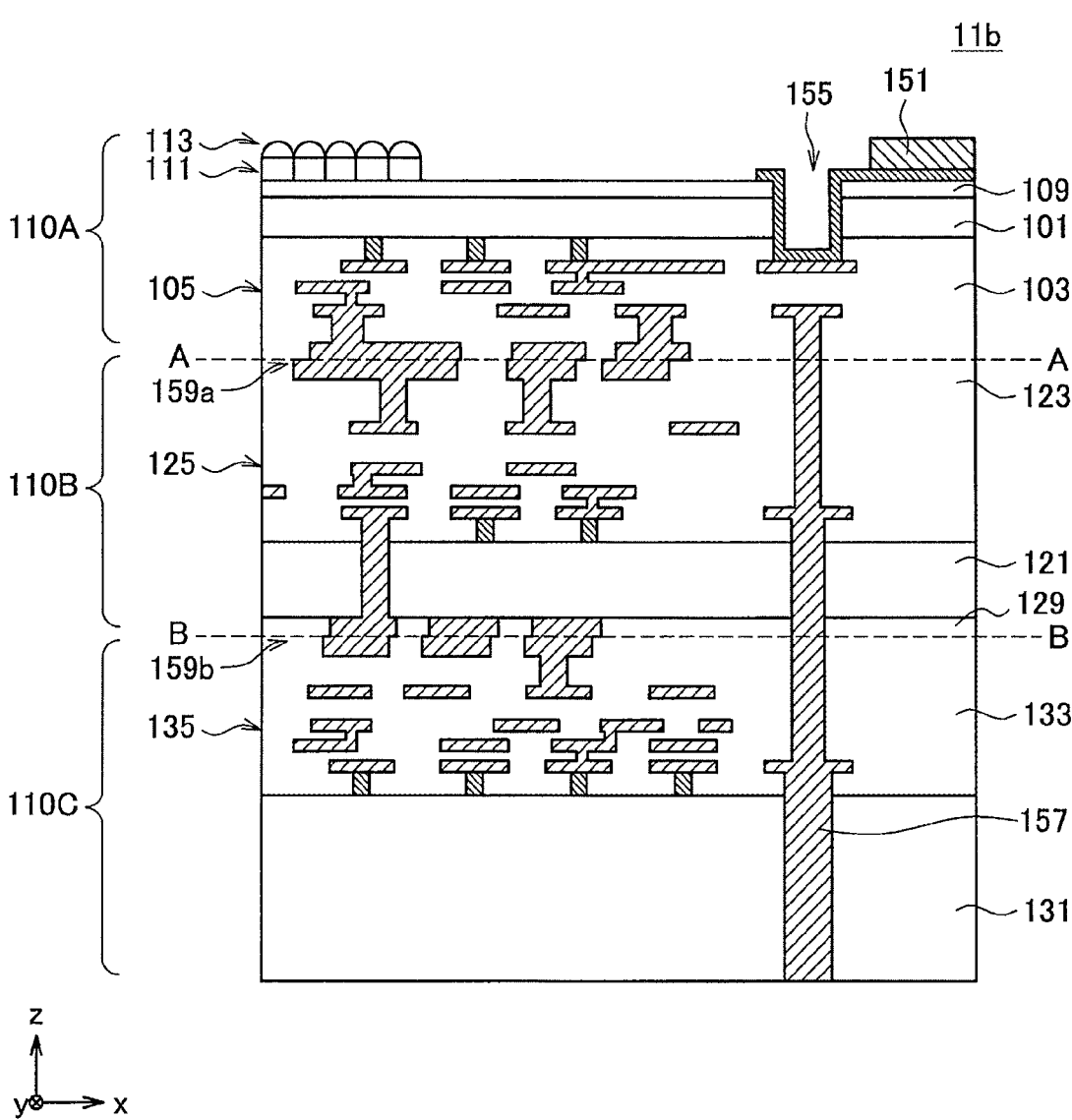
FIG. 19B is a vertical cross-sectional view of the schematic configuration of the solid-state imaging device according to the tenth configuration example of the present embodiment.

A solid-state imaging device 11b illustrated in FIG. 19B corresponds to the solid-state imaging device 11a illustrated in FIG. 19A in which the embedded pad structure is changed. Specifically, in the configuration illustrated in FIG.

19B, a non-embedded lead pad structure for a predetermined wiring line in the multi-layered wiring layer 105 of the first substrate 110A (i.e., the lead line opening 155 for the predetermined wiring line in the multi-layered wiring layer 105 of the first substrate 110A and the pad 151 on the surface on the back side of the first substrate 110A) is provided instead of the embedded pad structure.

Figure 19C:
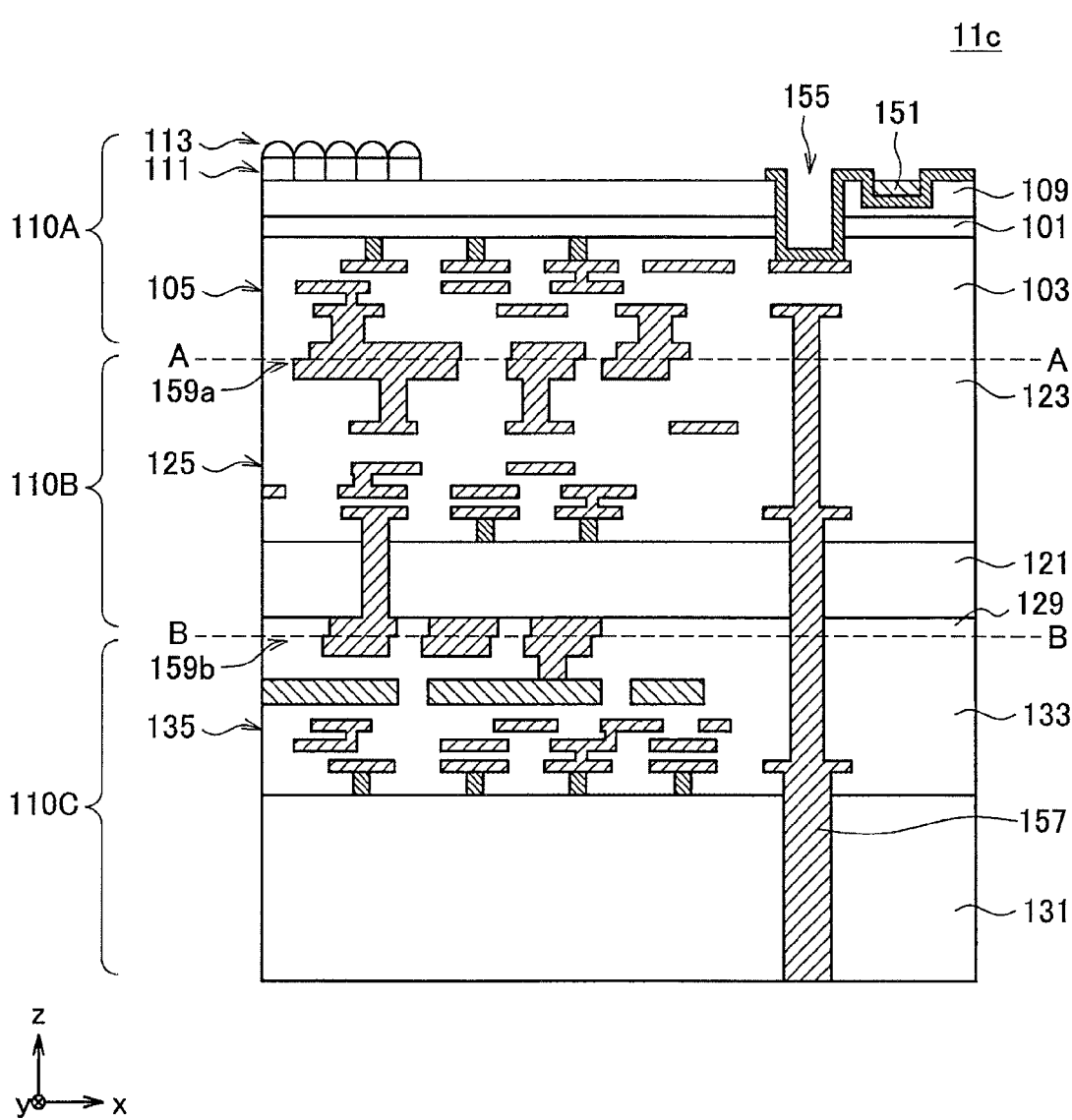
FIG. 19C is a vertical cross-sectional view of the schematic configuration of the solid-state imaging device according to the tenth configuration example of the present embodiment.

A solid-state imaging device 11c illustrated in FIG. 19C corresponds to the solid-state imaging device 11b illustrated in FIG. 19B in which the configuration of the lead pad structure is changed. Specifically, in the configuration illustrated in FIG. 19C, an embedded lead pad structure is provided as the lead pad structure instead of the non-embedded lead pad structure.

Figure 19D:
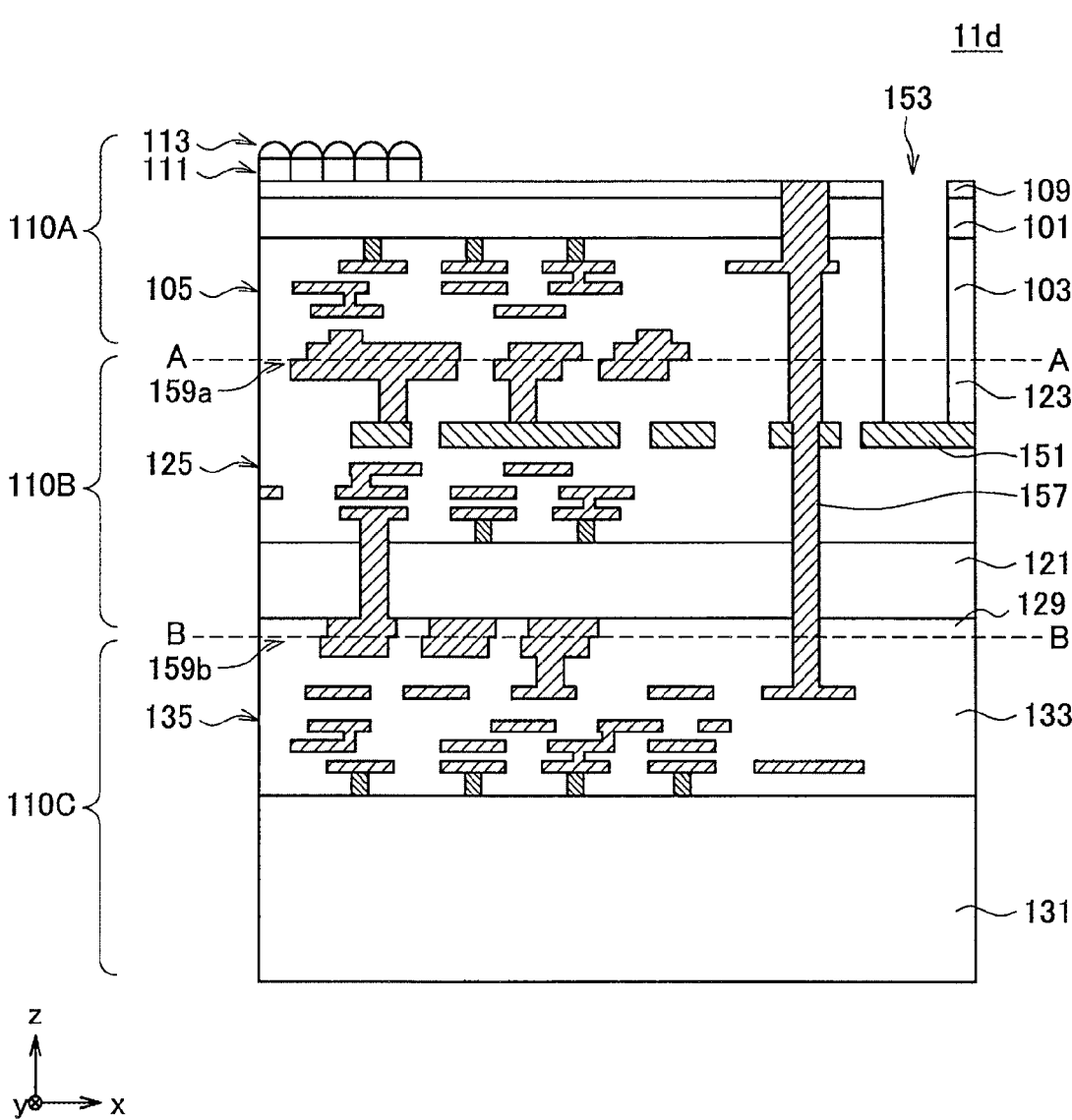
FIG. 19D is a vertical cross-sectional view of the schematic configuration of the solid-state imaging device according to the tenth configuration example of the present embodiment.

A solid-state imaging device 11d illustrated in FIG. 19D corresponds to the solid-state imaging device 11a illustrated in FIG. 19A in which the configuration of the shared contact type three-layer TSV 157 is changed. Specifically, in the configuration illustrated in FIG. 19D, the TSV 157 is formed from the back surface side of the first substrate 110A, and is provided to electrically couple the respective signal lines included in the first substrate 110A, the second substrate 110B, and the third substrate 110C to each other and electrically couple the respective power supply lines included in the first substrate 110A, the second substrate 110B, and the third substrate 110C to each other. Note that in the configuration illustrated in FIG. 19D, the TSV 157 electrically couples a predetermined wiring line of the first metal wiring layer in the multi-layered wiring layer 125 of the first substrate 110A, a predetermined wiring line of the second metal wiring layer in the multi-layered wiring layer 125 of the second substrate 110B, and a predetermined wiring line of the first metal wiring layer in the multi-layered wiring layer 135 of the third substrate 110C to each other.

Figure 19E:
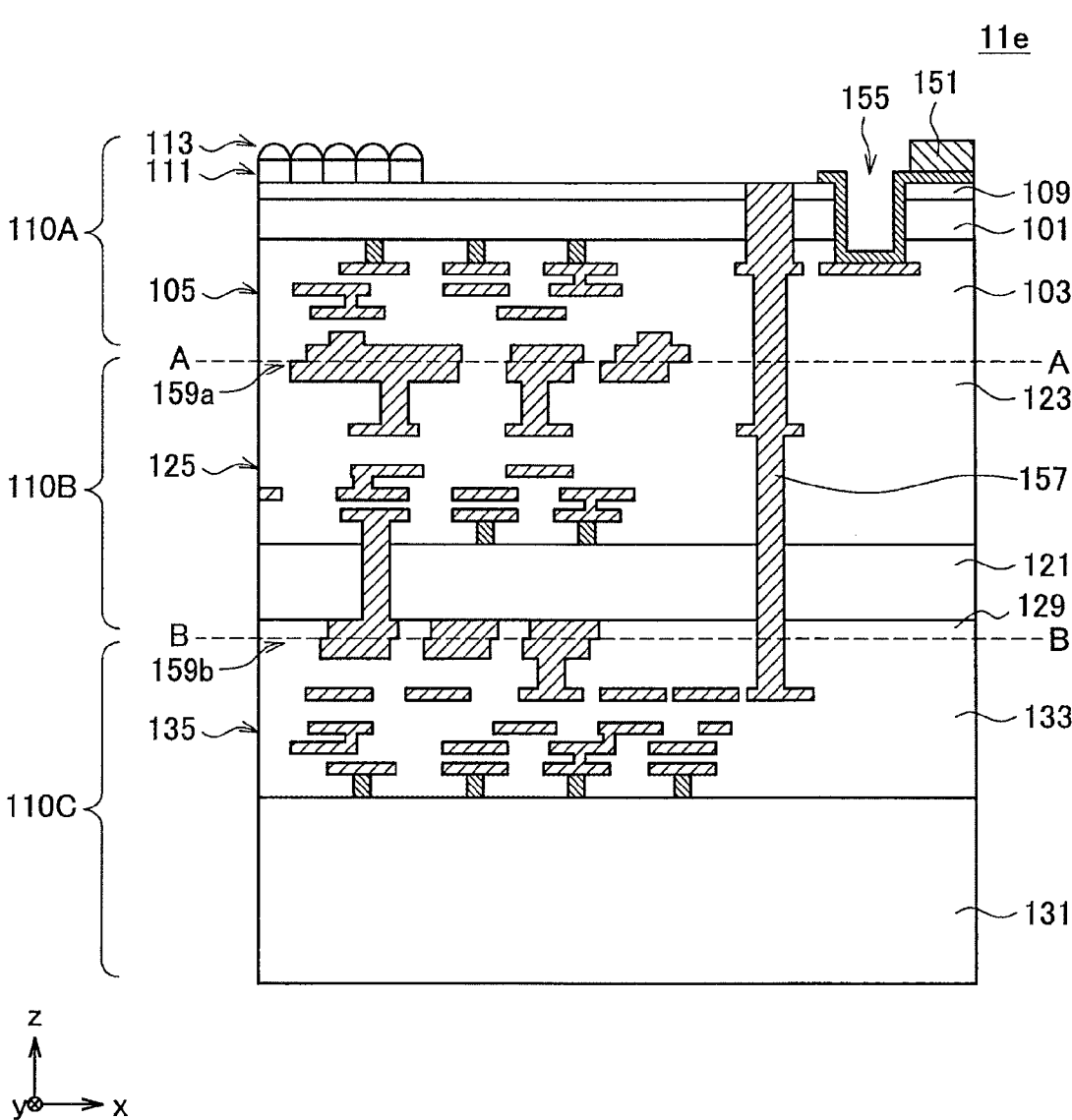
FIG. 19E is a vertical cross-sectional view of the schematic configuration of the solid-state imaging device according to the tenth configuration example of the present embodiment.

A solid-state imaging device 11e illustrated in FIG. 19E corresponds to the solid-state imaging device 11d illustrated in FIG. 19D in which the embedded pad structure and the types of wiring lines electrically coupled to each other by the shared contact type three-layer TSV 157 are changed. Specifically, in the configuration illustrated in FIG. 19E, a non-embedded lead pad structure for a predetermined wiring line in the multi-layered wiring layer 105 of the first substrate 110A is provided instead of the embedded pad structure. Moreover, in the configuration illustrated in FIG. 19E, the TSV 157 electrically couples a predetermined wiring line of the first metal wiring layer in the multi-layered wiring layer 125 of the first substrate 110A, a predetermined wiring line of the first metal wiring layer in the multi-layered wiring layer 125 of the second substrate 110B, and a predetermined wiring line of the first metal wiring layer in the multi-layered wiring layer 135 of the third substrate 110C to each other.

Figure 19F:
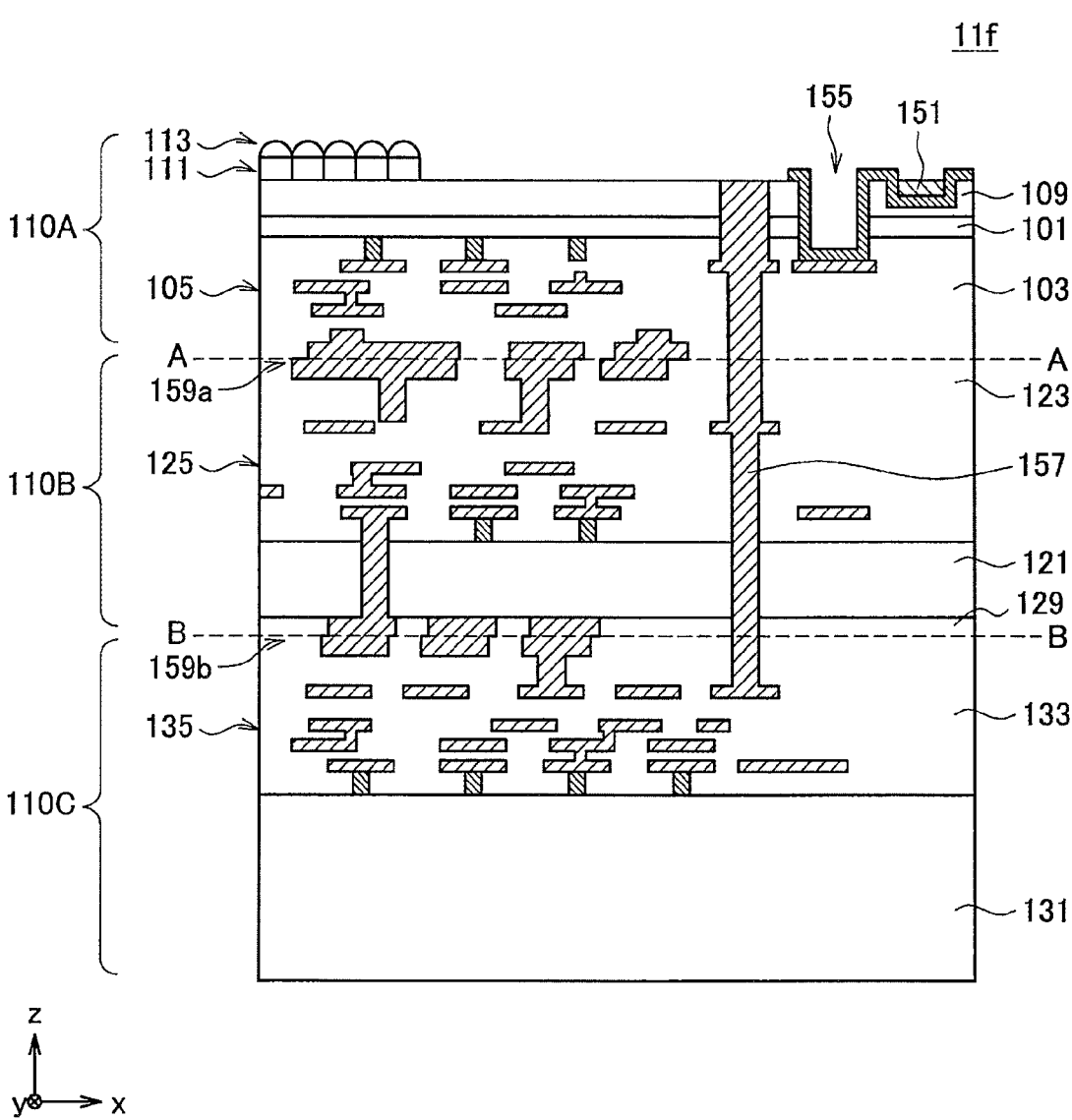
FIG. 19F is a vertical cross-sectional view of the schematic configuration of the solid-state imaging device according to the tenth configuration example of the present embodiment.

A solid-state imaging device 11f illustrated in FIG. 19F corresponds to the solid-state imaging device 11e illustrated in FIG. 19E in which the configuration of the lead pad structure is changed. Specifically, in the configuration illustrated in FIG. 19F, an embedded lead pad structure is provided as the lead pad structure instead of the non-embedded lead pad structure.

Note that in the respective configurations illustrated in FIGS. 19A to 19F, the types of wiring lines to which the shared contact type three-layer TSV 157 is coupled are not limited. The TSV 157 may be coupled to a predetermined wiring line of the first metal wiring layer or may be coupled to a predetermined wiring line of the second metal wiring layer. For example, in the respective configurations illustrated in FIGS. 19A to 19F, the wiring line of the first metal wiring layer to which the TSV 157 is coupled may be changed to a wiring line of the second metal wiring layer, and the wiring line of the second metal wiring layer to which the TSV 157 is coupled may be changed to a wiring line of the first metal wiring layer. Moreover, each of the multi-layered wiring layers 105, 125, and 135 may include only the first metal wiring layer, may include only the second metal wiring layer, or may include both the first metal wiring layer and the second metal wiring layer. For example, in the respective configurations illustrated in FIGS. 19A to 19F, the multi-layered wiring layer 135 of the third substrate 110C may include both the first metal wiring layer and the second metal wiring layer.

Further, it is sufficient if the shared contact type three-layer TSV 157 electrically couples the respective signal lines included in at least two substrates of the first substrate 110A, the second substrate 110B, and the third substrate 110C to each other and electrically couples the respective power supply lines included in the at least two substrates of the first substrate 110A, the second substrate 110B, and the third substrate 110C to each other, and the substrates including the respective signal lines electrically coupled to each other by the TSV 157 and the respective power supply lines electrically coupled to each other by the TSV 157 may be optionally changed.

5-11. Summary

Several configuration examples of the solid-state imaging device according to the present embodiment have been described above.

Note that in the second to fourth configuration examples and the seventh to tenth configuration examples of the configuration examples described above, it is possible to form the TSV 157 in a manner that an upper end thereof is exposed on the back surface side of the first substrate 110A or on the back surface side of the third substrate 110C. It is possible for the thus-exposed upper end of the TSV 157 to function as an electrode for electrically coupling a circuit included in the solid-state imaging device and an external circuit to each other. For example, a solder bump or the like may be provided on the exposed upper end of the TSV 157 to electrically couple the solid-state imaging device and an external device to each other.

In addition, in the configuration examples described above, only one TSV 157 is provided in the second to fourth configuration examples and the seventh to tenth configuration examples, but the present embodiment is not limited to such examples. A plurality of TSVs 157 may be provided. Moreover, the plurality of TSVs 157 provided may differ from each other in modes thereof (whether the TSV is a twin contact or a shared contact, and which substrates have wiring lines coupled to each other by the TSV, and the like).

In addition, in the respective configuration examples described above, in a case where the pad 151 is provided for each of the substrates 110A, 110B, and 110C, an embedded pad structure or a lead pad structure may be applied. Further, as for the lead pad structure, a non-embedded lead pad structure or an embedded lead pad structure may be applied.

6. Application Examples

Application to Electronic Apparatus

Application examples of the solid-state imaging devices 1 to 11f according to the present embodiment described above will be described. Several examples of an electronic apparatus to which the solid-state imaging devices 1 to 11f may be applied will be described here.

Figure 20A:
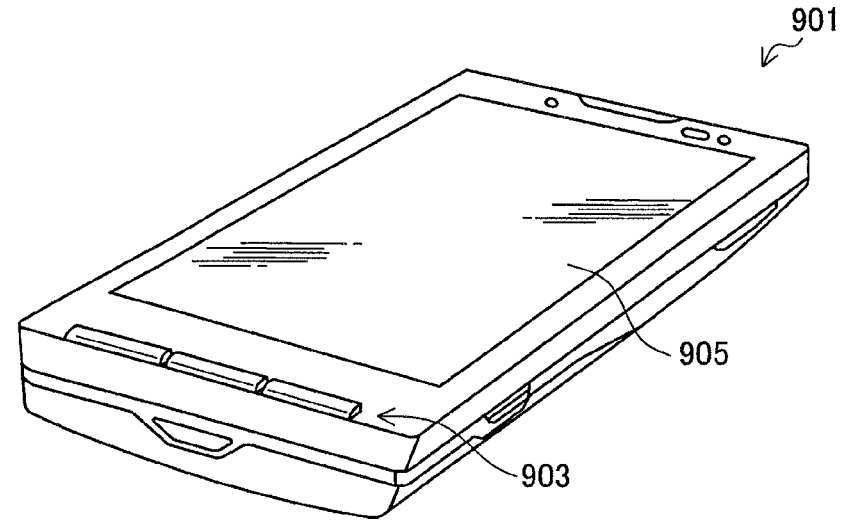
FIG. 20A is a diagram illustrating appearance of a smartphone that is an example of an electronic apparatus to which the solid-state imaging device according to the present embodiment may be applied.

FIG. 20A is a diagram illustrating appearance of a smartphone that is an example of an electronic apparatus to which the solid-state imaging devices 1 to 11f according to the present embodiment may be applied. As illustrated in FIG. 20A, a smartphone 901 includes an operation unit 903 that includes a button to receive an operation input mode by a user, a display unit 905 that displays various kinds of information, and an imaging unit (not illustrated) that is provided in a housing and electronically shoots an image of an object to be observed. The imaging unit may include the solid-state imaging devices 1 to 11f.

Figure 20B:
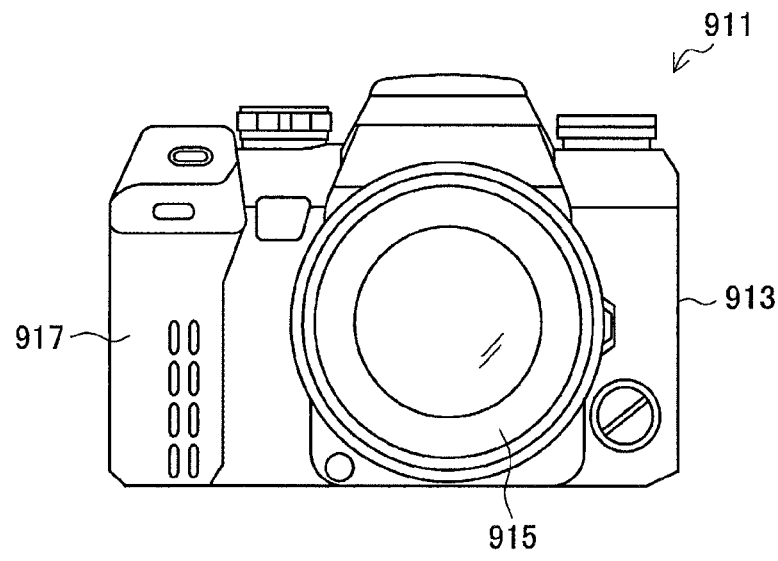
FIG. 20B is a diagram illustrating appearance of a digital camera that is another example of the electronic apparatus to which the solid-state imaging device according to the present embodiment may be applied.
Figure 20C:
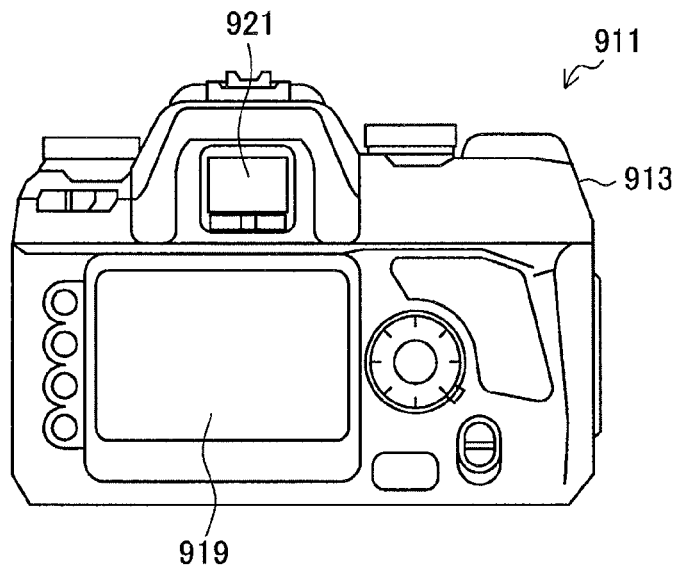
FIG. 20C is a diagram illustrating appearance of the digital camera that is another example of the electronic apparatus to which the solid-state imaging device according to the present embodiment may be applied.

FIGS. 20B and 20C are diagram illustrating appearance of a digital camera that is another example of the electronic apparatus to which the solid-state imaging devices 1 to 11f according to the present embodiment may be applied. FIG. 20B illustrates appearance of a digital camera 911 as viewed from the front (subject side), and FIG. 20C illustrates appearance of the digital camera 911 as viewed from the back. As illustrated in FIGS. 20B and 20C, the digital camera 911 includes a main body (camera body) 913, an interchangeable lens unit 915, a grip unit 917 that is grasped by a user at the time of shooting, a monitor 919 that displays various kinds of information, an EVF 921 that displays a through image observed by a user at the time of shooting, and an imaging unit (not illustrated) that is provided in a housing and electronically shoots an image of an object to be observed. The imaging unit may include the solid-state imaging devices 1 to 11f.

Several examples of an electronic apparatus to which the solid-state imaging devices 1 to 11f according to the present embodiment may be applied have been described above. Note that an electronic apparatus to which the solid-state imaging devices 1 to 11f may be applied is not limited to those exemplified above, but the solid-state imaging devices 1 to 11f are applicable as an imaging unit mounted on any electronic apparatus such as a video camera, a spectacle-type wearable device, an HMD (Head Mounted Display), a tablet PC, or a game console.

Application to Another Structure of Solid-State Imaging Device

Figure 21A:
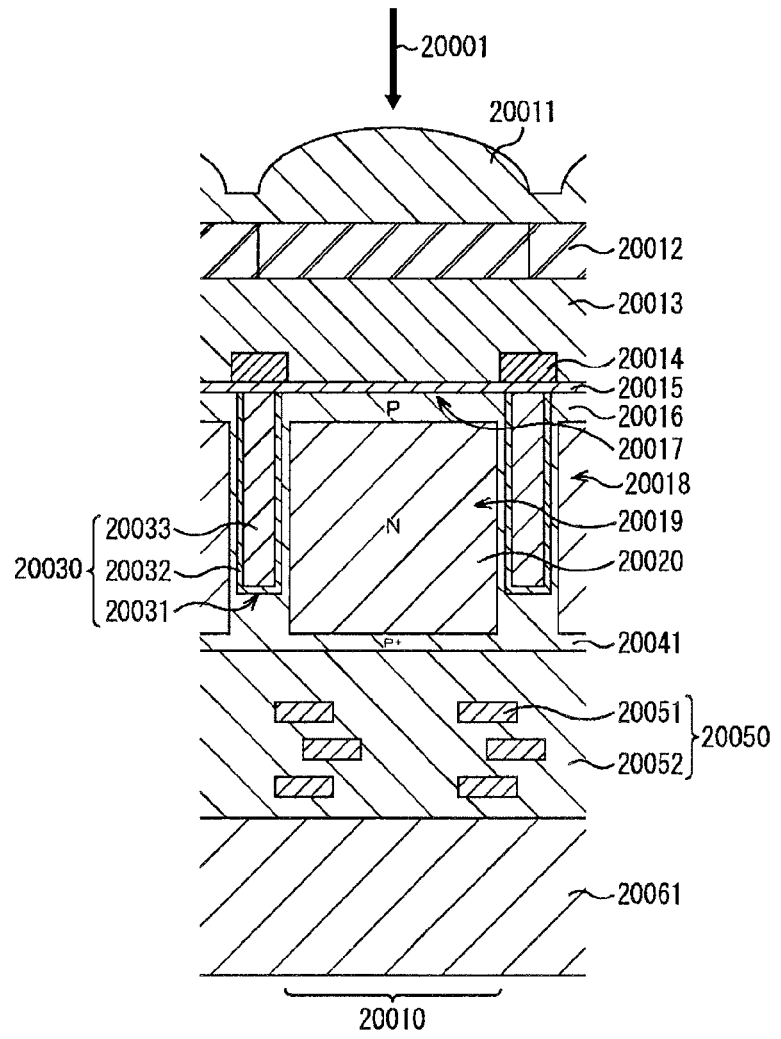
FIG. 21A is a cross-sectional view of a configuration example of a solid-state imaging device to which the technology according to the present disclosure may be applied.

Note that the technology according to the present disclosure may be applied to the solid-state imaging device illustrated in FIG. 21A. FIG. 21A is a cross-sectional view of a configuration example of a solid-state imaging device to which the technology according to the present disclosure may be applied.

In the solid-state imaging device, a PD (photodiode) 20019 receives incident light 20001 coming from the back surface (upper surface in the diagram) side of a semiconductor substrate 20018. Above the PD 20019, a planarization film 20013, a CF (color filter) 20012, and a microlens 20011 are provided, and the incident light 20001 sequentially passing through the respective units is received by a light-receiving surface 20017 to be subjected to photoelectric conversion.

For example, in the PD 20019, an n-type semiconductor region 20020 is formed as a charge accumulation region that accumulates charges (electrons). In the PD 20019, the n-type semiconductor region 20020 is provided inside p-type semiconductor regions 20016 and 20041 of the semiconductor substrate 20018. The front surface (lower surface) side of the semiconductor substrate 20018 of the n-type semiconductor region 20020 is provided with the p-type semiconductor region 20041 having higher impurity concentration than that of the back surface (upper surface) side. That is, the PD 20019 has an HAD (Hole-Accumulation Diode) structure, and the p-type semiconductor regions 20016 and 20041 are formed to suppress the generation of dark currents at the respective interfaces with the upper surface side and the lower surface side of the n-type semiconductor region 20020.

A pixel separation unit 20030 that electrically separates a plurality of pixels 20010 from each other is provided inside the semiconductor substrate 20018, and the PD 20019 is provided in a region defined by the pixel separation unit 20030. In the diagram, in a case where the solid-state imaging device is viewed from the upper surface side, the pixel separation unit 20030 is formed in the shape of a grid to be interposed between the plurality of pixels 20010, for example, and the PD 20019 is formed in a region defined by this pixel separation unit 20030.

In each PD 20019, the anode is grounded. In the solid-state imaging device, signal charges (e.g., electrons) accumulated by the PD 20019 are read out through a transfer Tr (MOS FET) or the like that is not illustrated and outputted as electric signals to a VSL (vertical signal line) that is not illustrated.

A wiring layer 20050 is provided on the front surface (lower surface) of the semiconductor substrate 20018 that is opposed to the back surface (upper surface) on which respective units such as a light-shielding film 20014, the CF 20012, and the microlens 20011 are provided.

The wiring layer 20050 includes a wiring line 20051 and an insulating layer 20052, and the wiring line 20051 is formed in the insulating layer 20052 to be electrically coupled to each element. The wiring layer 20050 is a so-called multi-layered wiring layer, and is formed by alternately stacking interlayer insulating films and the wiring lines 20051 a plurality of times. The interlayer insulating films are included in the insulating layer 20052. Here, as the wiring line 20051, wiring lines to a Tr such as the transfer Tr for reading out charges from the PD 20019, and respective wiring lines such as the VSL are stacked with the insulating layer 20052 interposed therebetween.

The wiring layer 20050 is provided with a support substrate 20061 on the surface opposite to the side on which the PD 20019 is provided. For example, a substrate including a silicon semiconductor and having a thickness of several hundreds of μm is provided as the support substrate 20061.

The light-shielding film 20014 is provided to the back surface (upper surface in the diagram) side of the semiconductor substrate 20018.

The light-shielding film 20014 is configured to block a portion of the incident light 20001 from above the semiconductor substrate 20018 toward the back surface of the semiconductor substrate 20018.

The light-shielding film 20014 is provided above the pixel separation unit 20030 provided inside the semiconductor substrate 20018. Here, the light-shielding film 20014 is provided on the back surface (upper surface) of the semiconductor substrate 20018 to protrude in the shape of a projection through the insulating film 20015 such as a silicon oxide film. In contrast, to make the incident light 20001 enter the PD 20019, the light-shielding film 20014 is not provided, but there is an opening above the PD 20019 provided inside the semiconductor substrate 20018.

That is, in a case where the solid-state imaging device is viewed from the upper surface side in the diagram, the light-shielding film 20014 has a grid shape in a plan view, and an opening through which the incident light 20001 passes to the light-receiving surface 20017 is formed.

The light-shielding film 20014 includes a light-shielding material that blocks light. For example, titanium (Ti) films and tungsten (W) films are sequentially stacked to form the light-shielding film 20014. In addition, it is possible to form the light-shielding film 20014 by sequentially stacking, for example, titanium nitride (TiN) films and tungsten (W) films.

The light-shielding film 20014 is covered with the planarization film 20013. The planarization film 20013 is formed using an insulating material that transmits light.

The pixel separation unit 20030 includes a groove 20031, a fixed-charge film 20032, and an insulating film 20033.

The fixed-charge film 20032 is formed on the back surface (upper surface) side of the semiconductor substrate 20018 to cover the groove 20031 that defines the space between the plurality of pixels 20010.

Specifically, the fixed-charge film 20032 is provided to cover the inner surface of the groove 20031 formed on the back surface (upper surface) side of the semiconductor substrate 20018 with a predetermined thickness. The insulating film 20033 is then provided to be embedded in (loaded into) the inside of the groove 20031 covered with the fixed-charge film 20032.

Here, the fixed-charge film 20032 is formed using a high dielectric material having a negative fixed charge to form a positive-charge (hole) accumulation region at the interface with the semiconductor substrate 20018 and suppress the generation of dark currents. The fixed charge film 20032 is formed to have a negative fixed charge. This causes the negative fixed charge to apply an electric field to the interface with the semiconductor substrate 20018, and forms a positive-charge (hole) accumulation region.

It is possible to form the fixed-charge film 20032 by using, for example, a hafnium oxide film ($HfO_2$ film). In addition, it is possible to form the fixed-charge film 20032 to additionally include at least one of oxides of hafnium, zirconium, aluminum, tantalum, titanium, magnesium, yttrium, lanthanide elements, or the like, for example.

Figure 21B:
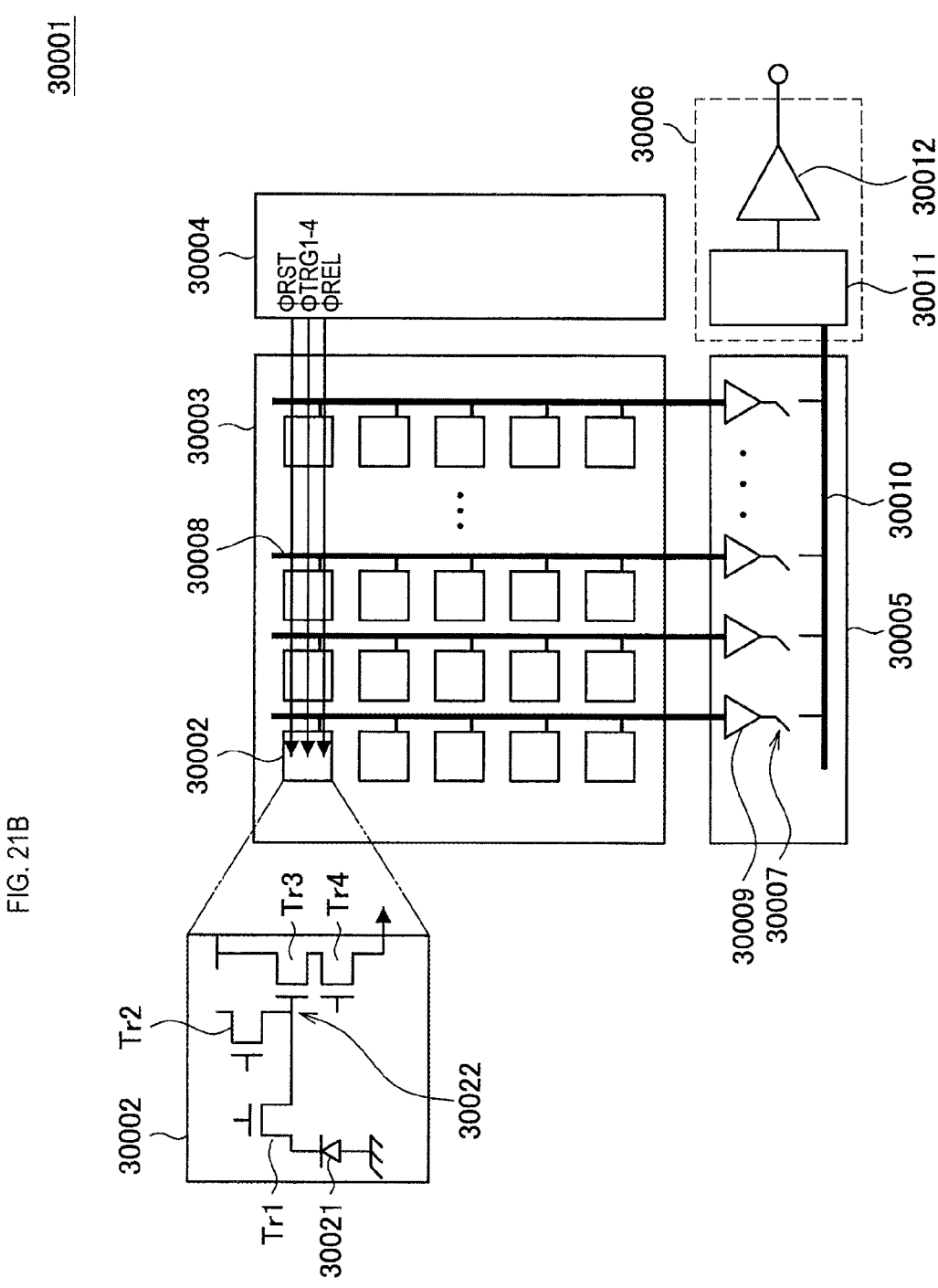
FIG. 21B is an explanatory diagram illustrating a schematic configuration of the solid-state imaging device to which the technology according to the present disclosure may be applied.

In addition, the technology according to the present disclosure may also be applied to a solid-state imaging device illustrated in FIG. 21B. FIG. 21B illustrates a schematic configuration of a solid-state imaging device to which the technology according to the present disclosure may be applied.

A solid-state imaging device 30001 includes an imaging unit (so-called pixel unit) 30003 in which a plurality of pixels 30002 is regularly arranged two-dimensionally, and peripheral circuits, that is, a vertical driving unit 30004, a horizontal transfer unit 30005, and an output unit 30006 disposed around the imaging unit 30003. The pixels 30002 each include a photodiode 30021 that is one photoelectric conversion element, and a plurality of pixel transistors (MOS transistors) Tr1, Tr2, Tr3, and Tr4.

The photodiode 30021 has a region in which signal charges that are photoelectrically converted by using incoming light and are generated by the photoelectric conversion are accumulated. In this example, the plurality of pixel transistors includes the four MOS transistors of a transfer transistor Tr1, a reset transistor Tr2, an amplifying transistor Tr3, and a selection transistor Tr4. The transfer transistor Tr1 is a transistor that reads out the signal charges accumulated in the photodiode 30021 into a floating diffusion (FD) region 30022 described below. The reset transistor Tr2 is a transistor for setting a prescribed value as the electric potential of the FD region 30022. The amplifying transistor Tr3 is a transistor for electrically amplifying the signal charges read out to the FD region 30022. The selection transistor Tr4 is a transistor for selecting one row of pixels and reading out a pixel signal to the vertical signal line 30008.

Note that, although not illustrated, it is also possible to include the three transistors excluding the selection transistor Tr4 and the photodiode PD in a pixel.

In the circuit configuration of the pixel 30002, the source of the transfer transistor Tr1 is coupled to the photodiode 30021, and the drain thereof is coupled to the source of the reset transistor Tr2. The FD region 30022 (corresponding to the drain region of the transfer transistor and the source region of the reset transistor) serving as a charge-voltage conversion means between the transfer transistor Tr1 and the reset transistor Tr2 is coupled to the gate of the amplifying transistor Tr3. The source of the amplifying transistor Tr3 is coupled to the drain of the selection transistor Tr4. The drain of the reset transistor Tr2 and the drain of the amplifying transistor Tr3 are coupled to a power supply voltage supplying unit. In addition, the source of the selection transistor Tr4 is coupled to the vertical signal line 30008.

Row reset signals φRST commonly applied to the gates of the reset transistors Tr2 of the pixels arranged in one row, row transfer signals φTRG commonly applied in the same manner to the gates of the transfer transistors Tr1 of the pixels in one row, and row select signals φSEL commonly applied in the same manner to the gates of the selection transistors Tr4 in one row are each supplied from the vertical driving unit 30004.

The horizontal transfer unit 30005 includes an amplifier or an analog/digital converter (ADC) coupled to the vertical signal line 30008 of each column, which is, in this example, an analog/digital converter 30009, a column selection circuit (switch means) 30007, and a horizontal transfer line (e.g., bus wiring including the same number of wiring lines as the number of data bit lines) 30010. The output unit 30006 includes an amplifier or an analog/digital converter and/or a signal processing circuit, which is, in this example, a signal processing circuit 30011 that processes an output from the horizontal transfer line 30010, and an output buffer 30012.

In this solid-state imaging device 30001, the signals of the pixels 30002 in each row are subjected to analog/digital conversion by each analog/digital converter 30009, read out through the sequentially selected column selection circuit 30007 into horizontal transfer lines 30010, and horizontally transferred sequentially. The image data read out to the horizontal transfer line 30010 is outputted by the output buffer 30012 through the signal processing circuit 30011.

As the general operation of the pixel 3002, the gate of the transfer transistor Tr1 and the gate of the reset transistor Tr2 are first turned on to empty all the charges in the photodiode 30021. The gate of the transfer transistor Tr1 and the gate of the reset transistor Tr2 are then turned off to accumulate charges. Next, the gate of the reset transistor Tr2 is turned on immediately before the charges of the photodiode 30021 are read out, and the electric potential of the FD region 30022 is reset. Afterwards, the gate of the reset transistor Tr2 is turned off, and the gate of the transfer transistor Tr1 is turned on to transfer the charges from the photodiodes 30021 to the FD region 30022. The amplifying transistor Tr3 electrically amplifies signal charges in response to the application of the charges to the gate. Meanwhile, only the selection transistor Tr4 in a pixel to be read is turned on at the time of FD resetting immediately before the reading, and an image signal, subjected to charge-to-voltage conversion, from the amplifying transistor Tr3 in the pixel is read out to the vertical signal line 30008.

Other structural examples of a solid-state imaging device to which the technology according to the present disclosure may be applied have been described above.

Example of Application to Camera

Figure 21C:
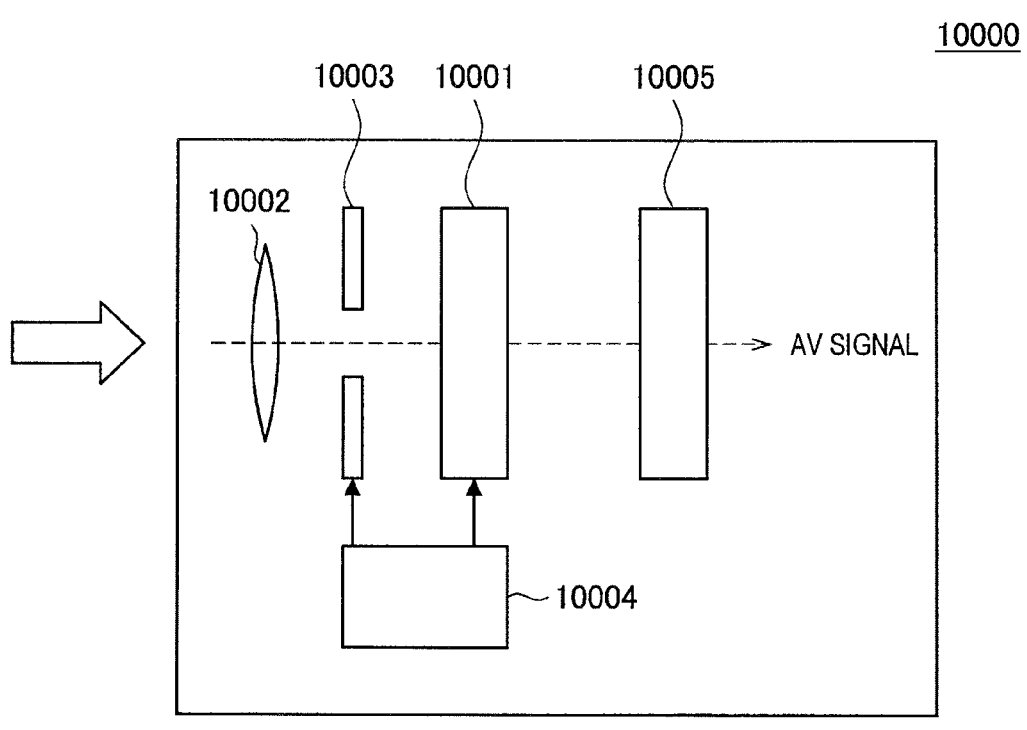
FIG. 21C is an explanatory diagram illustrating a configuration example of a video camera to which the technology according to the present disclosure may be applied.

The solid-state imaging device described above is applicable to an electronic apparatus such as a camera system such as a digital camera or a video camera, a mobile phone having an imaging function, or another device having an imaging function, for example. As a configuration example of an electronic apparatus, the following makes description by using a camera as an example. FIG. 21C is an explanatory diagram illustrating a configuration example of a video camera to which the technology according to the present disclosure may be applied.

A camera 10000 in this example includes a solid-state imaging device 10001, an optical system 10002 that guides incident light to a light-receiving sensor unit of the solid-state imaging device 10001, a shutter device 10003 provided between the solid-state imaging device 10001 and the optical system 10002, and a drive circuit 10004 that drives the solid-state imaging device 10001. Further, the camera 10000 includes a signal processing circuit 10005 that processes an output signal of the solid-state imaging device 10001.

The optical system (optical lenses) 10002 forms an image of image light (incident light) from a subject on an imaging surface (not illustrated) of the solid-state imaging device 10001. This causes signal charges to be accumulated in the solid-state imaging device 10001 for a predetermined period. Note that the optical system 10002 may include an optical lens group including a plurality of optical lenses. In addition, the shutter device 10003 controls a light irradiating period and a light shielding period of incident light on the solid-state imaging device 10001.

The drive circuit 10004 supplies drive signals to the solid-state imaging device 10001 and the shutter device 10003. The drive circuit 10004 then controls the operation of the solid-state imaging device 10001 to output signals to the signal processing circuit 10005 and the shutter operation of the shutter device 10003 on the basis of the supplied drive signals. That is, in this example, the operation of transferring signals from the solid-state imaging device 10001 to the signal processing circuit 10005 is performed on the basis of drive signals (timing signals) supplied from the drive circuit 10004.

The signal processing circuit 10005 performs various kinds of signal processing on the signals transferred from the solid-state imaging device 10001. The signals (AV-SIGNAL) subjected to the various kinds of signal processing are stored in a storage medium (not illustrated) such as a memory, or is outputted to a monitor (not illustrated).

An example of a camera to which the technology according to the present disclosure may be applied has been described above.

Example of Application to Endoscopic Surgery System

For example, the technology according to the present disclosure may be applied to an endoscopic surgery system.

Figure 21D:
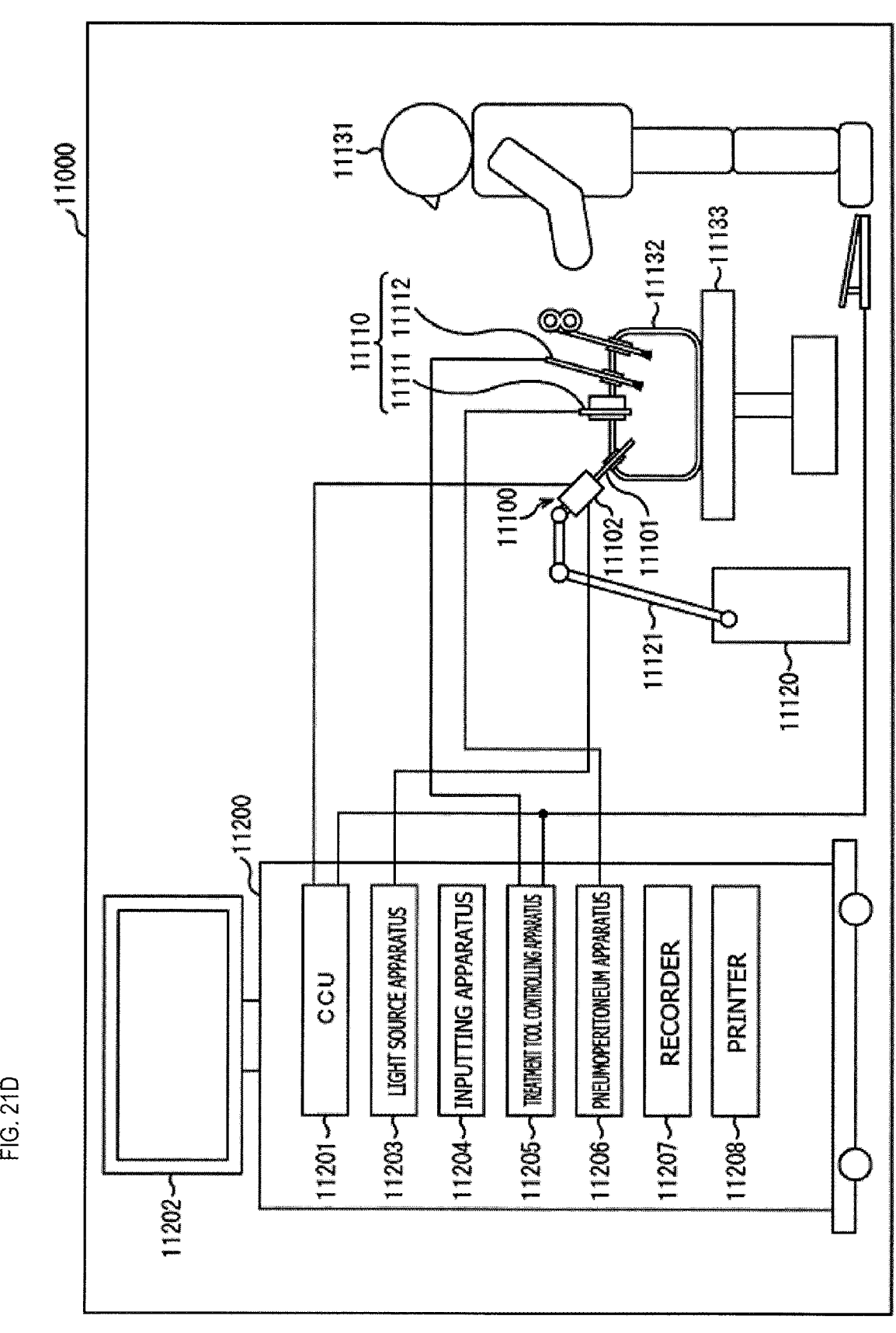
FIG. 21D is a view depicting an example of a schematic configuration of an endoscopic surgery system.

FIG. 21D is a view depicting an example of a schematic configuration of an endoscopic surgery system to which the technology according to an embodiment of the present disclosure (present technology) can be applied.

In FIG. 21D, a state is illustrated in which a surgeon (medical doctor) 11131 is using an endoscopic surgery system 11000 to perform surgery for a patient 11132 on a patient bed 11133. As depicted, the endoscopic surgery system 11000 includes an endoscope 11100, other surgical tools 11110 such as a pneumoperitoneum tube 11111 and an energy device 11112, a supporting arm apparatus 11120 which supports the endoscope 11100 thereon, and a cart 11200 on which various apparatus for endoscopic surgery are mounted.

The endoscope 11100 includes a lens barrel 11101 having a region of a predetermined length from a distal end thereof to be inserted into a body cavity of the patient 11132, and a camera head 11102 connected to a proximal end of the lens barrel 11101. In the example depicted, the endoscope 11100 is depicted which includes as a rigid endoscope having the lens barrel 11101 of the hard type. However, the endoscope 11100 may otherwise be included as a flexible endoscope having the lens barrel 11101 of the flexible type.

The lens barrel 11101 has, at a distal end thereof, an opening in which an objective lens is fitted. A light source apparatus 11203 is connected to the endoscope 11100 such that light generated by the light source apparatus 11203 is introduced to a distal end of the lens barrel 11101 by a light guide extending in the inside of the lens barrel 11101 and is irradiated toward an observation target in a body cavity of the patient 11132 through the objective lens. It is to be noted that the endoscope 11100 may be a forward-viewing endoscope or may be an oblique-viewing endoscope or a side-viewing endoscope.

An optical system and an image pickup element are provided in the inside of the camera head 11102 such that reflected light (observation light) from the observation target is condensed on the image pickup element by the optical system. The observation light is photoelectrically converted by the image pickup element to generate an electric signal corresponding to the observation light, namely, an image signal corresponding to an observation image. The image signal is transmitted as RAW data to a CCU 11201.

The CCU 11201 includes a central processing unit (CPU), a graphics processing unit (GPU) or the like and integrally controls operation of the endoscope 11100 and a display apparatus 11202. Further, the CCU 11201 receives an image signal from the camera head 11102 and performs, for the image signal, various image processes for displaying an image based on the image signal such as, for example, a development process (demosaic process).

The display apparatus 11202 displays thereon an image based on an image signal, for which the image processes have been performed by the CCU 11201, under the control of the CCU 11201.

The light source apparatus 11203 includes a light source such as, for example, a light emitting diode (LED) and supplies irradiation light upon imaging of a surgical region to the endoscope 11100.

An inputting apparatus 11204 is an input interface for the endoscopic surgery system 11000. A user can perform inputting of various kinds of information or instruction inputting to the endoscopic surgery system 11000 through the inputting apparatus 11204. For example, the user would input an instruction or a like to change an image pickup condition (type of irradiation light, magnification, focal distance or the like) by the endoscope 11100.

A treatment tool controlling apparatus 11205 controls driving of the energy device 11112 for cautery or incision of a tissue, sealing of a blood vessel or the like. A pneumoperitoneum apparatus 11206 feeds gas into a body cavity of the patient 11132 through the pneumoperitoneum tube 11111 to inflate the body cavity in order to secure the field of view of the endoscope 11100 and secure the working space for the surgeon. A recorder 11207 is an apparatus capable of recording various kinds of information relating to surgery. A printer 11208 is an apparatus capable of printing various kinds of information relating to surgery in various forms such as a text, an image or a graph.

It is to be noted that the light source apparatus 11203 which supplies irradiation light when a surgical region is to be imaged to the endoscope 11100 may include a white light source which includes, for example, an LED, a laser light source or a combination of them. Where a white light source includes a combination of red, green, and blue (RGB) laser light sources, since the output intensity and the output timing can be controlled with a high degree of accuracy for each color (each wavelength), adjustment of the white balance of a picked up image can be performed by the light source apparatus 11203. Further, in this case, if laser beams from the respective RGB laser light sources are irradiated time-divisionally on an observation target and driving of the image pickup elements of the camera head 11102 are controlled in synchronism with the irradiation timings. Then images individually corresponding to the R, G and B colors can be also picked up time-divisionally. According to this method, a color image can be obtained even if color filters are not provided for the image pickup element.

Further, the light source apparatus 11203 may be controlled such that the intensity of light to be outputted is changed for each predetermined time. By controlling driving of the image pickup element of the camera head 11102 in synchronism with the timing of the change of the intensity of light to acquire images time-divisionally and synthesizing the images, an image of a high dynamic range free from underexposed blocked up shadows and overexposed highlights can be created.

Further, the light source apparatus 11203 may be configured to supply light of a predetermined wavelength band ready for special light observation. In special light observation, for example, by utilizing the wavelength dependency of absorption of light in a body tissue to irradiate light of a narrow band in comparison with irradiation light upon ordinary observation (namely, white light), narrow band observation (narrow band imaging) of imaging a predetermined tissue such as a blood vessel of a superficial portion of the mucous membrane or the like in a high contrast is performed. Alternatively, in special light observation, fluorescent observation for obtaining an image from fluorescent light generated by irradiation of excitation light may be performed. In fluorescent observation, it is possible to perform observation of fluorescent light from a body tissue by irradiating excitation light on the body tissue (autofluorescence observation) or to obtain a fluorescent light image by locally injecting a reagent such as indocyanine green (ICG) into a body tissue and irradiating excitation light corresponding to a fluorescent light wavelength of the reagent upon the body tissue. The light source apparatus 11203 can be configured to supply such narrow-band light and/or excitation light suitable for special light observation as described above.

Figure 21E:
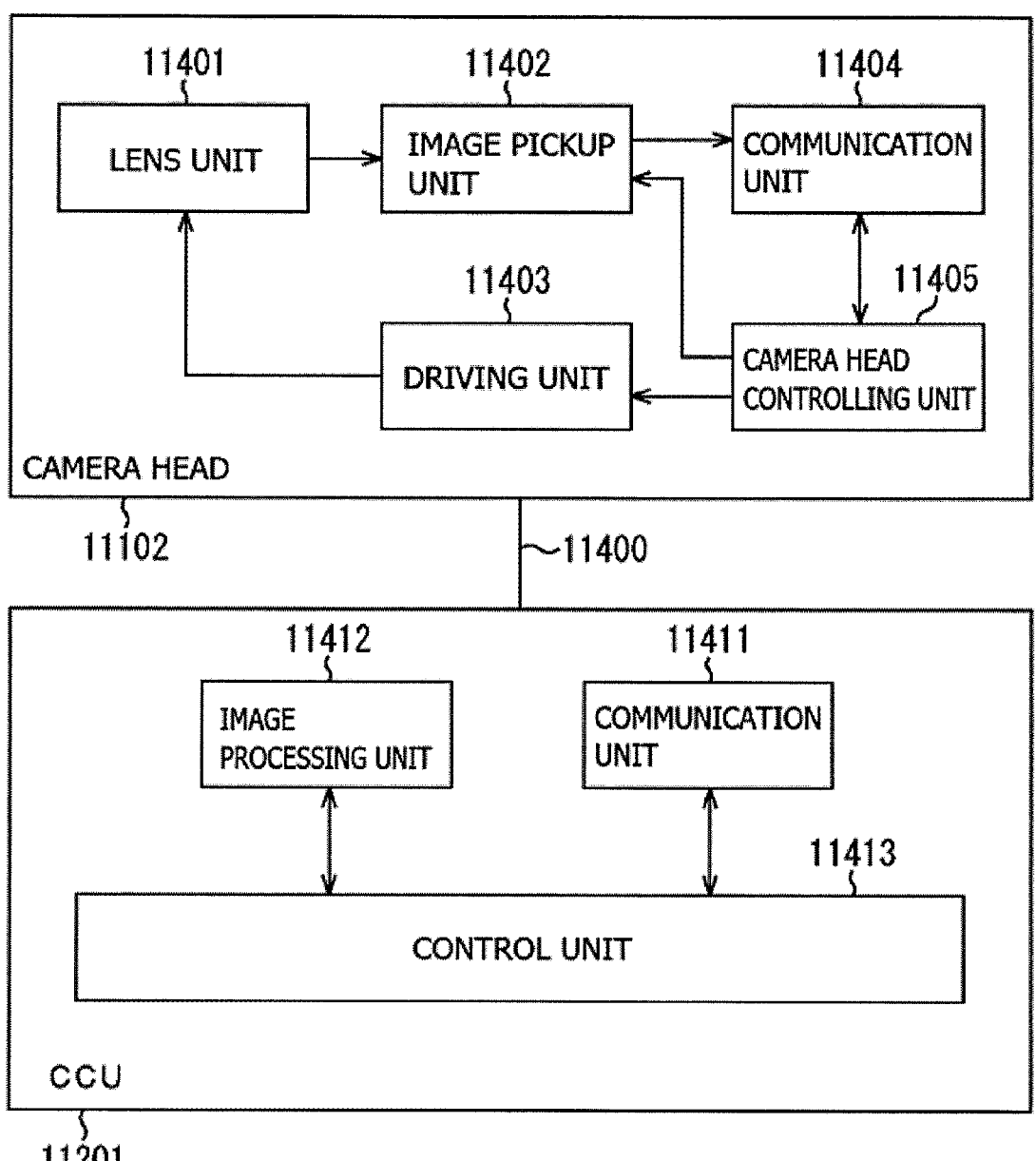
FIG. 21E is a block diagram depicting an example of a functional configuration of a camera head and a camera control unit (CCU).

FIG. 21E is a block diagram depicting an example of a functional configuration of the camera head 11102 and the CCU 11201 depicted in FIG. 21D.

The camera head 11102 includes a lens unit 11401, an image pickup unit 11402, a driving unit 11403, a communication unit 11404 and a camera head controlling unit 11405. The CCU 11201 includes a communication unit 11411, an image processing unit 11412 and a control unit 11413. The camera head 11102 and the CCU 11201 are connected for communication to each other by a transmission cable 11400.

The lens unit 11401 is an optical system, provided at a connecting location to the lens barrel 11101. Observation light taken in from a distal end of the lens barrel 11101 is guided to the camera head 11102 and introduced into the lens unit 11401. The lens unit 11401 includes a combination of a plurality of lenses including a zoom lens and a focusing lens.

The number of image pickup elements which is included by the image pickup unit 11402 may be one (single-plate type) or a plural number (multi-plate type). Where the image pickup unit 11402 is configured as that of the multi-plate type, for example, image signals corresponding to respective R, G and B are generated by the image pickup elements, and the image signals may be synthesized to obtain a color image. The image pickup unit 11402 may also be configured so as to have a pair of image pickup elements for acquiring respective image signals for the right eye and the left eye ready for three dimensional (3D) display. If 3D display is performed, then the depth of a living body tissue in a surgical region can be comprehended more accurately by the surgeon 11131. It is to be noted that, where the image pickup unit 11402 is configured as that of stereoscopic type, a plurality of systems of lens units 11401 are provided corresponding to the individual image pickup elements.

Further, the image pickup unit 11402 may not necessarily be provided on the camera head 11102. For example, the image pickup unit 11402 may be provided immediately behind the objective lens in the inside of the lens barrel 11101.

The driving unit 11403 includes an actuator and moves the zoom lens and the focusing lens of the lens unit 11401 by a predetermined distance along an optical axis under the control of the camera head controlling unit 11405. Consequently, the magnification and the focal point of a picked up image by the image pickup unit 11402 can be adjusted suitably.

The communication unit 11404 includes a communication apparatus for transmitting and receiving various kinds of information to and from the CCU 11201. The communication unit 11404 transmits an image signal acquired from the image pickup unit 11402 as RAW data to the CCU 11201 through the transmission cable 11400.

In addition, the communication unit 11404 receives a control signal for controlling driving of the camera head 11102 from the CCU 11201 and supplies the control signal to the camera head controlling unit 11405. The control signal includes information relating to image pickup conditions such as, for example, information that a frame rate of a picked up image is designated, information that an exposure value upon image picking up is designated and/or information that a magnification and a focal point of a picked up image are designated.

It is to be noted that the image pickup conditions such as the frame rate, exposure value, magnification or focal point may be designated by the user or may be set automatically by the control unit 11413 of the CCU 11201 on the basis of an acquired image signal. In the latter case, an auto exposure (AE) function, an auto focus (AF) function and an auto white balance (AWB) function are incorporated in the endoscope 11100.

The camera head controlling unit 11405 controls driving of the camera head 11102 on the basis of a control signal from the CCU 11201 received through the communication unit 11404.

The communication unit 11411 includes a communication apparatus for transmitting and receiving various kinds of information to and from the camera head 11102. The communication unit 11411 receives an image signal transmitted thereto from the camera head 11102 through the transmission cable 11400.

Further, the communication unit 11411 transmits a control signal for controlling driving of the camera head 11102 to the camera head 11102. The image signal and the control signal can be transmitted by electrical communication, optical communication or the like.

The image processing unit 11412 performs various image processes for an image signal in the form of RAW data transmitted thereto from the camera head 11102.

The control unit 11413 performs various kinds of control relating to image picking up of a surgical region or the like by the endoscope 11100 and display of a picked up image obtained by image picking up of the surgical region or the like. For example, the control unit 11413 creates a control signal for controlling driving of the camera head 11102.

Further, the control unit 11413 controls, on the basis of an image signal for which image processes have been performed by the image processing unit 11412, the display apparatus 11202 to display a picked up image in which the surgical region or the like is imaged. Thereupon, the control unit 11413 may recognize various objects in the picked up image using various image recognition technologies. For example, the control unit 11413 can recognize a surgical tool such as forceps, a particular living body region, bleeding, mist when the energy device 11112 is used and so forth by detecting the shape, color and so forth of edges of objects included in a picked up image. The control unit 11413 may cause, when it controls the display apparatus 11202 to display a picked up image, various kinds of surgery supporting information to be displayed in an overlapping manner with an image of the surgical region using a result of the recognition. Where surgery supporting information is displayed in an overlapping manner and presented to the surgeon 11131, the burden on the surgeon 11131 can be reduced and the surgeon 11131 can proceed with the surgery with certainty.

The transmission cable 11400 which connects the camera head 11102 and the CCU 11201 to each other is an electric signal cable ready for communication of an electric signal, an optical fiber ready for optical communication or a composite cable ready for both of electrical and optical communications.

Here, while, in the example depicted, communication is performed by wired communication using the transmission cable 11400, the communication between the camera head 11102 and the CCU 11201 may be performed by wireless communication.

An example of an endoscopic surgery system to which the technology according to the present disclosure may be applied has been described above. The technology according to the present disclosure may be applied to, for example, the image pickup unit 11402 of the camera head 11102 out of the components described above. Applying the technology according to the present disclosure to the image pickup unit 11402 makes it possible to obtain a clearer image of a surgical region. This allows a surgeon to check the surgical region with certainty.

Note that the endoscopic surgery system has been described here as an example, but the technology according to the present disclosure may be additionally applied to, for example, a microscopic surgery system or the like.

Example of Application to Mobile Body

For example, the technology according to the present disclosure may be implemented as a device mounted on any type of mobile body such as an automobile, an electric vehicle, a hybrid electric vehicle, a motorcycle, a bicycle, a personal mobility, an airplane, a drone, a vessel, or a robot.

Figure 21F:
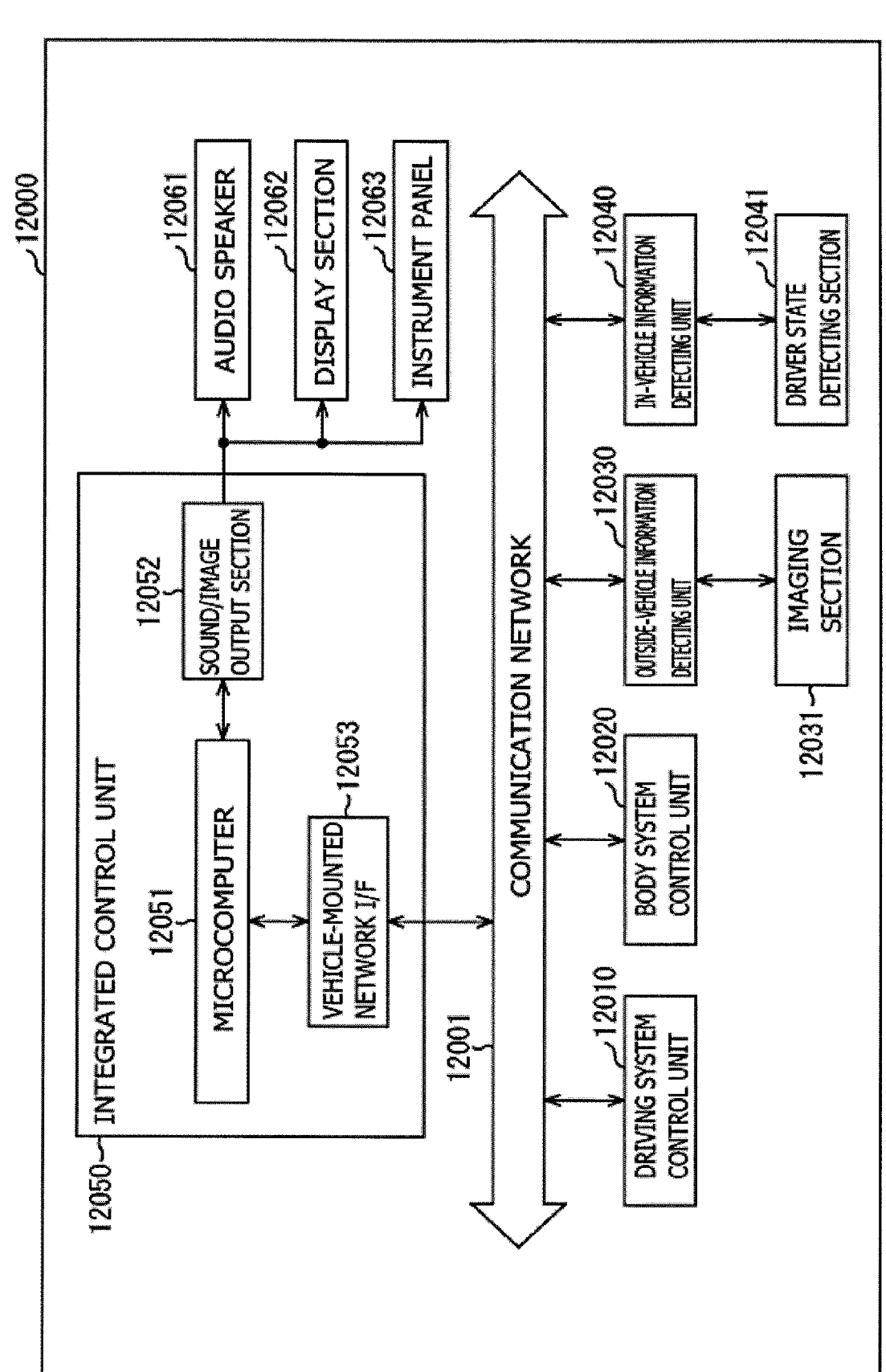
FIG. 21F is a block diagram depicting an example of schematic configuration of a vehicle control system.

FIG. 21F is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 21F, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 21F, an audio speaker 12061, a display section 12062, and an instrument panel 12063 are illustrated as the output device. The display section 12062 may, for example, include at least one of an on-board display and a head-up display.

Figure 21G:
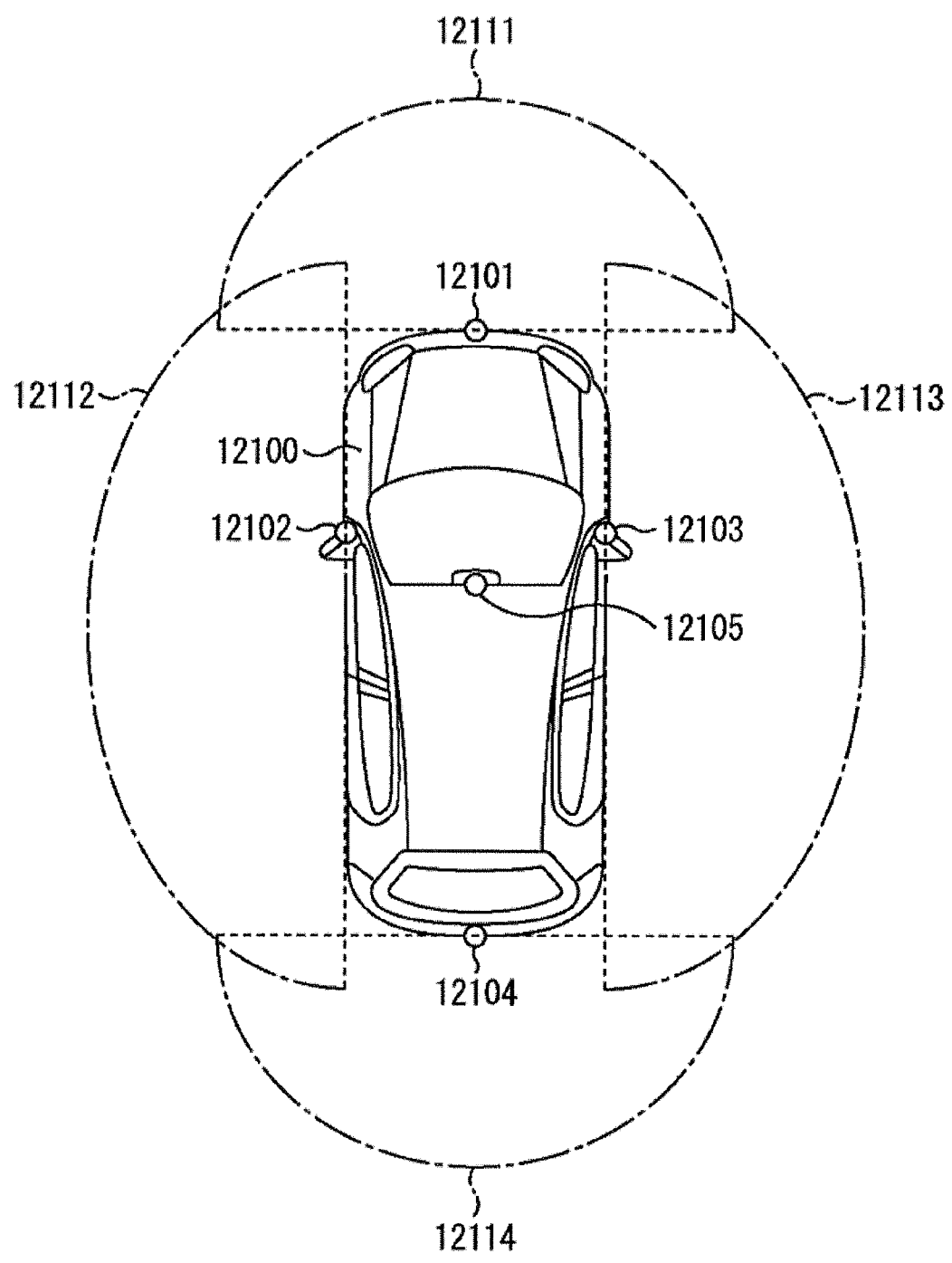
FIG. 21G is a diagram of assistance in describing an example of installation positions of an outside-vehicle information detecting section and an imaging section.

FIG. 21G is a diagram depicting an example of the installation position of the imaging section 12031.

In FIG. 21G, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 1022 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

An example of a vehicle control system to which the technology according to the present disclosure may be applied has been described above. The technology according to the present disclosure may be applied to the imaging section 12031 and the like out of the components described above. Applying the technology according to the present disclosure to the imaging section 12031 makes it possible to obtain a captured image that is easier to see. This makes it possible to reduce fatigue of a driver. In addition, it is possible to obtain a captured image that is easier to recognize, which makes it possible to improve the accuracy of driving assistance.

7. Supplement

The preferred embodiment(s) of the present disclosure has/have been described above with reference to the accompanying drawings, whilst the present disclosure is not limited to the above examples. A person skilled in the art may find various alterations and modifications within the scope of the appended claims, and it should be understood that they will naturally come under the technical scope of the present disclosure.

For example, the respective configurations of the solid-state imaging device according to the present embodiment described above (for example, the respective components of the solid-state imaging devices 1 to 11*f* illustrated in FIG. 1 and FIG. 10A to FIG. 19F) may be combined within a possible range. The solid-state imaging device according to the present embodiment may also encompass a solid-state imaging device having such a combination of the respective configurations.

Moreover, the configurations of the respective solid-state imaging devices according to the present embodiment described above are only examples of the technology according to the present disclosure. In the present disclosure, as another embodiment, a solid-state imaging device may be provided that has various coupling structures that are not included in the embodiment described above.

Further, the effects described in this specification are merely illustrative or exemplified effects, and are not limitative. That is, with or in the place of the above effects, the technology according to the present disclosure may achieve other effects that are clear to those skilled in the art from the description of this specification.

Note that the technical scope of the present disclosure also includes the following configurations.

(1) A solid-state imaging device including:
  a first substrate including a first semiconductor substrate and a first multi-layered wiring layer stacked on the first semiconductor substrate, the first semiconductor substrate having a pixel unit formed thereon, the pixel unit having pixels arranged thereon;

a second substrate including a second semiconductor substrate and a second multi-layered wiring layer stacked on the second semiconductor substrate, the second semiconductor substrate having a circuit formed thereon, the circuit having a predetermined function; and a third substrate including a third semiconductor substrate and a third multi-layered wiring layer stacked on the third semiconductor substrate, the third semiconductor substrate having a circuit formed thereon, the circuit having a predetermined function, the first substrate, the second substrate, and the third substrate being stacked in this order, the first substrate and the second substrate being bonded together in a manner that the first multi-layered wiring layer and the second multi-layered wiring layer are opposed to each other, a first coupling structure for electrically coupling the first substrate and the second substrate to each other existing on bonding surfaces of the first substrate and the second substrate, and including an electrode junction structure in which electrodes formed on the respective bonding surfaces are joined to each other in direct contact with each other.

(2) The solid-state imaging device according to (1), further including a second coupling structure for electrically coupling the second substrate and the third substrate to each other, in which the second coupling structure includes an opening provided by penetrating at least the first substrate from a back surface side of the first substrate to expose a predetermined wiring line in the second multi-layered wiring layer, and an opening provided by penetrating at least the first substrate and the second substrate from the back surface side of the first substrate to expose a predetermined wiring line in the third multi-layered wiring layer.

(3) The solid-state imaging device according to (2), in which the predetermined wiring line in the second multi-layered wiring layer that is exposed by the opening and the predetermined wiring line in the third multi-layered wiring layer that is exposed by the opening include pads that function as I/O units.

(4) The solid-state imaging device according to (2), in which pads that function as I/O units exist on a surface on a back side of the first substrate, a film including an electrically-conductive material is formed on an inner wall of the opening, and the predetermined wiring line in the second multi-layered wiring layer that is exposed by the opening and the predetermined wiring line in the third multi-layered wiring layer that is exposed by the opening are electrically coupled to the pads by the electrically-conductive material.

(5) The solid-state imaging device according to (4), in which the predetermined wiring line in the second multi-layered wiring layer and the predetermined wiring line in the third multi-layered wiring layer are electrically coupled to the same pad by the electrically-conductive material.

(6) The solid-state imaging device according to (4), in which the predetermined wiring line in the second multi-layered wiring layer and the predetermined wiring line in the third multi-layered wiring layer are electrically coupled to the pads by the electrically-conductive material, the pads being different from each other.

(7) The solid-state imaging device according to any one of (1) to (6), further including a second coupling structure for electrically coupling the second substrate and the third substrate to each other, in which the second substrate and the third substrate are bonded together in a manner that the second semiconductor substrate and the third multi-layered wiring layer are opposed to each other, and the second coupling structure includes a via that is provided by penetrating at least the second substrate from a front surface side of the second substrate and electrically couples a predetermined wiring line in the second multi-layered wiring layer and a predetermined wiring line in the third multi-layered wiring layer to each other, or a via that is provided by penetrating at least the third substrate from a back surface side of the third substrate and electrically couples a predetermined wiring line in the second multi-layered wiring layer and a predetermined wiring line in the third multi-layered wiring layer to each other.

(8) The solid-state imaging device according to (7), in which the via has a structure in which electrically-conductive materials are embedded in a first through hole that exposes the predetermined wiring line in the second multi-layered wiring layer and a second through hole that exposes the predetermined wiring line in the third multi-layered wiring layer and is different from the first through hole, or a structure in which films including electrically-conductive materials are formed on inner walls of the first through hole and the second through hole.

(9) The solid-state imaging device according to (7), in which the via has a structure in which an electrically-conductive material is embedded in one through hole provided to expose the predetermined wiring line in the third multi-layered wiring layer while exposing a portion of the predetermined wiring line in the second multi-layered wiring layer, or one through hole provided to expose the predetermined wiring line in the second multi-layered wiring layer while exposing a portion of the predetermined wiring line in the third multi-layered wiring layer, or a structure in which a film including an electrically-conductive material is formed on an inner wall of the through hole.

(10) The solid-state imaging device according to any one of (1) to (9), further including a third coupling structure for electrically coupling the first substrate and the third substrate to each other, in which the second substrate and the third substrate are bonded together in a manner that the second semiconductor substrate and the third multi-layered wiring layer are opposed to each other, and the third coupling structure includes a via that is provided by penetrating at least the first substrate and the second substrate from a back surface side of the first substrate and electrically couples a predetermined wiring line in the first multi-layered wiring layer and a predetermined wiring line in the third multi-layered wiring layer to each other, or a via that is provided by penetrating at least the third substrate and the second substrate from a back surface side of the third substrate and electrically couples a predetermined wiring line in the first multi-layered wiring layer and a predetermined wiring line in the third multi-layered wiring layer to each other.

(11) The solid-state imaging device according to (10), in which the via has a structure in which electrically-conductive materials are embedded in a first through hole that exposes the predetermined wiring line in the first multi-layered wiring layer, and a second through hole that exposes the predetermined wiring line in the third multi-layered wiring layer and is different from the first through hole, or a structure in which films including electrically-conductive materials are formed on inner walls of the first through hole and the second through hole.

(12) The solid-state imaging device according to (10), in which the via has a structure in which an electrically-conductive material is embedded in one through hole provided to expose the predetermined wiring line in the third multi-layered wiring layer while exposing a portion of the predetermined wiring line in the first multi-layered wiring layer, or one through hole provided to expose the predetermined wiring line in the first multi-layered wiring layer while exposing a portion of the predetermined wiring line in the third multi-layered wiring layer, or a structure in which a film including an electrically-conductive material is formed on an inner wall of the through hole.

(13) The solid-state imaging device according to (12), in which the via is also electrically coupled to a predetermined wiring line in the second multi-layered wiring layer.

(14) The solid-state imaging device according to any one of (1) to (13), further including a second coupling structure for electrically coupling the second substrate and the third substrate to each other,
in which the second coupling structure exists on bonding surfaces of the second substrate and the third substrate, and includes an electrode junction structure in which electrodes formed on the respective bonding surfaces are joined to each other in direct contact with each other.

(15) The solid-state imaging device according to any one of (1) to (14), in which the second substrate and the third substrate include at least one of a logic circuit or a memory circuit, the logic circuit executing various kinds of signal processing related to an operation of the solid-state imaging device, the memory circuit temporarily holding a pixel signal acquired by each of the pixels of the first substrate.

(16) The solid-state imaging device according to any one of (1) to (15),
in which the second substrate includes a pixel signal processing circuit that performs AD conversion on a pixel signal acquired by each of the pixels of the first substrate, and
the first coupling structure exists in association with each of the pixels for transmitting the pixel signal to the pixel signal processing circuit.

(17) An electronic apparatus including:
a solid-state imaging device that electronically shoots an image of a target to be observed,
the solid-state imaging device including
a first substrate including a first semiconductor substrate and a first multi-layered wiring layer stacked on the first semiconductor substrate, the first semiconductor substrate having a pixel unit formed thereon, the pixel unit having pixels arranged thereon,
a second substrate including a second semiconductor substrate and a second multi-layered wiring layer stacked on the second semiconductor substrate, the second semiconductor substrate having a circuit formed thereon, the circuit having a predetermined function, and
a third substrate including a third semiconductor substrate and a third multi-layered wiring layer stacked on the third semiconductor substrate, the third semiconductor substrate having a circuit formed thereon, the circuit having a predetermined function,
the first substrate, the second substrate, and the third substrate being stacked in this order,
the first substrate and the second substrate being bonded together in a manner that the first multi-layered wiring layer and the second multi-layered wiring layer are opposed to each other,
a first coupling structure for electrically coupling the first substrate and the second substrate to each other existing on bonding surfaces of the first substrate and the second substrate, and including an electrode junction structure in which electrodes formed on the respective bonding surfaces are joined to each other in direct contact with each other.

REFERENCE NUMERALS LIST

1, 1a to 1f, 2a to 2e, 3a to 3e, 4a to 4k, 5a to 5c, 6a to 6f, 7a to 7j, 8a to 8f, 9a to 9l, 10a to 10c, 11a to 11f solid-state imaging device
101, 121, 131 semiconductor substrate
103, 109, 123, 129, 133 insulating film
105, 125, 135 multi-layered wiring layer
110A first substrate
110B second substrate
110C third substrate
111 CF layer
113 ML array
151 pad
153, 153a, 153b pad opening
155 lead line opening
157 TSV
159, 159a, 159b electrode junction structure
501 electrically-conductive material film
503 resin film
901 smartphone (electronic apparatus)
911 digital camera (electronic apparatus)

What is claimed is:

1. A light detecting device, comprising:
a first structure including a first semiconductor substrate and a first insulating layer, the first semiconductor substrate having a plurality of pixels;
a second structure including a second semiconductor substrate, a second insulating layer, and a third insulating layer; and
a third structure including a third semiconductor substrate and a fourth insulating layer,
wherein the first structure and the second structure are bonded together such that the first insulating layer and the second insulating layer are adjacent to each other, and
wherein the second structure and the third structure are bonded together such that the third insulating layer and the fourth insulating layer are adjacent to each other;

a first via that passes through the second semiconductor substrate; and a first electrode in the third insulating layer and a second electrode in the fourth insulating layer that are bonded to each other, wherein the first electrode and the second electrode are disposed in a peripheral region, and wherein the peripheral region does not overlap the plurality of pixels.

2. The light detecting device according to claim 1, wherein the first via is in the peripheral region.

3. The light detecting device according to claim 2, further comprising a second via that passes through the second semiconductor substrate, wherein the second electrode overlaps with at least a part of the plurality of pixels in a plan view.

4. The light detecting device according to claim 3, further comprising a third electrode in the third insulating layer and a fourth electrode in the fourth insulating layer, wherein the third electrode and the fourth electrode are bonded to each other.

5. The light detecting device according to claim 4, wherein the third electrode and the fourth electrode overlap with a part of the plurality of pixels.

6. The light detecting device according to claim 5, further comprising:

a fifth electrode in the first insulating layer; and a sixth electrode in the second insulating layer, wherein the fifth electrode and the sixth electrode are bonded to each other.

7. The light detecting device according to claim 2, wherein the first via extends between the second insulating layer and the third insulating layer.

8. The light detecting device according to claim 7, wherein the first via is bonded to a third electrode in the second insulating layer and to the first electrode in the third insulating layer.

9. The light detecting device according to claim 8, wherein a fourth electrode in the first insulating layer is bonded to a fifth electrode in the second insulating layer.

10. The light detecting device according to claim 1, wherein the plurality of pixels are disposed in a two-dimensional array.

11. The light detecting device according to claim 1, wherein the first insulating layer is part of a first multi-layered wiring layer, and wherein the second insulating layer is part of a second multi-layered wiring layer.

12. The light detecting device according to claim 11, wherein the third insulating layer is part of a third multi-layered wiring layer, and wherein the fourth insulating layer is part of a fourth multi-layered wiring layer.

13. An electronic apparatus, comprising:

an imaging device, including:

a first structure including a first semiconductor substrate and a first insulating layer, the first semiconductor substrate having a plurality of pixels;

a second structure including a second semiconductor substrate, a second insulating layer, and a third insulating layer; and a third structure including a third semiconductor substrate and a fourth insulating layer, wherein the first structure and the second structure are bonded together such that the first insulating layer and the second insulating layer are adjacent to each other, and wherein the second structure and the third structure are bonded together such that the third insulating layer and the fourth insulating layer are adjacent to each other;

a first via that passes through the second semiconductor substrate; and a first electrode in the third insulating layer and a second electrode in the fourth insulating layer that are bonded to each other, wherein the first electrode and the second electrode are disposed in a peripheral region, and wherein the peripheral region does not overlap the plurality of pixels.

* * * * *